United States Patent [19]
Sano et al.

[11] Patent Number: 5,824,566
[45] Date of Patent: Oct. 20, 1998

[54] METHOD OF PRODUCING A PHOTOVOLTAIC DEVICE

[75] Inventors: Masafumi Sano, Soraku-gun; Keishi Saito, Nara, both of Japan

[73] Assignee: Canon Kabushiki Kaisha, Japan

[21] Appl. No.: 719,409

[22] Filed: Sep. 24, 1996

[30] Foreign Application Priority Data

| Sep. 26, 1995 | [JP] | Japan | 7-247196 |
| Sep. 26, 1995 | [JP] | Japan | 7-247197 |
| Sep. 26, 1995 | [JP] | Japan | 7-247198 |
| Sep. 26, 1995 | [JP] | Japan | 7-247204 |
| Sep. 26, 1995 | [JP] | Japan | 7-247205 |

[51] Int. Cl.$^6$ ............................................. H01L 31/0216
[52] U.S. Cl. ................................. 438/69; 438/96; 438/97; 427/74; 136/256; 136/258
[58] Field of Search ........................ 438/69, 96–97; 204/192.27, 192.29; 136/249 TJ, 256, 258 AM, 258 PC, 259; 257/436, 458; 427/74

[56] References Cited

U.S. PATENT DOCUMENTS

| 5,101,260 | 3/1992 | Nath et al. | 257/53 |
| 5,221,854 | 6/1993 | Banerjee et al. | 257/431 |
| 5,250,120 | 10/1993 | Takada et al. | 136/256 |
| 5,296,045 | 3/1994 | Banerjee et al. | 136/249 |
| 5,324,365 | 6/1994 | Niwa | 136/256 |
| 5,401,330 | 3/1995 | Saito et al. | 136/259 |
| 5,453,135 | 9/1995 | Nakagawa et al. | 136/259 |
| 5,486,238 | 1/1996 | Nakagawa et al. | 136/259 |
| 5,500,055 | 3/1996 | Toyama et al. | 136/259 |
| 5,569,332 | 10/1996 | Glatfelter et al. | 136/249 |
| 5,603,778 | 2/1997 | Sonoda | 136/259 |
| 5,612,229 | 3/1997 | Yoshida | 438/72 |
| 5,620,530 | 4/1997 | Nakayama | 136/259 |
| 5,668,050 | 9/1997 | Iwasaki | 438/69 |

FOREIGN PATENT DOCUMENTS

| 0167231 | 1/1986 | European Pat. Off. | H01L 31/02 |
| 0534473 | 3/1993 | European Pat. Off. | H01L 31/0224 |
| 0661761 | 7/1995 | European Pat. Off. | H01L 31/20 |
| 4-218977 | 8/1992 | Japan | 136/259 |

OTHER PUBLICATIONS

A. Banerjee et al. "High–rate (–50–Å/s) deposition of ZnO films for amorphous silicon alloy solar–cell back reflector application", *Journal of Applied Physics*, vol. 70, No. 3, Aug. 1, 1991, pp. 1692–1694.

*Primary Examiner*—Nam Nguyen
*Attorney, Agent, or Firm*—Fitzpatrick, Cella, Harper & Scinto

[57] ABSTRACT

A method for producing a photo voltaic device, wherein the device comprises a base member including a substrate. A reflecting layer and a reflection enhancing layer are formed on the base member. A p-i-n structure formed of n-type, i-type and p-type semiconductor layers containing silicon atoms having a non-single crystal structure, is also formed on the base member at least once. The method comprises the steps of (a) depositing a material constituting the reflecting layer, at a substrate temperature of from 200° to 500° C. to form the reflecting layer; (b) thereafter lowering the substrate temperature to 100° C. or below; and (c) thereafter depositing a material constituting the reflection enhancing layer on the reflecting layer at a substrate temperature of from 200° to 400° C., to form the reflection enhancing layer.

21 Claims, 8 Drawing Sheets

METHOD OF PRODUCING A PHOTOVOLTAIC DEVICE

BACKGROUND OF THE INVENTION

1. Field of the Invention

The present invention relates to a method of producing a photovoltaic device. More particularly, the present invention relates to a method of producing a photovoltaic device having various advantages such as an improved photoelectric conversion efficiency, high-reliability films which will not peel off even at a high temperature and/or a high humidity, high productivity, no cracking in films at bending portions, low shunt resistance, and no cracking and no peeling in cutting process for producing a module.

2. Related Background Art

In photovoltaic devices, various techniques have been developed to improve the utilization of light illuminating the devices. A widely used technique is to provide a reflecting layer or a reflection enhancing layer in a photovoltaic device. For example in the technique disclosed in Japanese Patent Application Laid-Open No. 4-218977, a discontinuous reflecting layer is formed of metal having irregularities on its surface, and a continuous metal layer having a uniform thickness is formed on the reflecting layer so as to increase the reflectivity. However, the reflectivity is still insufficient, and thus further improvement in the reflectivity is required to increase the photoelectric conversion efficiency of photovoltaic devices.

Furthermore, the conventional photovoltaic device has a problem of adhesion between the reflecting layer and the reflection enhancing layer. In particular, the problem of adhesion becomes serious when the photovoltaic device is used for a long time at a high temperature with high humidity.

SUMMARY OF THE INVENTION

It is an object of the present invention to provide a photovoltaic device exhibiting a high photoelectric conversion efficiency, high reflectivity of a reflecting layer and a reflection enhancing layer, and good adhesion between the reflecting layer and the reflection enhancing layer and between the reflecting layer and a substrate.

To achieve the above object, the present invention provides a method for producing a photovoltaic device, wherein the device comprises a base member including a substrate. A reflecting layer and a reflection enhancing layer, are formed on a based member. A pin structure formed of n-type, i-type and p-type semiconductor layers containing silicon atoms having a non-single crystal structure, is also formed on the base member at least once. The method comprises the steps of:

(a) depositing a material constituting the reflecting layer, at a substrate temperature of from 200° to 500° C. to form the reflecting layer;

(b) thereafter lowering the substrate temperature to 100° C. or below; and (c) thereafter depositing a material constituting the reflection enhancing layer, on the reflecting layer at a substrate temperature of from 200° to 400° C. to form the reflection enhancing layer.

DETAILED DESCRIPTION OF THE PREFERRED EMBODIMENTS

Figure 1:
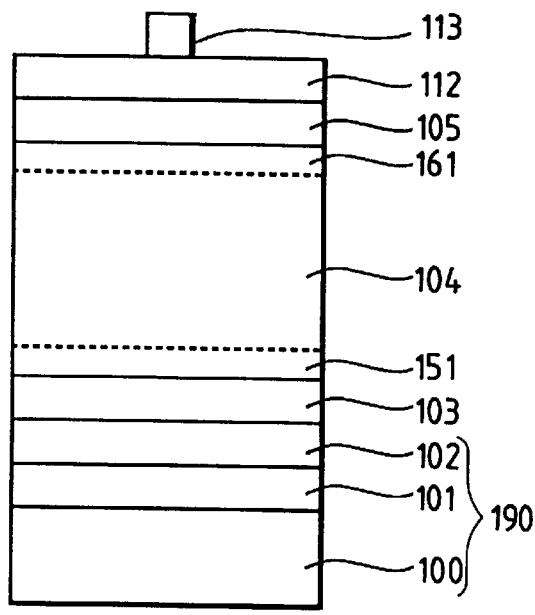
FIG. 1 is a cross-sectional view illustrating a photovoltaic device according to an embodiment of the present invention.

The present invention provides a method for producing a photovoltaic device comprising a base member comprising a substrate and superposingly formed thereon a reflecting layer and a reflection enhancing layer, and a pin structure formed of n-type, i-type and p-type semiconductor layers containing silicon atoms and being non-single crystal as crystal structure. The method of the invention can solve the problem of degradation which may occur when the photovoltaic device is used at a high temperature with high humidity. The method of the present invention is characterized that the method includes the steps of: (a) depositing a material constituting the reflecting layer, at a substrate temperature of from 200° to 500° C. to form the reflecting layer; (b) lowering after the step (a) the substrate temperature to 100° C. or below; and (c) depositing after the step (b) a material constituting the reflection enhancing layer, on the reflecting layer at a substrate temperature of from 200° to 400° C. to form the reflection enhancing layer. By employing the processing steps (a) to (c), it is possible to form a reflecting layer comprising, for example, a metal having irregularities on its surface, which result in an improvement in confinement of light. In this method, it is also possible to suppress the oxidation of the surface of the reflecting layer. Thus, the photovoltaic device of the present invention has the reflecting layer having high reflectivity.

The present invention is applicable to a production method called a roll-to-roll method, wherein semiconductor layers and other films are continuously formed on a long rolled substrate. When a reflecting layer and a reflection enhancing layer are formed successively on the substrate in production of a device according to a roll-to-roll method, oxygen atoms diffuse toward the underlying reflecting layer maintained at a high temperature during the process of depositing a material for forming the reflection enhancing layer (a transparent conductive layer), for example, an oxide. Thus, the reflecting layer is oxidized excessively. In the production method according to the present invention, the above problem of the excessive oxidation can be avoided.

The photovoltaic device produced according to the method of the present invention has improved resistance against external force which is imposed on the device, for example, when the photovoltaic device is bent. Therefore, a plurality of photovoltaic devices can be integrated into a single module without having a problem of the separation of a semiconductor layer from the substrate.

Furthermore, as explained above, the method of the present invention suppresses the oxidation of the surface of the reflecting layer composed of metal or the like. This results in an improvement in adhesion between the reflecting layer and the reflection enhancing layer of the photovoltaic device. Furthermore, according to the method of the present invention, it is possible to form a thin oxide film thereby reducing the strain. As a result, the stresses in the reflection layer and the reflection enhancing layer are reduced.

In the present invention, after forming a reflecting layer on a substrate in step (a), the substrate is cooled in the subsequent step (b) at a cooling rate of 1° to 50° C./sec so as to minimize the thermal strain caused by the change in temperature during the process of cooling the substrate thereby preventing the upper layers from peeling from the substrate during the production process or in the completed photovoltaic device and also preventing the increase in the series resistance that is the sum of resistance of the whole layers constituting the photovoltaic device.

Furthermore, in step (c) of forming the reflection enhancing layer, the temperature of the substrate is raised in a rate of 10° to 100° C./sec up to a temperature in the range from 200° to 400° C. This suppresses the thermal strain caused by the change in temperature which occurs when the temperature of the substrate is reduced after the step (c). The reduction in the thermal strain prevents the upper layers from peeling from the substrate and also prevents the increase in the series resistance of the photovoltaic device.

In the present invention, the cooling of the substrate in step (b) is performed with gas. Preferably, one or more gases selected from the group consisting of hydrogen gas, helium gas, and argon gas are used to cool the substrate down to a desired temperature without introducing oxidation of the surface of the reflecting layer which has already been formed.

With reference to preferred embodiments, the present invention will be explained in further detail below in conjunction with the drawings.

BRIEF DESCRIPTION OF THE DRAWINGS

FIGS. 1 to 4 illustrate some examples of the structure of the photovoltaic device produced according to the method of the present invention. In the examples shown in FIGS. 1 and 2, the photovoltaic device has one pin structure, while the photovoltaic device has three pin structures in the examples shown in FIGS. 3 and 4.

FIG. 1 is a cross-sectional view illustrating a photovoltaic device having one pin structure (a single type device). The photovoltaic device of this type can be constructed in two different ways. In the first structure, light is incident on the surface opposite to the base member, while light is incident on the surface of the base member in the second structure.

In the photovoltaic device with the structure in which light is incident on the surface opposite to the base member, the photovoltaic device includes: a base member 190 including a substrate 100, a reflecting layer 101 and a reflection enhancing layer 102; a first n-type layer (or p-type layer) 103; an n/i (or p/i) buffer layer 151; a first i-type layer 104; a p/i (or n/i) buffer layer 161; a first p-type layer (or n-type layer) 105; a transparent electrode 112; and a collector electrode 113, wherein these elements are formed one on another from the bottom to the top in the above-explained order.

In the device having the structure shown in FIG. 1, an intermediate layer (multifunction adhesive layer) 199 may be disposed between the substrate 100 and the reflecting layer 101 in the base member 190 as shown in FIG. 1 so as to improve the performance such as the adhesion between the substrate 100 and the reflecting layer 101. (In FIG. 2, similar parts to those in FIG. 1 are denoted by similar reference numerals.)

Figure 3:
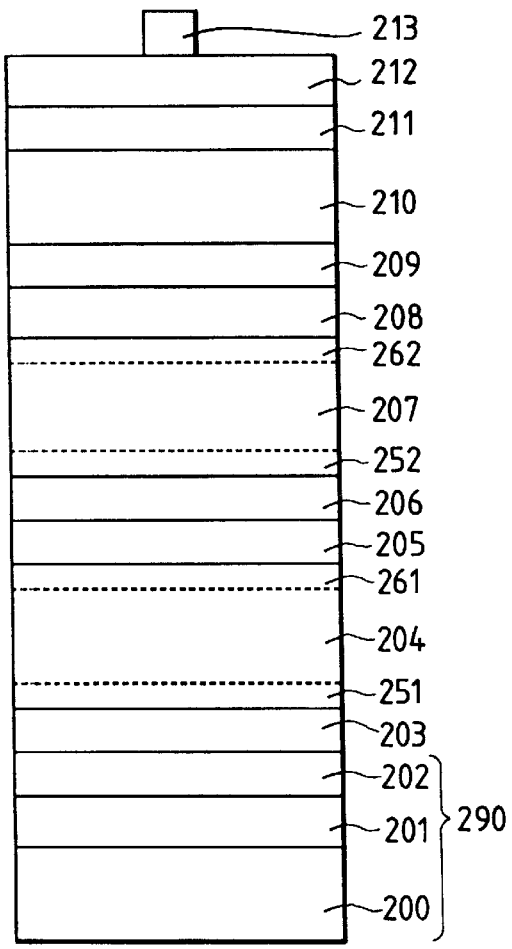
FIG. 3 is a cross-sectional view illustrating a photovoltaic device according to still another embodiment of the present invention.

FIG. 3 is a cross-sectional view illustrating a photovoltaic device having three pin structures (a triple type device). The photovoltaic device of this type can also be constructed in two different ways. That is, in the first structure, light is incident on the surface opposite to the base member, while light is incident on the surface of the base member in the second structure.

In the photovoltaic device with the structure in which light is incident on the surface opposite to the base member, the photovoltaic device comprises: a base member 290 comprising a substrate 200, a reflecting layer 201 and a reflection enhancing layer 202; a first n-type layer (or p-type layer) 203; a first n/i (or p/i) buffer layer 251; a first i-type layer 204; a first p/i (or n/i) buffer layer 261; a first p-type layer (or n-type layer) 205; a second n-type layer (or p-type layer) 206; a second n/i (or p/i) buffer layer 252; a second i-type layer 207; a second p/i (or n/i) buffer layer 262; a second p-type layer (or n-type layer) 208; a third n-type layer (or p-type layer) 209; a third i-type layer 210; a third p-type layer (or n-type layer) 211; a transparent electrode 212; and a collector electrode 213, wherein these elements are formed one on another from the bottom to the top in the above-explained order.

Figure 4:
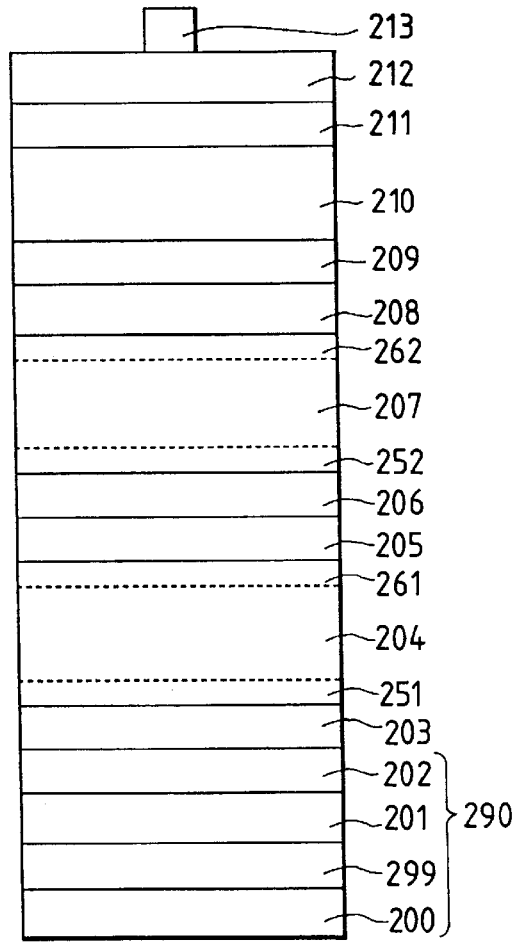
FIG. 4 is a cross-sectional view illustrating a photovoltaic device according to further embodiment of the present invention.

In the device having the structure shown in FIG. 3, an intermediate layer (multifunction adhesive layer) 299 may be disposed between the substrate 200 and the reflecting layer 201 in the base member 290 as shown in FIG. 4 so as to improve the performance such as the adhesion between the substrate 200 and the reflecting layer 201 (in FIG. 4, similar parts to those in FIG. 3 are denoted by similar reference numerals).

In the production of the photovoltaic device of the present invention, it is desirable to perform annealing on the parts near the interface between the p/i buffer layer and the p-type layer; near the interface between the n/i buffer layer and the n-type layer; near the i-type layer and the p-type layer; and/or near the i-type layer and the n-type layer. Preferably, the annealing is performed in an ambient of hydrogen gas, helium gas or argon gas. The flow rate of the annealing gas is preferably in the range from 100 to 10,000 sccm, although the optimum flow rate depends on the size of a chamber in which the annealing is performed.

The process of forming the reflecting layer and the reflection enhancing layer of the photovoltaic device according to the production method of the present invention as well as apparatus used in the production will be explained below.

FIGS. 5 to 8 illustrate some examples of apparatus which can be used to form a reflecting layer and a reflection enhancing layer according to the present invention. In the examples shown in FIG. 5 and FIG. 6, the apparatus has a plurality of chambers separated from each other. On the other hand, in the examples shown in FIGS. 7 and 8, the apparatus is of the roll-to-roll type.

The apparatus having the plurality of separated chambers shown in FIG. 5 and 6 will be explained in further detail below.

Figure 5:
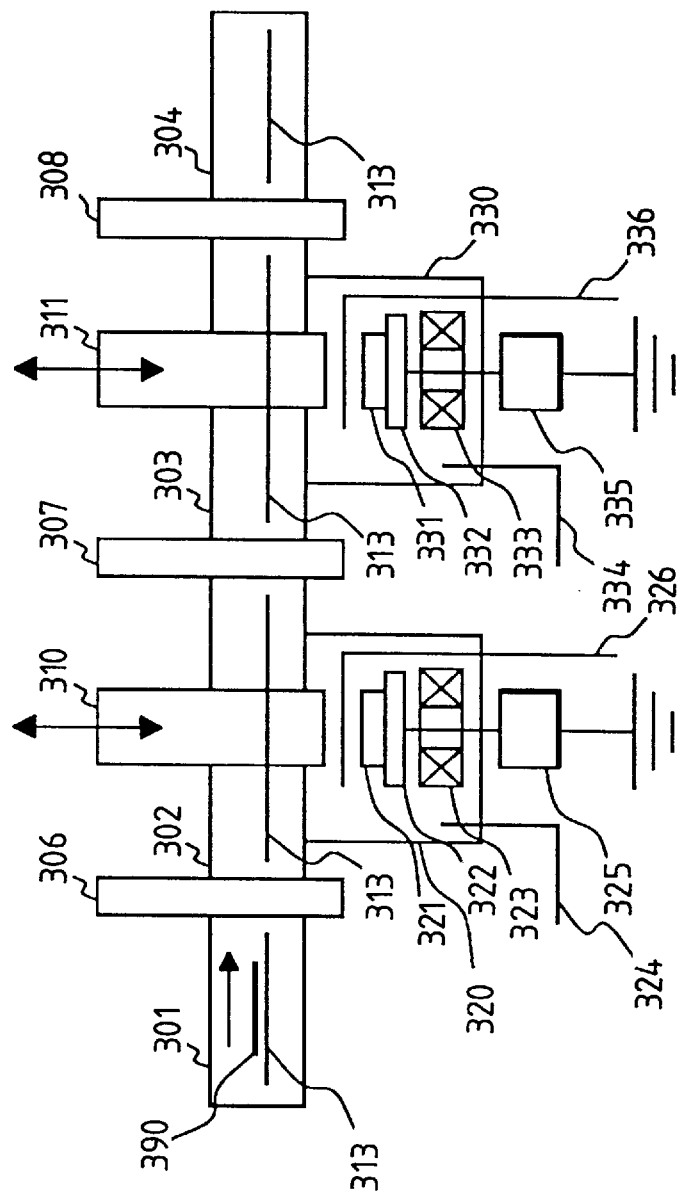
FIG. 5 is a cross-sectional view illustrating an example of an apparatus having a plurality of chambers separated from each other for producing a reflecting layer.
Figure 6:
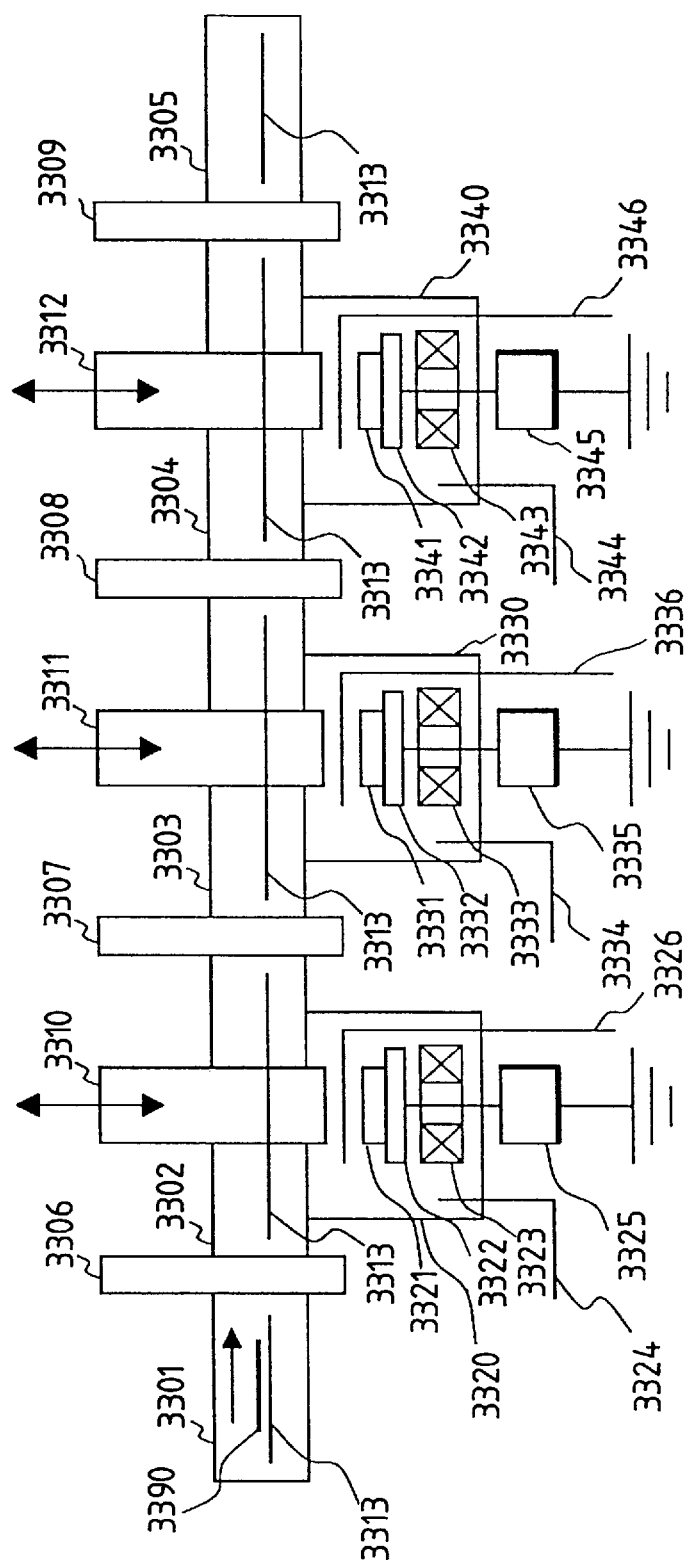
FIG. 6 is a cross-sectional view illustrating another example of an apparatus having a plurality of chambers separated from each other for producing a reflecting layer.

The apparatus shown in FIG. 5 or 6 is of the type in which layer formation is performed from wafer to wafer. A substrate having a predetermined shape is successively carried from a chamber to another of the plurality of chambers, and different layers are formed on the substrate in different chambers.

The apparatus 300 having the structure shown in FIG. 5 includes: a load-lock chamber 301; transfer chambers 302 and 303; an unload chamber 304; gate valves 306, 307, and 308; substrate heaters 310 and 311; a substrate transfer rail 313; a light reflecting layer deposition chamber 320; a reflection enhancing layer deposition chamber 330; targets 321 and 331; target electrodes 322 and 332; gas inlet pipes 324 and 334; sputtering power supplies 325 and 335; and target shutters 326 and 336.

A source gas supplying system (not shown) is connected to the apparatus shown in FIG. 5 via the gas inlet pipes. The source gas supplying system includes gas cylinders containing ultra-high-purity hydrogen, argon, and helium, respectively. On the target 321 a material such as, metal to be used to form a reflecting layer is placed. On the target 331 a material such as an oxide to be used to form a reflection enhancing layer is placed. A substrate 390 is transferred from chamber to chamber in the apparatus in the direction denoted by the arrow wherein a layer is deposited on the substrate 390 in a chamber and then another layer is further deposited thereon in the other chamber.

By way of example, the processing steps of forming a reflecting layer and a reflection enhancing layer of a photovoltaic device such as that shown in FIG. 1 or 3 using the apparatus having the plurality of separated chambers will be explained below.

(SA-1) The substrate 390 is cleaned with acetone and isopropanol or the like by means of ultrasonic cleaning, and then dried with hot air. The cleaned substrate 390 is placed on the substrate transfer rail 313 in the load chamber 301, and the load chamber 301 is evacuated with a vacuum pump (not shown) down to a pressure of about $1 \times 10^{-5}$ Torr.

(SA-2) Then, the gate valve 306 is opened, and the substrate 390 is transferred into the deposition chamber 320 via the transfer chamber 302 wherein both the deposition chamber 320 and the transfer chamber 302 have already been evacuated with a vacuum pump (not shown).

(SA-3) The substrate 390 is placed such that the back surface thereof comes into contact with the substrate heater 310 so that the substrate 390 is heated at a rate of 10° to 100° C./sec up to a temperature in the range from 200° to 500° C. The inside of the deposition chamber 320 is evacuated with the vacuum pump (not shown) down to a pressure of, for example, about $3 \times 10^{-6}$ Torr.

(SA-4) Then for example argon gas is introduced into the chamber 320 via the gas inlet pipe 324 at a desired flow rate. The pressure inside the deposition chamber 320 is adjusted to, for example 1 to 30 mTorr by means of a conductance valve (not shown). An electric current is passed through a toroidal coil 323 and, for example, DC power of, for example, 100 V to 1000 V is supplied to the target from the sputtering power supply 325 thereby generating an argon plasma.

(SA-5) A target shutter 326 is opened so as to start depositing a metal material on the surface of the substrate thereby forming a light reflecting layer (101 in the case of the device shown in FIG. 1 or 201 in the case of the device shown in FIG. 3) having a thickness of 0.25 μm to 1 μm. After completion of the deposition, the target shutter 326 is closed and the plasma is turned off.

(SA-6) The substrate heater 310 is raised to an upper position. Then in the ambient of He gas serving as the substrate cooling gas, the substrate is cooled preferably at a rate of 1° to 50° C./sec down to a temperature equal to or lower than 100° C. The gate valve 307 is then opened, and the substrate 390 is transferred into the deposition chamber 330 via the transfer chamber 303 wherein both the deposition chamber 330 and the transfer chamber 303 have already been evacuated with a vacuum pump (not shown).

(SA-7) The substrate 390 is placed such that the back surface thereof comes into contact with the substrate heater 311 so that the substrate 390 is heated preferably at a rate of 10° to 100° C./sec up to a temperature in the range from 200° to 400° C. The inside of the deposition chamber 330 is evacuated with the vacuum pump (not shown) down to a pressure of, for example, about $2 \times 10^{-6}$ Torr.

(SA-8) Then, for example, Ar gas is introduced into the chamber 330 via the gas inlet pipe 334 at a desired flow rate. The pressure inside the deposition chamber 330 is adjusted to, for example, about 6 mTorr by means of a conductance valve (not shown). An electric current is passed through a toroidal coil 333 and, for example, DC power of for example 100 V to 1000 V is supplied to the target from the sputtering power supply 335 thereby generating an Ar plasma.

(SA-9) A target shutter 336 is opened so as to start depositing a metal material on the surface of the substrate thereby forming a reflection enhancing layer (102 in the case of the device shown in FIG. 1 or 202 in the case of the device shown in FIG. 3) having a thickness of 0.05 μm to 4 μm. After completion of the deposition, the target shutter 336 is closed and the plasma is turned off.

(SA-10) The substrate heater 311 is raised to an upper position. Then in the ambient of He gas serving as the substrate cooling gas, the substrate is cooled preferably at a rate of 1° to 50° C./sec down to a temperature equal to or lower than 100° C. The gate valve 308 is then opened, and the substrate 390 is transferred into the unload chamber 304 which has already been evacuated with a vacuum pump (not shown). Thus, the reflecting layer and the reflection enhancing layer are formed.

Figure 2:
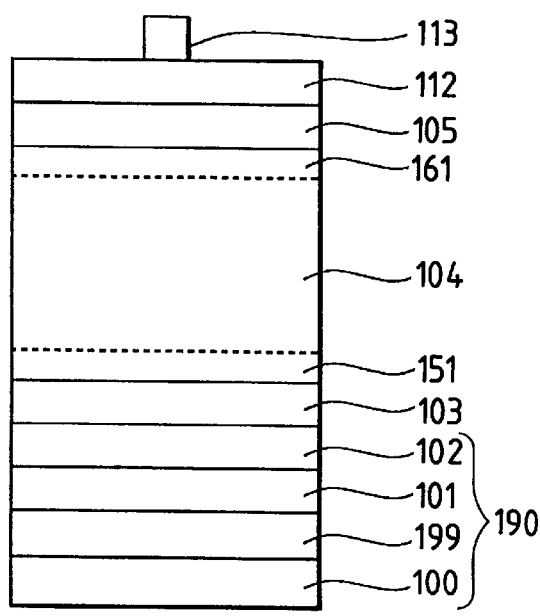
FIG. 2 is a cross-sectional view illustrating a photovoltaic device according to another embodiment of the present invention.

In production of a photovoltaic device having a structure such as that shown in FIG. 2 or 4, the apparatus having the plurality of separated chambers shown in FIG. 6 can be used to successively form an intermediate layer, a reflecting layer and a reflection enhancing layer on a substrate.

The apparatus 3300 shown in FIG. 6 includes: a load-lock chamber 3301; transfer chambers 3302, 3303 and 3304; an unload chamber 3305; gate valves 3306, 3307, 3308 and 3309; substrate heaters 3310, 3311 and 3312; a substrate transfer rail 3313; an intermediate layer deposition chamber 3320; a light reflecting layer deposition chamber 3330; a reflection enhancing layer deposition chamber 3340; targets 3321, 3331 and 3341; target electrodes 3322, 3332 and 3342; gas inlet pipes 3324, 3334 and 3344; sputtering electrodes 3325, 3335 and 3345; and target shutters 3326, 3336 and 3346.

A source gas supplying system (not shown) is connected to the apparatus shown in FIG. 6 via the gas inlet pipes. The source gas supplying system includes gas cylinders containing ultra-high-purity hydrogen, argon, and helium, respectively. On the target 3321 a material to be used to form an intermediate layer is placed. On the target 3331 a material such as metal to be used to form a reflecting layer is placed. On the target 341 a material such as an oxide to be used to form a reflection enhancing layer is placed.

As in the apparatus shown in FIG. 5, a substrate 3390 is transferred from chamber to chamber in the apparatus in the direction denoted by the arrow wherein a layer is deposited on the substrate 3390 in one chamber and another layer is further deposited thereon in another chamber, and so on.

By way of example, the processing steps of forming an intermediate layer, a reflecting layer and a reflection enhancing layer using the apparatus having the plurality of separated chambers shown in FIG. 6 will be explained below.

(SB-1) The substrate is cleaned with acetone and isopropanol or the like by means of ultrasonic cleaning, and then dried with hot air. The cleaned substrate 3390 is placed on the substrate transfer rail 3313 in the load chamber 3301, and the load chamber 3301 is evacuated with a vacuum pump (not shown) down to a pressure of, for example, about $1 \times 10^{-5}$ Torr.

(SB-2) Then the substrate 3390 is transferred into the deposition chamber 3320 via the transfer chamber 3302 wherein both the deposition chamber 3320 and the transfer chamber 3302 have already been evacuated with a vacuum pump (not shown).

(SB-3) The substrate 3390 is placed such that the back surface thereof comes into contact with the substrate heater 3310 so that the substrate 3390 is heated preferably up to a temperature in the range from 30° to 500° C. The inside of the deposition chamber 3320 is evacuated with the vacuum pump (not shown) down to a pressure of for example about $2 \times 10^{-6}$ Torr.

(SB-4) Then for example argon gas is introduced into the chamber 3320 via the gas inlet pipe 3324 at a desired flow rate. The pressure inside the deposition chamber 3320 is adjusted to for example 1 to 30 mTorr by means of a conductance valve (not shown). An electric current is passed through a toroidal coil 3323 and for example DC power of for example 100 V to 1000 V is supplied to the target from the sputtering power supply 3325 thereby generating an argon plasma.

(SB-5) A target shutter 3326 is opened so as to start depositing an intermediate layer (199 in the case of the device shown in FIG. 2 or 299 in the case of the device shown in FIG. 4) on the surface of the substrate. When the thickness of the intermediate layer has reached the desired value in the range from 1 to 100 nmr the target shutter 3326 is closed and the plasma is turned off.

(SB-6) The gate valve 3307 is then opened and the substrate 3390 is transferred into the deposition chamber 3330. The substrate 3390 is placed such that the back surface thereof comes into contact with the substrate heater 3311 so that the substrate 3390 is heated preferably at a rate of 10° to 100° C./sec up to a temperature in the range from 200° to 500° C. The inside of the deposition chamber 3330 is evacuated with the vacuum pump (not shown) down to a pressure of, for example, about $3 \times 10^{-6}$ Torr.

(SB-7) Then, for example, argon gas is introduced into the chamber 3330 via the gas inlet pipe 3334 at a desired flow rate. The pressure inside the deposition chamber 3330 is adjusted to, for example, 1 to 30 mTorr by means of a conductance valve (not shown). An electric current is passed through a toroidal coil 3333 and, for example, DC power of for example 100 V to 1000 V is supplied to the target from the sputtering power supply 3335 thereby generating an argon plasma.

(SB-8) A target shutter 3336 is opened so as to start depositing a metal material thereby forming a reflecting layer (101 in the case of the device shown in FIG. 2 or 201 in the case of the device shown in FIG. 4) on the surface of the substrate. When the thickness of the reflecting layer has reached a desired value in the range from 0.25 $\mu$m to 1 $\mu$m, the target shutter 3336 is closed and the plasma is turned off.

(SB-9) The substrate heater 3311 is raised to an upper position. Then in the ambient of He gas serving as the substrate cooling gas, the substrate is cooled preferably at a rate of 1° to 50° C./sec down to a temperature equal to or lower than 100° C. The gate valve 3308 is then opened, and the substrate 3390 is transferred into the deposition chamber 3340 via the transfer chamber 3304 wherein both the deposition chamber 3340 and the transfer chamber 3304 have already been evacuated with a vacuum pump (not shown).

(SB-10) The substrate 3390 is placed such that the back surface thereof comes into contact with the substrate heater 3312 so that the substrate 3390 is heated preferably at a rate of 10° to 100° C./sec up to a temperature in the range from 200° to 400° C. The inside of the deposition chamber 3340 is evacuated with the vacuum pump (not shown) down to a pressure of for example about $2 \times 10^{-6}$ Torr.

(SB-11) Then, for example, argon gas is introduced into the chamber 3340 via the gas inlet pipe 3334 at a desired flow rate. The pressure inside the deposition chamber 3340 is adjusted to, for example, 1 to 30 mTorr by means of a conductance valve (not shown). An electric current is passed through a toroidal coil 3343 and, for example, DC power of for example 100 V to 1000 V is supplied to the target from the sputtering power supply 3345 thereby generating an argon plasma.

(SB-12) A target shutter 3346 is opened so as to start depositing a reflection enhancing layer (102 in the case of the device shown in FIG. 2 or 202 in the case of the device shown in FIG. 4) on the surface of Ag reflecting layer 101. When the thickness of the reflection enhancing layer has reached a desired value in the range from 0.05 $\mu$m to 4 $\mu$m, the target shutter 3346 is closed and the plasma is turned off.

(SB-13) The substrate heater 3312 is raised to an upper position. Then in the ambient of He gas serving as the substrate cooling gas, the substrate is cooled preferably at a rate of 1° to 50° C./sec down to a temperature equal to or lower than 100° C. The gate valve 3309 is then opened, and the substrate 3390 is transferred into the unload chamber 3305 which has already been evacuated with a vacuum pump (not shown). Thus, the intermediate layer, the reflecting layer and the reflection enhancing layer have been formed.

Now, the apparatus of the roll-to-roll type shown in FIGS. 7 and 8 will be explained below.

Figure 7:
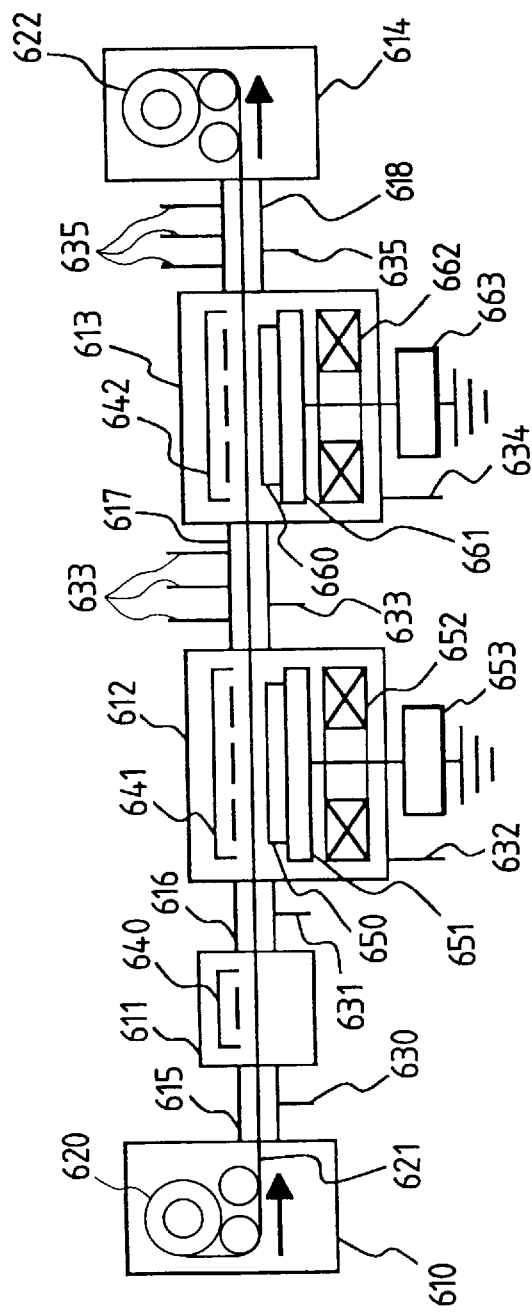
FIG. 7 is a cross-sectional view illustrating an example of a roll-to-roll type apparatus for producing a reflecting layer.
Figure 8:
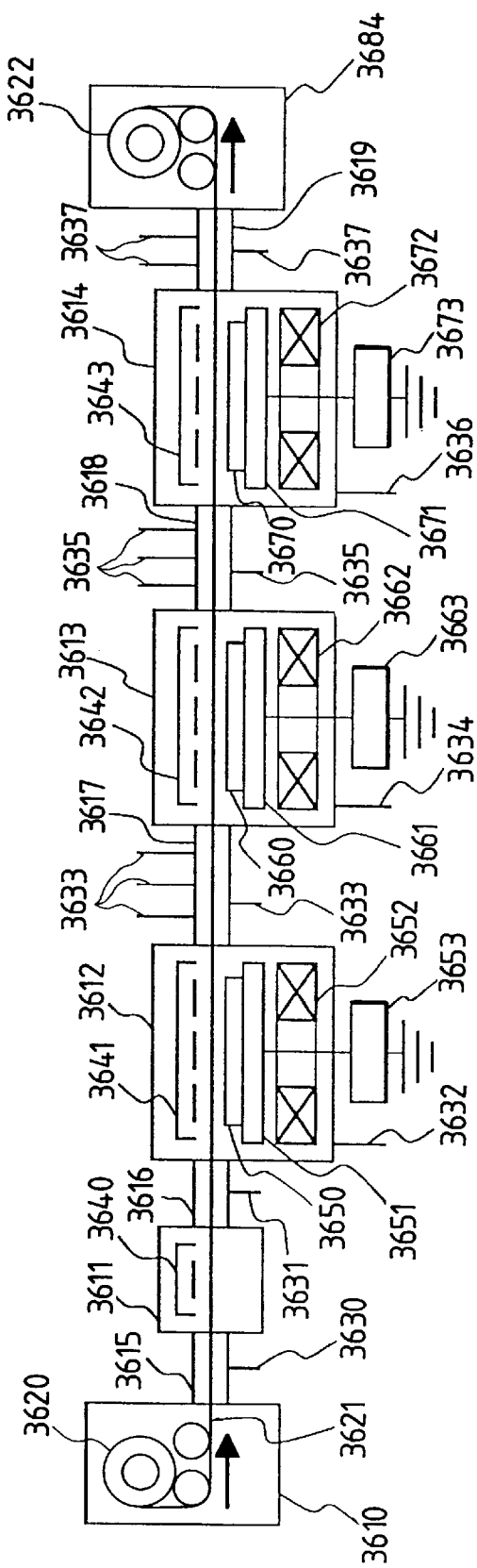
FIG. 8 is a cross-sectional view illustrating another example of a roll-to-roll type apparatus for producing a reflecting layer.

In the apparatus shown in FIG. 7 or 8, a rolled ribbon-shaped substrate is passed through a plurality of chambers so that a plurality of layers are successively formed on the substrate.

The apparatus 600 shown in FIG. 7 includes: a substrate feeding chamber 610; a plurality of deposition chambers 611–613; and a substrate winding chamber 614. These chambers are arranged side by side, and adjacent chambers are connected to each other via separation paths 615, 616, 617, and 618. Each chamber has a vent via which the inside of the chamber can be evacuated. The ribbon-shaped substrate 621 is moved in the apparatus in the direction denoted by the arrow so that layers are deposited on the substrate from chamber to chamber.

The processing steps of forming a reflecting layer in the production of a photovoltaic device having a structure such as that shown in FIG. 1 or 3 using the apparatus of the roll-to-roll type shown in FIG. 7 will be explained below.

The ribbon-shaped substrate 621 is fed into the apparatus and is passed through the respective deposition chambers and separation paths. The ribbon-shaped substrate 621 is then wound into a roll in the substrate winding chamber. Gas is introduced into each separation path via a gas inlet, and the gas is exhausted from the chamber via the vent so that layers are deposited one on another during the passage of the ribbon-shaped substrate 621.

A light reflecting layer is formed in the deposition chamber 612, and a reflection enhancing layer (102 in the case of the structure shown in FIG. 1 and 202 in the case of the structure shown in FIG. 3) is formed in the deposition chamber 613.

In each deposition chamber, there is provided a halogen lamp heater 640, 641, and 642 for heating the substrate from the back thereof up to a temperature predetermined for each chamber. Each separation path 617, 618 has a cooling mechanism.

In the deposition chamber 612, a film is deposited, for example, by means of the DC magnetron sputtering technique in the ambient of, for example, Ar gas introduced via a gas inlet 632. A material such as a metal for forming the reflecting layer is employed as the target 650.

In the deposition chamber 613, a film is deposited, for example, by means of the DC or RF magnetron sputtering technique in the ambient of, for example, Ar gas introduced via a gas inlet 634. A material such as an oxide for forming the reflection enhancing layer is employed as the target 660.

After forming the reflecting layer and the reflection enhancing layer under given conditions, the ribbon-shaped substrate 621 is wound into a roll in the substrate winding chamber 3684.

On the other hand, the apparatus of the roll-to-roll type shown in FIG. 8 can be employed to form an intermediate layer, a reflecting layer, and a reflection enhancing layer on a substrate in the production of a photovoltaic device such as that shown in FIG. 2 or 4.

The apparatus 3600 shown in FIG. 8 includes: a substrate feeding chamber 3610; a plurality of deposition chambers 3611–3613; and a substrate winding chamber 3684. These chambers are arranged side by side, and adjacent chambers are connected to each other via separation paths 3615, 3616, 3617, 3618, and 3619. Each chamber has a vent via which the inside of the chamber can be evacuated. The ribbon-shaped substrate 3621 is moved in the apparatus in the direction denoted by the arrow so that layers are deposited on the substrate from chamber to chamber.

The processing steps of forming an intermediate layer, a reflecting layer, and a reflection enhancing layer in the production of a photovoltaic device having a structure such as that shown in FIG. 2 or 4 using the apparatus of the roll-to-roll type shown in FIG. 8 will be explained below.

The ribbon-shaped substrate 3621 is fed into the apparatus and is passed through the respective deposition chambers and separation paths. The ribbon-shaped substrate 3621 is then wound into a roll in the substrate winding chamber. Gas is introduced into each separation path via a gas inlet, and the gas is exhausted from the chamber via the vent so that layers are deposited one on another during the passage of the ribbon-shaped substrate 3621.

In the deposition chamber 3612, an intermediate layer (199 in the case of the structure shown in FIG. 2 and 299 in the case of the structure shown in FIG. 4) is formed. In the deposition chamber 3613, a reflecting layer (101 in the case of the structure shown in FIG. 2 and 201 in the case of the structure shown in FIG. 4) is formed. A reflection enhancing layer (102 in the case of the structure shown in FIG. 2 and 204 in the case of the structure shown in FIG. 4) is formed in the deposition chamber 3614.

In each deposition chamber, there is provided a halogen lamp heater 3640, 3641, 3642, 3643 for heating the substrate from the back thereof up to a temperature predetermined for each chamber. Each separation path 3617, 3618, 3619 has a cooling mechanism.

In the deposition chamber 3612, a film is deposited, for example, by means of the DC magnetron sputtering technique in the ambient of, for example, Ar gas introduced via a gas inlet 3632. A material for forming the intermediate layer is employed as the target 3650.

In the deposition chamber 3613, a film is deposited, for example, by means of the DC or RF magnetron sputtering technique in the ambient of, for example, Ar gas introduced via a gas inlet 3634. A material for forming the reflecting layer is employed as the target 3660.

In the deposition chamber 3614, a film is deposited, for example, by means of the DC magnetron sputtering technique in, for example, Ar gas ambient introduced via a gas inlet 3636. A material for forming the reflection enhancing layer is employed as the target 3670.

After forming the intermediate layer, the reflecting layer and the reflection enhancing layer under given conditions, the ribbon-shaped substrate 3621 is wound into a roll in the substrate winding chamber 3614.

In the production of the photovoltaic device according to the present invention, the processing steps of forming semiconductor layers into the pin structure on the base member on which the reflecting layer and the reflection enhancing layer have been formed in the above-explained manner will now be explained below with reference to the drawings.

Figure 9:
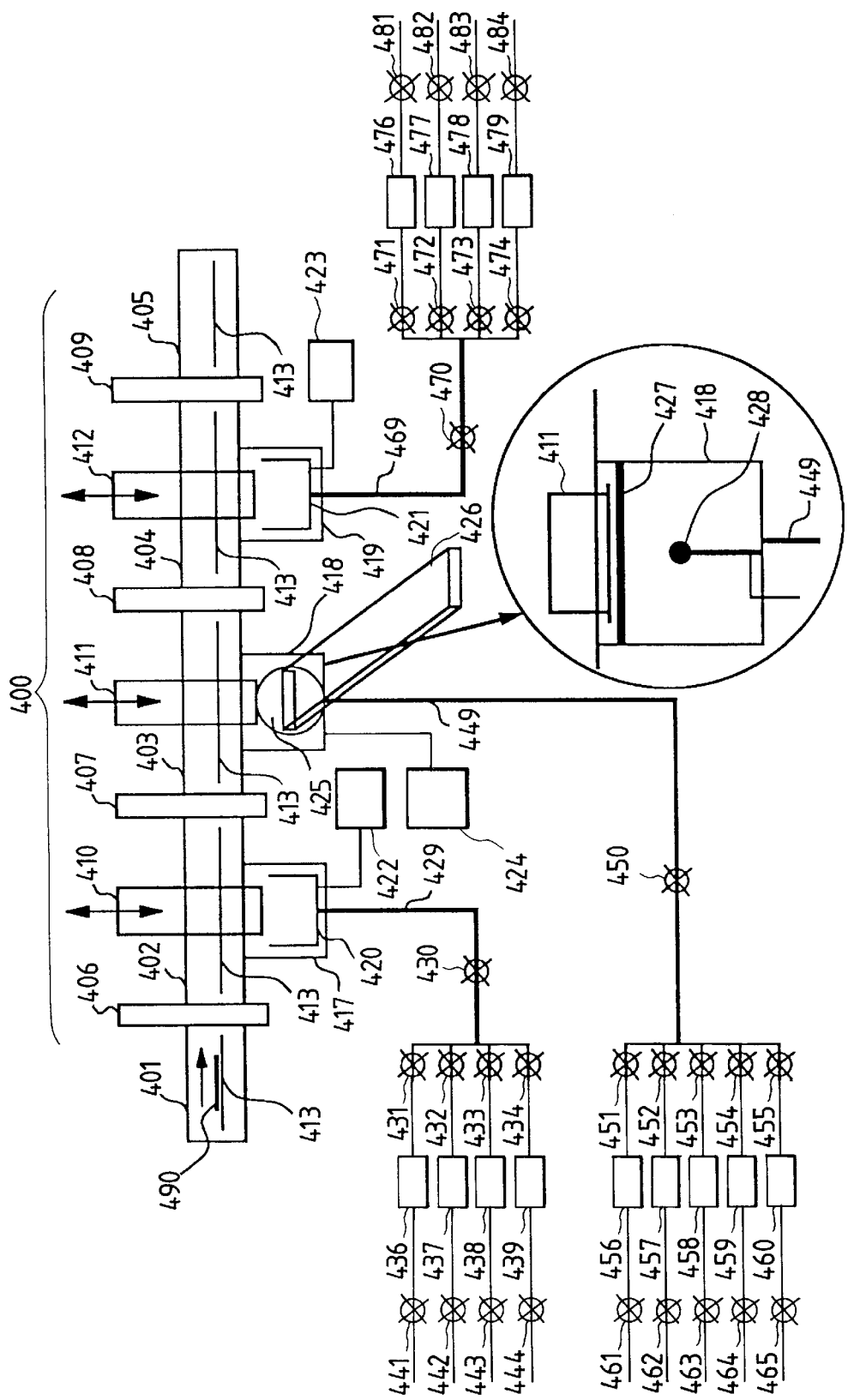
FIG. 9 is a cross-sectional view illustrating an example of an apparatus having a plurality of chambers separated from each other for producing a photovoltaic device.
Figure 10:
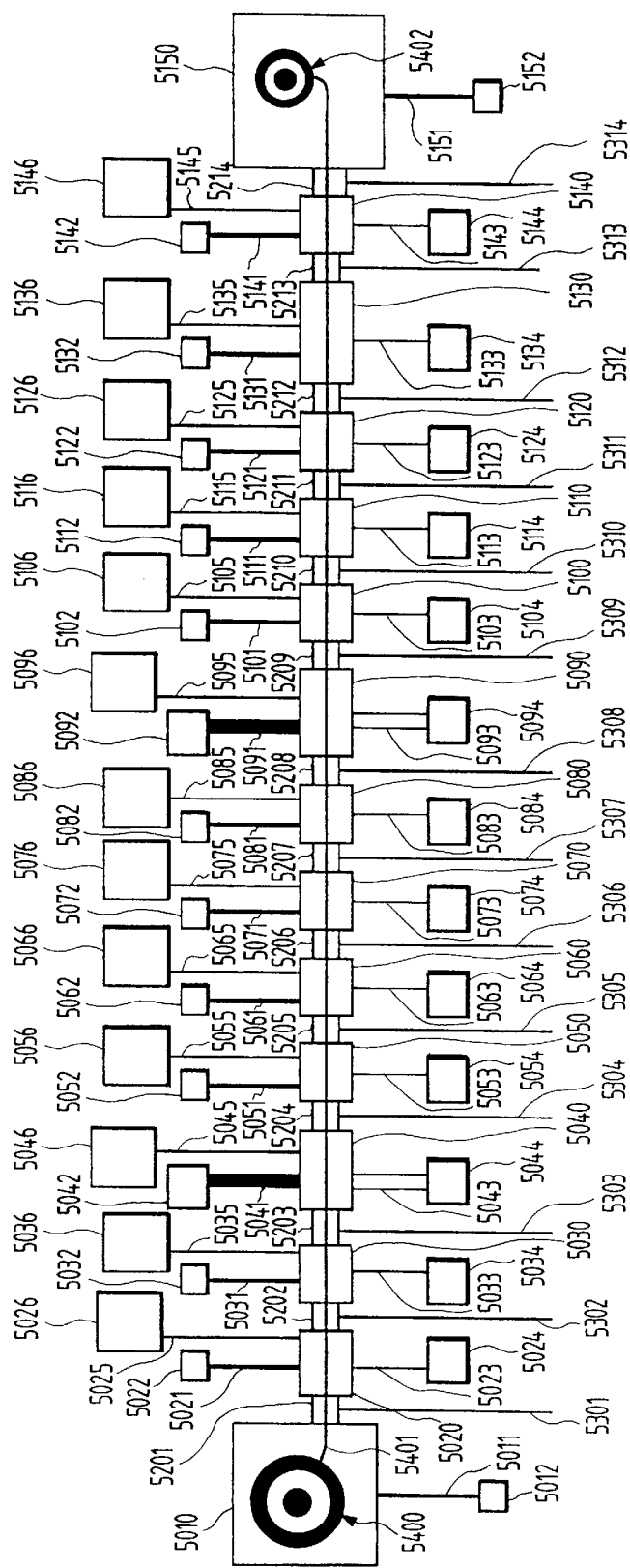
FIG. 10 is a cross-sectional view illustrating an example of a roll-to-roll type apparatus for producing a photovoltaic device.

As for the production apparatus for this purpose, for example the apparatus shown in FIG. 9 or 10 can be used. The apparatus shown in FIG. 9 is of the type having a plurality of separated chambers, and the apparatus shown in FIG. 10 is of the roll-to-roll type.

The apparatus having the plurality of separated chambers shown in FIG. 9 will be explained in further detail below.

In this apparatus, substrates having a predetermined shape are fed successively into the plurality of chambers, and the deposition of a semiconductor layer is performed in each chamber from one substrate to another thereby producing a device having any of structures shown in FIGS. 1–4.

The apparatus 400 of FIG. 9 includes: a load chamber 401; transfer chambers 402, 403, 404; unload chamber 405; gate valves 406, 407, 408, 409; substrate heaters 410, 411, 412; a substrate transfer rail 413; an n-type layer (or p-type layer) deposition chamber 417; an i-type layer deposition chamber 418; a p-type layer (or n-type layer) deposition chamber 419; plasma excitation cups 420, 421; power supplies 422, 423, 424; a microwave entrance window 425; a wave guide 426; gas inlet pipes 429, 449, 469; valves 430, 431, 432, 433, 434, 441, 442, 443, 444, 450, 451, 452, 453, 454, 455, 461, 462, 463, 464, 465, 470, 471, 472, 474, 481, 482, 483, 484; mass flow controllers 436, 437, 438, 439, 456, 457, 458, 459, 460, 476, 477, 478, 479; a shutter 427; a bias bar 428; a base member holder 490; an evacuation system (not shown); a microwave power supply (not shown); a vacuum gauge (not shown); and a controller (not shown).

An example of a method of producing a photovoltaic device using the in-line production apparatus shown in FIG. 9, according to the present invention, will now be explained below.

(I-1) All chambers of the deposition apparatus 400 are evacuated down to a pressure of, for example, $10^{-6}$ Torr or lower via turbo-molecular pumps (not shown) connected to the respective chambers.

(I-2) A substrate on which a reflecting layer and a reflection enhancing layer have been formed in the above-explained manner is placed on a substrate holder 490.

(I-3) The substrate holder 490 is put into the load chamber 401 and the door of the load chamber 401 is closed. The load chamber 401 is then pumped down to a predetermined pressure using an evacuation system (not shown) including a mechanical booster pump and a rotary pump (MP/RP evacuation system).

(I-4) If the load chamber has been evacuated to the predetermined pressure, the MP/RP is switched to a turbo-molecular pump, and further pumped down to, for example, $10^{-6}$ Torr or lower.

(I-5) When the pressure inside the load chamber has become $10^{-6}$ Torr or lower, the gate valve 406 is opened, and the substrate holder 490 is moved along the substrate transfer rail 413 into the transfer chamber 402. The gate valve 406 is then closed.

(I-6) The substrate heater 410 in the transfer chamber 402 is raised to an upper position so that the substrate holder 490 does not collide with the substrate heater 410. The substrate holder 490 is positioned so that the substrate comes to a location just below the heater 410. The substrate heater 410 is then lowered and the substrate is moved into the n-layer deposition chamber.

(I-7) The temperature of the substrate is adjusted to a value suitable for the deposition of the n-type layer. A gas containing silicon such as $SiH_4$, $Si_2H_6$ or the like and a gas containing a Group V element to be used to form the n-type layer are introduced into the deposition chamber 417 via the valve 433, the mass flow controller 438, and the valve 433. Preferably, hydrogen gas is also introduced into the deposition chamber 417 at a proper flow rate depending on the characteristics of the n-type layer to be deposited. In this way, the source gases for depositing the n-type layer are introduced into the deposition chamber 417 and the vent valve (not shown) is adjusted so that the pressure inside the deposition chamber 417 has a proper value for example in the range from 0.1 Torr to 10 Torr.

(I-8) The RF power is then applied from the RF power supply 422 to the plasma excitation cup 420 thereby generating plasma discharging, which is maintained for a proper time duration until the n-type layer having a desired thickness has been deposited.

(I-9) After completion of the deposition of the n-type layer, the supply of the source gases into the deposition chamber 417 is stopped, and the inside of the chamber 417 is purged by hydrogen gas or helium gas. After sufficiently purging the chamber 417, the supply of the hydrogen or helium gas is stopped, and the inside of the chamber 417 is pumped down, for example, to a pressure of $10^{-6}$ Torr using the turbo-molecular pump.

(I-10) The gate valve 407 is opened, and the substrate holder 490 is moved into the transfer chamber 403. The gate valve 407 is then closed.

(I-11) The position of the substrate holder 490 is then adjusted so that the substrate can be heated by the substrate heater 411. The substrate heater 411 is moved such that it comes into contact with the substrate and the substrate is heated up to a proper temperature. Hydrogen gas or an inert gas such as helium is introduced into the deposition chamber 418. The deposition chamber 418 is preferably maintained at a pressure equal to that at which an n/i buffer layer will be deposited in the following step.

(I-12) When the substrate temperature has reached the proper value, the gas for use during the heating of the substrate is shut off, and source gases to be used to deposit the n/i buffer layer are supplied into the deposition chamber 418 from the source gas supplying system. The valves 462, 463, and 464 are opened and the flow rates of hydrogen gas, silane gas, and germane gas are adjusted to desired values by the mass flow controllers 457, 458, and 459. The valves 452, 453, 454, and 450 are then opened so as to introduce the above gases into the deposition chamber 418. These source gases are pumped by a diffusion pump (not shown) so that the inside of the deposition chamber 418 is maintained at a proper pressure.

(I-13) When the pressure inside the deposition chamber 418 has become stable at the desired value, RF power is applied to the bias bar from the RF power supply (not shown) and an n/i buffer layer is deposited by means of RF plasma CVD. Preferably, the n/i buffer layer is deposited at a deposition rate smaller than that at which an i-type layer will be deposited on it in the following step.

(I-14) The substrate is then heated to a temperature suitable for depositing the i-type layer. During the heating of the substrate, hydrogen gas or an inert gas such as helium is preferably introduced into the deposition chamber 418 via the valves 461, 451, and 450 wherein the flow rate of the gas is controlled by a mass flow controller. The deposition chamber 418 is preferable maintained at a pressure equal to that at which the i-type layer will be deposited.

(I-15) When the substrate temperature has reached the proper value, the gas for use during the heating of the substrate is shut off, and source gases to be used to deposit the i-type layer are supplied into the deposition chamber 418 from the source gas supplying system. The valves 462, 463, and 464 are opened and the flow rates of hydrogen gas, silane gas, and germane gas are adjusted to desired values by the mass flow controllers 457, 458, and 459. The valves 452, 453, 454, and 450 are then opened so as to introduce the above gases into the deposition chamber 418. At the same time, these source gases are pumped by the diffusion pump (not shown) so that the inside of the deposition chamber 418 is maintained at a proper pressure.

(I-16) When the pressure inside the deposition chamber 418 has become stable at the proper value, microwave power is introduced via the wave guide 426 and the microwave entrance window 425 into the deposition chamber 418. In addition to the above microwave power, DC bias power may also be introduced via the bias bar into the deposition chamber 418 from an external DC power supply, RF power supply, or VHF power supply 424, as shown in an enlarged fashion in FIG. 9. Thus, the i-type layer having a desired thickness is deposited. When the thickness of the i-type layer has reached the desired value, the microwave power and the bias power are turned off.

(I-17) The inside of the deposition chamber 418 is purged with hydrogen gas or an inert gas such as helium gas as required. A p/i buffer layer having a desired thickness is then deposited on the i-type layer in a similar manner to that in the n/i buffer layer. After completion of the deposition of the p/i buffer layer, the inside of the deposition chamber 418 is purged with hydrogen gas or an inert gas such as helium gas as required.

(I-18) After the purging, the evacuating system is switched from the diffusion pump to the turbo-molecular pump and the deposition chamber is pumped down to a pressure, for example, $10^{-6}$ Torr or less. At the same time, the substrate heater is raised so that the substrate holder may move without collision with the heater. The gate valve 408 is opened, and the substrate holder is moved to the transfer chamber 404 via the transfer chamber 403. The gate valve 408 is then closed.

(I-19) The substrate holder is moved to a position just below the substrate heater 412, and the substrate is heated by the substrate heater 412. During the heating process, it is more preferable that the evacuating systems be switched from the turbo-molecular pump to the MP/RP and hydrogen gas or an inert gas such as helium be supplied into the deposition chamber while maintaining the pressure inside the deposition chamber at a value equal to that at which a p-type layer will be deposited. When the substrate temperature has reached a desired value, the hydrogen gas or inert gas for use during the heating of the substrate is shut off, and source gases such as $H_2$, $SiH_4$, and a gas containing, for the case of the deposition of a p-type layer, a Group III element, for example, $BF_3$ are supplied into the deposition chamber 419 via the valves 482, 483, 484, the mass flow controllers 477, 478, 479, the valves 472, 473, 474, and the gas inlet 469.

(I-20) The vent valve is adjusted so that the pressure inside the deposition chamber 419 is maintained at a proper value. When the pressure inside the deposition chamber 419 has become stable at the proper value, RF power is supplied to the plasma excitation cup from the RF power supply 423. Thus, deposition is performed for a proper time duration thereby forming a p-type layer.

(I-21) After completion of the deposition, the RF power and the source gases are stopped, and the inside of the deposition chamber is purged with hydrogen gas or an inert gas such as helium gas. After the purging, the evacuating system is switched from the MP/RP to the turbo-molecular pump and the deposition chamber is pumped down to a pressure $10^{-6}$ Torr or less. Meanwhile, the substrate heater is raised. Furthermore, the gate valve 409 is opened and the substrate holder 490 is moved to the unload chamber 405. The gate valve 409 is then closed. If the substrate holder has been cooled down to a temperature 100° C. or less, the door of the unload chamber is opened and the substrate is taken out to the outside. In this way, semiconductor layers in the form of a pin structure have been formed on the substrate.

(I-22) The substrate on which the pin semiconductor layers have been formed is then placed in a vacuum vapor deposition chamber and a transparent electrode is vapor-deposited onto the top of the semiconductor layers. The substrate on which the transparent electrode has been formed in the previous step is then placed in another vacuum vapor deposition chamber and a collector electrode is vapor-deposited onto the transparent electrode.

Thus, after the processing steps (I-1) to (I-22), a complete photovoltaic semiconductor device has been obtained.

Now, the apparatus of the roll-to-roll type shown in FIG. 10 will be explained below.

In the apparatus shown in FIG. 10, a rolled ribbon-shaped substrate is passed through a plurality of chambers connected to each other so that a plurality of semiconductor layers are successively formed on the substrate or required processing is performed thereby producing a device having any of structures shown in FIGS. 1 to 4.

The deposition apparatus 5000 includes thirteen chambers connected to each other. These thirteen chambers are disposed between a load chamber 5010 from which a substrate in the sheet form is fed into the chambers and an unload chamber 5150. The thirteen chambers are: a first n-type layer deposition chamber 5020; a first RF i-layer (n/i) deposition chamber 5030; a first MW (microwave) i-layer deposition chamber 5040; a first RF i-layer (p/i) deposition chamber 5050; a first p-type layer deposition chamber 5060; a second n-type layer deposition chamber 5070; a second RF i-layer (n/i) deposition chamber 5080; a second MW i-layer deposition chamber 5090; a second RF i-layer (p/i) deposition chamber 5100; a second p-type layer deposition chamber 5110; a second RF i-layer deposition chamber 5130; and a third p-type layer deposition chamber 5140.

The adjacent chambers are connected to each other via a gas gate (5201, 5202, 5203, 5204, 5205, 5206, 5207, 5208, 5209, 5210, 5211, 5212, 5213, 5214). Each gas gate has a gas supply pipe (5301, 5302, 5303, 5304, 5305, 5306, 5307, 5308, 5309, 5310, 5311, 5312, 5313, 5314) via which gas is supplied into the gas gate.

The load chamber 5010, the unload chamber 5150, and the deposition chambers are each connected to an evacuation pump (5012, 5022, 5032, 5042, 5052, 5062, 5072, 5082, 5092, 5102, 5112, 5122, 5132, 5142, 5152) via an exhaust pipe (5011, 5021, 5031, 5041, 5051, 5061, 5071, 5081, 5091, 5101, 5111, 5121, 5131, 5141, 5151).

A source gas supply pipe (5025, 5035, 5045, 5055, 5065, 5075, 5085, 5095, 5105, 5115, 5125, 5135, 5145) is connected to each deposition chamber wherein the other end of each source gas supply pipe is connected to a mixing device (5026, 5036, 5046, 5056, 5066, 5076, 5086, 5096, 5106, 5116, 5126, 5136, 5146).

Furthermore, each deposition chamber is connected to a high frequency (RF) power supply (5024, 5034, 5044, 5054, 5064, 5074, 5084, 5094, 5104, 5114, 5124, 5134, 5144) via an RF coaxial cable (5023, 5033, 5043, 5053, 5063, 5073, 5083, 5093, 5103, 5113, 5123, 5133, 5143).

A sheet feeding mechanism 5400 is disposed in the load chamber 5010, and a sheet winding mechanism 5402 is disposed in the unload chamber 5150. A substrate in the form of a sheet 5401 is fed from the sheet feeding mechanism 5400 and is passed through the above-explained thirteen deposition chambers. The substrate 5401 is then wound by the sheet winding mechanism 5402.

The MW i-layer deposition chamber is also connected to a bias power supply via a coaxial cable. Furthermore, the MW i-layer deposition chamber is connected to an exhaust gas disposal system.

An example of a method of producing a photovoltaic device using the production apparatus of the roll-to-roll type shown in FIG. 10, according to the present invention, will now be explained below.

(R-1) The sheet-shaped substrate on which a reflecting layer and a reflection enhancing layer have been formed in the above-explained manner is wound into a roll. The roll of substrate is set in the load chamber 5010 provided for feeding the sheet-shaped substrate.

(R-2) The sheet-shaped substrate is then connected to the sheet winding mechanism 5402 in the unload chamber 5150 through the deposition chambers and gas gates. After evacuating each deposition chamber with the evacuation system (not shown) down to $10^{-3}$ Torr or lower, hydrogen gas is supplied to the respective chambers via the mixing devices 5024, 5034, 5044, 5054, 5064, 5074, 5084, 5094, 5104, 5114, 5124, 5134, and 5144.

(R-3) Hydrogen gas is supplied from the gate gas supplying system to the respective gas gates 5201, 5202, 5203,

5204, 5205, 5206, 5207, 5208, 5209, 5210, 5211, 5212, 5213, and 5214. The flow rates of the hydrogen gas supplied to the gas gates are controlled so that the source gases are not mixed between adjacent deposition chambers. The preferable flow rates depend on the intervals of the sheet-shaped substrate passing through the gas gates. In the case where the intervals are 0.5 to 5 mm, it is preferable to set the flow rates of the hydrogen gas to a value in the range from 200 sccm to 3000 sccm.

(R-4) The sheet-shaped substrate 5401 is heated to a predetermined substrate temperature by a substrate heater provided in each deposition chamber. If the substrate temperature has become stable, the hydrogen gas supplied to each deposition chamber is switched to proper source gas depending on the respective deposition chambers. After switching the gas to the source gas, the degree of opening of the exhaust valve of each evacuation system is adjusted so that the inside of each deposition chamber is maintained at a proper gas pressure.

(R-5) The feeding of the sheet-shaped substrate 5401 is started. After the pressure has become stable, RF or MW power used to generate a plasma is supplied to each deposition chamber thereby producing a photovoltaic device having for example three pin structures superposingly formed in a one-on-another fashion on the sheet-shaped substrate.

(R-6) After forming a photovoltaic device over the whole roll of the substrate, the plasma discharging is turned off. Then the pinch valve (made of rubber in the form of a plate designed to maintain the vacuum isolation) provided in the gas gate 5201 is closed. The load chamber 5010 for feeding the sheet-shaped substrate is leaked while supplying nitrogen gas into the load chamber 5010. Another roll of sheet-shaped substrate is set in the load chamber 5010 and an end of the sheet-shaped substrate is connected by means of welding to an end of the sheet-shaped substrate pinched by the above-explained pinch valve.

(R-7) The load chamber 5010 is closed, and is evacuated to a predetermined pressure. The pinch valve is opened, and plasma discharging is started again so as to form a photovoltaic device on the substrate. At the same time, the feeding of the sheet-shaped substrate is started. The above processing steps are performed repeatedly until the photovoltaic device having a structure such as that shown in FIG. 3 or 4 has been formed on the roll of the sheet-shaped substrate.

The details of each layer of the photovoltaic device according to the present invention will be explained below.
[SUBSTRATE (100 in the case of the device shown in FIG. 1 or 2, and 200 in the case of the device shown in FIG. 3 or 4)]

It is desirable that the material of the substrate used in the present invention should have proper mechanical strength and electrical conductivity, and should not have excessive deformation or strain when it is heated to a temperature required for the film deposition. Furthermore, it is also desirable that no degradation occur in the adhesion between the substrate and the reflecting layer or the reflection enhancing layer due to the hydrogen plasma treatment which is performed after depositing the reflecting layer and the reflection enhancing layer.

More specifically, examples of preferable substrate materials include: a thin film made up of a metallic material such as stainless steel, aluminum, aluminum alloys, iron, iron alloys, copper, copper alloys, etc.; a combination of these metallic materials; any one of the above-explained materials coated with a different thin metal film and/or an insulating thin film such as $SiO_2$, $Si_3N_4$, $Al_2O_3$, AlN, wherein the coating may be performed by means of sputtering, vapor deposition, or plating; a sheet of heat-resisting resin such as polyimide, polyamide, polyethylene terephthalate, and epoxy resin; and a combination of any of the above sheet of heat-resisting resin and a fiber material such as glass fiber, carbon fiber, boron fiber, and metal fiber wherein the surface of the material is coated, by means of sputtering, vapor deposition, or plating, with a conductive thin film such as metal elements, metal alloys, or transparent and conductive oxides.

The thickness of the substrate is preferably as thin as possible to achieve low cost and small volume in the range that can provide a sufficient mechanical strength such that it is not easily broken when it is bent during the film deposition process or during the transferring process of the substrate. More specifically, the thickness of the substrate is preferably in the range from 0.01 mm to 5 mm, more preferably, from 0.02 mm to 2 mm, and most preferably, from 0.05 mm to 1 mm. In particular, a thin metallic film is preferable because a very thin film can be obtained while maintaining a sufficient mechanical strength.

There is no special limitation regarding the width of the substrate and the width may be properly selected depending on the size of the vacuum chamber or other factors.

There is also no limitation regarding the length of the substrate. A long substrate in a rolled form or a plurality of long substrates connected by means of welding into a longer form may be employed.

In the present invention, the substrate is heated and cooled for a short time duration, and thus it is preferable that heat conduction in a direction along the transfer motion of the substrate should be as small as possible. On the other hand, it is desirable that great heat conduction occur in the direction of the thickness of the substrate so that the surface of the substrate can be quickly heated and cooled.

One simple way to have great heat conduction in the thickness direction and small heat conduction in the movement direction is to employ a thin substrate. If it is assumed that the substrate has a uniform thickness, it is preferably that the product of the thermal conductivity and the thickness be $1 \times 10^{-1}$ W/K or less, and more preferably $0.5 \times 10^{-2}$ W/K or less.

[REFLECTING LAYER (101 in FIG. 1 or 2, 201 in FIG. 3 or 4)]

Examples of materials suitable for the reflecting layer include metals such as Ag, Au, Pt, Ni, Cr, Cu, Al, Ti, Zn, Mo, and W, and alloys of these metals, wherein the reflecting layer may be formed of any of these materials into a thin film shape by means of vapor deposition, electron beam vapor deposition, or sputtering. The thin metal film should be formed such that the film does not act as a significant series resistance of a photovoltaic semiconductor device. To this end, the sheet resistance of the reflecting layer should preferably be 50 Ω or less, and more preferably, 10 Ω or less.

In particular, materials containing Ag or Al—Si alloy as a main constituent are suitable as the material of the reflecting layer. If such a material is employed, the resultant reflecting layer has irregularities on its surface, which result in an improvement in confinement of light. When Al—Si alloy is employed, it is preferable that the Si content in the alloy be in the range from 5 to 20%.

[REFLECTION ENHANCING LAYER (102 in FIG. 1 or 2, 202 in FIG. 3 or 4)]

In the present invention, the reflection enhancing layer (substantially, a transparent conductive layer) allows the semiconductor layers to absorb a greater amount of incident light such as solar radiation or radiation of a daylight fluorescent lamp. To the above end, it is desirable that the transmittance of the reflection enhancing layer be 85% or more. Furthermore, it is desirable that the sheet resistance of the reflection enhancing layer be 100 Ω or less so that it does not act as a significant series resistance of a photovoltaic device. Examples of materials suitable for this purpose are metal oxides such as $SnO_2$, $In_2O_3$, ZnO, CdO, $Cd_2SnO_4$, ITO ($In_2O_3+SnO_2$), etc. Of these materials, ZnO is particularly suitable to form a reflection enhancing layer having discontinuous surface with high-reflectivity unevenness on its surface.

In the case where ZnO or the like is employed as the material of the reflection enhancing layer, it is desirable that the layer contain a metal element such as Ag, Ni, Fe, Cr, or Cu. The content of such metal in the reflection enhancing layer is preferably in the range from 10 to 10000 ppm. If the metal content is less than 10 ppm, the metal does not have any effects. On the other hand, if the metal content is greater than 10000 ppm, the adhesion of the reflection enhancing layer to the semiconductor layer becomes poor. Thus, the addition of a proper amount of metal results in an improvement in the adhesion of the reflection enhancing layer to the upper semiconductor layer and also results in a reduction in the whole device and series resistance of the device.

It is desirable that the reflection enhancing layer have a thickness which results in an increase in reflectivity. Various techniques may be employed to form the reflection enhancing layer. They include resistive heating vapor deposition, electron beam vapor deposition, sputtering, and spraying techniques.

The reflection enhancing layer may also be formed by mean of reactive sputtering using a target containing metal which is a constituent element of the above-explained oxide.

[INTERMEDIATE LAYER (199 in FIG. 2, 299 in FIG. 4)]

In the present invention, an intermediate layer may be provided between the substrate and the reflecting layer so as to improve the adhesion between the substrate and the reflecting layer. Preferably, the intermediate layer has a thickness in the range between 1 to 100 nm, although the optimum thickness depends on the material employed.

For example, zinc oxide is suitable to form the intermediate layer. In the case where stainless steel and Ag are employed as the materials for the substrate and the reflecting layer, respectively, zinc oxide is particularly suitable to greatly improve the adhesion between the substrate and the reflecting layer. Preferably, the intermediate layer of zinc oxide has a grain size 100 nm or less. If the grain size is greater than 100 nm, the adhesion becomes poor. When the intermediate layer is formed of zinc oxide, it is preferable that the layer be formed at a deposition rate in the range from 0.1 to 20 nm/sec.

In general, the surface of the metal substrate is covered with an oxide. Therefore, if an oxide is employed as the intermediate layer, the intermediate layer exhibits good adhesion to the substrate. In this sense, zinc oxide is an excellent material.

To obtain good adhesion between the intermediate layer and the reflecting layer of metal, it is desirable that the oxygen content in the zinc oxide intermediate layer decrease with the position from the interface with the substrate to the interface with the reflecting layer.

It is preferable that the zinc oxide intermediate layer contain a metal element such as Ag, Ni, Fe, Cr, or Cu. The content of such metal in the intermediate layer is preferably in the range from 10 to 10000 ppm so as to obtain good adhesion between the substrate and the reflecting layer and so as to achieve a reduction in the series resistance of the device. If the metal content is 10 ppm or less, the metal does not have enough effects. On the other hand, if the metal content is greater than 10000 ppm, the adhesion becomes poor. Furthermore, it is desirable that metal be distributed in the intermediate layer in such a manner that the concentration of metal is higher near the substrate than the opposite side.

Al—Si alloy is also suitable as the material of the intermediate layer. In particular when stainless steel and Ag are employed as the materials of the substrate and the reflecting layer, respectively, the intermediate layer of Al—Si alloy results in a great improvement in the adhesion between the reflecting layer and the substrate. Preferably, the intermediate layer of Al—Si alloy has a grain size 100 nm or less. If the grain size is greater than 100 nm, the adhesion becomes poor. When the intermediate layer is formed of Al—Si alloy, it is preferable that the layer be formed at a deposition rate in the range from 0.1 to 20 nm/sec. As explained above, when the intermediate layer is formed on the substrate, the substrate is preferably maintained at a temperate in the range 30° to 500° C. The intermediate layer formed under the above conditions leads to an improvement in adhesion between the lower layer or the substrate and the upper layer or the reflecting layer. Furthermore, the intermediate layer results in a reduction in series resistance of the completed device.

In the case where the surface of the substrate is contaminated with organic material or the like, it is preferable that the intermediate layer is deposited at a higher temperature. It is more preferable that the temperature of the substrate is gradually lowered after starting the deposition of the intermediate layer during the deposition process.

[I-TYPE SEMICONDUCTOR LAYER (104 in FIG. 1 or 2, 204 in FIG. 3 or 4)]

In the present invention, the i-type semiconductor layer in the pin structure plays an important role in carrier generation in response to light illumination and also in transportation of generated carriers. The i-type semiconductor layer is particularly important in photovoltaic devices made of an amorphous semiconductor material containing IV-group element or an alloy of IV-group element.

In the present invention, the term "i-type layer" is used to describe not only semiconductor layers of the i-type but also those slightly exhibiting p- or n-type characteristics. The slightly p-type or n-type semiconductor layer serving as the i-type layer may be formed by incorporating hydrogen atoms (H, D) or halogen atoms (X) into an amorphous semiconductor material. As explained in further detail later, the incorporated atoms play important roles.

Dangling bonds in the i-type layer are compensated by hydrogen (H, D) atoms or halogen (X) atoms included in the i-type layer. As a result, the product of the carrier mobility and the lifetime in the i-type layer is increased. Furthermore, the interface states present at the interface between a p-type layer and an i-type layer, or between an n-type layer and an i-type layer are also compensated by hydrogen or halogen atoms, and thus the photo electromotive force and photo-current of a photovoltaic device are increased and the optical response characteristics are improved. The concentration of hydrogen atoms and/or halogen atoms included in the i-type layer is preferably in the range from 1 to 40 atomic %. In particular, the hydrogen atoms and/or halogen atoms are preferably distributed such that their concentration is greater near the interface between the p-type layer and the i-type layer or the interface between the n-type layer and the i-type layer than in the bulk region. More specifically, the above concentration is preferably in the range from 1.1 to 2 times the concentration in the bulk region. The concentration of hydrogen atoms and/or halogen atoms preferably changes in correspondence with the concentration of silicon atoms.

In the photovoltaic semiconductor device having a plurality of pin structures according to the present invention, the pin structures are preferably formed such that the i-type layer nearest to the light incidence side has the greatest bandgap and the bandgap decreases with the position of the i-type layer relative to the incidence side. An i-type layer having a wider bandgap can be formed of amorphous silicon or amorphous silicon carbide. An i-type layer having a narrower bandgap can be obtained by employing amorphous silicon germanium.

Examples of amorphous silicon and amorphous silicon germanium are a-Si:H, a-Si:F, a-Si:H:F, a-SiGe:H, a-SiGe:F, a-SiGe:H:F wherein H and F are compensation elements for dangling bonds. When amorphous silicon germanium is used to form an i-type layer, the concentration of germanium is preferably changed in the thickness direction of the i-type layer. In particular, it is preferable that the concentration of germanium decrease continuously toward the n-type and/or p-type layer. The profile of the germanium concentration in the layers can be varied by controlling the ratio of the flow rate of a gas containing germanium to that of the total flow rate of source gases.

When the MW plasma CVD method is employed to form an i-type layer, the germanium concentration in the i-type layer can also be varied by varying the flow rate of hydrogen gas acting as a carrier gas of source gases in addition to the above-explained method in which the flow rate of a gas containing germanium is varied. For example, if the flow rate of hydrogen gas acting as the carrier gas is increased, then the concentration of germanium in a deposited layer (i-type layer) will be increased.

More particularly, in the photovoltaic semiconductor device according to the present invention, the i-type layer in the pin structure is preferably formed of hydrogenated amorphous silicon (a-Si:H) having an optical bandgap (Eg) in the range from 1.60 eV to 1.85 eV, hydrogen concentration in the range from 1.0% to 25.0%, photoconductivity ($\delta p$) of $1.0 \times 10^{-5}$ S/cM or more under the quasi-solar illumination condition of AM1.5 (100 mW/cm$^2$), dark conductivity (ad) of $1.0 \times 10^{-9}$ S/cm or less, a gradient of Urbach tail of 55 meV or less as measured by the constant photo current method (CPM), and a Density of State of $1 \times 10^{17}$/cm$^3$ or less.

Furthermore, in the photovoltaic semiconductor device according to the present invention, when amorphous silicon germanium is employed to form an i-type layer having a rather narrow bandgap, it is preferable that its optical bandgap be in the range from 1.20 eV to 1.60 eV, the hydrogen concentration be in the range from 1.0% to 25.0%, the gradient of Urbach tail be 55 meV or less as measured by the constant photo current method (CPM), and Density of State be $1 \times 10^{17}$/cm$^3$ or less.

In the photovoltaic device of the present invention, the i-type layer can preferably be deposited as follows. Amorphous semiconductor layers are deposited preferably by means of RF plasma CVD, VHF plasma CVD, or MW plasma CVD.

When the RF plasma CVD method is employed to form the i-type layer, the substrate temperature is preferably in the range from 100° C. to 350° C., the pressure in the deposition chamber is preferably in the range from 0.05 Torr to 10 Torr, and the frequency of RF power is preferably in the range from 1 MHz to 50 MHz. In particular, it is more desirable to select 13.56 MHz as the frequency of RF power. The magnitude of RF power input to the inside of the deposition chamber is preferably in the range from 0.01 to 5 W/cm$^2$. As a result of the application of the RF power, the substrate is preferably self-biased at a voltage in the range from 0 to 300 V.

When the VHF plasma CVD method is employed to deposit the i-type layer, the substrate temperature is preferably in the range from 100° C. to 450° C., the pressure in the deposition chamber is preferably in the range from 0.0001 Torr to 1 Torr, and the frequency of VHF power is preferably in the range from 60 MHz to 99 MHz. The magnitude of VHF power input to the inside of the deposition chamber is preferably in the range from 0.01 to 1 W/cm$^2$. As a result of the application of the VHF power, the substrate is preferably self-biased at a voltage in the range from 10 to 1000 V. If additional DC or RF power is introduced into the deposition chamber by superimposing it on the VHF power or otherwise via a separate bias bar, it is possible to improve the quality of a deposited amorphous layer. When the additional DC bias is introduced via the bias bar, the DC bias is preferably applied to the bias bar such that the potential at the bias bar becomes positive. If the DC bias is directly applied to a substrate, the DC bias is preferably applied to the substrate in such a manner that the potential at the substrate becomes negative. In the case of the RF bias, the RF electrode preferably has a smaller area than the substrate.

When the MW plasma CVD method is employed to deposit the i-type layer, the substrate temperature is preferably in the range from 100° C. to 450° C., the pressure in the deposition chamber is preferably in the range from 0.0001 Torr to 0.05 Torr, and the frequency of MW power is preferably in the range from 100 MHz to 10 GHz. In particular, it is more desirable to employ 2.45 GHz as the frequency of MW power. The magnitude of MW power input to the inside of the deposition chamber is preferably in the range from 0.01 to 1 W/cm$^2$. Most preferably, the MW power is introduced into the deposition chamber via a wave guide. If additional DC or RF power is introduced into the deposition chamber by superimposing it on the MW power or otherwise via a separate bias bar, it is possible to improve the quality of a deposited amorphous layer. When the additional DC bias is introduced via the bias bar, the DC bias is preferably applied to the bias bar such that the potential at the bias bar becomes positive. If the DC bias is directly applied to a substrate, the DC bias is preferably applied to the substrate in such a manner that the potential at the substrate becomes negative. In the case of the RF bias, the RF electrode preferably has a smaller area than the substrate.

In the present invention, the i-type layer is preferably formed using a silane-based source gas such as $SiH_4$, $Si_2H_6$, $SiF_4$, $SiF_2H_2$. To obtain a wider bandgap in the i-type layer, a proper amount of carbon, nitrogen, or oxygen gas is preferably added to the above-explained silane-based source gas. In this case, rather than introducing a constant amount of carbon, nitrogen, or oxygen into the i-type layer, it is more preferable that the concentration is greater near a p-type layer and/or a n-type layer than in other portions thereby increasing the open-circuit voltage without degrading the mobility of carriers in the i-type layer.

As for a gas containing carbon, $C_nH_{2n+2}$, $C_nH_{2n}$, or $C_2H_2$ is preferable (where n is an integer). As for a gas containing nitrogen, $N_2$, NO, $N_2O$, $NO_2$, or $NH_3$ is preferable. $O_2$, $CO_2$, or $O_3$ is preferable as a gas containing oxygen. Any combination of these gases can also be employed. The concentration of the gas added to the source gas to obtain a wider bandgap is preferably in the range from 0.1% to 50%.

The i-type layer may contain additional elements of Group III and/or V so as to further improve the electric characteristics of the device. Examples of the Group III elements suitable for this purpose include B, Al, Ga, etc. To incorporate B into the i-type layer, it is preferable to employ $B_2H_6$, or $BF_3$. Examples of suitable Group V elements include N, P, As, etc. To incorporate P into the i-type layer, it is preferable to employ $PH_3$. The concentration of Group III and/or V elements in the i-type layer is preferably in the range from 0.1 ppm to 1000 ppm.

If the i-type layer is formed such that it includes an n/i buffer layer or a p/i buffer layer (151, 161 in FIG. 1 or 2, 251, 261, 252, 262 in FIG. 3), it is possible to improve the characteristics of the photovoltaic device. The buffer layers can be formed in similar manner to the i-type layer explained above. However, it is preferable that the buffer layers are deposited at a lower deposition rate than the i-type layer. Furthermore, the buffer layers are preferably formed of semiconductor layers having a wider bandgap than that of the i-type layer. Preferably, the bandgap is varied continuously and smoothly from the i-type layer to the buffer layer. The bandgap of the buffer layer can be reduced continuously by increasing the concentration of germanium in a silicon-based amorphous semiconductor layer. On the other hand, the bandgap can be increased continuously by increasing the concentrations of carbon, oxygen, and/or nitrogen in a silicon-based non-single crystal semiconductor layer. Preferably, the ratio of the narrowest bandgap to the widest bandgap is in the range from 1.01 to 1.5.

When Group III and/or V elements are incorporated into the buffer layers, a Group III element is preferable as an element incorporated in the n/i buffer layer, and a Group V element is preferable as an element incorporated in the p/i buffer layer since the above selections can prevent the degradation due to the diffusion of impurities into the i-type layer from the n-type layer and/or the p-type layer.

[P-TYPE AND N-TYPE SEMICONDUCTOR LAYERS (103, 105 in FIG. 1 or 2, 203, 205 in FIG. 3 or 4)]

The p-type layer and the n-type layer are important to obtain good characteristics in the photovoltaic device of the invention.

Preferably, the p-type and n-type semiconductor layers are made of an amorphous or polycrystalline material.

The term "amorphous material" is used here to describe a wide variety of materials to form the p-type and n-type semiconductor layers including microcrystalline materials wherein amorphous materials are denoted by a prefix "a-" followed by a material name, and microcrystalline materials are denoted by a prefix "$\mu$c-" followed by a material name. Specific examples include a-Si:H, a-Si:HX, a-SiC:H, a-SiC:HX, a-SiGe:H, a-SiGeC:H, a-SiO:H, a-SiN:H, a-SiON:HX, a-SiOCN:HX, $\mu$c-Si:H, $\mu$c-SiC:H, $\mu$c-Si:HX, $\mu$c-SiC:HX, $\mu$c-SiGe:H, $\mu$c-SiO:H, $\mu$c-SiGeC:H, $\mu$c-SiN:H, $\mu$c-SiON:HX, $\mu$c-SiOCN:HX wherein these materials are heavily doped with p-type impurities (Group III elements such as B, Al, Ga, In, Tl) or heavily doped with n-type impurities (Group V elements such as P, As, Sb, Bi).

Examples of polycrystalline materials (denoted by a material name with a prefix "poly-") used to form the p-type and n-type layers include poly-Si:H, poly-Si:HX, poly-SiC:H, poly-SiC:HX, poly-SiGe:H, poly-Si, poly-SiC, poly-SiGe wherein these materials are heavily doped with p-type impurities (Group III elements such as B, Al, Ga, In, Tl) or heavily doped with n-type impurities (Group V elements such as P, As, Sb, Bi).

In particular, a crystalline semiconductor layer which absorbs a rather small amount of light or an amorphous semiconductor layer having a wide bandgap is suitable for a p-type or n-type layer disposed near the surface on which light is incident.

The concentration of a Group III element in a p-type layer and the concentration of a Group V element in an n-type layer are preferably in the range from 0.1 to 50 atomic %.

Hydrogen (H, D) or halogen atoms are incorporated into p-type or n-type layers so that dangling bonds in the p-type or n-type layers are compensated by the hydrogen or halogen atoms thereby increasing the doping efficiency of the p-type or n-type layers. Preferably, the concentration of the hydrogen or halogen atoms incorporated in the p-type or n-type layers is in the range from 0.1 to 40 atomic %. In particular, for p-type or n-type layers formed of a crystalline material, it is preferable that the concentration of hydrogen or halogen atoms be in the range from 0.1 to 8 atomic %.

Furthermore, hydrogen or halogen atoms are preferably incorporated in p-type or n-type layers such that the region near the interface between a p-type layer and an i-type layer or the interface between a n-type layer and an i-type layer has a greater concentration. More specifically, the concentration of the hydrogen or halogen atoms near such an interface is preferably in the range from 1.1 to 2 times the concentration in the bulk region. The greater concentration of the hydrogen or halogen atoms at the p/i interface or n/i interface allows a reduction in defect level density or mechanical strain near the interface and thus leads to an increase in the photo electromotive force and photocurrent of a photovoltaic semiconductor device.

Preferably, the p-type and n-type layers of the photovoltaic device are formed of a material having activation energy 0.2 eV or less, and more preferably 0.1 eV or less. The specific resistance of the material is preferably 100 $\Omega$cm or less, and more preferably 1 $\Omega$cm or less. The thickness of the p-type and n-type layers are preferably in the range from 1 to 50 nm, and more preferably from 3 to 10 nm.

The microwave plasma CVD method is the most suitable for forming Group IV element or Group IV element-based alloy amorphous semiconductor layers for use as semiconductor layers in the photovoltaic device according to the present invention, whereas the RF plasma CVD method may also be employed.

In the microwave plasma CVD method, source gas and carrier gas are introduced into a deposition chamber which is evacuated by a vacuum pump to a constant pressure. Microwave power generated by a microwave power source is transmitted along a wave guide and introduced into the deposition chamber via a dielectric window (formed of a material such as alumina ceramic) so that the gas is excited into a plasma state thereby depositing a desired film on a substrate. In this method, a wide range of deposition conditions are possible and thus it is possible to deposit a variety of films required in photovoltaic semiconductor devices.

Examples of source gases suitable for deposition of Group IV element layers or Group IV element-based alloy amorphous semiconductor layers are gasifiable compounds containing silicon, gasifiable compounds containing germanium, gasifiable compounds containing carbon, gasifiable compounds containing nitrogen, gasifiable compounds containing oxygen, and mixture gases of these compounds.

Examples of gasifiable compounds containing silicon are silane compounds having a ring or chain structure such as $SiH_4$, $Si_2H_6$, $SiF_4$, $SiFH_3$, $SiF_2H_2$, $SiF_3H$, $Si_3H_8$, $SiD_4$, $SiHD_3$, $SiH_2D_2$, $SiH_3D$, $SiFD_3$, $SiF_2D_2$, $SiD_3H$, $Si_2D_3H_3$, $(SiF_2)_5$, $(SiF_2)_6$, $(SiF_2)_4$, $Si_2F_6$, $Si_3F_8$, $Si_2H_2F_4$, $Si_2H_3F_3$, $SiCl_4$, $(SiCl_2)_5$, $SiBr_4$, $(SiBr_2)_5$, $Si_2Cl_6$, $SiHCl_3$, $SiH_2Br_2$, $SiH_2Cl_2$, $Si_2Cl_3F3$, etc., wherein these are in a gas phase under normal conditions or they can be easily vaporized.

Specific examples of gasifiable compounds containing germanium are $GeH_4$, $GeD_4$, $GeF_4$, $GeFH_3$, $GeF_2H_2$, $GeF_3H$, $GeHD_3$, $GeH_2D_2$, $GeH_3D$, $Ge_2H_6$, $Ge_2D_6$, etc.

Specific examples of gasifiable compounds containing carbon are $CH_4$, $CD_4$, $C_nH_{2n+2}$ (n is an integer), $C_nH_{2n}$ (n is an integer), $C_2H_2$, $C_6H_6$, $CO_2$, CO, etc.

Specific examples of materials for gas containing nitrogen are $N_2$, $NH_3$, $ND_3$, NO, $NO_2$, $N_2O$, etc.

Specific examples of materials for gas containing oxygen are $O_2$, CO, $CO_2$, NO, $NO_2$, $N_2O$, $CH_3CH_2OH$, $CH_3OH$, etc.

In a practical deposition process, the above-explained gasifiable compounds may be diluted in other gas such as $H_2$, He, Ne, Ar, Xe, Kr, etc., as required.

To control the valence electrons, elements in Group III and V of the periodic table are preferably introduced into the p-type or n-type layers.

Boron which is an element in Group III can be derived and introduced into the layers from boron hydrides such as $B_2H_6$, $B_4H_1$, $B_5H_9$, $B_5H_{11}$, $B_6H_{10}$, $B_6H_{12}$, $B_6H_{14}$, etc., or from boron halides such as $BF_3$, $BCl_3$, etc. Furthermore, compound gases such as $AlCl_3$, $GaCl_3$, $InCl_3$, $TlCl_3$, etc., can also be employed for the same purpose. Of the above, $B_2H_6$ and $BF_3$ are more preferable.

Phosphorus which is one of the Group V elements can be derived and introduced into the layers from phosphorus hydrides such as $PH_3$, $P_2H_4$, etc., or from phosphorus halides such as $PH_4I$, $PF_3$, $PF_5$, $PCl_3$, $PCl_5$, $PBr_3$, $PBr_5$, $PI_3$, etc. Furthermore, $AsH_3$, $AsF_3$, $AsCl_3$, $AsBr_3$, $AsF_5$, $SbH_3$, $SbF_3$, $SbF_5$, $SbCl_3$, $SbCl_5$, $BiH_3$, $BiCl_3$, $BiBr_3$, etc., can also be employed for the same purpose. Of the above, $PH_3$ and $PF_3$ are more preferable.

In particular, when microcrystalline semiconductor or a-SiC:H is employed to deposit a layer which absorbs a rather small amount of light or which has a wide bandgap, the source gas is preferably diluted 2 to 100 times in hydrogen gas and rather high microwave or RF power is preferably introduced into the deposition chamber.

[TRANSPARENT ELECTRODE (112 in FIG. 1 or 2, 212 in FIG. 3 or 4)]

It is desirable that the transmittance of the transparent electrode be 85% or more so that a great amount of incident light such as solar radiation or radiation of a daylight fluorescent lamp can be absorbed by the semiconductor layers. Furthermore, it is desirable that the sheet resistance of the transparent electrode is 100 Ω or less so that it does not act as a significant series resistance of a photovoltaic semiconductor device. Examples of materials suitable for this purpose are metal oxides such as $SnO_2$, $In_2O_3$, ZnO, CdO, $Cd_2SnO_4$, $ITO(In_2O_3+SnO_2)$, etc., and metals such as Au, Al, Cu, etc., deposited into the form of a very thin film such that they are semitransparent.

It is desirable that the thickness of the transparent electrode be selected such that the anti-reflection condition is satisfied. The transparent electrode can be formed by means of resistive heating vapor deposition, electron beam vapor deposition, sputtering, spraying, etc., although the optimum method depends on the characteristics of the material employed.

[COLLECTOR ELECTRODE (113 in FIG. 1 or 2, 213 in FIG. 3 or 4)]

In the photovoltaic device according to the present invention, a collector electrode is preferably formed of a silver-filled epoxy adhesive by means of a screen printing or formed of metal such as Cr, Ag, Au, Cu, Ni, Mo, Al, etc., by means of vapor deposition via a mask. The collector electrode may also be formed by attaching metal wires such as Cu, Au, Ag, Al to the surface of the photovoltaic device via a carbon-filled or silver-filled epoxy adhesive.

A plurality of photovoltaic semiconductor devices may be connected to each other in series or in parallel so as to achieve a desired output voltage or output current. In this case, protective layers are formed on the surface and the back surface of each photovoltaic semiconductor device, and an output electrode is formed as required. When a plurality of photovoltaic semiconductor devices are connected in series, reverse-current protection diodes may be incorporated in the circuit.

The present invention will be described below in greater detail by giving Examples for producing the photovoltaic device by forming the light-reflecting layer, the reflection enhancing layer and other optional layer and forming the non-single-crystal silicon type semiconductor layers. The present invention is by no means limited to these.

EXAMPLE A1

In the present Example, the light-reflecting layer 101 and reflection enhancing layer 102 that constitute the device shown in FIG. 1 were formed using the fabrication apparatus of a multi-chamber-separated system as shown in FIG. 5.

Their production process will be described below, following its procedure. To the apparatus shown in FIG. 5, a material gas feeding system (not shown) is connected through gas feed pipes. The material gas cylinders are all purified in an ultra-high purity. As the material gas cylinders, an $H_2$ gas cylinder, an Ar gas cylinder and an He gas cylinder were connected thereto. Ag and ZnO were used as targets. These are so provided that sputtering can be carried out in vacuum.

As the substrate (100 in FIG. 1), a stainless steel sheet of 0.5 mm thick and 50×50 $mm^2$ was used, which was subjected to ultrasonic cleaning with acetone and isopropanol, followed by hot-air drying. As the sputter power source, the DC power source 325 was connected, and a light-reflecting layer 101 of Ag was formed on the substrate by DC magnetron sputtering. Then the subsequent processing was carried out.

The above production process will be described below following its procedure with reference to FIG. 5.

(1) A substrate 390 (corresponding to 100 in FIG. 1) having been cleaned was placed on the substrate transporting rail 313 provided in the load chamber 301, and the inside of the load chamber 301 was evacuated by means of a vacuum exhaust pump (not shown) to have a pressure of about $1\times10^{-5}$ Torr.

(2) The gate valve 306 was opened to carry the substrate into the transport chamber 302 and deposition chamber 320 previously evacuated by means of a vacuum exhaust pump (not shown). The substrate 390 was set in the manner the back thereof was brought into close contact with the substrate heater 310, and was heated while raising temperature at a rate of 15° C./sec., to bring the substrate temperature to 290° C. Then, the inside of the deposition chamber 320 was evacuated by means of a vacuum exhaust pump (not shown) to have a pressure of about $3\times10^{-6}$ Torr.

(3) 50 sccm of Ar gas was fed into it through the gas feed pipe 324, and a conductance valve (not shown) was operated to control the pressure so as to be 6 mTorr. Electric current was flowed to the toroidal coil 323, and 380 V of a DC power was applied from the sputter power source 325 to cause Ar plasma.

(4) The target shutter 326 was opened, and the light-reflecting layer 101 of Ag with a layer thickness of 0.8 μm was formed on the surface of the stainless steel sheet, whereupon the target shutter 326 was closed to extinguish the plasma.

(5) The substrate heater 310 was lifted, and the substrate temperature was lowered to 100° C. or below while dropping temperature at a rate of 5° C./sec. in an atmosphere of He gas used as substrate cooling gas. Thereafter, the gate valve 307 was opened to carry the substrate into the transport chamber 303 and deposition chamber 330 previously evacuated by means of a vacuum exhaust pump (not shown). The substrate 390 was set in the manner the back thereof was brought into close contact with the substrate heater 311, and was heated while raising temperature at a rate of 20° C./sec., to bring the substrate temperature to 290° C. Then, the inside of the deposition chamber 330 was evacuated by means of a vacuum exhaust pump (not shown) to have a pressure of about $2 \times 10^{-6}$ Torr.

(6) 60 sccm of Ar gas was fed into it through the gas feed pipe 334, and a conductance valve (not shown) was operated to control the pressure so as to be 6 mTorr. Electric current was flowed to the toroidal coil 333, and 380 V of a DC power was applied from the sputter power source 335 to cause Ar plasma. Next, the target shutter 336 was opened, and a reflection enhancing layer 102 of ZnO with a layer thickness of 1.5 $\mu$m was formed on the surface of the light-reflecting layer 101 of Ag, whereupon the target shutter 336 was closed to extinguish the plasma.

(7) The substrate heater 311 was lifted, and the substrate temperature was lowered to 100° C. or below while dropping temperature at a rate of 5° C./sec. in an atmosphere of He gas used as substrate cooling gas. Thereafter, the gate valve 308 was opened to carry the substrate into the unload chamber 304 previously evacuated by means of a vacuum exhaust pump (not shown).

Thus, the formation of the light-reflecting layer and reflection enhancing layer (hereinafter often inclusively called "light-reflecting layer" when applicable) according to the present Example was completed. Samples having this light-reflecting layer are called "SA1".

Reference Example A1-1

This example is different from Example A1 only in that the substrate temperature was set to 150° C. when the light-reflecting layer 101 of Ag was formed. Except for this point, the procedure of Example A1 was repeated to produce samples. The samples having the light-reflecting layer of this example are called "SA1-1".

Reference Example A1-2

This example is different from Example A1 only in that the substrate temperature was set to 550° C. when the light-reflecting layer 101 of Ag was formed. Except for this point, the procedure of Example A1 was repeated to produce samples. The samples having the light-reflecting layer of this example are called "SA1-2".

Reference Example A1-3

This example is different from Example A1 only in that, after the light-reflecting layer 101 of Ag was formed, the reflection enhancing layer 102 of ZnO was formed without the step of lowering the substrate temperature to 100° C. or below. Except for this point, the procedure of Example A1 was repeated to produce samples. The samples having the light-reflecting layer of this example are called "SA1-3".

Reference Example A1-4

This example is different from Example A1 only in that the substrate temperature was set to 150° C. when the reflection enhancing layer 102 of ZnO was formed. Except for this point, the procedure of Example A1 was repeated to produce samples. The samples having the light-reflecting layer of this example are called "SA1-4".

Reference Example A1-5

This example is different from Example A1 only in that the substrate temperature was set to 450° C. when the reflection enhancing layer 102 of ZnO was formed. Except for this point, the procedure of Example A1 was repeated to produce samples. The samples having the light-reflecting layer of this example are called "SA1-5".

For every six kinds of the samples having the above light-reflecting layers, i.e., SA1 and SA1-1 to SA1-5, four samples were prepared. In respect of the light-reflecting layers of these samples, light reflectance was measured and, from the measurements obtained, total reflectance and scattered reflectance were evaluated to obtain the results as shown in Table A1.

The light reflectance was measured using a spectrophotometer (Spectrophotometer U-4000, manufactured by Hitachi Ltd.), and was evaluated as the total reflectance and scattered reflectance at a wavelength of 800 nm.

The results of total reflectance and scattered reflectance shown in Table A1 are indicated for each sample by standardizing the results of the samples SA1-1 to SA1-5 on the basis of the results of the sample SA1 which are regarded as 1.

TABLE A1

| Sample | Total reflectance | Scattered reflectance |
|--------|-------------------|-----------------------|
| SA1    | 1.00              | 1.00                  |
| SA1-1  | 1.00              | 0.60                  |
| SA1-2  | 0.98              | 0.92                  |
| SA1-3  | 0.81              | 0.84                  |
| SA1-4  | 0.92              | 0.79                  |
| SA1-5  | 0.89              | 0.91                  |

As is seen from the results shown in Table A1, the sample SA1 having the light-reflecting layer of Example A1 is superior to the samples SA1-1 to SA1-5 having the light-reflecting layers of five Reference Examples, in all the evaluation results at the same time, that is, has superior reflecting properties.

EXAMPLE A2

This example is different from Example A1 in that the light-reflecting layer was formed using $H_2$ gas as the substrate cooling gas in place of He gas.

In the present Example, like Example A1, the light-reflecting layer 101 and reflection enhancing layer 102 that constitute the device shown in FIG. 1 were formed using the fabrication apparatus of a multi-chamber-separated system as shown in FIG. 5.

Their production process will be described below, following its procedure. To the apparatus shown in FIG. 5, the material gas feeding system (not shown) is connected through gas feed pipes. The material gas cylinders are all purified in an ultra-high purity. As the material gas cylinders, an $H_2$ gas cylinder, an Ar gas cylinder and an He gas cylinder were connected thereto. Ag and ZnO were used as targets. These are so provided that sputtering can be carried out in vacuum.

As the substrate (100 in FIG. 1), a stainless steel sheet of 0.5 mm thick and 50×50 mM$^2$ was used, which was subjected to ultrasonic cleaning with acetone and isopropanol, followed by hot-air drying. As the sputter power source, the DC power source 325 was connected, and a light-reflecting layer 101 of Ag was formed on the substrate by DC magnetron sputtering. Then the subsequent processing was carried out.

The above production process will be described below following its procedure with reference to FIG. 5.

(1) A substrate 390 (corresponding to 100 in FIG. 1) having been cleaned was placed on the substrate transporting rail 313 provided in the load chamber 301, and the inside of the load chamber 301 was evacuated by means of a vacuum exhaust pump (not shown) to have a pressure of about $1 \times 10^{-5}$ Torr.

(2) The gate valve 306 was opened to carry the substrate into the transport chamber 302 and deposition chamber 320 previously evacuated by means of a vacuum exhaust pump (not shown). The substrate 390 was set in the manner the back thereof was brought into close contact with the substrate heater 310, and was heated while raising temperature at a rate of 20° C./sec., to bring the substrate temperature to 270° C. Then, the inside of the deposition chamber 320 was evacuated by means of a vacuum exhaust pump (not shown) to have a pressure of about $3 \times 10^{-6}$ Torr.

(3) 70 sccm of Ar gas was fed into it through the gas feed pipe 324, and a conductance valve (not shown) was operated to control the pressure so as to be 4 mTorr. Electric current was flowed to the toroidal coil 323, and 400 V of a DC power was applied from the sputter power source 325 to cause Ar plasma.

(4) The target shutter 326 was opened, and the light-reflecting layer 101 of Ag with a layer thickness of 0.7 μm was formed on the surface of the stainless steel sheet, whereupon the target shutter 326 was closed to extinguish the plasma.

(5) The substrate heater 310 was lifted, and the substrate temperature was lowered to 100° C. or below while dropping temperature at a rate of 15° C./sec. in an atmosphere of $H_2$ gas used as substrate cooling gas. Thereafter, the gate valve 307 was opened to carry the substrate into the transport chamber 303 and deposition chamber 330 previously evacuated by means of a vacuum exhaust pump (not shown). The substrate 390 was set in the manner the back thereof was brought into close contact with the substrate heater 311, and was heated while raising temperature at a rate of 25° C./sec., to bring the substrate temperature to 320° C. Then, the inside of the deposition chamber 330 was evacuated by means of a vacuum exhaust pump (not shown) to have a pressure of about $2 \times 10^{-6}$ Torr.

(6) 60 sccm of Ar gas was fed into it through the gas feed pipe 334, and a conductance valve (not shown) was operated to control the pressure so as to be 5 mTorr. Electric current was flowed to the toroidal coil 333, and 390 V of a DC power was applied from the sputter power source 335 to cause Ar plasma. Next, the target shutter 336 was opened, and a reflection enhancing layer 102 of ZnO with a layer thickness of 2 μm was formed on the surface of the light-reflecting layer 101 of Ag, whereupon the target shutter 336 was closed to extinguish the plasma.

(7) The substrate heater 311 was lifted, and the substrate temperature was lowered to 100° C. or below while dropping temperature at a rate of 25° C./sec. in an atmosphere of $H_2$ gas used as substrate cooling gas. Thereafter, the gate valve 308 was opened to carry the substrate into the unload chamber 304 previously evacuated by means of a vacuum exhaust pump (not shown).

Thus, the formation of the light-reflecting layer and reflection enhancing layer according to the present Example was completed. Samples having this light-reflecting layer are called "SA2".

Reference Example A2-1

This example is different from Example A2 in that, after the light-reflecting layer 101 of Ag was formed, the reflection enhancing layer 102 of ZnO was formed without the step of lowering the substrate temperature to 100° C. or below. Except for this point, the procedure of Example A2 was repeated to produce samples. The samples having the light-reflecting layer of this example are called "SA2-1".

For every two kinds of the samples having the above light-reflecting layers, i.e., SA2 and SA2-1, four samples were prepared. In respect of the light-reflecting layers of these samples, light reflectance was measured and, from the measurements obtained, total reflectance and scattered reflectance were evaluated in the same manner as in Example A1 to obtain the results as shown in Table A2.

The results of total reflectance and scattered reflectance shown in Table A2 are indicated for each sample by standardizing the results of the sample SA2-1 on the basis of the results of the sample SA1 which are regarded as 1.

TABLE A2

| Sample | Total reflectance | Scattered reflectance |
|--------|-------------------|----------------------|
| SA2    | 1.00              | 1.00                 |
| SA2-1  | 0.78              | 0.82                 |

As is seen from the results shown in Table A2, the sample SA2 having the light-reflecting layer of Example A2 is superior to the sample SA2-1 of the Reference Example, produced without the step of lowering the substrate temperature to 100° C. or below after the light-reflecting layer was formed, being superior in all the evaluation results at the same time, that is, having superior reflecting properties. It is also seen that $H_2$ gas is effective as the substrate cooling gas.

EXAMPLE A3

This example is different from Example A1 in that the light-reflecting layer was formed using Ar gas as the substrate cooling gas in place of He gas.

Like Example A1, the light-reflecting layer 101 and reflection enhancing layer 102 that constitute the device shown in FIG. 1 were formed using the fabrication apparatus of a multi-chamber-separated system as shown in FIG. 5.

Their production process will be described below, following its procedure. To the apparatus shown in FIG. 5, the material gas feeding system (not shown) is connected through gas feed pipes. The material gas cylinders are all purified in an ultra-high purity. As the material gas cylinders, an Ar gas cylinder, an Ar gas cylinder and an He gas cylinder were connected thereto. Ag and ZnO were used as targets. These are so provided that sputtering can be carried out in vacuum.

As the substrate (100 in FIG. 1), a stainless steel sheet of 0.5 mm thick and 50×50 mm² was used, which was subjected to ultrasonic cleaning with acetone and isopropanol, followed by hot-air drying. As the sputter power source, the DC power source 325 was connected, and a light-reflecting layer 101 of Ag was formed on the substrate by DC magnetron sputtering. Then the subsequent processing was carried out.

The above production process will be described below following its procedure with reference to FIG. 5.

(1) A substrate 390 (corresponding to 100 in FIG. 1) having been cleaned was placed on the substrate transporting rail 313 provided in the load chamber 301, and the inside of the load chamber 301 was evacuated by means of a vacuum exhaust pump (not shown) to have a pressure of about $1 \times 10^{-5}$ Torr.

(2) The gate valve 306 was opened to carry the substrate into the transport chamber 302 and deposition chamber 320 previously evacuated by means of a vacuum exhaust pump (not shown). The substrate 390 was set in the manner the back thereof was brought into close contact with the substrate heater 310, and was heated while raising temperature at a rate of 30° C./sec., to bring the substrate temperature to 330° C. Then, the inside of the deposition chamber 320 was evacuated by means of a vacuum exhaust pump (not shown) to have a pressure of about $3 \times 10^{-6}$ Torr.

(3) 30 sccm of Ar gas was fed into it through the gas feed pipe 324, and a conductance valve (not shown) was operated to control the pressure so as to be 3 mTorr. Electric current was flowed to the toroidal coil 323, and 370 V of a DC power was applied from the sputter power source 325 to cause Ar plasma.

(4) The target shutter 326 was opened, and the light-reflecting layer 101 of Ag with a layer thickness of 0.6 μm was formed on the surface of the stainless steel sheet, whereupon the target shutter 326 was closed to extinguish the plasma.

(5) The substrate heater 310 was lifted, and the substrate temperature was lowered to 100° C. or below while dropping temperature at a rate of 3° C./sec. in an atmosphere of Ar gas used as substrate cooling gas. Thereafter, the gate valve 307 was opened to carry the substrate into the transport chamber 303 and deposition chamber 330 previously evacuated by means of a vacuum exhaust pump (not shown). The substrate 390 was set in the manner the back thereof was brought into close contact with the substrate heater 311, and was heated while raising temperature at a rate of 10° C./sec., to bring the substrate temperature to 335° C. Then, the inside of the deposition chamber 330 was evacuated by means of a vacuum exhaust pump (not shown) to have a pressure of about $3 \times 10^{-6}$ Torr.

(6) 30 sccm of Ar gas was fed into it through the gas feed pipe 334, and a conductance valve (not shown) was operated to control the pressure so as to be 4 mTorr. Electric current was flowed to the toroidal coil 333, and 380 V of a DC power was applied from the sputter power source 335 to cause Ar plasma. Next, the target shutter 336 was opened, and a reflection enhancing layer 102 of ZnO with a layer thickness of 1 pm was formed on the surface of the light-reflecting layer 101 of Ag, whereupon the target shutter 336 was closed to extinguish the plasma.

(7) The substrate heater 311 was lifted, and the substrate temperature was lowered to 100° C. or below while dropping temperature at a rate of 4° C./sec. in an atmosphere of Ar gas used as substrate cooling gas. Thereafter, the gate valve 308 was opened to carry the substrate into the unload chamber 304 previously evacuated by means of a vacuum exhaust pump (not shown).

Thus, the formation of the light-reflecting layer and reflection enhancing layer according to the present Example was completed. Samples having this light-reflecting layer are called "SA3".

Reference Example A3-1

This example is different from Example A3 in that, after the light-reflecting layer 101 of Ag was formed, the reflection enhancing layer 102 of ZnO was formed without the step of lowering the substrate temperature to 100° C. or below. Except for this point, the procedure of Example A3 was repeated to produce samples. The samples having the light-reflecting layer of this example are called "SA3-1".

For every two kinds of the samples having the above light-reflecting layers, i.e., SA3 and SA3-1, five samples were prepared. In respect of the light-reflecting layers of these samples, light reflectance was measured and, from the measurements obtained, total reflectance and scattered reflectance were evaluated in the same manner as in Example A1 to obtain the results as shown in Table A3.

The results of total reflectance and scattered reflectance shown in Table A3 are indicated for each sample by standardizing the results of the sample SA3-1 on the basis of the results of the sample SA3 which are regarded as 1.

TABLE A3

| Sample | Total reflectance | Scattered reflectance |
| --- | --- | --- |
| SA3 | 1.00 | 1.00 |
| SA3-1 | 0.76 | 0.84 |

As is seen from the results shown in Table A3, the sample SA3 having the light-reflecting layer of Example A3 is superior to the sample SA3-1 of Reference Example A3-1, produced without the step of lowering the substrate temperature to 100° C. or below after the light-reflecting layer was formed, being superior in all the evaluation results at the same time, that is, having superior reflecting properties. It is also seen that Ar gas is effective as the substrate cooling gas.

EXAMPLE A4

This example is different from Example A1 in that the Ar gas used alone when the reflection enhancing layer 102 was formed was replaced with Ar gas and $O_2$ used in combination, to form a reflection enhancing layer.

Like Example A1, the light-reflecting layer 101 and reflection enhancing layer 102 that constitute the device shown in FIG. 1 were formed using the fabrication apparatus of a multi-chamber-separated system as shown in FIG. 5.

Their production process will be described below, following its procedure. To the apparatus shown in FIG. 5, the material gas feeding system (not shown) is connected through gas feed pipes. The material gas cylinders are all purified in an ultra-high purity. As the material gas cylinders, an Ar gas cylinder, an Ar gas cylinder and an He gas cylinder were connected thereto. Ag and ZnO were used as targets. These are so provided that sputtering can be carried out in vacuum.

As the substrate (100 in FIG. 1), a stainless steel sheet of 0.5 mm thick and 50×50 mm² was used, which was subjected to ultrasonic cleaning with acetone and isopropanol, followed by hot-air drying. As the sputter power source, the DC power source 325 was connected, and a light-reflecting layer 101 of Ag was formed on the substrate by DC magnetron sputtering. Then the subsequent processing was carried out.

The above production process will be described below following its procedure with reference to FIG. 5.

(1) A substrate 390 (corresponding to 100 in FIG. 1) having been cleaned was placed on the substrate transporting rail 313 provided in the load chamber 301, and the inside of the load chamber 301 was evacuated by means of a vacuum exhaust pump (not shown) to have a pressure of about $1 \times 10^{-5}$ Torr.

(2) The gate valve 306 was opened to carry the substrate into the transport chamber 302 and deposition chamber 320 previously evacuated by means of a vacuum exhaust pump (not shown). The substrate 390 was set in the manner the back thereof was brought into close contact with the substrate heater 310, and was heated while raising temperature at a rate of 10° C./sec., to bring the substrate temperature to 370° C. Then, the inside of the deposition chamber 320 was evacuated by means of a vacuum exhaust pump (not shown) to have a pressure of about $3 \times 10^{-6}$ Torr.

(3) 25 sccm of Ar gas was fed into it through the gas feed pipe 324, and a conductance valve (not shown) was operated to control the pressure so as to be 3 mTorr. Electric current was flowed to the toroidal coil 323, and 370 V of a DC power was applied from the sputter power source 325 to cause Ar plasma.

(4) The target shutter 326 was opened, and the light-reflecting layer 101 of Ag with a layer thickness of 0.5 μm was formed on the surface of the stainless steel sheet, whereupon the target shutter 326 was closed to extinguish the plasma.

(5) The substrate heater 310 was lifted, and the substrate temperature was lowered to 100° C. or below while dropping temperature at a rate of 10° C./sec. in an atmosphere of Ar gas used as substrate cooling gas. Thereafter, the gate valve 307 was opened to carry the substrate into the transport chamber 303 and deposition chamber 330 previously evacuated by means of a vacuum exhaust pump (not shown). The substrate 390 was set in the manner the back thereof was brought into close contact with the substrate heater 311, and was heated while raising temperature at a rate of 13° C./sec., to bring the substrate temperature to 280° C. Then, the inside of the deposition chamber 330 was evacuated by means of a vacuum exhaust pump (not shown) to have a pressure of about $2 \times 10^{-6}$ Torr.

(6) 60 sccm of Ar gas was fed into it through the gas feed pipe 334, and 60 sccm of $O_2$ gas was also fed. Then, a conductance valve (not shown) was operated to control the pressure so as to be 2 mTorr. Electric current was flowed to the toroidal coil 333, and 360 V of a DC power was applied from the sputter power source 335 to cause Ar/$O_2$ plasma. Next, the target shutter 336 was opened, and a reflection enhancing layer 102 of ZnO with a layer thickness of 1.3 μm was formed on the surface of the light-reflecting layer 101 of Ag, whereupon the target shutter 336 was closed to extinguish the plasma.

(7) The substrate heater 311 was lifted, and the substrate temperature was lowered to 100° C. or below while dropping temperature at a rate of 20° C./sec. in an atmosphere of He gas used as substrate cooling gas. Thereafter, the gate valve 308 was opened to carry the substrate into the unload chamber 304 previously evacuated by means of a vacuum exhaust pump (not shown).

Thus, the formation of the light-reflecting layer and reflection enhancing layer according to the present Example was completed. Samples having this light-reflecting layer are called "SA4".

Reference Example A4-1

This example is different from Example A4 in that, after the light-reflecting layer 101 of Ag was formed, the reflection enhancing layer 102 of ZnO was formed without the step of lowering the substrate temperature to 100° C. or below. Except for this point, the procedure of Example A4 was repeated to produce samples. The samples having the light-reflecting layer of this example are called "SA4-1".

For every two kinds of the samples having the above light-reflecting layers, i.e., SA4 and SA4-1, four samples were prepared. In respect of the light-reflecting layers of these samples, light reflectance was measured and, from the measurements obtained, total reflectance and scattered reflectance were evaluated in the same manner as in Example A1 to obtain the results as shown in Table A4.

The results of total reflectance and scattered reflectance shown in Table A4 are indicated for each sample by standardizing the results of the sample SA4-1 on the basis of the results of the sample SA4 which are regarded as 1.

TABLE A4

| Sample | Total reflectance | Scattered reflectance |
|--------|-------------------|----------------------|
| SA4    | 1.00              | 1.00                 |
| SA4-1  | 0.82              | 0.81                 |

As is seen from the results shown in Table A4, the sample SA4 having the light-reflecting layer of Example A4 is superior to the samples SA4-1 of Reference Example A4-1, produced without the step of lowering the substrate temperature to 100° C. or below after the light-reflecting layer was formed, being superior in all the evaluation results at the same time, that is, having superior reflecting properties.

EXAMPLE A5

In this example, the photovoltaic device as shown in FIG. 1 was produced using a sample (base member) having the light-reflecting layer 101 and reflection enhancing layer 102 formed in the same manner as in Example A1, and using the fabrication apparatus employing a multi-chamber-separated system as shown in FIG. 9.

The apparatus 400 shown in FIG. 9 can carry out both MWPCVD (microwave plasma-assisted CVD) and RFPCVD (radio frequency plasma-assisted CVD). Using this apparatus, semiconductor layers (103, 151, 104, 161, 105) and other layers were formed on the reflection enhancing layer 102 according to the layer configuration as shown in FIG. 1.

Their production process will be described below with reference to FIG. 9, following its procedure. To the apparatus shown in FIG. 9, a material gas feeding system (not shown) is connected through gas feed pipes. The material gas cylinders are all purified in an ultra-high purity. As the material gas cylinders, an $SiH_4$ gas cylinder, a $CH_4$ gas cylinder, a $GeH_4$ gas cylinder, an $Si_2H_6$ gas cylinder, a $PH_3/H_2$ (dilution: 0.1%) gas cylinder, a $B_2H_6/H_2$ (dilution: 0.2%) gas cylinder, an $H_2$ gas cylinder, an He gas cylinder, an $SiCl_2H_2$ gas cylinder and an $SiH_4/H_2$ (dilution: 1%) gas cylinder were connected thereto.

(1) A base member 490 (corresponding to 190 in FIG. 1) comprising the substrate and the light-reflecting layer 101 and reflection enhancing layer 102 formed thereon was placed on the base member transporting rail 413 provided in the load chamber 401, and the inside of the load chamber 401 was evacuated by means of a vacuum exhaust pump (not shown) to have a pressure of about $1 \times 10^{-5}$ Torr.

(2) The gate valve 406 was opened to carry the base member into the transport chamber 402 and deposition chamber 417 previously evacuated by means of a vacuum exhaust pump (not shown). The base member 490 was heated in the manner the back thereof was brought into close contact with the base member heater 410. Then, the inside of the deposition chamber 417 was evacuated by means of a vacuum exhaust pump (not shown) to have a pressure of about $1×10^{-5}$ Torr.

(3) After preparation for film formation was completed in this way, $H_2$ gas was fed into the deposition chamber 417 through the gas feed pipe 429. Then, the valves 441, 431 and 430 were opened, and $H_2$ gas flow rate was controlled by means of the mass flow controller 436 so as to be 300 sccm. The pressure inside the deposition chamber 417 was controlled by means of a conductance valve (not shown) so as to be 1.0 Torr. The base member heater 410 was set so as to bring the base member temperature to 350° C.

(4) At the time the base member temperature became stable, an RF n-type layer 103 comprised of pc-Si was formed.

To form the RF n-type layer 103 comprised of pc-Si, the valves 443, 433, 444 and 434 were operated to feed $SiH_4$ gas and $PH_3/H_2$ gas into the deposition chamber 417 through the gas feed pipe 429. Here, $SiH_4$ gas flow rate, $H_2$ gas flow rate and $PH_3/H_2$ gas flow rate were controlled by means of the mass flow controllers 438, 436 and 439 so as to be 2 sccm, 100 sccm and 200 sccm, respectively, and the pressure inside the deposition chamber 417 was controlled so as to be 1.0 Torr.

Next, the power of the RF power source 422 was set to 0.05 W/cm², and RF power was fed to the plasma forming cup 420 to cause glow discharge to take place. Thus, the formation of the RF n-type layer on the base member was started, and an RF n-type layer with a layer thickness of 20 nm was formed, whereupon the RF power source was turned off to stop the glow discharge to complete the formation of the RF n-type layer 103. The $SiH_4$ gas, $PH_3/H_2$ gas and $H_2$ gas were stopped from flowing into the deposition chamber 417, and then the inside of the deposition chamber and the inside of the gas pipe were evacuated to have a pressure of $1×10^{-5}$ Torr.

Subsequently, an RF i-type layer 151 comprised of a-Si, an MW i-type layer 104 comprised of a-SiGe, an RF i-type layer 161 comprised of a-Si and an RF p-type layer 105 comprised of a-SiC were successively formed in the following way.

(5) First, the gate valve 407 was opened to carry the base member into the transport chamber 403 and i-type layer deposition chamber 418 previously evacuated by means of a vacuum exhaust pump (not shown). The base member was heated in the manner the back thereof was brought into close contact with the base member heater 411. Then, the inside of the i-type layer deposition chamber 418 was evacuated by means of a vacuum exhaust pump (not shown) to have a pressure of about $1×10^{-5}$ Torr.

(6) To form the RF i-type layer (151), the base member heater 411 was set so as to bring the base member temperature to 300° C. At the time the base member was well heated, the valves 464, 454, 450, 463 and 453 were slowly opened to flow $Si_2H_6$ gas and $H_2$ gas into the i-type layer deposition chamber 418 through the gas feed pipe 449. Here, $Si_2H_6$ gas flow rate and $H_2$ gas flow rate were controlled by means of the corresponding mass flow controllers 459 and 458 so as to be 4 sccm and 110 sccm, respectively. The pressure inside the i-type layer deposition chamber 418 was controlled so as to be 0.7 Torr by adjusting the opening of the conductance valve (not shown).

Next, the power of the RF power source 424 was set to 0.008 W/cm² and was applied to the bias rod 428 to cause glow discharge to take place, and the shutter 427 was opened. Thus, the formation of the i-type layer on the RF n-type layer was started, and an i-type layer with a layer thickness of 10 nm was formed, whereupon the RF glow discharge was stopped and the output from the RF power source was stopped to complete the formation of the RF i-type layer 151.

The valves 464, 454, 453 and 450 were closed to stop the $Si_2H_6$ gas and $H_2$ gas from flowing into the i-type layer deposition chamber 418, and then the inside of the i-type layer deposition chamber 418 and the inside of the gas pipe were evacuated to have a pressure of $1×10^{-5}$ Torr.

(7) To form the MW i-type layer (104), the base member heater 411 was set so as to bring the base member temperature to 380° C. At the time the base member was well heated, the valves 461, 451, 450, 462, 452, 463 and 453 were slowly opened to flow $SiH_4$ gas, $GeH_4$ gas and $H_2$ gas into the i-type layer deposition chamber 418 through the gas feed pipe 449. Here, $SiH_4$ gas flow rate, $GeH_4$ gas flow rate and $H_2$ gas flow rate were controlled by means of the corresponding mass flow controllers 456, 457 and 458 so as to be 50 sccm, 35 sccm and 150 sccm, respectively. The pressure inside the i-type layer deposition chamber 418 was controlled so as to be 6 mTorr by adjusting the opening of the conductance valve (not shown). Next, the power of the RF power source 424 was set to 0.30 W/cm², and was applied to the bias rod 428.

Thereafter, the power of a microwave power source (2.45 GHz) (not shown) was set to 0.10 W/cm², and the microwave power was fed into the i-type layer deposition chamber 418 through the waveguide 426 and microwave introducing window 425 to cause glow discharge to take place, and the shutter 427 was opened. Thus, the formation of the MW i-type layer on the RF i-type layer was started, and an i-type layer with a layer thickness of 0.17 μm was formed, whereupon the microwave glow discharge was stopped and the output from the bias power source 424 was stopped to complete the formation of the MW i-type layer 104. The valves 451, 452 and 453 were closed to stop the $SiH_4$ gas, $GeH_4$ gas and $H_2$ gas from flowing into the i-type layer deposition chamber 418, and then the inside of the i-type layer deposition chamber 418 and the inside of the gas pipe were evacuated to have a pressure of $1×10^{-5}$ Torr.

(8) To form the RF i-type layer (161), the base member heater 411 was set so as to bring the base member temperature to 250° C. At the time the base member was well heated, the valves 464, 454, 450, 463 and 453 were slowly opened to flow $Si_2H_6$ gas and $H_2$ gas into the i-type layer deposition chamber 418 through the gas feed pipe 449. Here, $Si_2H_6$ gas flow rate and $H_2$ gas flow rate were controlled by means of the corresponding mass flow controllers 459 and 458 so as to be 3 sccm and 80 sccm, respectively. The pressure inside the i-type layer deposition chamber 418 was controlled so as to be 0.7 Torr by adjusting the opening of the conductance valve (not shown).

Next, the power of the RF power source 424 was set to 0.007 W/cm² and was applied to the bias rod 428 to cause glow discharge to take place, and the shutter 427 was opened. Thus, the formation of the RF i-type layer on the MW i-type layer was started, and an i-type layer with a layer thickness of 20 nm was formed, whereupon the RF glow discharge was stopped and the output from the RF power source 424 was stopped to complete the formation of the RF i-type layer 161. The valves 464, 454, 453 and 450 were closed to stop the $Si_2H_6$ gas and $H_2$ gas from flowing into the i-type layer deposition chamber 418, and then the inside of the i-type layer deposition chamber 418 and the inside of the gas pipe were evacuated to have a pressure of $1×10^{-5}$ Torr.

(9) To form the RF p-type layer 105 comprised of a-SiC, first, the gate valve 408 was opened to carry the base member into the transport chamber 404 and p-type layer deposition chamber 419 previously evacuated by means of a vacuum exhaust pump (not shown). The base member was heated in the manner the back thereof was brought into close contact with the base member heater 412. Then, the inside of the p-type layer deposition chamber 419 was evacuated by means of the vacuum exhaust pump (not shown) to have a pressure of about $1 \times 10^{-5}$ Torr.

The base member heater 412 was set so as to bring the base member temperature to 230° C. At the time the base member temperature became stable, the valves 481, 471, 470, 482, 472, 483, 473, 484 and 474 were operated to feed $H_2$ gas, $SiH_4/H_2$ gas, $B_2H_6/H_2$ gas and $CH_4$ gas into the deposition chamber 419 through the gas feed pipe 469. Here, $H_2$ gas flow rate, $SiH_4/H_2$ gas flow rate, $B_2H_6/H_2$ gas flow rate and $CH_4$ gas flow rate were controlled by means of the mass flow controllers 476, 477, 478 and 479 so as to be 60 sccm, 2 sccm, 10 sccm and 0.3 sccm, respectively, and the pressure inside the deposition chamber 419 was controlled so as to be 2.0 Torr by adjusting the opening of the conductance valve (not shown).

Next, the power of the RF power source 423 was set to 0.07 W/cm², and RF power was fed to the plasma forming cup 421 to cause glow discharge to take place. Thus, the formation of the RF p-type layer on the i-type layer was started, and an RF p-type layer with a layer thickness of 10 nm was formed, whereupon the RF power source was turned off to stop the glow discharge to complete the formation of the RF p-type layer 105.

The valves 472, 482, 473, 483, 474, 484, 471, 481 and 470 were closed to stop the $SiH_4/H_2$ gas, $B_2H_6/H_2$ gas, $CH_4$ gas and $H_2$ gas from flowing into the p-type layer deposition chamber 419, and then the inside of the p-type layer deposition chamber 419 and the inside of the gas pipe were evacuated to have a pressure of $1 \times 10^{-5}$ Torr.

(10) The gate valve 409 was opened to carry the base member into the unload chamber 405 previously evacuated by means of a vacuum exhaust pump (not shown), and a leak valve (not shown) was opened to let gases escape from the unload chamber 405.

(11) On the RF p-type layer 105, ITO was deposited by vacuum deposition in a layer thickness of 70 nm as the transparent conductive layer 112.

(12) On the transparent conductive layer 112, a mask with a comb-shaped opening was placed, and the comb-shaped collector electrode 113 with a flat structure, comprised of Cr(40 nm)/Ag(1,000 nm)/Cr(40 nm) was deposited by vacuum deposition.

Thus, the fabrication of the photovoltaic device of the present Example was completed. This photovoltaic device is herein called SCA5.

Reference Example A5-1

This example is different from Example A5 in that the sample (base member) of Reference Example A1-3 was used, i.e., the example in which, after the light-reflecting layer 101 of Ag was formed, the reflection enhancing layer 102 of ZnO was formed without the step of lowering the substrate temperature to 100° C. or below. Except for this point, the procedure of Example A5 was repeated to produce photovoltaic devices. The photovoltaic devices of this example are called "SCA5-1".

For every two kinds of the photovoltaic devices, i.e., SCA5 and SCA5-1, six devices were prepared. In respect of these photovoltaic devices, characteristics of initial photo-electric conversion efficiency (photo electromotive force/incident light intensity), stated specifically, photoelectric conversion efficiency, short-circuit current and open-end voltage were evaluated to obtain the results as shown in Table A5.

The characteristics of initial photoelectric conversion efficiency were evaluated by subjecting the photovoltaic devices thus produced, to irradiation by light of AM 1.5 (100 mW/cm²) and measuring the V-J characteristics.

The results of evaluation on the characteristics of initial photoelectric conversion efficiency shown in Table A5 are indicated by standardizing the results of the photovoltaic device SCA5-1 on the basis of the results of the photovoltaic device SCA5 which are regarded as 1.

TABLE A5

| Sample | Photoelectric conversion efficiency | Short-circuit current | Open-end voltage |
| --- | --- | --- | --- |
| SCA5 | 1.00 | 1.00 | 1.00 |
| SCA5-1 | 0.89 | 0.94 | 0.95 |

As is seen from the results shown in Table A5, the photovoltaic device SCA5 having the light-reflecting layer and reflection enhancing layer obtained in Example A5 by the process of the present invention is superior to the photovoltaic device SCA5-1 of Reference Example A5-1 in all the characteristics of initial photoelectric conversion efficiency at the same time.

EXAMPLE A6

In this example, the photovoltaic device as shown in FIG. 1 was produced using a base member having the light-reflecting layer 101 and reflection enhancing layer 102 formed in the same manner as in Example A1, and using the fabrication apparatus employing a multi-chamber-separated system as shown in FIG. 9.

The apparatus 400 shown in FIG. 9 can carry out both MWPCVD and RFPCVD. Using this apparatus, semiconductor layers (103, 151, 104, 161, 105) and other layers were formed on the reflection enhancing layer 102 according to the layer configuration as shown in FIG. 1.

Their production process will be described below with reference to FIG. 9, following its procedure. To the apparatus shown in FIG. 9, a material gas feeding system (not shown) is connected through gas feed pipes. The material gas cylinders are all purified in an ultra-high purity. As the material gas cylinders, an $SiH_4$ gas cylinder, a $CH_4$ gas cylinder, a $GeH_4$ gas cylinder, an $Si_2H_6$ gas cylinder, a $PH_3/H_2$ (dilution: 0.1%) gas cylinder, a $B_2H_6/H_2$ (dilution: 0.2%) gas cylinder, an $H_2$ gas cylinder, an He gas cylinder, an $SiCl_2H_2$ gas cylinder and an $SiH_4/H_2$ (dilution: 1%) gas cylinder were connected thereto.

(1) The base member 490 (corresponding to 190 in FIG. 1) comprising the substrate and the light-reflecting layer 101 and reflection enhancing layer 102 formed thereon, obtained in Example A4 was placed on the base member transporting rail 413 provided in the load chamber 401, and the inside of the load chamber 401 was evacuated by means of a vacuum exhaust pump (not shown) to have a pressure of about $1 \times 10^{-5}$ Torr.

(2) The gate valve 406 was opened to carry the base member into the transport chamber 402 and deposition chamber 417 previously evacuated by means of a vacuum exhaust pump (not shown). The base member 490 was heated in the manner the back thereof was brought into close contact with the base member heater 410. Then, the inside of the deposition chamber 417 was evacuated by means of a vacuum exhaust pump (not shown) to have a pressure of about $1\times10^{-5}$ Torr.

(3) After preparation for film formation was completed in this way, $H_2$ gas was fed into the deposition chamber 417 through the gas feed pipe 429. Then, the valves 441, 431 and 430 were opened, and $H_2$ gas flow rate was controlled by means of the mass flow controller 436 so as to be 300 sccm. The pressure inside the deposition chamber 417 was controlled by means of a conductance valve (not shown) so as to be 1.0 Torr. The base member heater 410 was set so as to bring the base member temperature to 350° C.

(4) At the time the base member temperature became stable, an RF n-type layer 103 comprised of $\mu c$-Si was formed.

To form the RF n-type layer 103 comprised of $\mu c$-Si, the valves 443, 433, 444 and 434 were operated to feed $SiH_4$ gas and $PH_3/H_2$ gas into the deposition chamber 417 through the gas feed pipe 429. Here, $SiH_4$ gas flow rate, $H_2$ gas flow rate and $PH_3/H_2$ gas flow rate were controlled by means of the mass flow controllers 438, 436 and 439 so as to be 2 sccm, 120 sccm and 200 sccm, respectively, and the pressure inside the deposition chamber 417 was controlled so as to be 1.0 Torr.

Next, the power of the RF power source 422 was set to 0.06 W/cm$^2$, and RF power was fed to the plasma forming cup 420 to cause glow discharge to take place. Thus, the formation of the RF n-type layer on the base member was started, and an RF n-type layer with a layer thickness of 20 nm was formed, whereupon the RF power source was turned off to stop the glow discharge to complete the formation of the RF n-type layer 103. The $SiH_4$ gas, $PH_3/H_2$ gas and $H_2$ gas were stopped from flowing into the deposition chamber 417, and then the inside of the deposition chamber and the inside of the gas pipe were evacuated to have a pressure of $1\times10^{-5}$ Torr.

Subsequently, an RF i-type layer 151 comprised of a-Si, an MW i-type layer 104 comprised of a-SiGe, an RF i-type layer 161 comprised of a-Si and an RF p-type layer 105 comprised of a-SiC were successively formed in the following way (see the layer configuration shown in FIG. 1).

(5) First, the gate valve 407 was opened to carry the base member into the transport chamber 403 and i-type layer deposition chamber 418 previously evacuated by means of a vacuum exhaust pump (not shown). The base member was heated in the manner the back thereof was brought into close contact with the base member heater 411. Then, the inside of the i-type layer deposition chamber 418 was evacuated by means of a vacuum exhaust pump (not shown) to have a pressure of about $1\times10^{-5}$ Torr.

(6) To form the RF i-type layer, the base member heater 411 was set so as to bring the base member temperature to 300° C. At the time the base member was well heated, the valves 464, 454, 450, 463 and 453 were slowly opened to flow $Si_2H_6$ gas and $H_2$ gas into the i-type layer deposition chamber 418 through the gas feed pipe 449. Here, $Si_2H_6$ gas flow rate and $H_2$ gas flow rate were controlled by means of the corresponding mass flow controllers 459 and 458 so as to be 4.2 sccm and 110 sccm, respectively. The pressure inside the i-type layer deposition chamber 418 was controlled so as to be 0.7 Torr by adjusting the opening of the conductance valve (not shown). Next, the power of the RF power source 424 was set to 0.007 W/cm$^2$ and was applied to the bias rod 428 to cause glow discharge to take place, and the shutter 427 was opened. Thus, the formation of the i-type layer on the RF n-type layer on the i-type layer was started, and an i-type layer with a layer thickness of 10 nm was formed, whereupon the RF glow discharge was stopped and the output from the RF power source was stopped to complete the formation of the RF i-type layer 151.

The valves 464, 454, 453 and 450 were closed to stop the $Si_2H_6$ gas and $H_2$ gas from flowing into the i-type layer deposition chamber 418, and then the inside of the i-type layer deposition chamber 418 and the inside of the gas pipe were evacuated to have a pressure of $1\times10^{-5}$ Torr.

(7) To form the MW i-type layer, the base member heater 411 was set so as to bring the base member temperature to 380° C. At the time the base member was well heated, the valves 461, 451, 450, 462, 452, 463 and 453 were slowly opened to flow $SiH_4$ gas, $GeH_4$ gas and $H_2$ gas into the i-type layer deposition chamber 418 through the gas feed pipe 449. Here, $SiH_4$ gas flow rate, $GeH_4$ gas flow rate and $H_2$ gas flow rate were controlled by means of the corresponding mass flow controllers 456, 457 and 458 so as to be 50 sccm, 45 sccm and 250 sccm, respectively. The pressure inside the i-type layer deposition chamber 418 was controlled so as to be 6 mTorr by adjusting the opening of the conductance valve (not shown). Next, the power of the RF power source 424 was set to 0.11 W/cm$^2$, and was applied to the bias rod 428.

Thereafter, the power of a microwave power source (2.45 GHz) (not shown) was set to 0.09 W/cm$^2$, and the microwave power was fed into the i-type layer deposition chamber 418 through the waveguide 426 and microwave introducing window 425 to cause glow discharge to take place, and the shutter 427 was opened. Thus, the formation of the MW i-type layer on the RF i-type layer was started, and an i-type layer with a layer thickness of 0.17 $\mu$m was formed, whereupon the microwave glow discharge was stopped and the output from the bias power source 424 was stopped to complete the formation of the MW i-type layer 104. The valves 451, 452 and 453 were closed to stop the $SiH_4$ gas, $GeH_4$ gas and $H_2$ gas from flowing into the i-type layer deposition chamber 418, and then the inside of the i-type layer deposition chamber 418 and the inside of the gas pipe were evacuated to have a pressure of $1\times10^{-5}$ Torr.

(8) To form the RF i-type layer, the base member heater 411 was set so as to bring the base member temperature to 250° C. At the time the base member was well heated, the valves 464, 454, 450, 463 and 453 were slowly opened to flow $Si_2H_6$ gas and $H_2$ gas into the i-type layer deposition chamber 418 through the gas feed pipe 449. Here, $Si_2H_6$ gas flow rate and $H_2$ gas flow rate were controlled by means of the corresponding mass flow controllers 459 and 458 so as to be 3 sccm and 110 sccm, respectively. The pressure inside the i-type layer deposition chamber 418 was controlled so as to be 0.6 Torr by adjusting the opening of the conductance valve (not shown).

Next, the power of the RF power source 424 was set to 0.007 W/cm$^2$ and was applied to the bias rod 428 to cause glow discharge to take place, and the shutter 427 was opened. Thus, the formation of the RF i-type layer on the MW i-type layer was started, and an i-type layer with a layer thickness of 20 nm was formed, whereupon the RF glow discharge was stopped and the output from the RF power source 424 was stopped to complete the formation of the RF i-type layer 161. The valves 464, 454, 453 and 450 were closed to stop the $Si_2H_6$ gas and $H_2$ gas from flowing into the i-type layer deposition chamber 418, and then the inside of the i-type layer deposition chamber 418 and the inside of the gas pipe were evacuated to have a pressure of $1\times10^{-5}$ Torr.

(9) To form the RF p-type layer 105 comprised of a-SiC, first, the gate valve 408 was opened to carry the base member into the transport chamber 404 and p-type layer deposition chamber 419 previously evacuated by means of a vacuum exhaust pump (not shown). The base member was heated in the manner the back thereof was brought into close contact with the base member heater 412. Then, the inside of the p-type layer deposition chamber 419 was evacuated by means of the vacuum exhaust pump (not shown) to have a pressure of about $1\times10^{-5}$ Torr.

The base member heater 412 was set so as to bring the base member temperature to 230° C. At the time the base member temperature became stable, the valves 481, 471, 470, 482, 472, 483, 473, 484 and 474 were operated to feed $H_2$ gas, $SiH_4/H_2$ gas, $B_2H_6/H_2$ gas and $CH_4$ gas into the deposition chamber 419 through the gas feed pipe 469. Here, $H_2$ gas flow rate, $SiH_4/H_2$ gas flow rate, $B_2H_6/H_2$ gas flow rate and $CH_4$ gas flow rate were controlled by means of the mass flow controllers 476, 477, 478 and 479 so as to be 60 sccm, 2 sccm, 10 sccm and 0.2 sccm, respectively, and the pressure inside the deposition chamber 419 was controlled so as to be 2.0 Torr by adjusting the opening of the conductance valve (not shown).

Next, the power of the RF power source 423 was set to 0.07 W/cm$^2$, and RF power was fed to the plasma forming cup 421 to cause glow discharge to take place. Thus, the formation of the RF p-type layer on the i-type layer was started, and an RF p-type layer with a layer thickness of 10 nm was formed, whereupon the RF power source was turned off to stop the glow discharge to complete the formation of the RF p-type layer 105. The valves 472, 482, 473, 483, 474, 484, 471, 481 and 470 were closed to stop the $SiH_4/H_2$ gas, $B_2H_6/H_2$ gas, $CH_4$ gas and $H_2$ gas from flowing into the p-type layer deposition chamber 419, and then the inside of the p-type layer deposition chamber 419 and the inside of the gas pipe were evacuated to have a pressure of $1\times10^{-5}$ Torr.

(10) The gate valve 409 was opened to carry the base member into the unload chamber 405 previously evacuated by means of a vacuum exhaust pump (not shown), and a leak valve (not shown) was opened to let gases escape from the unload chamber 405.

(11) On the RF p-type layer 105, ITO was deposited by vacuum deposition in a layer thickness of 70 nm as the transparent conductive layer 112.

(12) On the transparent conductive layer 112, a mask with a comb-shaped opening was placed, and the comb-shaped collector electrode 113 with a flat structure, comprised of Cr(40 nm)/Ag(1,000 nm)/Cr(40 nm) was deposited by vacuum deposition.

Thus, the fabrication of the photovoltaic device of the present Example was completed. This photovoltaic device is herein called SCA6.

Reference Example A6-1

This example is different from Example A6 in that the sample (base member) of Reference Example A4-1 was used, i.e., the example in which, after the light-reflecting layer 101 of Ag was formed, the reflection enhancing layer 102 of ZnO was formed without the step of lowering the substrate temperature to 100° C. or below. Except for this point, the procedure of Example A6 was repeated to produce photovoltaic devices. The photovoltaic devices of this example are called "SCA6-1".

For every two kinds of the photovoltaic devices, i.e., SCA6 and SCA6-1, five devices were prepared. In respect of these photovoltaic devices, characteristics of initial photoelectric conversion efficiency (photo electromotive force/incident light intensity), stated specifically, photoelectric conversion efficiency, short-circuit current and open-end voltage were evaluated in the same manner as in Example A5 to obtain the results as shown in Table A6.

The results of evaluation on the characteristics of initial photoelectric conversion efficiency as shown in Table A6 are indicated by standardizing the results of the photovoltaic device SCA6-1 on the basis of the results of the photovoltaic device SCA6 which are regarded as 1.

TABLE A6

| Sample | Photoelectric conversion efficiency | Short-circuit current | Open-end voltage |
|---|---|---|---|
| SCA6 | 1.00 | 1.00 | 1.00 |
| SCA6-1 | 0.86 | 0.91 | 0.94 |

As is seen from the results shown in Table A6, the photovoltaic device SCA6 having the light-reflecting layer and reflection enhancing layer obtained in Example A6 by the process of the present invention is superior to the photovoltaic devices SCA6-1 of Reference Example A6-1 in all the characteristics of initial photoelectric conversion efficiency at the same time.

EXAMPLE A7

In the present Example, the base member 290 having the light-reflecting layer as shown in FIG. 3 (i.e., the base member comprising the substrate 200 and the layers of light-reflecting layer 201 and reflection enhancing layer 202 formed on the substrate) was produced using the fabrication apparatus of a multi-chamber-separated system as shown in FIG. 5. Next, on the base member having these light-reflecting layer and reflection enhancing layer, semiconductor layers were formed using the apparatus employing a multi-chamber-separated system as shown in FIG. 9, to produce the photovoltaic device as shown in FIG. 3, the triple type device, having a pin structure.

The process of forming the light-reflecting layer and reflection enhancing layer having the configuration as shown in FIG. 3 will be described below with reference to FIG. 5.

To the apparatus shown in FIG. 5, a material gas feeding system (not shown) is connected through gas feed pipes. The material gas cylinders are all purified in an ultra-high purity. As the material gas cylinders, an $H_2$ gas cylinder, an Ar gas cylinder and an He gas cylinder were connected thereto. Ag and ZnO were used as targets. These are so provided that sputtering can be carried out in vacuum.

As the substrate (200 in FIG. 3), a stainless steel sheet of 0.5 mm thick and 50×50 mm$^2$ was used, which was subjected to ultrasonic cleaning with acetone and isopropanol, followed by hot-air drying. As the sputter power source, the DC power source 325 was connected, and a light-reflecting layer 101 of Ag was formed on the substrate by DC magnetron sputtering. Then the subsequent processing was carried out.

The process of forming the light-reflecting layer and reflection enhancing layer will be described below following its procedure.

(1) A substrate 390 (corresponding to 200 in FIG. 3) having been cleaned was placed on the substrate transporting rail 313 provided in the load chamber 301, and the inside of the load chamber 301 was evacuated by means of a vacuum exhaust pump (not shown) to have a pressure of about $1\times10^{-5}$ Torr.

(2) The gate valve 306 was opened to carry the substrate into the transport chamber 302 and deposition chamber 320 previously evacuated by means of a vacuum exhaust pump (not shown). The substrate 390 was set in the manner the back thereof was brought into close contact with the substrate heater 310, and was heated while raising temperature at a rate of 30° C./sec., to bring the substrate temperature to 300° C. Then, the inside of the deposition chamber 320 was evacuated by means of a vacuum exhaust pump (not shown) to have a pressure of about $3 \times 10^{-6}$ Torr.

(3) 55 sccm of Ar gas was fed into it through the gas feed pipe 324, and a conductance valve (not shown) was operated to control the pressure so as to be 3 mTorr. Electric current was flowed to the toroidal coil 323, and 385 V of a DC power was applied from the sputter power source 325 to cause Ar plasma.

(4) The target shutter 326 was opened, and the light-reflecting layer 201 of Ag with a layer thickness of 0.6 μm was formed on the surface of the stainless steel sheet, whereupon the target shutter 326 was closed to extinguish the plasma.

(5) The substrate heater 310 was lifted, and the substrate temperature was lowered to 100° C. or below while dropping temperature at a rate of 20° C./sec. in an atmosphere of $H_2$ gas used as substrate cooling gas. Thereafter, the gate valve 307 was opened to carry the substrate into the transport chamber 303 and deposition chamber 330 previously evacuated by means of a vacuum exhaust pump (not shown). The substrate 390 was set in the manner the back thereof was brought into close contact with the substrate heater 311, and was heated while raising temperature at a rate of 30° C./sec., to bring the substrate temperature to 320° C. Then, the inside of the deposition chamber 330 was evacuated by means of a vacuum exhaust pump (not shown) to have a pressure of about $2 \times 10^{-6}$ Torr.

(6) 50 sccm of Ar gas was fed into it through the gas feed pipe 334, and a conductance valve (not shown) was operated to control the pressure so as to be 4 mTorr. Electric current was flowed to the toroidal coil 333, and 380 V of a DC power was applied from the sputter power source 335 to cause Ar plasma. Next, the target shutter 336 was opened, and a reflection enhancing layer 202 of ZnO with a layer thickness of 1.5 μm was formed on the surface of the light-reflecting layer 201 of Ag, whereupon the target shutter 336 was closed to extinguish the plasma.

(7) The substrate heater 311 was lifted, and the substrate temperature was lowered to 100° C. or below while dropping temperature at a rate of 25° C./sec. in an atmosphere of $H_2$ gas used as substrate cooling gas. Thereafter, the gate valve 308 was opened to carry the substrate into the unload chamber 304 previously evacuated by means of a vacuum exhaust pump (not shown).

Thus, the formation of the light-reflecting layer and reflection enhancing layer according to the present Example was completed.

In the following, the process for producing the photovoltaic device will be described.

Using the base member having the light-reflecting layer and reflection enhancing layer formed through the steps (1) to (7) in Example A7, the triple type photovoltaic device as shown in FIG. 3 was produced using the apparatus employing a multi-chamber-separated system as shown in FIG. 9.

(8) The base member (490 in FIG. 9) comprising the substrate and the light-reflecting layer 201 and reflection enhancing layer 202 formed thereon was placed on the base member transporting rail 413 provided in the load chamber 401, and the inside of the load chamber 401 was evacuated by means of a vacuum exhaust pump (not shown) to have a pressure of about $1 \times 10^{-5}$ Torr.

(9) The gate valve 406 was opened to carry the base member into the transport chamber 402 and deposition chamber 417 previously evacuated by means of a vacuum exhaust pump (not shown). The base member 490 was heated in the manner the back thereof was brought into close contact with the base member heater 410. Then, the inside of the deposition chamber 417 was evacuated by means of a vacuum exhaust pump (not shown) to have a pressure of about $1 \times 10^{-5}$ Torr.

(10) After preparation for film formation was completed in this way, $H_2$ gas was fed into the deposition chamber 417 through the gas feed pipe 429. Then, the valves 441, 431 and 430 were opened, and $H_2$ gas flow rate was controlled by means of the mass flow controller 436 so as to be 500 sccm. The pressure inside the deposition chamber 417 was controlled by means of a conductance valve (not shown) so as to be 1.3 Torr. The base member heater 410 was set so as to bring the base member temperature to 350° C.

(11) At the time the base member temperature became stable, an RF n-type layer 203 comprised of pc-Si was formed.

To form the RF n-type layer 203 comprised of pc-Si, the valves 443, 433, 444 and 434 were operated to feed $SiH_4$ gas and $PH_3/H_2$ gas into the deposition chamber 417 through the gas feed pipe 429. Here, $SiH_4$ gas flow rate, $H_2$ gas flow rate and $PH_3/H_2$ gas flow rate were controlled by means of the mass flow controllers 438, 436 and 439 so as to be 2 sccm, 100 sccm and 200 sccm, respectively, and the pressure inside the deposition chamber 417 was controlled so as to be 1.3 Torr.

Next, the power of the RF power source 422 was set to 0.05 W/cm², and RF power was fed to the plasma forming cup 420 to cause glow discharge to take place. Thus, the formation of the RF n-type layer on the base member was started, and an RF n-type layer with a layer thickness of 20 nm was formed, whereupon the RF power source was turned off to stop the glow discharge to complete the formation of the RF n-type layer 203. The $SiH_4$ gas, $PH_3/H_2$ gas and $H_2$ gas were stopped from flowing into the deposition chamber 417, and then the inside of the deposition chamber and the inside of the gas pipe were evacuated to have a pressure of $1 \times 10^{-5}$ Torr.

(12) Subsequently, following the procedure in Example A5, an RF i-type layer 251 comprised of a-Si (corresponding to the RF i-type layer 151), an MW i-type layer 204 comprised of a-SiGe (corresponding to the MW i-type layer 104), an RF i-type layer 261 comprised of a-Si (corresponding to the RF i-type layer 161), an RF p-type layer 205 comprised of a-SiC (corresponding to the RF p-type layer 105), an RF n-type layer 206 comprised of μc-Si (corresponding to the RF n-type layer 103), an RF i-type layer 252 comprised of a-Si (corresponding to the RF i-type layer 151), an MW i-type layer 207 comprised of a-SiGe (corresponding to the MW i-type layer 104), an RF i-type layer 262 comprised of a-Si (corresponding to the RF i-type layer 161), an RF p-type layer 208 comprised of a-SiC (corresponding to the RF p-type layer 105), an RF n-type layer 209 comprised of μc-Si (corresponding to the RF n-type layer 103), an RF i-type layer 210 comprised of a-Si (corresponding to the RF i-type layer 161), and an RF p-type layer 211 comprised of a-SiC (corresponding to the RF p-type layer 105) were successively formed.

(13) On the RF p-type layer 211, ITO was deposited by vacuum deposition in a layer thickness of 70 nm as the transparent conductive layer 212.

(14) On the transparent conductive layer 212, a mask with a comb-shaped opening was placed, and the comb-shaped collector electrode 213 with a flat structure, comprised of Cr(40 nm)/Ag(1,000 nm)/Cr(40 nm) was deposited by vacuum deposition.

Thus, the fabrication of the photovoltaic device of the present Example was completed. This photovoltaic device is herein called SCA7. Conditions for forming the respective semiconductor layers RF n-type layers, RF i-type layers, MW i-type layers and RF p-type layers are shown together in Table A7.

The results of evaluation on the characteristics of initial photoelectric conversion efficiency as shown in Table A8 are indicated by standardizing the results of the photovoltaic device SCA7-1 on the basis of the results of the photovoltaic device SCA7 which are regarded as 1.

TABLE A8

| Sample | Photoelectric conversion efficiency | Short-circuit current | Photo-deterioration characteristics |
|---|---|---|---|
| SCA7 | 1.00 | 1.00 | 1.00 |
| SCA7-1 | 0.81 | 0.89 | 0.94 |

TABLE A7

| | $SiH_4$ Flow rate (sccm) | $Si_2H_6$ Flow rate (sccm) | $CH_4$ Flow rate (sccm) | $GeH_4$ Flow rate (sccm) | $H_2$ Flow rate (sccm) | $PH_3/H_2$ Flow rate (sccm) | $B_2H_6/H_2$ Flow rate (sccm) | $SiH_4/H_2$ Flow rate (sccm) | Pressure (Torr) | MW power (W/cm$^2$) | RF power (W/cm$^2$) | Base member temp. (°C.) | Layer thickness (nm) |
|---|---|---|---|---|---|---|---|---|---|---|---|---|---|
| RF n-type layer: (203) | 2.0 | — | — | — | 100 | 220 | — | — | 1.3 | — | 0.05 | 350 | 20 |
| RF i-type layer: (251) | — | 4.0 | — | — | 100 | — | — | — | 0.8 | — | 0.008 | 300 | 10 |
| MW i-type layer: (204) | 40 | — | — | 41 | 100 | — | — | — | 0.011 | 0.12 | 0.31 | 370 | 110 |
| RF i-type layer: (261) | — | 4.0 | — | — | 100 | — | — | — | 0.75 | — | 0.008 | 300 | 23 |
| RF p-type layer: (205) | — | — | 0.1 | — | 80 | — | 9 | 2 | 1.8 | — | 0.07 | 300 | 10 |
| RF n-type layer: (206) | 1.1 | — | — | — | 40 | 290 | — | — | 1.1 | — | 0.04 | 300 | 10 |
| RF i-type layer: (252) | — | 4.0 | — | — | 100 | — | — | — | 0.75 | — | 0.008 | 300 | 10 |
| MW i-type layer: (207) | 35 | — | — | 27 | 120 | — | — | — | 0.012 | 0.12 | 0.3 | 350 | 100 |
| RF i-type layer: (262) | — | 3.5 | — | — | 90 | — | — | — | 0.7 | — | 0 008 | 280 | 23 |
| RF p-type layer: (208) | — | — | 0.2 | — | 80 | — | 9 | 2 | 1.7 | — | 0.07 | 260 | 10 |
| RF n-type layer: (209) | 0.8 | — | — | — | 50 | 250 | — | — | 1.05 | — | 0.04 | 230 | 10 |
| RF i-type layer: (210) | — | 1.5 | — | — | 80 | — | — | — | 0.8 | — | 0.007 | 190 | 90 |
| RF p-type layer: (211) | — | — | 0.4 | — | 90 | — | 8 | 2 | 1.6 | — | 0.07 | 170 | 10 |

Reference Example A7-1

This example is different from Example A7 in that a base member was used in which, after the light-reflecting layer 201 of Ag was formed, the reflection enhancing layer 202 of ZnO was formed without the step of lowering the substrate temperature to 100° C. or below. Except for this point, the procedure of Example A7 was repeated to produce photovoltaic devices. The photovoltaic devices of this example are called "SCA7-1".

For every two kinds of the photovoltaic devices, i.e., SCA7 and SCA7-1, six devices were prepared. In respect of these photovoltaic devices, characteristics of initial photoelectric conversion efficiency (photo electromotive force/incident light intensity), stated specifically, photoelectric conversion efficiency and short-circuit current, were evaluated in the same manner as in Example A5. Photo-deterioration characteristics were also evaluated in the manner as described below. The results obtained are shown in Table A8.

To examine the photo-deterioration characteristics, photoelectric conversion efficiency was evaluated after photovoltaic devices having a temperature of 50° C. were irradiated by light for 1,000 hours under 1 sun of 100 mW/cm$^2$.

As is seen from the results shown in Table A8, the photovoltaic device SCA7 having the light-reflecting layer and reflection enhancing layer obtained in Example A7 by the process of the present invention is superior to the photovoltaic devices SCA7-1 of Reference Example A7-1 in all the characteristics of initial photoelectric conversion efficiency and photo-deterioration characteristics at the same time.

EXAMPLE A8

In the present Example, the triple type photovoltaic device as shown in FIG. 3 was produced using the fabrication apparatus employing a roll-to-roll system as shown in FIGS. 7 and 10.

As the substrate, a belt-like stainless steel sheet of 300 m long, 30 cm wide and 0.5 mm thick was used.

The process of forming the light-reflecting layer and reflection enhancing layer will be described below.

The apparatus for continuously forming the light-reflecting layer as shown in FIG. 7 is successively provided with the substrate feed-out chamber 610, a plurality of deposition chambers 611 to 613 and the substrate wind-up chamber 614, which are connected through separating paths 615, 616, 617 and 618 between them. Each deposition chamber has an exhaust vent, through which the inside thereof can be evacuated. The belt-like substrate 621 is passed through these deposition chambers and separating paths after it is sent out of the substrate feed-out chamber, and is wound up in the substrate wind-up chamber. At the same time, the apparatus is so designed that gases can be fed into the respective deposition chambers and separating paths through their gas inlets, gases can be drawn out through the respective exhaust vents and the respective layers can be formed.

The light-reflecting layer of Ag is formed in the deposition chamber 612, and the reflection enhancing layer of ZnO in the deposition chamber 613. The deposition chambers are respectively provided in their insides with the halogen lamp heaters 640, 641 and 642 for heating the substrate on the back thereof, and the substrate is temperature-raised or heated to the stated temperature in each deposition chamber. The separating paths 617 and 618 have also the function to lower temperature so that the substrate temperature is dropped at a given rate after the semiconductor layers are respectively formed in the deposition chambers 612 and 613. In particular, in the present Example, the substrate temperature is lowered to 100° C. or below in the separating path 617 after the light-reflecting layer is formed in the deposition chamber 612.

In the deposition chamber 612, DC magnetron sputtering is carried out, in which Ar gas is fed into the chamber through the gas inlet 632 and Ag is used as the target 650. In the deposition chamber 613, DC magnetron sputtering or RF magnetron sputtering is carried out, in which Ar gas is fed into the chamber through the gas inlet 634 and ZnO is used as the target 660. After the light-reflecting layer and reflection enhancing layer are formed on the belt substrate under conditions shown in Table A9, the substrate is wound up in the substrate wind-up chamber 614.

The process of producing the photovoltaic device will be described below.

The triple type photovoltaic device having the layer configuration as shown in FIG. 3 was produced under conditions as shown in Table A10 below, using the fabrication apparatus employing a roll-to-roll system as shown in FIG. 10.

The belt base member having the light-reflecting layer and reflection enhancing layer formed in the manner as described above was set in the load chamber 5010 for introducing the belt base member. This belt base member was passed through all the deposition chambers and all the gas gates and connected to the belt base member wind-up jig in the unload chamber 5150. The respective deposition chambers were evacuated to $10^{-3}$ Torr or below by means of an exhaust system (not shown). The desired materials gases were fed into the respective deposition chambers from the deposited film forming mixing systems 5024, 5034, 5044, 5054, 5064, 5074, 5084, 5094, 5104, 5114, 5124, 5134 and 5144. To the gas gates 5201, 5202, 5203, 5204, 5205, 5206, 5207, 5208, 5209, 5210, 5211, 5212, 5213 and 5214, gas was fed from the respective gate gas feeding system. The base member was heated by means of the base member heater in each deposition system, and the degree of vacuum was controlled by adjusting the opening of the exhaust valve of each exhaust system. After the base member temperature and degree of vacuum became stable, the belt base member was begun to be transported, and RF power or MW (frequency: 2.45 GHz) power for generating plasma was supplied to each deposition chamber. In this way, the triple type photovoltaic device having three pin structures as shown in FIG. 3, which were superposingly formed on the belt base member 290, was formed.

Next, on the RF p-type layer 211, ITO was deposited by vacuum deposition in a layer thickness of 70 nm as the transparent conductive layer 212.

Next, on the transparent conductive layer 212, a mask with a comb-shaped opening was placed, and the comb-shaped collector electrode 213 with a flat structure, comprised of Cr(40 nm)/Ag(1,000 nm)/Cr(40 nm) was deposited by vacuum deposition.

Thus, the fabrication of the photovoltaic device of the present Example was completed. This photovoltaic device is herein called SCA8. Conditions for forming the light-reflecting layer and reflection enhancing layer in the present Example are shown in Table A9. Conditions for forming the respective semiconductor layers RF n-type layers, RF i-type layers, MW i-type layers and RF p-type layers are shown in Table A10.

TABLE A9

Light-reflecting layer/reflection enhancing layer forming conditions (Example A8; apparatus used: FIG. 7)

|  | Light-reflecting layer: Ag | Reflection enhancing layer: ZnO |
|---|---|---|
| Temp. rise rate: (°C./sec.) | 15 | 15 |
| Substrate temp.: (°C.) | 280 | 300 |
| Ar gas flow rate: (sccm) | 30 | 35 |
| Pressure: (mTorr) | 3 | 4 |
| Target species: | Ag | ZnO |
| Type of sputtering: | DC | DC |
| Sputter voltage: (V) | 380 | 385 |
| Layer thickness: (μm) | 0.65 | 1.0 |
| Substrate cooling gas: | $H_2$ | He |
| Temp. drop rate: (°C./sec.) | 10 | 15 |

TABLE A10

| | SiH$_4$ Flow rate (sccm) | Si$_2$H$_6$ Flow rate (sccm) | CH$_4$ Flow rate (sccm) | GeH$_4$ Flow rate (sccm) | H$_2$ Flow rate (sccm) | PH$_3$/H$_2$ Flow rate (sccm) | B$_2$H$_6$/H$_2$ Flow rate (sccm) | SiH$_4$/H$_2$ Flow rate (sccm) | Pressure (Torr) | MW power (W/cm$^2$) | RF power (W/cm$^2$) | Base member temp. (°C.) | Layer thickness (nm) |
|---|---|---|---|---|---|---|---|---|---|---|---|---|---|
| RF n-type layer: (203) | 2.0 | — | — | — | 100 | 220 | — | — | 1.3 | — | 0.05 | 350 | 20 |
| RF i-type layer: (251) | — | 4.0 | — | — | 100 | — | — | — | 0.8 | — | 0.008 | 300 | 10 |

TABLE A10-continued

| | SiH$_4$ Flow rate (sccm) | Si$_2$H$_6$ Flow rate (sccm) | CH$_4$ Flow rate (sccm) | GeH$_4$ Flow rate (sccm) | H$_2$ Flow rate (sccm) | PH$_3$/H$_2$ Flow rate (sccm) | B$_2$H$_6$/H$_2$ Flow rate (sccm) | SiH$_4$/H$_2$ Flow rate (sccm) | Pressure (Torr) | MW power (W/cm$^2$) | RF power (W/cm$^2$) | Base member temp. (°C.) | Layer thickness (nm) |
|---|---|---|---|---|---|---|---|---|---|---|---|---|---|
| MW i-type layer: (204) | 48 | — | — | 49 | 110 | — | — | — | 0.005 | 0.07 | 0.28 | 380 | 100 |
| RF i-type layer: (261) | — | 4.0 | — | — | 100 | — | — | — | 0.55 | — | 0.008 | 300 | 23 |
| RF p-type layer: (205) | — | — | 0.1 | — | 80 | — | 9 | 2 | 1.8 | — | 0.07 | 300 | 10 |
| RF n-type layer: (206) | 1.1 | — | — | — | 40 | 290 | — | — | 1.1 | — | 0.04 | 300 | 10 |
| RF i-type layer: (252) | — | 4.0 | — | — | 90 | — | — | — | 0.75 | — | 0.008 | 300 | 10 |
| MW i-type layer: (207) | 33 | — | — | 29 | 120 | — | — | — | 0.005 | 0.05 | 0.28 | 360 | 98 |
| RF i-type layer: (262) | — | 3.5 | — | — | 90 | — | — | — | 0.5 | — | 0.008 | 280 | 23 |
| RF p-type layer: (208) | — | — | 0.2 | — | 80 | — | 9 | 2 | 1.7 | — | 0.07 | 260 | 10 |
| RF n-type layer: (209) | 0.8 | — | — | — | 50 | 250 | — | — | 1.05 | — | 0.04 | 230 | 10 |
| RF i-type layer: (210) | — | 2.0 | — | — | 80 | — | — | — | 0.8 | — | 0.007 | 190 | 90 |
| RF p-type layer: (211) | — | — | 0.4 | — | 90 | — | 8 | 2 | 1.6 | — | 0.07 | 170 | 10 |

Reference Example A8-1

This example is different from Example A8 in that a base member was used in which, after the light-reflecting layer 201 of Ag was formed, the reflection enhancing layer 202 of ZnO was formed without the step of lowering the substrate temperature to 100° C. or below. Except for this point, the procedure of Example A8 was repeated to produce photovoltaic devices having the structure as shown in FIG. 3. The photovoltaic devices of this example are called "SCA8-1".

For every two kinds of the photovoltaic devices, i.e., SCA8 and SCA8-1, six devices were prepared. In respect of these photovoltaic devices, characteristics of initial photoelectric conversion efficiency (photo electromotive force/incident light intensity), stated specifically, photoelectric conversion efficiency and short-circuit current, were evaluated in the same manner as in Example A5. Photo-deterioration characteristics were also evaluated in the manner as described below. The results obtained are shown in Table A11.

To examine the photo-deterioration characteristics, photoelectric conversion efficiency was evaluated after photovoltaic devices having a temperature of 50° C. were irradiated by light for 1,000 hours under 1 sun of 100 mW/cm$^2$.

The results of evaluation on the characteristics of initial photoelectric conversion efficiency as shown in Table A11 are indicated by standardizing the results of the photovoltaic device SCA8-1 on the basis of the results of the photovoltaic device SCA8 which are regarded as 1.

TABLE A11

| Sample | Photoelectric conversion efficiency | Short-circuit current | Photo-deterioration characteristics |
|---|---|---|---|
| SCA8 | 1.00 | 1.00 | 1.00 |
| SCA8-1 | 0.81 | 0.90 | 0.94 |

As is seen from the results shown in Table A11, the photovoltaic device SCA8 having the light-reflecting layer and reflection enhancing layer obtained in Example A8 by the process of the present invention is superior to the photovoltaic devices SCA8-1 of Reference Example A8-1 in all the characteristics of initial photoelectric conversion efficiency and photo-deterioration characteristics at the same time.

EXAMPLE A9

In the present Example, the rate of temperature rise at the time of the formation of the light-reflecting layer and reflection enhancing layer was changed in the range of from 2° C./sec. to 150° C./sec. to examine how it affects the initial photoelectric conversion characteristics and so forth in photovoltaic devices.

In the present Example, triple type photovoltaic devices having the structure as shown in FIG. 3 were produced in the same manner as in Example A8 except that the light-reflecting layer and reflection enhancing layer were formed under conditions shown in Table A12 and the semiconductor layers were formed under conditions shown in Table A13, using the apparatus for continuously forming the light-reflecting layer and reflection enhancing layer as shown in FIG. 7 and the apparatus for continuously forming the photovoltaic device semiconductor layers as shown in FIG. 10. Stated specifically, eight samples were prepared under different conditions for the rate of temperature rise.

In respect of the samples of the photovoltaic device thus obtained, characteristics of initial photoelectric conversion efficiency (photo electromotive force/incident light intensity) and photo-deterioration characteristics were evaluated in the same manner as in Example A5 to obtain the results as shown in Table A14.

The results of evaluation on the characteristics of the respective samples as shown in Table A14 are indicated by standardizing the results on the basis of the measurement results of the sample obtained when the temperature was raised at a rate of 2° C. In the table, "C" indicates 1.0 or more to less than 1.4; "B", 1.4 or more to less than 1.8; and "A", 1.8 or more.

As is seen from the results shown in Table A14, the rate of temperature rise at the time of the formation of the light-reflecting layer and reflection enhancing layer is preferably in the range of from 10° C./sec. to 100° C./sec. in view of the photoelectric conversion efficiency, the short-circuit current and the photo-deterioration characteristics.

TABLE A12

Light-reflecting layer/reflection enhancing layer forming conditions (Example A9; apparatus used: FIG. 7)

|  | Light-reflecting layer: Ag | Reflection enhancing layer: ZnO |
|---|---|---|
| Temp. rise rate: (°C./sec.) | 2–150 | 2–150 |
| Substrate temp.: (°C.) | 290 | 310 |
| Ar gas flow rate: (sccm) | 40 | 35 |
| Pressure: (mTorr) | 3 | 4 |
| Target species: | Ag | ZnO |
| Type of sputtering: | DC | DC |
| Sputter voltage: (V) | 390 | 385 |
| Layer thickness: (μm) | 0.55 | 1.2 |
| Substrate cooling gas: | He | He |
| Temp. drop rate: (°C./sec.) | 10 | 15 |

EXAMPLE A10

In the present Example, the rate of temperature drop after the formation of the light-reflecting layer and reflection enhancing layer was changed in the range of from 0.2° C./sec. to 90° C./sec. to examine how it affects the initial photoelectric conversion characteristics and so forth in photovoltaic devices.

In the present Example, triple type photovoltaic devices having the structure as shown in FIG. 3 were produced in the same manner as in Example A8 except that the light-reflecting layer and reflection enhancing layer were formed under conditions shown in Table A15 and the semiconductor layers were formed under conditions shown in Table A16, using the apparatus for continuously forming the light-reflecting layer and reflection enhancing layer as shown in FIG. 7 and the apparatus for continuously forming the photovoltaic device semiconductor layers as shown in FIG. 10. Stated specifically, eight samples were prepared under different conditions for the rate of temperature drop.

In respect of the samples of the photovoltaic device thus obtained, characteristics of initial photoelectric conversion efficiency (photo electromotive force/incident light intensity) and photo-deterioration characteristics were

TABLE A13

|  | $SiH_4$ Flow rate (sccm) | $Si_2H_6$ Flow rate (sccm) | $CH_4$ Flow rate (sccm) | $GeH_4$ Flow rate (sccm) | $H_2$ Flow rate (sccm) | $PH_3/H_2$ Flow rate (sccm) | $B_2H_6/H_2$ Flow rate (sccm) | $SiH_4/H_2$ Flow rate (sccm) | Pressure (Torr) | MW power (W/cm$^2$) | RF power (W/cm$^2$) | Base member temp. (°C.) | Layer thickness (nm) |
|---|---|---|---|---|---|---|---|---|---|---|---|---|---|
| RF n-type layer: (203) | 2.0 | — | — | — | 100 | 220 | — | — | 1.3 | — | 0.05 | 350 | 20 |
| RF i-type layer: (251) | — | 4.0 | — | — | 100 | — | — | — | 0.8 | — | 0.008 | 300 | 10 |
| MW i-type layer: (204) | 48 | — | — | 51 | 170 | — | — | — | 0.010 | 0.12 | 0.31 | 370 | 100 |
| RF i-type layer: (261) | — | 4.0 | — | — | 100 | — | — | — | 0.65 | — | 0.008 | 300 | 23 |
| RF p-type layer: (205) | — | — | 0.1 | — | 80 | — | 9 | 2 | 1.8 | — | 0.07 | 300 | 10 |
| RF n-type layer: (206) | 1.1 | — | — | — | 40 | 290 | — | — | 1.1 | — | 0.04 | 300 | 10 |
| RF i-type layer: (252) | — | 4.0 | — | — | 90 | — | — | — | 0.75 | — | 0.008 | 300 | 10 |
| MW i-type layer: (207) | 35 | — | — | 29 | 150 | — | — | — | 0.013 | 0.10 | 0.3 | 350 | 98 |
| RF i-type layer: (262) | — | 3.5 | — | — | 90 | — | — | — | 0.7 | — | 0.008 | 280 | 23 |
| RF p-type layer: (208) | — | — | 0.2 | — | 80 | — | 9 | 2 | 1.7 | — | 0.07 | 260 | 10 |
| RF n-type layer: (209) | 0.8 | — | — | — | 50 | 250 | — | — | 1.05 | — | 0.04 | 230 | 10 |
| RF i-type layer: (210) | — | 2.0 | — | — | 80 | — | — | — | 0.7 | — | 0.007 | 190 | 90 |
| RF p-type layer: (211) | — | — | 0.4 | — | 90 | — | 8 | 2 | 1.6 | — | 0.07 | 170 | 10 |

TABLE A14

| | Temp. rise rate: (°C./sec.) | | | | | | | |
|---|---|---|---|---|---|---|---|---|
| | 2 | 8 | 10 | 40 | 70 | 100 | 120 | 150 |
| Photoelectric conversion efficiency: | C | B | A | A | A | A | B | C |
| Short-circuit current: | C | B | A | A | A | A | C | C |
| Open-end voltage: | C | B | A | A | A | A | B | C | evaluated in the same manner as in Example A5 to obtain the results as shown in Table A17.

The results of evaluation on the characteristics of the respective samples as shown in Table A17 are indicated by standardizing the results on the basis of the measurement results of the sample obtained when the temperature was lowered at a rate of 0.2° C. In the table, "C" indicates 1.0 or more to less than 1.4; "B", 1.4 or more to less than 1.8; and "A", 1.8 or more.

As is seen from the results shown in Table A17, the rate of temperature drop at the time of the formation of the light-reflecting layer and reflection enhancing layer is preferably in the range of from 1° C./sec. to 50° C./sec. in view of the photoelectric conversion efficiency, the short-circuit current and the photo-deterioration characteristics.

TABLE A15

Light-reflecting layer/reflection enhancing layer forming conditions (Example A10; apparatus used: FIG. 7)

|  | Light-reflecting layer: Ag | Reflection enhancing layer: ZnO |
|---|---|---|
| Temp. rise rate: (°C./sec.) | 50 | 15 |
| Substrate temp.: (°C.) | 290 | 320 |
| Ar gas flow rate: (sccm) | 40 | 50 |
| Pressure: (mTorr) | 3 | 4 |
| Target species: | Ag | ZnO |
| Type of sputtering: | DC | DC |
| Sputter voltage: (V) | 380 | 390 |
| Layer thickness: (μm) | 0.6 | 2.0 |
| Substrate cooling gas: | $H_2$ | He |
| Temp. drop rate: (°C./sec.) | 0.2–90 | 0.2–90 |

EXAMPLE B1

In the present Example, the light-reflecting layer 101 and reflection enhancing layer 102 that constitute the device shown in FIG. 1 were formed using the fabrication apparatus of a multi-chamber-separated system as shown in FIG. 5.

Their production process will be described below, following its procedure. To the apparatus shown in FIG. 5, a material gas feeding system (not shown) is connected through gas feed pipes. The material gas cylinders are all purified in an ultra-high purity. As the material gas cylinders, an $H_2$ gas cylinder, an Ar gas cylinder and an He gas cylinder were connected thereto. Al—Si (95:5) and ZnO were used as targets. These are so provided that sputtering can be carried out in vacuum.

As the substrate (100 in FIG. 1), a stainless steel sheet of 0.5 mm thick and 50×50 mm$^2$ was used, which was subjected to ultrasonic cleaning with acetone and isopropanol, followed by hot-air drying. As the sputter power source, the DC power source 325 was connected, and a light-reflecting layer 101 of Al—Si (95:5) was formed on the substrate by DC magnetron sputtering. Then the subsequent processing was carried out.

TABLE A16

| | $SiH_4$ Flow rate (sccm) | $Si_2H_6$ Flow rate (sccm) | $CH_4$ Flow rate (sccm) | $GeH_4$ Flow rate (sccm) | $H_2$ Flow rate (sccm) | $PH_3/H_2$ Flow rate (sccm) | $B_2H_6/H_2$ Flow rate (sccm) | $SiH_4/H_2$ Flow rate (sccm) | Pressure (Torr) | MW power (W/cm$^2$) | RF power (W/cm$^2$) | Base member temp. (°C.) | Layer thickness (nm) |
|---|---|---|---|---|---|---|---|---|---|---|---|---|---|
| RF n-type layer: (203) | 2.0 | — | — | — | 100 | 220 | — | — | 1.3 | — | 0.05 | 350 | 20 |
| RF i-type layer: (251) | — | 4.0 | — | — | 100 | — | — | — | 0.8 | — | 0.008 | 300 | 10 |
| MW i-type layer: (204) | 48 | — | — | 51 | 120 | — | — | — | 0.010 | 0.10 | 0.32 | 370 | 100 |
| RF i-type layer: (261) | — | 4.0 | — | — | 105 | — | — | — | 0.55 | — | 0.008 | 300 | 23 |
| RF p-type layer: (205) | — | — | 0.1 | — | 80 | — | 9 | 2 | 1.8 | — | 0.07 | 300 | 10 |
| RF n-type layer: (206) | 1.1 | — | — | — | 30 | 290 | — | — | 1.2 | — | 0.04 | 300 | 10 |
| RF i-type layer: (252) | — | 4.0 | — | — | 90 | — | — | — | 0.75 | — | 0.008 | 300 | 10 |
| MW i-type layer: (207) | 35 | — | — | 30 | 120 | — | — | — | 0.013 | 0.10 | 0.3 | 350 | 98 |
| RF i-type layer: (262) | — | 3.5 | — | — | 90 | — | — | — | 0.7 | — | 0.008 | 280 | 23 |
| RF p-type layer: (208) | — | — | 0.2 | — | 80 | — | 9 | 2 | 1.7 | — | 0.07 | 260 | 10 |
| RF n-type layer: (209) | 0.8 | — | — | — | 50 | 250 | — | — | 1.05 | — | 0.04 | 230 | 10 |
| RF i-type layer: (210) | — | 2.0 | — | — | 80 | — | — | — | 0.7 | — | 0.007 | 190 | 90 |
| RF p-type layer: (211) | — | — | 0.4 | — | 90 | — | 8 | 2 | 1.6 | — | 0.07 | 170 | 10 |

TABLE A17

| | Temp. drop rate: (°C./sec.) | | | | | | | |
|---|---|---|---|---|---|---|---|---|
| | 2 | 8 | 10 | 40 | 70 | 100 | 120 | 150 |
| Photoelectric conversion efficiency: | C | B | A | A | A | A | B | C |
| Short-circuit current: | C | B | A | A | A | A | B | C |
| Open-end voltage: | C | B | A | A | A | A | B | C |

The above production process will be described below following its procedure with reference to FIG. 5.

(1) A substrate 390 (corresponding to 100 in FIG. 1) having been cleaned was placed on the substrate transporting rail 313 provided in the load chamber 301, and the inside of the load chamber 301 was evacuated by means of a vacuum exhaust pump (not shown) to have a pressure of about $1 \times 10^{-5}$ Torr.

(2) The gate valve 306 was opened to carry the substrate into the transport chamber 302 and deposition chamber 320 previously evacuated by means of a vacuum exhaust pump (not shown). The substrate 390 was set in the manner the back thereof was brought into close contact with the substrate heater 310, and was heated while raising temperature at a rate of 12° C./sec., to bring the substrate temperature to 280° C. Then, the inside of the deposition chamber 320 was evacuated by means of a vacuum exhaust pump (not shown) to have a pressure of about $3\times10^{-6}$ Torr.

(3) 60 sccm of Ar gas was fed into it through the gas feed pipe 324, and a conductance valve (not shown) was operated to control the pressure so as to be 6 mtorr. Electric current was flowed to the toroidal coil 323, and 380 V of a DC power was applied from the sputter power source 325 to cause Ar plasma.

(4) The target shutter 326 was opened, and the light-reflecting layer 101 of Al—Si (95:5) with a layer thickness of 0.8 μm was formed on the surface of the stainless steel sheet, whereupon the target shutter 326 was closed to extinguish the plasma.

(5) The substrate heater 310 was lifted, and the substrate temperature was lowered to 100° C. or below while dropping temperature at a rate of 8° C./sec. in an atmosphere of He gas used as substrate cooling gas. Thereafter, the gate valve 307 was opened to carry the substrate into the transport chamber 303 and deposition chamber 330 previously evacuated by means of a vacuum exhaust pump (not shown). The substrate 390 was set in the manner the back thereof was brought into close contact with the substrate heater 311, and was heated while raising temperature at a rate of 20° C./sec., to bring the substrate temperature to 280° C. Then, the inside of the deposition chamber 330 was evacuated by means of a vacuum exhaust pump (not shown) to have a pressure of about $2\times10^{-6}$ Torr.

(6) 60 sccm of Ar gas was fed into it through the gas feed pipe 334, and a conductance valve (not shown) was operated to control the pressure so as to be 5 mTorr. Electric current was flowed to the toroidal coil 333, and 380 V of a DC power was applied from the sputter power source 335 to cause Ar plasma. Next, the target shutter 336 was opened, and a reflection enhancing layer 102 of ZnO with a layer thickness of 1.3 μm was formed on the surface of the light-reflecting layer 101 of Al—Si (95:5), whereupon the target shutter 336 was closed to extinguish the plasma.

(7) The substrate heater 311 was lifted, and the substrate temperature was lowered to 100° C. or below while dropping temperature at a rate of 8° C./sec. in an atmosphere of He gas used as substrate cooling gas. Thereafter, the gate valve 308 was opened to carry the substrate into the unload chamber 304 previously evacuated by means of a vacuum exhaust pump (not shown).

Thus, the formation of the light-reflecting layer and reflection enhancing layer according to the present Example was completed. Samples having this light-reflecting layer are called "SB1".

Reference Example B1-1

This example is different from Example B1 only in that the substrate temperature was set to 150° C. when the light-reflecting layer 101 of Al—Si (95:5) was formed. Except for this point, the procedure of Example B1 was repeated to produce samples. The samples having the light-reflecting layer of this example are called "SB1-1".

Reference Example B1-2

This example is different from Example B1 only in that the substrate temperature was set to 550° C. when the light-reflecting layer 101 of Al—Si (95:5) was formed. Except for this point, the procedure of Example B1 was repeated to produce samples. The samples having the light-reflecting layer of this example are called "SB1-2".

Reference Example B1-3

This example is different from Example B1 only in that, after the light-reflecting layer 101 of Al—Si (95:5) was formed, the reflection enhancing layer 102 of ZnO was formed without the step of lowering the substrate temperature to 100° C. or below. Except for this point, the procedure of Example B1 was repeated to produce samples. The samples having the light-reflecting layer of this example are called "SB1-3".

Reference Example B1-4

This example is different from Example B1 only in that the substrate temperature was set to 150° C. when the reflection enhancing layer 102 of ZnO was formed. Except this point, the procedure of Example B1 was repeated to produce samples. The samples having the light-reflecting layer of this example are called "SB1-4".

Reference Example B1-5

This example is different from Example B1 only in that the substrate temperature was set to 450° C. when the reflection enhancing layer 102 of ZnO was formed. Except for this point, the procedure of Example B1 was repeated to produce samples. The samples having the light-reflecting layer of this example are called "SB1-5".

For every six kinds of the samples having the above light-reflecting layers, i.e., SB1 and SB1-1 to SB1-5, four samples were prepared. In respect of the light-reflecting layers of these samples, light reflectance was measured in the same manner as in Example A1 and, from the measurements obtained, total reflectance and scattered reflectance were evaluated to obtain the results as shown in Table B1.

The results of total reflectance and scattered reflectance shown in Table B1 are indicated for each sample by standardizing the results of the samples SB1-1 to SB1-5 on the basis of the results of the sample SB1 which are regarded as 1.

TABLE B1

| Sample | Total reflectance | Scattered reflectance |
| --- | --- | --- |
| SB1 | 1.00 | 1.00 |
| SB1-1 | 1.00 | 0.62 |
| SB1-2 | 0.96 | 0.91 |
| SB1-3 | 0.82 | 0.82 |
| SB1-4 | 0.91 | 0.78 |
| SB1-5 | 0.87 | 0.90 |

As is seen from the results shown in Table B1, the sample SB1 having the light-reflecting layer of Example B1 is superior to the samples SB1-1 to SB1-5 having the light-reflecting layers of five Reference Examples B1-1 to B1-5, in all the evaluation results at the same time, that is, has superior reflecting properties.

EXAMPLE B2

This example is different from Example B1 in that the light-reflecting layer was formed using $H_2$ gas as the substrate cooling gas in place of He gas.

In the present Example, like Example B1, the light-reflecting layer 101 and reflection enhancing layer 102 that constitute the device shown in FIG. 1 were formed using the fabrication apparatus of a multi-chamber-separated system as shown in FIG. 5.

Their production process will be described below, following its procedure. To the apparatus shown in FIG. 5, the material gas feeding system (not shown) is connected through gas feed pipes. The material gas cylinders are all purified in an ultra-high purity. As the material gas cylinders, an $H_2$ gas cylinder, an Ar gas cylinder and an He gas cylinder were connected thereto. Al—Si (95:5) and ZnO were used as targets. These are so provided that sputtering can be carried out in vacuum.

As the substrate (100 in FIG. 1), a stainless steel sheet of 0.5 mm thick and 50×50 mm² was used, which was subjected to ultrasonic cleaning with acetone and isopropanol, followed by hot-air drying. As the sputter power source, the DC power source 325 was connected, and a light-reflecting layer 101 of Al—Si (95:5) was formed on the substrate by DC magnetron sputtering. Then the subsequent processing was carried out.

The above production process will be described below following its procedure with reference to FIG. 5.

(1) A substrate 390 (corresponding to 100 in FIG. 1) having been cleaned was placed on the substrate transporting rail 313 provided in the load chamber 301, and the inside of the load chamber 301 was evacuated by means of a vacuum exhaust pump (not shown) to have a pressure of about $1 \times 10^{-5}$ Torr.

(2) The gate valve 306 was opened to carry the substrate into the transport chamber 302 and deposition chamber 320 previously evacuated by means of a vacuum exhaust pump (not shown). The substrate 390 was set in the manner the back thereof was brought into close contact with the substrate heater 310, and was heated while raising temperature at a rate of 23° C./sec., to bring the substrate temperature to 275° C. Then, the inside of the deposition chamber 320 was evacuated by means of a vacuum exhaust pump (not shown) to have a pressure of about $3 \times 10^{-6}$ Torr.

(3) 65 sccm of Ar gas was fed into it through the gas feed pipe 324, and a conductance valve (not shown) was operated to control the pressure so as to be 4 mTorr. Electric current was flowed to the toroidal coil 323, and 405 V of a DC power was applied from the sputter power source 325 to cause Ar plasma.

(4) The target shutter 326 was opened, and the light-reflecting layer 101 of Al—Si (95:5) with a layer thickness of 0.4 μm was formed on the surface of the stainless steel sheet, whereupon the target shutter 326 was closed to extinguish the plasma.

(5) The substrate heater 310 was lifted, and the substrate temperature was lowered to 100° C. or below while dropping temperature at a rate of 17° C./sec. in an atmosphere of $H_2$ gas used as substrate cooling gas. Thereafter, the gate valve 307 was opened to carry the substrate into the transport chamber 303 and deposition chamber 330 previously evacuated by means of a vacuum exhaust pump (not shown). The substrate 390 was set in the manner the back thereof was brought into close contact with the substrate heater 311, and was heated while raising temperature at a rate of 28° C./sec., to bring the substrate temperature to 325° C. Then, the inside of the deposition chamber 330 was evacuated by means of a vacuum exhaust pump (not shown) to have a pressure of about $2 \times 10^{-6}$ Torr.

(6) 65 sccm of Ar gas was fed into it through the gas feed pipe 334, and a conductance valve (not shown) was operated to control the pressure so as to be 4 mTorr. Electric current was flowed to the toroidal coil 333, and 395 V of a DC power was applied from the sputter power source 335 to cause Ar plasma. Next, the target shutter 336 was opened, and a reflection enhancing layer 102 of ZnO with a layer thickness of 2.1 μm was formed on the surface of the light-reflecting layer 101 of Al—Si (95:5), whereupon the target shutter 336 was closed to extinguish the plasma.

(7) The substrate heater 311 was lifted, and the substrate temperature was lowered to 100° C. or below while dropping temperature at a rate of 28° C./sec. in an atmosphere of $H_2$ gas used as substrate cooling gas. Thereafter, the gate valve 308 was opened to carry the substrate into the unload chamber 304 previously evacuated by means of a vacuum exhaust pump (not shown).

Thus, the formation of the light-reflecting layer and reflection enhancing layer according to the present Example was completed. Samples having this light-reflecting layer are called "SB2".

Reference Example B2-1

This example is different from Example B2 in that, after the light-reflecting layer 101 of Al—Si (95:5) was formed, the reflection enhancing layer 102 of ZnO was formed without the step of lowering the substrate temperature to 100° C. or below. Except this point, the procedure of Example B2 was repeated to produce samples. The samples having the light-reflecting layer of this example are called "SB2-1".

For every two kinds of the samples having the above light-reflecting layers, i.e., SB2 and SB2-1, four samples were prepared. In respect of the light-reflecting layers of these samples, light reflectance was measured and, from the measurements obtained, total reflectance and scattered reflectance were evaluated in the same manner as in Example A1 to obtain the results as shown in Table B2.

The results of total reflectance and scattered reflectance shown in Table B2 are indicated for each sample by standardizing the results of the sample SB2-1 on the basis of the results of the sample SB1 which are regarded as 1.

TABLE B2

| Sample | Total reflectance | Scattered reflectance |
|--------|-------------------|----------------------|
| SB2    | 1.00              | 1.00                 |
| SB2-1  | 0.76              | 0.81                 |

As is seen from the results shown in Table B2, the sample SB2 having the light-reflecting layer of Example B2 is superior to the samples SB2-1 of Reference Example B2-1, produced without the step of lowering the substrate temperature to 100° C. or below after the light-reflecting layer was formed, being superior in all the evaluation results at the same time, that is, having superior reflecting properties. It is also seen that $H_2$ gas is effective as the substrate cooling gas.

EXAMPLE B3

This example is different from Example B1 in that the light-reflecting layer was formed using Ar gas as the substrate cooling gas in place of He gas.

Like Example B1, the light-reflecting layer 101 and reflection enhancing layer 102 that constitute the device shown in FIG. 1 were formed using the fabrication apparatus of a multi-chamber-separated system as shown in FIG. 5.

Their production process will be described below, following its procedure. To the apparatus shown in FIG. 5, the material gas feeding system (not shown) is connected through gas feed pipes. The material gas cylinders are all purified in an ultra-high purity. As the material gas cylinders, an Ar gas cylinder, an Ar gas cylinder and an He gas cylinder were connected thereto. Al—Si (95:5) and ZnO were used as targets. These are so provided that sputtering can be carried out in vacuum.

As the substrate (100 in FIG. 1), a stainless steel sheet of 0.5 mm thick and 50×50 mm² was used, which was subjected to ultrasonic cleaning with acetone and isopropanol, followed by hot-air drying. As the sputter power source, the DC power source 325 was connected, and a light-reflecting layer 101 of Al—Si (95:5) was formed on the substrate by DC magnetron sputtering. Then the subsequent processing was carried out.

The above production process will be described below following its procedure with reference to FIG. 5.

(1) A substrate 390 (corresponding to 100 in FIG. 1) having been cleaned was placed on the substrate transporting rail 313 provided in the load chamber 301, and the inside of the load chamber 301 was evacuated by means of a vacuum exhaust pump (not shown) to have a pressure of about 1×10⁻⁵ Torr.

(2) The gate valve 306 was opened to carry the substrate into the transport chamber 302 and deposition chamber 320 previously evacuated by means of a vacuum exhaust pump (not shown). The substrate 390 was set in the manner the back thereof was brought into close contact with the substrate heater 310, and was heated while raising temperature at a rate of 32° C./sec., to bring the substrate temperature to 330° C. Then, the inside of the deposition chamber 320 was evacuated by means of a vacuum exhaust pump (not shown) to have a pressure of about 3×10⁻⁶ Torr.

(3) 35 sccm of Ar gas was fed into it through the gas feed pipe 324, and a conductance valve (not shown) was operated to control the pressure so as to be 4 mTorr. Electric current was flowed to the toroidal coil 323, and 375 V of a DC power was applied from the sputter power source 325 to cause Ar plasma.

(4) The target shutter 326 was opened, and the light-reflecting layer 101 of Al—Si (95:5) with a layer thickness of 0.6 μm was formed on the surface of the stainless steel sheet, whereupon the target shutter 326 was closed to extinguish the plasma.

(5) The substrate heater 310 was lifted, and the substrate temperature was lowered to 100° C. or below while dropping temperature at a rate of 4° C./sec. in an atmosphere of Ar gas used as substrate cooling gas. Thereafter, the gate valve 307 was opened to carry the substrate into the transport chamber 303 and deposition chamber 330 previously evacuated by means of a vacuum exhaust pump (not shown). The substrate 390 was set in the manner the back thereof was brought into close contact with the substrate heater 311, and was heated while raising temperature at a rate of 12° C./sec., to bring the substrate temperature to 335° C. Then, the inside of the deposition chamber 330 was evacuated by means of a vacuum exhaust pump (not shown) to have a pressure of about 3×10⁻⁶ Torr.

(6) 37 sccm of Ar gas was fed into it through the gas feed pipe 334, and a conductance valve (not shown) was operated to control the pressure so as to be 3 mTorr. Electric current was flowed to the toroidal coil 333, and 385 V of a DC power was applied from the sputter power source 335 to cause Ar plasma. Next, the target shutter 336 was opened, and a reflection enhancing layer 102 of ZnO with a layer thickness of 1 μm was formed on the surface of the light-reflecting layer 101 of Al—Si (95:5), whereupon the target shutter 336 was closed to extinguish the plasma.

(7) The substrate heater 311 was lifted, and the substrate temperature was lowered to 100° C. or below while dropping temperature at a rate of 5° C./sec. in an atmosphere of Ar gas used as substrate cooling gas. Thereafter, the gate valve 308 was opened to carry the substrate into the unload chamber 304 previously evacuated by means of a vacuum exhaust pump (not shown).

Thus, the formation of the light-reflecting layer and reflection enhancing layer according to the present Example was completed. Samples having this light-reflecting layer are called "SB3".

Reference Example B3-1

This example is different from Example B3 in that, after the light-reflecting layer 101 of Al—Si (95:5) was formed, the reflection enhancing layer 102 of ZnO was formed without the step of lowering the substrate temperature to 100° C. or below. Except for this point, the procedure of Example B3 was repeated to produce samples. The samples having the light-reflecting layer of this example are called "SB3-1".

For every two kinds of the samples having the above light-reflecting layers, i.e., SB3 and SB3-1, five samples were prepared. In respect of the light-reflecting layers of these samples, light reflectance was measured and, from the measurements obtained, total reflectance and scattered reflectance were evaluated in the same manner as in Example A1 to obtain the results as shown in Table B3.

The results of total reflectance and scattered reflectance shown in Table B3 are indicated for each sample by standardizing the results of the sample SB3-1 on the basis of the results of the sample SB3 which are regarded as 1.

TABLE B3

| Sample | Total reflectance | Scattered reflectance |
|--------|-------------------|----------------------|
| SB3    | 1.00              | 1.00                 |
| SB3-1  | 0.74              | 0.85                 |

As is seen from the results shown in Table B3, the sample SB3 having the light-reflecting layer of Example B3 is superior to the samples SB3-1 of Reference Example B3-1, produced without the step of lowering the substrate temperature to 100° C. or below after the light-reflecting layer was formed, being superior in all the evaluation results at the same time, that is, having superior reflecting properties. It is also seen that Ar gas is effective as the substrate cooling gas.

EXAMPLE B4

This example is different from Example B1 in that the Ar gas used alone when the reflection enhancing layer 102 was formed was replaced with Ar gas and $O_2$ used in combination, to form a reflection enhancing layer.

Like Example B1, the light-reflecting layer 101 and reflection enhancing layer 102 that constitute the device shown in FIG. 1 were formed using the fabrication apparatus of a multi-chamber-separated system as shown in FIG. 5.

Their production process will be described below, following its procedure. To the apparatus shown in FIG. 5, the material gas feeding system (not shown) is connected through gas feed pipes. The material gas cylinders are all purified in an ultra-high purity. As the material gas cylinders, an Ar gas cylinder, an Ar gas cylinder and an He gas cylinder were connected thereto. Al—Si (95:5) and ZnO were used as targets. These are so provided that sputtering can be carried out in vacuum.

As the substrate (100 in FIG. 1), a stainless steel sheet of 0.5 mm thick and 50×50 mm² was used, which was subjected to ultrasonic cleaning with acetone and isopropanol, followed by hot-air drying. As the sputter power source, the DC power source 325 was connected, and a light-reflecting layer 101 of Al—Si (95:5) was formed on the substrate by DC magnetron sputtering. Then the subsequent processing was carried out.

The above production process will be described below following its procedure with reference to FIG. 5.

(1) A substrate 390 (corresponding to 100 in FIG. 1) having been cleaned was placed on the substrate transporting rail 313 provided in the load chamber 301, and the inside of the load chamber 301 was evacuated by means of a vacuum exhaust pump (not shown) to have a pressure of about $1 \times 10^{-5}$ Torr.

(2) The gate valve 306 was opened to carry the substrate into the transport chamber 302 and deposition chamber 320 previously evacuated by means of a vacuum exhaust pump (not shown). The substrate 390 was set in the manner the back thereof was brought into close contact with the substrate heater 310, and was heated while raising temperature at a rate of 10° C./sec., to bring the substrate temperature to 370° C. Then, the inside of the deposition chamber 320 was evacuated by means of a vacuum exhaust pump (not shown) to have a pressure of about $3 \times 10^{-6}$ Torr.

(3) 28 sccm of Ar gas was fed into it through the gas feed pipe 324, and a conductance valve (not shown) was operated to control the pressure so as to be 3 mTorr. Electric current was flowed to the toroidal coil 323, and 375 V of a DC power was applied from the sputter power source 325 to cause Ar plasma.

(4) The target shutter 326 was opened, and the light-reflecting layer 101 of Al—Si (95:5) with a layer thickness of 0.5 μm was formed on the surface of the stainless steel sheet, whereupon the target shutter 326 was closed to extinguish the plasma.

(5) The substrate heater 310 was lifted, and the substrate temperature was lowered to 100° C. or below while dropping temperature at a rate of 14° C./sec. in an atmosphere of Ar gas used as substrate cooling gas. Thereafter, the gate valve 307 was opened to carry the substrate into the transport chamber 303 and deposition chamber 330 previously evacuated by means of a vacuum exhaust pump (not shown). The substrate 390 was set in the manner the back thereof was brought into close contact with the substrate heater 311, and was heated while raising temperature at a rate of 15° C./sec., to bring the substrate temperature to 285° C. Then, the inside of the deposition chamber 330 was evacuated by means of a vacuum exhaust pump (not shown) to have a pressure of about $2 \times 10^{-6}$ Torr.

(6) 65 sccm of Ar gas was fed into it through the gas feed pipe 334, and 65 sccm of $O_2$ gas was also fed. Then, a conductance valve (not shown) was operated to control the pressure so as to be 3 mTorr. Electric current was flowed to the toroidal coil 333, and 365 V of a DC power was applied from the sputter power source 335 to cause Ar/$O_2$ plasma. Next, the target shutter 336 was opened, and a reflection enhancing layer 102 of ZnO with a layer thickness of 1.3 μm was formed on the surface of the light-reflecting layer 101 of Al—Si (95:5), whereupon the target shutter 336 was closed to extinguish the plasma.

(7) The substrate heater 311 was lifted, and the substrate temperature was lowered to 100° C. or below while dropping temperature at a rate of 25° C./sec. in an atmosphere of He gas used as substrate cooling gas. Thereafter, the gate valve 308 was opened to carry the substrate into the unload chamber 304 previously evacuated by means of a vacuum exhaust pump (not shown).

Thus, the formation of the light-reflecting layer and reflection enhancing layer according to the present Example was completed. Samples having this light-reflecting layer are called "SB4".

Reference Example B4-1

This example is different from Example B4 in that, after the light-reflecting layer 101 of Al—Si (95:5) was formed, the reflection enhancing layer 102 of ZnO was formed without the step of lowering the substrate temperature to 100° C. or below. Except this point, the procedure of Example B4 was repeated to produce samples. The samples having the light-reflecting layer of this example are called "SB4-1".

For every two kinds of the samples having the above light-reflecting layers, i.e., SB4 and SB4-1, five samples were prepared. In respect of the light-reflecting layers of these samples, light reflectance was measured and, from the measurements obtained, total reflectance and scattered reflectance were evaluated in the same manner as in Example B1 to obtain the results as shown in Table B4.

The results of total reflectance and scattered reflectance shown in Table B4 are indicated for each sample by standardizing the results of the sample SB4-1 on the basis of the results of the sample SB4 which are regarded as 1.

TABLE B4

| Sample | Total reflectance | Scattered reflectance |
| --- | --- | --- |
| SB4 | 1.00 | 1.00 |
| SB4-1 | 0.81 | 0.80 |

As is seen from the results shown in Table B4, the sample SB4 having the light-reflecting layer of Example B4 is superior to the samples SB4-1 of Reference Example B4-1, produced without the step of lowering the substrate temperature to 100° C. or below after the light-reflecting layer was formed, being superior in all the evaluation results at the same time, that is, having superior reflecting properties.

EXAMPLE B5

In this example, the photovoltaic device as shown in FIG. 1 was produced using a sample (base member) having the light-reflecting layer 101 and reflection enhancing layer 102 formed in the same manner as in Example B1, and using the fabrication apparatus employing a multi-chamber-separated system as shown in FIG. 9.

The apparatus 400 shown in FIG. 9 can carry out both MWPCVD and RFPCVD. Using this apparatus, semiconductor layers (103, 151, 104, 161, 105) and other layers were formed on the reflection enhancing layer 102 according to the layer configuration as shown in FIG. 1.

Their production process will be described below with reference to FIG. 9, following its procedure. To the apparatus shown in FIG. 9, a material gas feeding system (not shown) is connected through gas feed pipes. The material gas cylinders are all purified in an ultra-high purity. As the material gas cylinders, an $SiH_4$ gas cylinder, a $CH_4$ gas cylinder, a $GeH_4$ gas cylinder, an $Si_2H_6$ gas cylinder, a $PH_3/H_2$ (dilution: 0.1%) gas cylinder, a $B_2H_6/H_2$ (dilution: 0.2%) gas cylinder, an $H_2$ gas cylinder, an He gas cylinder, an $SiCl_2H_2$ gas cylinder and an $SiH_4/H_2$ (dilution: 1%) gas cylinder were connected thereto.

(1) A base member 490 (corresponding to 190 in FIG. 1) comprising the substrate and the light-reflecting layer 101 and reflection enhancing layer 102 formed thereon was placed on the base member transporting rail 413 provided in the load chamber 401, and the inside of the load chamber 401 was evacuated by means of a vacuum exhaust pump (not shown) to have a pressure of about $1 \times 10^{-5}$ Torr.

(2) The gate valve 406 was opened to carry the base member into the transport chamber 402 and deposition chamber 417 previously evacuated by means of a vacuum exhaust pump (not shown). The base member 490 was heated in the manner the back thereof was brought into close contact with the base member heater 410. Then, the inside of the deposition chamber 417 was evacuated by means of a vacuum exhaust pump (not shown) to have a pressure of about $1 \times 10^{-5}$ Torr.

(3) After preparation for film formation was completed in this way, $H_2$ gas was fed into the deposition chamber 417 through the gas feed pipe 429. Then, the valves 441, 431 and 430 were opened, and $H_2$ gas flow rate was controlled by means of the mass flow controller 436 so as to be 300 sccm. The pressure inside the deposition chamber 417 was controlled by means of a conductance valve (not shown) so as to be 1.0 Torr. The base member heater 410 was set so as to bring the base member temperature to 350° C.

(4) At the time the base member temperature became stable, an RF n-type layer 103 comprised of pc-Si was formed.

To form the RF n-type layer 103 comprised of pc-Si, the valves 443, 433, 444 and 434 were operated to feed $SiH_4$ gas and $PH_3/H_2$ gas into the deposition chamber 417 through the gas feed pipe 429. Here, $SiH_4$ gas flow rate, $H_2$ gas flow rate and $PH_3/H_2$ gas flow rate were controlled by means of the mass flow controllers 438, 436 and 439 so as to be 2 sccm, 110 sccm and 200 sccm, respectively, and the pressure inside the deposition chamber 417 was controlled so as to be 1.2 Torr.

Next, the power of the RF power source 422 was set to 0.06 W/cm², and RF power was fed to the plasma forming cup 420 to cause glow discharge to take place. Thus, the formation of the RF n-type layer on the base member was started, and an RF n-type layer with a layer thickness of 20 nm was formed, whereupon the RF power source was turned off to stop the glow discharge to complete the formation of the RF n-type layer 103. The $SiH_4$ gas, $PH_3/H_2$ gas and $H_2$ gas were stopped from flowing into the deposition chamber 417, and then the inside of the deposition chamber and the inside of the gas pipe were evacuated to have a pressure of $1 \times 10^{-5}$ Torr.

Subsequently, an RF i-type layer 151 comprised of a-Si, an MW i-type layer 104 comprised of a-SiGe, an RF i-type layer 161 comprised of a-Si and an RF p-type layer 105 comprised of a-SiC were successively formed in the following way.

(5) First, the gate valve 407 was opened to carry the base member into the transport chamber 403 and i-type layer deposition chamber 418 previously evacuated by means of a vacuum exhaust pump (not shown). The base member was heated in the manner the back thereof was brought into close contact with the base member heater 411. Then, the inside of the i-type layer deposition chamber 418 was evacuated by means of a vacuum exhaust pump (not shown) to have a pressure of about $1 \times 10^{-5}$ Torr.

(6) To form the RF i-type layer, the base member heater 411 was set so as to bring the base member temperature to 300° C. At the time the base member was well heated, the valves 464, 454, 450, 463 and 453 were slowly opened to flow $Si_2H_6$ gas and $H_2$ gas into the i-type layer deposition chamber 418 through the gas feed pipe 449. Here, $Si_2H_6$ gas flow rate and $H_2$ gas flow rate were controlled by means of the corresponding mass flow controllers 459 and 458 so as to be 4 sccm and 110 sccm, respectively. The pressure inside the i-type layer deposition chamber 418 was controlled so as to be 0.6 Torr by adjusting the opening of the conductance valve (not shown).

Next, the power of the RF power source 424 was set to 0.007 W/cm² and was applied to the bias rod 428 to cause glow discharge to take place, and the shutter 427 was opened. Thus, the formation of the i-type layer on the RF n-type layer was started, and an i-type layer with a layer thickness of 10 nm was formed, whereupon the RF glow discharge was stopped and the output from the RF power source was stopped to complete the formation of the RF i-type layer 151.

The valves 464, 454, 453 and 450 were closed to stop the $Si_2H_6$ gas and $H_2$ gas from flowing into the i-type layer deposition chamber 418, and then the inside of the i-type layer deposition chamber 418 and the inside of the gas pipe were evacuated to have a pressure of $1 \times 10^{-5}$ Torr.

(7) To form the MW i-type layer, the base member heater 411 was set so as to bring the base member temperature to 380° C. At the time the base member was well heated, the valves 461, 451, 450, 462, 452, 463 and 453 were slowly opened to flow $SiH_4$ gas, $GeH_4$ gas and $H_2$ gas into the i-type layer deposition chamber 418 through the gas feed pipe 449. Here, $SiH_4$ gas flow rate, $GeH_4$ gas flow rate and $H_2$ gas flow rate were controlled by means of the corresponding mass flow controllers 456, 457 and 458 so as to be 47 sccm, 38 sccm and 150 sccm, respectively. The pressure inside the i-type layer deposition chamber 418 was controlled so as to be 6 mTorr by adjusting the opening of the conductance valve (not shown). Next, the power of the RF power source 424 was set to 0.30 W/cm², and was applied to the bias rod 428.

Thereafter, the power of a microwave power source (2.45 GHz) (not shown) was set to 0.08 W/cm², and the microwave power was fed into the i-type layer deposition chamber 418 through the waveguide 426 and microwave introducing window 425 to cause glow discharge to take place, and the shutter 427 was opened. Thus, the formation of the MW i-type layer on the RF i-type layer was started, and an i-type layer with a layer thickness of 0.17 μm was formed, whereupon the microwave glow discharge was stopped and the output from the bias power source 424 was stopped to complete the formation of the MW i-type layer 104. The valves 451, 452 and 453 were closed to stop the $SiH_4$ gas, $GeH_4$ gas and $H_2$ gas from flowing into the i-type layer deposition chamber 418, and then the inside of the i-type layer deposition chamber 418 and the inside of the gas pipe were evacuated to have a pressure of $1 \times 10^{-5}$ Torr.

(8) To form the RF i-type layer, the base member heater 411 was set so as to bring the base member temperature to 250° C. At the time the base member was well heated, the valves 464, 454, 450, 463 and 453 were slowly opened to flow $Si_2H_6$ gas and $H_2$ gas into the i-type layer deposition chamber 418 through the gas feed pipe 449. Here, $Si_2H_6$ gas flow rate and $H_2$ gas flow rate were controlled by means of the corresponding mass flow controllers 459 and 458 so as to be 3 sccm and 85 sccm, respectively. The pressure inside the i-type layer deposition chamber 418 was controlled so as to be 0.7 Torr by adjusting the opening of the conductance valve (not shown).

Next, the power of the RF power source 424 was set to 0.007 W/cm² and was applied to the bias rod 428 to cause glow discharge to take place, and the shutter 427 was opened. Thus, the formation of the RF i-type layer on the MW i-type layer was started, and an i-type layer with a layer thickness of 20 nm was formed, whereupon the RF glow discharge was stopped and the output from the RF power source 424 was stopped to complete the formation of the RF i-type layer 161. The valves 464, 454, 453 and 450 were closed to stop the $Si_2H_6$ gas and $H_2$ gas from flowing into the i-type layer deposition chamber 418, and then the inside of the i-type layer deposition chamber 418 and the inside of the gas pipe were evacuated to have a pressure of $1\times10^{-5}$ Torr.

(9) To form the RF p-type layer 105 comprised of a-SiC, first, the gate valve 408 was opened to carry the base member into the transport chamber 404 and p-type layer deposition chamber 419 previously evacuated by means of a vacuum exhaust pump (not shown). The base member was heated in the manner the back thereof was brought into close contact with the base member heater 412. Then, the inside of the p-type layer deposition chamber 419 was evacuated by means of the vacuum exhaust pump (not shown) to have a pressure of about $1\times10^{-5}$ Torr.

The base member heater 412 was set so as to bring the base member temperature to 230° C. At the time the base member temperature became stable, the valves 481, 471, 470, 482, 472, 483, 473, 484 and 474 were operated to feed $H_2$ gas, $SiH_4/H_2$ gas, $B_2H_6/H_2$ gas and $CH_4$ gas into the deposition chamber 419 through the gas feed pipe 469. Here, $H_2$ gas flow rate, $SiH_4/H_2$ gas flow rate, $B_2H_6/H_2$ gas flow rate and $CH_4$ gas flow rate were controlled by means of the mass flow controllers 476, 477, 478 and 479 so as to be 60 sccm, 2 sccm, 10 sccm and 0.3 sccm, respectively, and the pressure inside the deposition chamber 419 was controlled so as to be 1.8 Torr by adjusting the opening of the conductance valve (not shown).

Next, the power of the RF power source 423 was set to 0.07 $W/cm^2$, and RF power was fed to the plasma forming cup 421 to cause glow discharge to take place. Thus, the formation of the RF p-type layer on the i-type layer was started, and an RF p-type layer with a layer thickness of 10 nm was formed, whereupon the RF power source was turned off to stop the glow discharge to complete the formation of the RF p-type layer 105.

The valves 472, 482, 473, 483, 474, 484, 471, 481 and 470 were closed to stop the $SiH_4/H_2$ gas, $B_2H_6/H_2$ gas, $CH_4$ gas and $H_2$ gas from flowing into the p-type layer deposition chamber 419, and then the inside of the p-type layer deposition chamber 419 and the inside of the gas pipe were evacuated to have a pressure of $1\times10^{-5}$ Torr.

(10) The gate valve 409 was opened to carry the base member into the unload chamber 405 previously evacuated by means of a vacuum exhaust pump (not shown), and a leak valve (not shown) was opened to let gases escape from the unload chamber 405.

(11) On the RF p-type layer 105, ITO was deposited by vacuum deposition in a layer thickness of 70 nm as the transparent conductive layer 112.

(12) On the transparent conductive layer 112, a mask with a comb-shaped opening was placed, and the comb-shaped collector electrode 113 with a flat structure, comprised of Cr(40 nm)/Ag(1,000 nm)/Cr(40 nm) was deposited by vacuum deposition.

Thus, the fabrication of the photovoltaic device of the present Example was completed. This photovoltaic device is herein called SCB5.

Reference Example B5-1

This example is different from Example B5 in that the sample (base member) of Reference Example B1-3 was used, i.e., the example in which, after the light-reflecting layer 101 of Al—Si (95:5) was formed, the reflection enhancing layer 102 of ZnO was formed without the step of lowering the substrate temperature to 100° C. or below. Except this point, the procedure of Example B5 was repeated to produce photovoltaic devices. Samples of the photovoltaic device of this example are called "SCB5-1".

For every two kinds of the photovoltaic devices, i.e., SCB5 and SCB5-1, six devices were prepared. In respect of these photovoltaic devices, characteristics of initial photoelectric conversion efficiency (photo electromotive force/incident light intensity), stated specifically, photoelectric conversion efficiency, short-circuit current and open-end voltage were evaluated in the same manner as in Example A5 to obtain the results as shown in Table B5.

The results of evaluation on the characteristics of initial photoelectric conversion efficiency shown in Table B5 are indicated by standardizing the results of the photovoltaic device SCB5-1 on the basis of the results of the photovoltaic device SCB5 which are regarded as 1.

TABLE B5

| Sample | Photoelectric conversion efficiency | Short-circuit current | Open-end voltage |
|---|---|---|---|
| SCB5 | 1.00 | 1.00 | 1.00 |
| SCB5-1 | 0.88 | 0.94 | 0.94 |

As is seen from the results shown in Table B5, the photovoltaic device SCB5 having the light-reflecting layer and reflection enhancing layer obtained in Example B5 by the process of the present invention is superior to the photovoltaic devices SCB5-1 of Reference Example B5-1 in all the characteristics of initial photoelectric conversion efficiency at the same time.

EXAMPLE B6

In the present Example, the photovoltaic device as shown in FIG. 1 was produced using a base member having the light-reflecting layer 101 and reflection enhancing layer 102 formed in the same manner as in Example B1, and using the fabrication apparatus employing a multi-chamber-separated system as shown in FIG. 9.

The apparatus 400 shown in FIG. 9 can carry out both MWPCVD and RFPCVD. Using this apparatus, semiconductor layers (103, 151, 104, 161, 105) and other layers were formed on the reflection enhancing layer 102 according to the layer configuration as shown in FIG. 1.

Their production process will be described below with reference to FIG. 9, following its procedure. To the apparatus shown in FIG. 9, a material gas feeding system (not shown) is connected through gas feed pipes. The material gas cylinders are all purified in an ultra-high purity. As the material gas cylinders, an $SiH_4$ gas cylinder, a $CH_4$ gas cylinder, a $GeH_4$ gas cylinder, an $Si_2H_6$ gas cylinder, a $PH_3/H_2$ (dilution: 0.1%) gas cylinder, a $B_2H_6/H_2$ (dilution: 0.2%) gas cylinder, an $H_2$ gas cylinder, an He gas cylinder, an $SiCl_2H_2$ gas cylinder and an $SiH_4/H_2$ (dilution: 1%) gas cylinder were connected thereto.

(1) The base member 490 (corresponding to 190 in FIG. 1) comprising the substrate and the light-reflecting layer 101 and reflection enhancing layer 102 formed thereon, obtained in Example B4 was placed on the base member transporting rail 413 provided in the load chamber 401, and the inside of the load chamber 401 was evacuated by means of a vacuum exhaust pump (not shown) to have a pressure of about $1\times10^{-5}$ Torr.

(2) The gate valve 406 was opened to carry the base member into the transport chamber 402 and deposition chamber 417 previously evacuated by means of a vacuum exhaust pump (not shown). The base member 490 was heated in the manner the back thereof was brought into close contact with the base member heater 410. Then, the inside of the deposition chamber 417 was evacuated by means of a vacuum exhaust pump (not shown) to have a pressure of about $1×10^{-5}$ Torr.

(3) After preparation for film formation was completed in this way, $H_2$ gas was fed into the deposition chamber 417 through the gas feed pipe 429. Then, the valves 441, 431 and 430 were opened, and $H_2$ gas flow rate was controlled by means of the mass flow controller 436 so as to be 300 sccm. The pressure inside the deposition chamber 417 was controlled by means of a conductance valve (not shown) so as to be 1.2 Torr. The base member heater 410 was set so as to bring the base member temperature to 350° C.

(4) At the time the base member temperature became stable, an RF n-type layer 103 comprised of $\mu$c-Si was formed.

To form the RF n-type layer 103 comprised of $\mu$c-Si, the valves 443, 433, 444 and 434 were operated to feed $SiH_4$ gas and $PH_3/H_2$ gas into the deposition chamber 417 through the gas feed pipe 429. Here, $SiH_4$ gas flow rate, $H_2$ gas flow rate and $PH_3/H_2$ gas flow rate were controlled by means of the mass flow controllers 438, 436 and 439 so as to be 2 sccm, 120 sccm and 210 sccm, respectively, and the pressure inside the deposition chamber 417 was controlled so as to be 1.2 Torr.

Next, the power of the RF power source 422 was set to 0.06 W/cm$^2$, and RF power was fed to the plasma forming cup 420 to cause glow discharge to take place. Thus, the formation of the RF n-type layer on the base member was started, and an RF n-type layer with a layer thickness of 20 nm was formed, whereupon the RF power source was turned off to stop the glow discharge to complete the formation of the RF n-type layer 103. The $SiH_4$ gas, $PH_3/H_2$ gas and $H_2$ gas were stopped from flowing into the deposition chamber 417, and then the inside of the deposition chamber and the inside of the gas pipe were evacuated to have a pressure of $1×10^{-5}$ Torr.

Subsequently, an RF i-type layer 151 comprised of a-Si, an MW i-type layer 104 comprised of a-SiGe, an RF i-type layer 161 comprised of a-Si and an RF p-type layer 105 comprised of a-SiC were successively formed in the following way (see the layer configuration shown in FIG. 1).

(5) First, the gate valve 407 was opened to carry the base member into the transport chamber 403 and i-type layer deposition chamber 418 previously evacuated by means of a vacuum exhaust pump (not shown). The base member was heated in the manner the back thereof was brought into close contact with the base member heater 411. Then, the inside of the i-type layer deposition chamber 418 was evacuated by means of a vacuum exhaust pump (not shown) to have a pressure of about $1×10^{-5}$ Torr.

(6) To form the RF i-type layer, the base member heater 411 was set so as to bring the base member temperature to 300° C. At the time the base member was well heated, the valves 464, 454, 450, 463 and 453 were slowly opened to flow $Si_2H_6$ gas and $H_2$ gas into the i-type layer deposition chamber 418 through the gas feed pipe 449. Here, $Si_2H_6$ gas flow rate and $H_2$ gas flow rate were controlled by means of the corresponding mass flow controllers 459 and 458 so as to be 4.1 sccm and 115 scam, respectively. The pressure inside the i-type layer deposition chamber 418 was controlled so as to be 0.6 Torr by adjusting the opening of the conductance valve (not shown).

Next, the power of the RF power source 424 was set to 0.007 W/cm$^2$ and was applied to the bias rod 428 to cause glow discharge to take place, and the shutter 427 was opened. Thus, the formation of the i-type layer on the RF n-type layer on the i-type layer was started, and an i-type layer with a layer thickness of 10 nm was formed, whereupon the RF glow discharge was stopped and the output from the RF power source was stopped to complete the formation of the RF i-type layer 151.

The valves 464, 454, 453 and 450 were closed to stop the $Si_2H_6$ gas and $H_2$ gas from flowing into the i-type layer deposition chamber 418, and then the inside of the i-type layer deposition chamber 418 and the inside of the gas pipe were evacuated to have a pressure of $1×10^{-5}$ Torr.

(7) To form the MW i-type layer, the base member heater 411 was set so as to bring the base member temperature to 380° C. At the time the base member was well heated, the valves 461, 451, 450, 462, 452, 463 and 453 were slowly opened to flow $SiH_4$ gas, $GeH_4$ gas and $H_2$ gas into the i-type layer deposition chamber 418 through the gas feed pipe 449. Here, $SiH_4$ gas flow rate, $GeH_4$ gas flow rate and $H_2$ gas flow rate were controlled by means of the corresponding mass flow controllers 456, 457 and 458 so as to be 52 sccm, 45 sccm and 250 sccm, respectively. The pressure inside the i-type layer deposition chamber 418 was controlled so as to be 6 mTorr by adjusting the opening of the conductance valve (not shown). Next, the power of the RF power source 424 was set to 0.31 W/cm$^2$, and was applied to the bias rod 428.

Thereafter, the power of a microwave power source (2.45 GHz) (not shown) was set to 0.10 W/cm$^2$, and the microwave power was fed into the i-type layer deposition chamber 418 through the waveguide 426 and microwave introducing window 425 to cause glow discharge to take place, and the shutter 427 was opened. Thus, the formation of the MW i-type layer on the RF i-type layer was started, and an i-type layer with a layer thickness of 0.17 $\mu$m was formed, whereupon the microwave glow discharge was stopped and the output from the bias power source 424 was stopped to complete the formation of the MW i-type layer 104. The valves 451, 452 and 453 were closed to stop the $SiH_4$ gas, $GeH_4$ gas and $H_2$ gas from flowing into the i-type layer deposition chamber 418, and then the inside of the i-type layer deposition chamber 418 and the inside of the gas pipe were evacuated to have a pressure of $1×10^{-5}$ Torr.

(8) To form the RF i-type layer, the base member heater 411 was set so as to bring the base member temperature to 250° C. At the time the base member was well heated, the valves 464, 454, 450, 463 and 453 were slowly opened to flow $Si_2H_6$ gas and $H_2$ gas into the i-type layer deposition chamber 418 through the gas feed pipe 449. Here, $Si_2H_6$ gas flow rate and $H_2$ gas flow rate were controlled by means of the corresponding mass flow controllers 459 and 458 so as to be 3.5 sccm and 110 sccm, respectively. The pressure inside the i-type layer deposition chamber 418 was controlled so as to be 0.6 Torr by adjusting the opening of the conductance valve (not shown).

Next, the power of the RF power source 424 was set to 0.007 W/cm$^2$ and was applied to the bias rod 428 to cause glow discharge to take place, and the shutter 427 was opened. Thus, the formation of the RF i-type layer on the MW i-type layer was started, and an i-type layer with a layer thickness of 20 nm was formed, whereupon the RF glow discharge was stopped and the output from the RF power source 424 was stopped to complete the formation of the RF i-type layer 161. The valves 464, 454, 453 and 450 were closed to stop the Si$_2$H$_6$ gas and H$_2$ gas from flowing into the i-type layer deposition chamber 418, and then the inside of the i-type layer deposition chamber 418 and the inside of the gas pipe were evacuated to have a pressure of 1×10$^{-5}$ Torr.

(9) To form the RF p-type layer 105 comprised of a-SiC, first, the gate valve 408 was opened to carry the base member into the transport chamber 404 and p-type layer deposition chamber 419 previously evacuated by means of a vacuum exhaust pump (not shown). The base member was heated in the manner the back thereof was brought into close contact with the base member heater 412. Then, the inside of the p-type layer deposition chamber 419 was evacuated by means of the vacuum exhaust pump (not shown) to have a pressure of about 1×10$^{-5}$ Torr.

The base member heater 412 was set so as to bring the base member temperature to 230° C. At the time the base member temperature became stable, the valves 481, 471, 470, 482, 472, 483, 473, 484 and 474 were operated to feed H$_2$ gas, SiH$_4$/H$_2$ gas, B$_2$H$_6$/H$_2$ gas and CH$_4$ gas into the deposition chamber 419 through the gas feed pipe 469. Here, H$_2$ gas flow rate, SiH$_4$/H$_2$ gas flow rate, B$_2$H$_6$/H$_2$ gas flow rate and CH$_4$ gas flow rate were controlled by means of the mass flow controllers 476, 477, 478 and 479 so as to be 65 sccm, 2 sccm, 10 sccm and 0.2 sccm, respectively, and the pressure inside the deposition chamber 419 was controlled so as to be 2.0 Torr by adjusting the opening of the conductance valve (not shown).

Next, the power of the RF power source 423 was set to 0.07 W/cm$^2$, and RF power was fed to the plasma forming cup 421 to cause glow discharge to take place. Thus, the formation of the RF p-type layer on the i-type layer was started, and an RF p-type layer with a layer thickness of 10 nm was formed, whereupon the RF power source was turned off to stop the glow discharge to complete the formation of the RF p-type layer 105.

The valves 472, 482, 473, 483, 474, 484, 471, 481 and 470 were closed to stop the SiH$_4$/H$_2$ gas, B$_2$H$_6$/H$_2$ gas, CH$_4$ gas and H$_2$ gas from flowing into the p-type layer deposition chamber 419, and then the inside of the p-type layer deposition chamber 419 and the inside of the gas pipe were evacuated to have a pressure of 1×10$^{-5}$ Torr.

(10) The gate valve 409 was opened to carry the base member into the unload chamber 405 previously evacuated by means of a vacuum exhaust pump (not shown), and a leak valve (not shown) was opened to let gases escape from the unload chamber 405.

(11) On the RF p-type layer 105, ITO was deposited by vacuum deposition in a layer thickness of 70 nm as the transparent conductive layer 112.

(12) On the transparent conductive layer 112, a mask with a comb-shaped opening was placed, and the comb-shaped collector electrode 113 with a flat structure, comprised of Cr(40 nm)/Ag(1,000 nm)/Cr(40 nm) was deposited by vacuum deposition.

Thus, the fabrication of the photovoltaic device of the present Example was completed. This photovoltaic device is herein called SCB6.

Reference Example B6-1

This example is different from Example B6 in that the sample (base member) of Reference Example B4-1 was used, i.e., the example in which, after the light-reflecting layer 101 of Al—Si (95:5) was formed, the reflection enhancing layer 102 of ZnO was formed without the step of lowering the substrate temperature to 100° C. or below. Except for this point, the procedure of Example B6 was repeated to produce photovoltaic devices. The photovoltaic devices of this example are called "SCB6-1".

For every two kinds of the photovoltaic devices, i.e., SCB6 and SCB6-1, five devices were prepared. In respect of these photovoltaic devices, characteristics of initial photoelectric conversion efficiency (photo electromotive force/ incident light intensity), stated specifically, photoelectric conversion efficiency, short-circuit current and open-end voltage were evaluated in the same manner as in Example A5 to obtain the results as shown in Table B6.

The results of evaluation on the characteristics of initial photoelectric conversion efficiency as shown in Table B6 are indicated by standardizing the results of the photovoltaic device SCB6-1 on the basis of the results of the photovoltaic device SCB6 which are regarded as 1.

TABLE B6

| Sample | Photoelectric conversion efficiency | Short-circuit current | Open-end voltage |
|---|---|---|---|
| SCB6 | 1.00 | 1.00 | 1.00 |
| SCB6-1 | 0.86 | 0.92 | 0.93 |

As is seen from the results shown in Table B6, the photovoltaic device SCB6 having the light-reflecting layer and reflection enhancing layer obtained in Example B6 by the process of the present invention is superior to the photovoltaic devices SCB6-1 of Reference Example B6-1 in all the characteristics of initial photoelectric conversion efficiency at the same time.

EXAMPLE B7

In the present Example, the base member 290 having the light-reflecting layer in the device structure as shown in FIG. 3 (i.e., the base member comprising the substrate 200 and the layers of light-reflecting layer 201 and reflection enhancing layer 202 formed on the substrate) was produced using the fabrication apparatus of a multi-chamber-separated system as shown in FIG. 5.

The process of forming the light-reflecting layer and reflection enhancing layer having the configuration as shown in FIG. 3 will be described below with reference to FIG. 5.

To the apparatus shown in FIG. 5, a material gas feeding system (not shown) is connected through gas feed pipes. The material gas cylinders are all purified in an ultra-high purity. As the material gas cylinders, an H$_2$ gas cylinder, an Ar gas cylinder and an He gas cylinder were connected thereto. Al—Si (95:5) and ZnO were used as targets. These are so provided that sputtering can be carried out in vacuum.

As the substrate (200 in FIG. 3), a stainless steel sheet of 0.5 mm thick and 50×50 mm$^2$ was used, which was subjected to ultrasonic cleaning with acetone and isopropanol, followed by hot-air drying. As the sputter power source, the DC power source 325 was connected, and a light-reflecting layer 101 of Al—Si (95:5) was formed on the substrate by DC magnetron sputtering. Then the subsequent processing was carried out.

The process of forming the light-reflecting layer and reflection enhancing layer will be described below following its procedure.

(1) A substrate 390 (corresponding to 200 in FIG. 3) having been cleaned was placed on the substrate transporting rail 313 provided in the load chamber 301, and the inside of the load chamber 301 was evacuated by means of a vacuum exhaust pump (not shown) to have a pressure of about $1 \times 10^{-5}$ Torr.

(2) The gate valve 306 was opened to carry the substrate into the transport chamber 302 and deposition chamber 320 previously evacuated by means of a vacuum exhaust pump (not shown). The substrate 390 was set in the manner the back thereof was brought into close contact with the substrate heater 310, and was heated while raising temperature at a rate of 25° C./sec., to bring the substrate temperature to 300° C. Then, the inside of the deposition chamber 320 was evacuated by means of a vacuum exhaust pump (not shown) to have a pressure of about $3 \times 10^{-6}$ Torr.

(3) 55 sccm of Ar gas was fed into it through the gas feed pipe 324, and a conductance valve (not shown) was operated to control the pressure so as to be 3 mTorr. Electric current was flowed to the toroidal coil 323, and 390 V of a DC power was applied from the sputter power source 325 to cause Ar plasma.

(4) The target shutter 326 was opened, and the light-reflecting layer 201 of Al—Si (95:5) with a layer thickness of 0.6 μm was formed on the surface of the stainless steel sheet, whereupon the target shutter 326 was closed to extinguish the plasma.

(5) The substrate heater 310 was lifted, and the substrate temperature was lowered to 100° C. or below while dropping temperature at a rate of 23° C./sec. in an atmosphere of He gas used as substrate cooling gas. Thereafter, the gate valve 307 was opened to carry the substrate into the transport chamber 303 and deposition chamber 330 previously evacuated by means of a vacuum exhaust pump (not shown). The substrate 390 was set in the manner the back thereof was brought into close contact with the substrate heater 311, and was heated while raising temperature at a rate of 25° C./sec., to bring the substrate temperature to 310° C. Then, the inside of the deposition chamber 330 was evacuated by means of a vacuum exhaust pump (not shown) to have a pressure of about $2 \times 10^{-6}$ Torr.

(6) 45 sccm of Ar gas was fed into it through the gas feed pipe 334, and a conductance valve (not shown) was operated to control the pressure so as to be 3 mTorr. Electric current was flowed to the toroidal coil 333, and 385 V of a DC power was applied from the sputter power source 335 to cause Ar plasma. Next, the target shutter 336 was opened, and a reflection enhancing layer 202 of ZnO with a layer thickness of 1.5 μm was formed on the surface of the light-reflecting layer 201 of Al—Si (95:5), whereupon the target shutter 336 was closed to extinguish the plasma.

(7) The substrate heater 311 was lifted, and the substrate temperature was lowered to 100° C. or below while dropping temperature at a rate of 28° C./sec. in an atmosphere of He gas used as substrate cooling gas. Thereafter, the gate valve 308 was opened to carry the substrate into the unload chamber 304 previously evacuated by means of a vacuum exhaust pump (not shown).

Thus, the formation of the light-reflecting layer and reflection enhancing layer according to the present Example was completed.

Subsequently, using the base member having the light-reflecting layer and reflection enhancing layer formed through the steps (1) to (7) in Example B7, the triple type photovoltaic device as shown in FIG. 3 was produced using the apparatus employing a multi-chamber-separated system as shown in FIG. 9.

In the following, the process for producing the photovoltaic device will be described.

(8) The base member (490 in FIG. 9) comprising the substrate and the light-reflecting layer 201 and reflection enhancing layer 202 formed thereon was placed on the base member transporting rail 413 provided in the load chamber 401, and the inside of the load chamber 401 was evacuated by means of a vacuum exhaust pump (not shown) to have a pressure of about $1 \times 10^{-5}$ Torr.

(9) The gate valve 406 was opened to carry the base member into the transport chamber 402 and deposition chamber 417 previously evacuated by means of a vacuum exhaust pump (not shown). The base member 490 was heated in the manner the back thereof was brought into close contact with the base member heater 410. Then, the inside of the deposition chamber 417 was evacuated by means of a vacuum exhaust pump (not shown) to have a pressure of about $1 \times 10^{-5}$ Torr.

(10) After preparation for film formation was completed in this way, $H_2$ gas was fed into the deposition chamber 417 through the gas feed pipe 429. Then, the valves 441, 431 and 430 were opened, and $H_2$ gas flow rate was controlled by means of the mass flow controller 436 so as to be 500 sccm. The pressure inside the deposition chamber 417 was controlled by means of a conductance valve (not shown) so as to be 1.3 Torr. The base member heater 410 was set so as to bring the base member temperature to 350° C.

(11) At the time the base member temperature became stable, an RF n-type layer 203 comprised of pc-Si was formed.

To form the RF n-type layer 203 comprised of pc-Si, the valves 443, 433, 444 and 434 were operated to feed $SiH_4$ gas and $PH_3/H_2$ gas into the deposition chamber 417 through the gas feed pipe 429. Here, $SiH_4$ gas flow rate, $H_2$ gas flow rate and $PH_3/H_2$ gas flow rate were controlled by means of the mass flow controllers 438, 436 and 439 so as to be 2 sccm, 110 sccm and 200 sccm, respectively, and the pressure inside the deposition chamber 417 was controlled so as to be 1.2 Torr.

Next, the power of the RF power source 422 was set to 0.05 W/cm², and RF power was fed to the plasma forming cup 420 to cause glow discharge to take place. Thus, the formation of the RF n-type layer on the base member was started, and an RF n-type layer with a layer thickness of 20 nm was formed, whereupon the RF power source was turned off to stop the glow discharge to complete the formation of the RF n-type layer 203. The $SiH_4$ gas, $PH_3/H_2$ gas and $H_2$ gas were stopped from flowing into the deposition chamber 417, and then the inside of the deposition chamber and the inside of the gas pipe were evacuated to have a pressure of $1 \times 10^{-5}$ Torr.

(12) Subsequently, following the procedure in Example B5, an RF i-type layer 251 comprised of a-Si (corresponding to the RF i-type layer 151), an MW i-type layer 204 comprised of a-SiGe (corresponding to the MW i-type layer 104), an RF i-type layer 261 comprised of a-Si (corresponding to the RF i-type layer 161), an RF p-type layer 205 comprised of a-SiC (corresponding to the RF p-type layer 105), an RF n-type layer 206 comprised of μc-Si (corresponding to the RF n-type layer 103), an RF i-type layer 252 comprised of a-Si (corresponding to the RF i-type layer 151), an MW i-type layer 207 comprised of a-SiGe (corresponding to the MW i-type layer 104), an RF i-type layer 262 comprised of a-Si (corresponding to the RF i-type layer 161), an RF p-type layer 208 comprised of a-SiC (corresponding to the RF p-type layer 105), an RF n-type layer 209 comprised of μc-Si (corresponding to the RF n-type layer 103), an RF i-type layer 210 comprised of a-Si (corresponding to the RF i-type layer 161), and an RF p-type layer 211 comprised of a-SiC (corresponding to the RF p-type layer 105) were successively formed.

(13) On the RF p-type layer 211, ITO was deposited by vacuum deposition in a layer thickness of 70 nm as the transparent conductive layer 212.

(14) On the transparent conductive layer 212, a mask with a comb-shaped opening was placed, and the comb-shaped collector electrode 213 with a flat structure, comprised of Cr(40 nm)/Ag(1,000 nm)/Cr(40 nm) was deposited by vacuum deposition.

Thus, the fabrication of the photovoltaic device of the present Example was completed. This photovoltaic device is herein called SCB7. Conditions for forming the respective semiconductor layers RF n-type layers, RF i-type layers, MW i-type layers and RF p-type layers are shown together in Table B7.

To examine the photo-deterioration characteristics, photoelectric conversion efficiency was evaluated after photovoltaic devices having a temperature of 50° C. were irradiated by light for 1,000 hours under 1 sun of 100 mW/cm$^2$.

The results of evaluation on the characteristics of initial photoelectric conversion efficiency as shown in Table B8 are indicated by standardizing the results of the photovoltaic device SCB7-1 on the basis of the results of the photovoltaic device SCB7 which are regarded as 1.

TABLE B7

| | $SiH_4$ Flow rate (sccm) | $Si_2H_6$ Flow rate (sccm) | $CH_4$ Flow rate (sccm) | $GeH_4$ Flow rate (sccm) | $H_2$ Flow rate (sccm) | $PH_3/H_2$ Flow rate (sccm) | $B_2H_6/H_2$ Flow rate (sccm) | $SiH_4/H_2$ Flow rate (sccm) | Pressure (Torr) | MW power (W/cm$^2$) | RF power (W/cm$^2$) | Base member temp. (°C.) | Layer thickness (nm) |
|---|---|---|---|---|---|---|---|---|---|---|---|---|---|
| RF n-type layer: (203) | 2.0 | — | — | — | 100 | 220 | — | — | 1.3 | — | 0.05 | 350 | 20 |
| RF i-type layer: (251) | — | 4.0 | — | — | 100 | — | — | — | 0.8 | — | 0.008 | 300 | 10 |
| MW i-type layer: (204) | 39 | — | — | 41 | 100 | — | — | — | 0.010 | 0.11 | 0.31 | 370 | 110 |
| RF i-type layer: (261) | — | 4.0 | — | — | 105 | — | — | — | 0.75 | — | 0.008 | 300 | 23 |
| RF p-type layer: (205) | — | — | 0.1 | — | 80 | — | 9 | 2 | 1.9 | — | 0.07 | 300 | 10 |
| RF n-type layer: (206) | 1.1 | — | — | — | 40 | 290 | — | — | 1.1 | — | 0.04 | 300 | 10 |
| RF i-type layer: (252) | — | 4.0 | — | — | 100 | — | — | — | 0.75 | — | 0.008 | 300 | 10 |
| MW i-type layer: (207) | 35 | — | — | 28 | 120 | — | — | — | 0.012 | 0.12 | 0.3 | 350 | 100 |
| RF i-type layer: (262) | — | 3.5 | — | — | 90 | — | — | — | 0.7 | — | 0.008 | 280 | 23 |
| RF p-type layer: (208) | — | — | 0.2 | — | 80 | — | 9 | 2 | 1.7 | — | 0.07 | 260 | 10 |
| RF n-type layer: (209) | 0.8 | — | — | — | 50 | 250 | — | — | 1.05 | — | 0.04 | 230 | 10 |
| RF i-type layer: (210) | — | 1.5 | — | — | 80 | — | — | — | 0.8 | — | 0.007 | 190 | 90 |
| RF p-type layer: (211) | — | — | 0.4 | — | 90 | — | 8 | 2 | 1.6 | — | 0.07 | 170 | 10 |

Reference Example B7-1

This example is different from Example B7 in that a base member was used in which, after the light-reflecting layer 201 of Al—Si (95:5) was formed, the reflection enhancing layer 202 of ZnO was formed without the step of lowering the substrate temperature to 100° C. or below. Except this point, the procedure of Example B7 was repeated to produce photovoltaic devices. The photovoltaic devices of this example are called "SCB7-1".

For every two kinds of the photovoltaic devices, i.e., SCB7 and SCB7-1, six devices were prepared. In respect of these photovoltaic devices, characteristics of initial photoelectric conversion efficiency (photo electromotive force/incident light intensity), stated specifically, photoelectric conversion efficiency and short-circuit current, were evaluated in the same manner as in Example A5. Photo-deterioration characteristics were also evaluated in the manner as described below. The results obtained are shown in Table B8.

TABLE B8

| Sample | Photoelectric conversion efficiency | Short-circuit current | Photo-deterioration characteristics |
|---|---|---|---|
| SCB7 | 1.00 | 1.00 | 1.00 |
| SCB7-1 | 0.82 | 0.89 | 0.95 |

As is seen from the results shown in Table B8, the photovoltaic device SCB7 having the light-reflecting layer and reflection enhancing layer obtained in Example B7 by the process of the present invention is superior to the photovoltaic devices SCB7-1 of Reference Example B7-1 in all the characteristics of initial photoelectric conversion efficiency and photo-deterioration characteristics at the same time.

EXAMPLE B8

In the present Example, the triple type photovoltaic device as shown in FIG. 3 was produced using the fabrication apparatus employing a roll-to-roll system as shown in FIGS. 7 and 10.

As the substrate, a belt-like stainless steel sheet of 300 m long, 30 cm wide and 0.2 mm thick was used.

The process of forming the light-reflecting layer and reflection enhancing layer will be described below.

The apparatus for continuously forming the light-reflecting layer as shown in FIG. 7 is successively provided with the substrate feed-out chamber 610, a plurality of deposition chambers 611 to 613 and the substrate wind-up chamber 614, which are connected through separating paths 615, 616, 617 and 618 between them. Each deposition chamber has an exhaust vent, through which the inside thereof can be evacuated. The belt-like substrate 621 is passed through these deposition chambers and separating paths after it is sent out of the substrate feed-out chamber, and is wound up in the substrate wind-up chamber. At the same time, the apparatus is so designed that gases can be fed into the respective deposition chambers and separating paths through their gas inlets, gases can be drawn out through the respective exhaust vents and the respective layers can be formed.

The light-reflecting layer of Al—Si (95:5) is formed in the deposition chamber 612, and the reflection enhancing layer of ZnO in the deposition chamber 613. The deposition chambers are respectively provided in their insides with the halogen lamp heaters 640, 641 and 642 for heating the substrate on the back thereof, and the substrate is temperature-raised or heated to the stated temperature in each deposition chamber. The separating paths 617 and 618 have also the function to lower temperature so that the substrate temperature is dropped at a given rate after the semiconductor layers are respectively formed in the deposition chambers 612 and 613. In particular, in the present Example, the substrate temperature is lowered to 100° C. or below in the separating path 617 after the light-reflecting layer is formed in the deposition chamber 612.

In the deposition chamber 612, DC magnetron sputtering is carried out, in which Ar gas is fed into the chamber through the gas inlet 632 and Al—Si (95:5) is used as the target 650. In the deposition chamber 613, DC magnetron sputtering or RF magnetron sputtering is carried out, in which Ar gas is fed into the chamber through the gas inlet 634 and ZnO is used as the target 660. After the light-reflecting layer and reflection enhancing layer are formed on the belt substrate under conditions shown in Table B9, the substrate is wound up in the substrate wind-up chamber 614.

The process of producing the photovoltaic device will be described below.

The triple type photovoltaic device having the layer configuration as shown in FIG. 3 was produced under conditions as shown in Table B10 below and under the same operation as in Example A8 in respect of other details, using the fabrication apparatus employing a roll-to-roll system as shown in FIG. 10.

Next, like Example A8, ITO was deposited on the RF p-type layer 211, by vacuum deposition in a layer thickness of 70 nm as the transparent conductive layer 212.

Next, on the transparent conductive layer 212, the comb-shaped collector electrode 213 with a flat structure, comprised of Cr(40 nm)/Ag(1,000 nm)/Cr(40 nm) was deposited by vacuum deposition.

Thus, the fabrication of the photovoltaic device of the present Example was completed. This photovoltaic device is herein called SCB8. Conditions for forming the light-reflecting layer and reflection enhancing layer in the present Example are shown in Table B9. Conditions for forming the respective semiconductor layers RF n-type layers, RF i-type layers, MW i-type layers and RF p-type layers are shown in Table B10.

TABLE B9

Light-reflecting layer/reflection enhancing layer forming conditions (Example B8; apparatus used: FIG. 7)

| | Light-reflecting layer: Al—Si(95:5) | Reflection enhancing layer: ZnO |
|---|---|---|
| Temp. rise rate: (°C./sec.) | 13 | 15 |
| Substrate temp.: (°C.) | 290 | 300 |
| Ar gas flow rate: (sccm) | 35 | 40 |
| Pressure: (mTorr) | 3 | 4 |
| Target species: | Al—Si(95:5) | ZnO |
| Type of sputtering: | DC | DC |
| Sputter voltage: (V) | 385 | 380 |
| Layer thickness: ($\mu$m) | 0.56 | 1.1 |
| Substrate cooling gas: | $H_2$ | He |
| Temp. drop rate: (°C./sec.) | 15 | 18 |

TABLE B10

| | $SiH_4$ Flow rate (sccm) | $Si_2H_6$ Flow rate (sccm) | $CH_4$ Flow rate (sccm) | $GeH_4$ Flow rate (sccm) | $H_2$ Flow rate (sccm) | $PH_3/H_2$ Flow rate (sccm) | $B_2H_6/H_2$ Flow rate (sccm) | $SiH_4/H_2$ Flow rate (sccm) | Pressure (Torr) | MW power (W/cm$^2$) | RF power (W/cm$^2$) | Base member temp. (°C.) | Layer thickness (nm) |
|---|---|---|---|---|---|---|---|---|---|---|---|---|---|
| RF n-type layer: (203) | 2.0 | — | — | — | 100 | 220 | — | — | 1.3 | — | 0.05 | 350 | 20 |
| RF i-type layer: (251) | — | 4.0 | — | — | 100 | — | — | — | 0.8 | — | 0.008 | 300 | 10 |
| MW i-type layer: (204) | 48 | — | — | 49 | 130 | — | — | — | 0.005 | 0.07 | 0.28 | 380 | 100 |
| RF i-type layer: (261) | — | 4.0 | — | — | 100 | — | — | — | 0.50 | — | 0.008 | 300 | 23 |
| RF p-type layer: (205) | — | — | 0.1 | — | 80 | — | 9 | 2 | 1.8 | — | 0.07 | 300 | 10 |
| RF n-type layer: (206) | 1.1 | — | — | — | 40 | 290 | — | — | 1.1 | — | 0.04 | 300 | 10 |
| RF i-type layer: (252) | — | 4.0 | — | — | 90 | — | — | — | 0.75 | — | 0.008 | 300 | 10 |
| MW i-type layer: (207) | 33 | — | — | 26 | 120 | — | — | — | 0.005 | 0.05 | 0.28 | 360 | 98 |

TABLE B10-continued

|  | SiH$_4$ Flow rate (sccm) | Si$_2$H$_6$ Flow rate (sccm) | CH$_4$ Flow rate (sccm) | GeH$_4$ Flow rate (sccm) | H$_2$ Flow rate (sccm) | PH$_3$/ H$_2$ Flow rate (sccm) | B$_2$H$_6$/ H$_2$ Flow rate (sccm) | SiH$_4$/ H$_2$ Flow rate (sccm) | Pressure (Torr) | MW power (W/cm$^2$) | RF power (W/cm$^2$) | Base member temp. (°C.) | Layer thickness (nm) |
|---|---|---|---|---|---|---|---|---|---|---|---|---|---|
| RF i-type layer: (262) | — | 3.5 | — | — | 90 | — | — | — | 0.5 | — | 0.008 | 280 | 23 |
| RF p-type layer: (208) | — | — | 0.2 | — | 80 | — | 9 | 2 | 1.7 | — | 0.07 | 260 | 10 |
| RF n-type layer: (209) | 0.8 | — | — | — | 50 | 250 | — | — | 1.05 | — | 0.04 | 230 | 10 |
| RF i-type layer: (210) | — | 2.0 | — | — | 70 | — | — | — | 0.8 | — | 0.007 | 190 | 90 |
| RF p-type layer: (211) | — | — | 0.4 | — | 90 | — | 8 | 2 | 1.6 | — | 0.07 | 170 | 10 |

Reference Example B8-1

This example is different from Example B8 in that a base member was used in which, after the light-reflecting layer 201 of Al—Si (95:5) was formed, the reflection enhancing layer 202 of ZnO was formed without the step of lowering the substrate temperature to 100° C. or below. Except for this point, the procedure of Example B8 was repeated to produce photovoltaic devices having the structure as shown in FIG. 3. The photovoltaic devices of this example are called "SCB8-1".

For every two kinds of the photovoltaic devices, i.e., SCB8 and SCB8-1, six devices were prepared. In respect of these photovoltaic devices, characteristics of initial photoelectric conversion efficiency (photo electromotive force/ incident light intensity), stated specifically, photoelectric conversion efficiency and short-circuit current, were evaluated in the same manner as in Example A5. Photo-deterioration characteristics were also evaluated in the manner as described below. The results obtained are shown in Table 11.

To examine the photo-deterioration characteristics, photoelectric conversion efficiency was evaluated after photovoltaic devices having a temperature of 50° C. was irradiated by light for 1,000 hours under 1 sun of 100 mW/cm$^2$.

The results of evaluation on the characteristics of initial photoelectric conversion efficiency as shown in Table B11 are indicated by standardizing the results of the photovoltaic device SCB8-1 on the basis of the results of the photovoltaic device SCB8 which are regarded as 1.

TABLE B11

| Sample | Photoelectric conversion efficiency | Short-circuit current | Photo-deterioration characteristics |
|---|---|---|---|
| SCB8 | 1.00 | 1.00 | 1.00 |
| SCB8-1 | 0.82 | 0.90 | 0.95 |

As is seen from the results shown in Table B11, the photovoltaic device SCB8 having the light-reflecting layer and reflection enhancing layer obtained in Example B8 by the process of the present invention is superior to the photovoltaic devices SCB8-1 of Reference Example B8-1 in all the characteristics of initial photoelectric conversion efficiency and photo-deterioration characteristics at the same time.

EXAMPLE B9

In the present Example, the rate of temperature rise at the time of the formation of the light-reflecting layer and reflection enhancing layer was changed in the range of from 2° C./sec. to 150° C./sec. to examine how it affects the initial photoelectric conversion characteristics and so forth in photovoltaic devices.

In the present Example, triple type photovoltaic devices having the structure as shown in FIG. 3 were produced in the same manner as in Example B8 except that the light-reflecting layer and reflection enhancing layer were formed under conditions shown in Table B12 and the semiconductor layers were formed under conditions shown in Table B13, using the apparatus for continuously forming the light-reflecting layer and reflection enhancing layer as shown in FIG. 7 and the apparatus for continuously forming the photovoltaic device semiconductor layers as shown in FIG. 10. Stated specifically, eight samples were prepared under different conditions for the rate of temperature rise.

In respect of the samples of the photovoltaic device thus obtained, characteristics of initial photoelectric conversion efficiency (photo electromotive force/incident light intensity) and photo-deterioration characteristics were evaluated in the same manner as in Example B5 to obtain the results as shown in Table B14.

The results of evaluation on the characteristics of the respective samples as shown in Table B14 are indicated by standardizing the results on the basis of the measurement results of the sample obtained when the temperature was raised at a rate of 2° C./sec. In the table, "C" indicates 1.0 or more to less than 1.4; "B", 1.4 or more to less than 1.8; and "A", 1.8 or more.

As is seen from the results shown in Table B14, the rate of temperature rise at the time of the formation of the light-reflecting layer and reflection enhancing layer is preferably in the range of from 10° C./sec. to 100° C./sec. in view of the photoelectric conversion efficiency, the short-circuit current and the photo-deterioration characteristics.

TABLE B12

Light-reflecting layer/reflection enhancing layer forming conditions (Example B9; apparatus used: FIG. 7)

|  | Light-reflecting layer: Al—Si(95:5) | Reflection enhancing layer: ZnO |
|---|---|---|
| Temp. rise rate: (°C./sec.) | 2–150 | 2–150 |
| Substrate temp.: (°C.) | 290 | 310 |
| Ar gas flow rate: (sccm) | 35 | 40 |
| Pressure: (mTorr) | 3 | 4 |

TABLE B12-continued

Light-reflecting layer/reflection enhancing layer
forming conditions (Example B9; apparatus used: FIG. 7)

|  | Light-reflecting layer: Al—Si(95:5) | Reflection enhancing layer: ZnO |
|---|---|---|
| Target species: | Al—Si(95:5) | ZnO |
| Type of sputtering: | DC | DC |
| Sputter voltage: (V) | 395 | 380 |
| Layer thickness: (μm) | 0.50 | 1.3 |
| Substrate cooling gas: | He | He |
| Temp. drop rate: (°C./sec.) | 12 | 13 |

In the present Example, triple type photovoltaic devices having the structure as shown in FIG. 3 were produced in the same manner as in Example B8 except that the light-reflecting layer and reflection enhancing layer were formed under conditions shown in Table B15 and the semiconductor layers were formed under conditions shown in Table B16, using the apparatus for continuously forming the light-reflecting layer and reflection enhancing layer as shown in FIG. 7 and the apparatus for continuously forming the photovoltaic device semiconductor layers as shown in FIG. 10. Stated specifically, eight samples were prepared under different conditions for the rate of temperature drop.

In respect of the samples of the photovoltaic device thus obtained, characteristics of initial photoelectric conversion efficiency (photoelectromotive force/incident light intensity)

TABLE B13

|  | SiH$_4$ Flow rate (sccm) | Si$_2$H$_6$ Flow rate (sccm) | CH$_4$ Flow rate (sccm) | GeH$_4$ Flow rate (sccm) | H$_2$ Flow rate (sccm) | PH$_3$/ H$_2$ Flow rate (sccm) | B$_2$H$_6$/ H$_2$ Flow rate (sccm) | SiH$_4$/ H$_2$ Flow rate (sccm) | Pressure (Torr) | MW power (W/cm$^2$) | RF power (W/cm$^2$) | Base member temp. (°C.) | Layer thickness (nm) |
|---|---|---|---|---|---|---|---|---|---|---|---|---|---|
| RF n-type layer: (203) | 2.0 | — | — | — | 100 | 220 | — | — | 1.3 | — | 0.05 | 350 | 20 |
| RF i-type layer: (251) | — | 4.0 | — | — | 100 | — | — | — | 0.8 | — | 0.008 | 300 | 10 |
| MW i-type layer: (204) | 48 | — | — | 51 | 160 | — | — | — | 0.008 | 0.12 | 0.31 | 370 | 100 |
| RF i-type layer: (261) | — | 4.0 | — | — | 100 | — | — | — | 0.65 | — | 0.008 | 300 | 23 |
| RF p-type layer: (205) | — | — | 0.1 | — | 80 | — | 9 | 2 | 1.8 | — | 0.07 | 300 | 10 |
| RF n-type layer: (206) | 1.1 | — | — | — | 40 | 290 | — | — | 1.1 | — | 0.04 | 300 | 10 |
| RF i-type layer: (252) | — | 4.0 | — | — | 90 | — | — | — | 0.75 | — | 0.008 | 300 | 10 |
| MW i-type layer: (207) | 35 | — | — | 27 | 150 | — | — | — | 0.010 | 0.10 | 0.3 | 350 | 98 |
| RF i-type layer: (262) | — | 3.5 | — | — | 90 | — | — | — | 0.7 | — | 0.008 | 280 | 23 |
| RF p-type layer: (208) | — | — | 0.2 | — | 80 | — | 9 | 2 | 1.7 | — | 0.07 | 260 | 10 |
| RF n-type layer: (209) | 0.8 | — | — | — | 50 | 250 | — | — | 1.05 | — | 0.04 | 230 | 10 |
| RF i-type layer: (210) | — | 2.0 | — | — | 55 | — | — | — | 0.7 | — | 0.007 | 190 | 90 |
| RF p-type layer: (211) | — | — | 0.4 | — | 90 | — | 8 | 2 | 1.6 | — | 0.07 | 170 | 10 |

TABLE B14

| | Temp. rise rate: (°C./sec.) | | | | | | | |
|---|---|---|---|---|---|---|---|---|
| | 2 | 8 | 10 | 40 | 70 | 100 | 120 | 150 |
| Photoelectric conversion efficiency: | C | B | A | A | A | A | B | C |
| Short-circuit current: | C | B | A | A | A | A | B | C |
| Open-end voltage: | C | B | A | A | A | C | C | C |

EXAMPLE B10

In the present Example, the rate of temperature drop after the formation of the light-reflecting layer and reflection enhancing layer was changed in the range of from 0.2° C./sec. to 90° C./sec. to examine how it affects the initial photoelectric conversion characteristics and so forth in photovoltaic devices.

and photo-deterioration characteristics were evaluated in the same manner as in Example B5 to obtain the results as shown in Table B17.

The results of evaluation on the characteristics of the respective samples as shown in Table B17 are indicated by standardizing the results on the basis of the measurement results of the sample obtained when the temperature was lowered at a rate of 0.2° C. In the table, "C" indicates 1.0 or more to less than 1.4; "B", 1.4 or more to less than 1.8; and "A", 1.8 or more.

As is seen from the results shown in Table B17, the rate of temperature drop at the time of the formation of the light-reflecting layer and reflection enhancing layer is preferably in the range of from 1° C./sec. to 50° C./sec. in view of the photoelectric conversion efficiency, the short-circuit current and photo-deterioration characteristics.

TABLE B15

Light-reflecting layer/reflection enhancing layer
forming conditions (Example B10; apparatus used: FIG. 7)

|  | Light-reflecting layer: Al—Si(95:5) | Reflection enhancing layer: ZnO |
|---|---|---|
| Temp. rise rate: (°C./sec.) | 30 | 15 |
| Substrate temp.: (°C.) | 295 | 320 |
| Ar gas flow rate: (sccm) | 40 | 45 |
| Pressure: (mTorr) | 4 | 4 |
| Target species: | Al—Si(95:5) | ZnO |
| Type of sputtering: | DC | DC |
| Sputter voltage: (V) | 385 | 395 |
| Layer thickness: ($\mu$m) | 0.7 | 2.0 |
| Substrate cooling gas: | $H_2$ | He |
| Temp. drop rate: (°C./sec.) | 0.2–90 | 0.2–90 |

TABLE B16

|  | $SiH_4$ Flow rate (sccm) | $Si_2H_6$ Flow rate (sccm) | $CH_4$ Flow rate (sccm) | $GeH_4$ Flow rate (sccm) | $H_2$ Flow rate (sccm) | $PH_3/H_2$ Flow rate (sccm) | $B_2H_6/H_2$ Flow rate (sccm) | $SiH_4/H_2$ Flow rate (sccm) | Pressure (Torr) | MW power (W/cm²) | RF power (W/cm²) | Base member temp. (°C.) | Layer thickness (nm) |
|---|---|---|---|---|---|---|---|---|---|---|---|---|---|
| RF n-type layer: (203) | 2.0 | — | — | — | 100 | 220 | — | — | 1.3 | — | 0.05 | 350 | 20 |
| RF i-type layer: (251) | — | 4.0 | — | — | 100 | — | — | — | 0.8 | — | 0.008 | 300 | 10 |
| MW i-type layer: (204) | 48 | — | — | 51 | 140 | — | — | — | 0.007 | 0.10 | 0.32 | 370 | 100 |
| RF i-type layer: (261) | — | 4.0 | — | — | 105 | — | — | — | 0.55 | — | 0.008 | 300 | 23 |
| RF p-type layer: (205) | — | — | 0.1 | — | 80 | — | 9 | 2 | 1.8 | — | 0.07 | 300 | 10 |
| RF n-type layer: (206) | 1.1 | — | — | — | 30 | 290 | — | — | 1.2 | — | 0.04 | 300 | 10 |
| RF i-type layer: (252) | — | 4.0 | — | — | 90 | — | — | — | 0.75 | — | 0.008 | 300 | 10 |
| MW i-type layer: (207) | 35 | — | — | 29 | 120 | — | — | — | 0.011 | 0.10 | 0.3 | 350 | 98 |
| RF i-type layer: (262) | — | 3.5 | — | — | 90 | — | — | — | 0.7 | — | 0.008 | 280 | 23 |
| RF p-type layer: (208) | — | — | 0.2 | — | 80 | — | 9 | 2 | 1.7 | — | 0.07 | 260 | 10 |
| RF n-type layer: (209) | 0.8 | — | — | — | 50 | 250 | — | — | 1.05 | — | 0.04 | 230 | 10 |
| RF i-type layer: (210) | — | 2.0 | — | — | 60 | — | — | — | 0.7 | — | 0.007 | 190 | 90 |
| RF p-type layer: (211) | — | — | 0.4 | — | 90 | — | 8 | 2 | 1.6 | — | 0.07 | 170 | 10 |

TABLE B17

| Temp. rise rate: (°C./sec.) | | | | | | | | |
|---|---|---|---|---|---|---|---|---|
|  | 0.2 | 0.8 | 1 | 10 | 30 | 70 | 90 | 150 |
| Photoelectric conversion efficiency: | C | A | A | A | A | A | B | C |
| Short-circuit current: | C | B | A | A | A | A | B | B |
| Open-end voltage: | C | B | A | A | A | A | B | C |

EXAMPLE B11

In the present Example, when the base member for photovoltaic devices is produced, Al—Si (90:10) was used as the target used to form the light-reflecting layer to obtain a light-reflecting layer having the same composition. Next, using this base member for photovoltaic device, a triple type photovoltaic device was produced to examine how it affects the initial photoelectric conversion characteristics.

In the present Example, the triple type photovoltaic device as shown in FIG. 3 was also produced in the same manner as in Example B8, using the fabrication apparatus employing a roll-to-roll system as shown in FIGS. 7 and 10.

As the substrate, a belt-like stainless steel sheet of 300 m long, 30 cm wide and 0.5 mm thick was used.

The photovoltaic device of the present Example was produced in the same manner as in Example B8 except that Al—Si (90:10) alloy was used as the target used when the light-reflecting layer was formed by sputtering, the light-reflecting layer and reflection enhancing layer were formed under base member forming conditions (conditions for forming the light-reflecting layer and the reflection enhancing layer) as shown in Table B18 and the respective semiconductor layers RF n-type layers, RF i-type layers, MW i-type layers and RF p-type layers were formed under conditions as shown in Table B19. This photovoltaic device is herein called SCB11.

TABLE B18

Light-reflecting layer/reflection enhancing layer
forming conditions (Example B11; apparatus used: FIG. 7)

|  | Light-reflecting layer: Al—Si(90:10) | Reflection enhancing layer: ZnO |
|---|---|---|
| Temp. rise rate: (°C./sec.) | 10 | 10 |
| Substrate temp.: (°C.) | 290 | 290 |
| Ar gas flow rate: (sccm) | 35 | 30 |
| Pressure: (mTorr) | 3 | 4 |
| Target species: | Al—Si(90:10) | ZnO |

TABLE B18-continued

Light-reflecting layer/reflection enhancing layer
forming conditions (Example B11; apparatus used: FIG. 7)

|  | Light-reflecting layer: Al—Si(90:10) | Reflection enhancing layer: ZnO |
|---|---|---|
| Type of sputtering: | DC | DC |
| Sputter voltage: (V) | 380 | 380 |
| Layer thickness: ($\mu$m) | 0.7 | 1.2 |
| Substrate cooling gas: | $H_2$ | He |
| Temp. drop rate: (°C./sec.) | 18 | 18 |

TABLE B19

|  | $SiH_4$ Flow rate (sccm) | $Si_2H_6$ Flow rate (sccm) | $CH_4$ Flow rate (sccm) | $GeH_4$ Flow rate (sccm) | $H_2$ Flow rate (sccm) | $PH_3/H_2$ Flow rate (sccm) | $B_2H_6/H_2$ Flow rate (sccm) | $SiH_4/H_2$ Flow rate (sccm) | Pressure (Torr) | MW power (W/cm²) | RF power (W/cm²) | Base member temp. (°C.) | Layer thickness (nm) |
|---|---|---|---|---|---|---|---|---|---|---|---|---|---|
| RF n-type layer: (203) | 2.0 | — | — | — | 100 | 220 | — | — | 1.3 | — | 0.05 | 350 | 20 |
| RF i-type layer: (251) | — | 4.0 | — | — | 100 | — | — | — | 0.8 | — | 0.008 | 300 | 10 |
| MW i-type layer: (204) | 47 | — | — | 49 | 135 | — | — | — | 0.005 | 0.07 | 0.28 | 380 | 100 |
| RF i-type layer: (261) | — | 4.0 | — | — | 120 | — | — | — | 0.50 | — | 0.008 | 300 | 23 |
| RF p-type layer: (205) | — | — | 0.1 | — | 80 | — | 9 | 2 | 1.8 | — | 0.07 | 300 | 10 |
| RF n-type layer: (206) | 1.1 | — | — | — | 40 | 290 | — | — | 1.1 | — | 0.04 | 300 | 10 |
| RF i-type layer: (252) | — | 4.0 | — | — | 90 | — | — | — | 0.75 | — | 0.008 | 300 | 10 |
| MW i-type layer: (207) | 33 | — | — | 25 | 130 | — | — | — | 0.005 | 0.05 | 0.28 | 360 | 98 |
| RF i-type layer: (262) | — | 3.5 | — | — | 90 | — | — | — | 0.5 | — | 0.008 | 280 | 23 |
| RF p-type layer: (208) | — | — | 0.2 | — | 80 | — | 9 | 2 | 1.7 | — | 0.07 | 260 | 10 |
| RF n-type layer: (209) | 0.8 | — | — | — | 50 | 250 | — | — | 1.05 | — | 0.04 | 230 | 10 |
| RF i-type layer: (210) | — | 2.0 | — | — | 60 | — | — | — | 0.8 | — | 0.007 | 190 | 90 |
| RF p-type layer: (211) | — | — | 0.4 | — | 90 | — | 8 | 2 | 1.6 | — | 0.07 | 170 | 10 |

Reference Example B11-1

This example is different from Example B11 in that a base member was used in which, after the light-reflecting layer 201 of Al—Si (90:10) was formed, the reflection enhancing layer 202 of ZnO was formed without the step of lowering the substrate temperature to 100° C. or below. Except for this point, the procedure of Example B11 was repeated to produce photovoltaic devices. The photovoltaic devices of this example are called "SCB11-1".

For every two kinds of the photovoltaic devices, i.e., SCB11 and SCB11-1, seven devices were prepared. In respect of these photovoltaic devices, characteristics of initial photoelectric conversion efficiency (photoelectromotive force/incident light intensity), stated specifically, photoelectric conversion efficiency and short-circuit current, and photo-deterioration characteristics were evaluated in the same manner as in Example A5 to obtain the results as shown in Table B20.

The results of evaluation on the characteristics of initial photoelectric conversion efficiency as shown in Table B20 are indicated by standardizing the results of the photovoltaic device SCB11-1 on the basis of the results of the photovoltaic device SCB11 which are regarded as 1.

TABLE B20

| Sample | Photoelectric conversion efficiency | Short-circuit current | Photo-deterioration characteristics |
|---|---|---|---|
| SCB11 | 1.00 | 1.00 | 1.00 |
| SCB11-1 | 0.81 | 0.91 | 0.95 |

As is seen from the results shown in Table B20, the photovoltaic device SCB11 having the light-reflecting layer and reflection enhancing layer obtained in Example B11 by the process of the present invention is superior to the photovoltaic devices SCB11-1 of Reference Example B11-1 in all the characteristics of initial photoelectric conversion efficiency and the photo-deterioration characteristics at the same time.

EXAMPLE C1

In the present Example, the base member 190 that constitutes the device shown in FIG. 2 was produced using the apparatus of a multi-chamber-separated system as shown in FIG. 6. More specifically, the intermediate layer 199, light-reflecting layer 101 and reflection enhancing layer 102 were formed on the substrate 100.

Their production process will be described below, following its procedure. To the apparatus shown in FIG. 6, a material gas feeding system (not shown) is connected through gas feed pipes. The material gas cylinders are all purified in an ultra-high purity. As the material gas cylinders, an $H_2$ gas cylinder, an Ar gas cylinder and an He gas cylinder were connected thereto. Al—Si (95:5), Ag and ZnO were used as targets. These are so provided that sputtering can be carried out in vacuum.

As the substrate (100 in FIG. 2), a stainless steel sheet of 0.5 mm thick and 50×50 mm$^2$ was used, which was subjected to ultrasonic cleaning with acetone and isopropanol, followed by hot-air drying. As the sputter power source, the DC power source 3325 was connected, and an intermediate layer 199 of Al—Si (95:5) was formed on the substrate by DC magnetron sputtering. Then the subsequent processing was carried out.

The above production process will be described below in detail, following its procedure with reference to FIG. 6.

(1) A substrate 3390 (corresponding to 100 in FIG. 2) having been cleaned was placed on the substrate transporting rail 3313 provided in the load chamber 3301, and the inside of the load chamber 3301 was evacuated by means of a vacuum exhaust pump (not shown) to have a pressure of about 1×10$^{-5}$ Torr.

(2) The gate valve 3306 was opened to carry the substrate into the transport chamber 3302 and deposition chamber 3320 previously evacuated by means of a vacuum exhaust pump (not shown). The substrate 3390 was set in the manner the back thereof was brought into close contact with the substrate heater 3310, and was heated while raising temperature at a rate of 13° C./sec., to bring the substrate temperature to 160° C. Then, the inside of the deposition chamber 3320 was evacuated by means of a vacuum exhaust pump (not shown) to have a pressure of about 3×10$^{-6}$ Torr.

(3) 37 sccm of Ar gas was fed into it through the gas feed pipe 3324, and a conductance valve (not shown) was operated to control the pressure so as to be 4 mTorr. Electric current was flowed to the toroidal coil 3323, and 380 V of a DC power was applied from the sputter power source 3325 to cause Ar plasma.

(4) The target shutter 3326 was opened, and the intermediate layer 199 of Al—Si (95:5) with a layer thickness of 0.01 μm was formed on the surface of the stainless steel sheet, whereupon the target shutter 3326 was closed to extinguish the plasma.

(5) The substrate heater 3310 was lifted, and the substrate temperature was lowered to 100° C. or below while dropping temperature at a rate of 6° C./sec. in an atmosphere of He gas used as substrate cooling gas. Thereafter, the gate valve 3307 was opened to carry the substrate into the transport chamber 3303 and deposition chamber 3330 previously evacuated by means of a vacuum exhaust pump (not shown). The substrate 3390 was set in the manner the back thereof was brought into close contact with the substrate heater 3311, and was heated while raising temperature at a rate of 13° C./sec., to bring the substrate temperature to 290° C. Then, the inside of the deposition chamber 3330 was evacuated by means of a vacuum exhaust pump (not shown) to have a pressure of about 2×10$^{-6}$ Torr.

(6) 45 sccm of Ar gas was fed into it through the gas feed pipe 3334, and a conductance valve (not shown) was operated to control the pressure so as to be 4 mTorr. Electric current was flowed to the toroidal coil 3333, and 380 V of a DC power was applied from the sputter power source 3335 to cause Ar plasma. Next, the target shutter 3336 was opened, and a light-reflecting layer 101 of Ag with a layer thickness of 0.5 μm was formed on the surface of the intermediate layer 199 of Al—Si (95:5), whereupon the target shutter 3336 was closed to extinguish the plasma.

(7) The substrate heater 3311 was lifted, and the substrate temperature was lowered to 100° C. or below while dropping temperature at a rate of 6° C./sec. in an atmosphere of He gas used as substrate cooling gas. Thereafter, the gate valve 3308 was opened to carry the substrate into the transport chamber 3304 and deposition chamber 3340 previously evacuated by means of a vacuum exhaust pump (not shown). The substrate 3390 was set in the manner the back thereof was brought into close contact with the substrate heater 3312, and was heated while raising temperature at a rate of 12° C./sec., to bring the substrate temperature to 290° C. Then, the inside of the deposition chamber 3340 was evacuated by means of a vacuum exhaust pump (not shown) to have a pressure of about 3×10$^{-6}$ Torr.

(8) 45 sccm of Ar gas was fed into it through the gas feed pipe 3344, and a conductance valve (not shown) was operated to control the pressure so as to be 4 mTorr. Electric current was flowed to the toroidal coil 3343, and 385 V of a DC power was applied from the sputter power source 3345 to cause Ar plasma. Next, the target shutter 3346 was opened, and a reflection enhancing layer 102 of ZnO with a layer thickness of 1.2 μm was formed on the surface of the light-reflecting layer 101 of Ag, whereupon the target shutter 3346 was closed to extinguish the plasma.

(9) The substrate heater 3312 was lifted, and the substrate temperature was lowered to 100° C. or below while dropping temperature at a rate of 5° C./sec. in an atmosphere of He gas used as substrate cooling gas. Thereafter, the gate valve 3309 was opened to carry the substrate into the unload chamber 3305 previously evacuated by means of a vacuum exhaust pump (not shown).

Thus, the production of the photovoltaic device base member (190 in FIG. 2) of the present Example was completed. Samples of this photovoltaic device base member are called "SC1".

Reference Example C1-1

This example is different from Example C1 only in that the substrate temperature was set to 10° C. when the intermediate layer 199 of Al—Si (95:5) was formed. Except for this point, the procedure of Example C1 was repeated to produce base member samples. The samples of the photovoltaic device base member of this example are called "SC1-1".

Reference Example C1-2

This example is different from Example C1 only in that the substrate temperature was set to 60° C. when the intermediate layer 199 of Al—Si (95:5) was formed. Except for this point, the procedure of Example C1 was repeated to produce samples. The samples of the photovoltaic device base member of this example are called "SC1-2".

Reference Example C1-3

This example is different from Example C1 only in that the substrate temperature was set to 150° C. when the light-reflecting layer 101 of Ag was formed. Except for this point, the procedure of Example C1 was repeated to produce samples. The samples of the photovoltaic device base member of this example are called "SC1-3".

Reference Example C1-4

This example is different from Example C1 only in that the substrate temperature was set to 550° C. when the light-reflecting layer 101 of Ag was formed. Except for this point, the procedure of Example C1 was repeated to produce samples. The samples of the photovoltaic device base member of this example are called "SC1-4".

Reference Example C1-5

This example is different from Example C1 only in that, after the light-reflecting layer 101 of Ag was formed, the reflection enhancing layer 102 of ZnO was formed without the step of lowering the substrate temperature to 100° C. or below. Except this point, the procedure of Example C1 was repeated to produce samples. The samples of the photovoltaic device base member of this example are called "SC1-5".

Reference Example C1-6

This example is different from Example C1 only in that the substrate temperature was set to 150° C. when the reflection enhancing layer 102 of ZnO was formed. Except for this point, the procedure of Example C1 was repeated to produce samples. The samples of the photovoltaic device base member of this example are called "SC1-6".

Reference Example C1-7

This example is different from Example C1 only in that the substrate temperature was set to 450° C. when the reflection enhancing layer 102 of ZnO was formed. Except for this point, the procedure of Example C1 was repeated to produce samples. The samples of the photovoltaic device base member of this example are called "SC1-7".

For every eight kinds of the samples of the photovoltaic device base member, i.e., SC1 and SC1-1 to SC1-7, four samples were prepared. In respect of these samples of the photovoltaic device base member, a bending peel test was carried out to examine their environmental resistance to obtain the results as shown in Table C1.

The bending peel test was carried out in the following way: The respective photovoltaic device base members were left to stand for 110 hours in an environment of a high-temperature and high-humidity atmosphere (temperature: 80° C; humidity: 82% RH), and thereafter put to a bending test repeated twenty times. In addition, to the part thus bended, a weight of 10 kg was dropped twelve times at a height of 50 cm, and any peeling in the base member was observed using a scanning electron microscope (SEM), manufactured by Hitachi Ltd. (model: S-4500; magnifications: 50,000×).

In the results of the bending peel test, shown in Table C1, letter symbol "A" indicates an instance where no peeling occurs at all, and "B" an instance where peeling only partly occurs.

In respect of the above samples, light reflectance was also measured and, from the measurements obtained, total reflectance and scattered reflectance were evaluated in the same manner as in Example A1 to obtain the results as shown together in Table C1.

The results of total reflectance and scattered reflectance shown in Table C1 are indicated for each sample by standardizing the results of the samples SC1-1 to SC1-7 on the basis of the results of the sample SC1 which are regarded as 1.

TABLE C1

| Sample | Bending peel test | Total reflectance | Scattered reflectance |
|---|---|---|---|
| SC1 | A | 1.00 | 1.0 |
| SC1-1 | B | 1.00 | 1.0 |
| SC1-2 | B | 1.00 | 1.0 |
| SC1-3 | A | 1.00 | 0.59 |
| SC1-4 | A | 0.97 | 0.90 |
| SC1-5 | A | 0.82 | 0.88 |
| SC1-6 | A | 0.92 | 0.77 |
| SC1-7 | A | 0.87 | 0.91 |

As is seen from the results shown in Table C1, the photovoltaic device base member SC1 of Example C1 is superior to the photovoltaic device base members SC1-1 to SC1-7 of Reference Examples C1-1 to C1-7 in the light-reflecting properties and the environmental resistance required as base members, at the same time.

EXAMPLE C2

This example is different from Example C1 in that the light-reflecting layer was formed using $H_2$ gas as the substrate cooling gas in place of He gas.

Like Example C1, the base member 190 that constitutes the photovoltaic device shown in FIG. 2 was produced using the apparatus of a multi-chamber-separated system as shown in FIG. 6. More specifically, the intermediate layer 199, light-reflecting layer 101 and reflection enhancing layer 102 were formed on the substrate 100.

Their production process will be described below, following its procedure. To the apparatus shown in FIG. 6, the material gas feeding system (not shown) is connected through gas feed pipes. The material gas cylinders are all purified in an ultra-high purity. As the material gas cylinders, an $H_2$ gas cylinder, an Ar gas cylinder and an He gas cylinder were connected thereto. Al—Si (95:5), Ag and ZnO were used as targets. These are so provided that sputtering can be carried out in vacuum.

As the substrate (100 in FIG. 2), a stainless steel sheet of 0.5 mm thick and 50×50 mm$^2$ was used, which was subjected to ultrasonic cleaning with acetone and isopropanol, followed by hot-air drying. As the sputter power source, the DC power source 3325 was connected, and an intermediate layer 199 of Al—Si (95:5) was formed on the substrate by DC magnetron sputtering. Then the subsequent processing was carried out.

The above production process will be described below in detail, following its procedure with reference to FIG. 6.

(1) A substrate 3390 (corresponding to 100 in FIG. 2) having been cleaned was placed on the substrate transporting rail 3313 provided in the load chamber 3301, and the inside of the load chamber 3301 was evacuated by means of a vacuum exhaust pump (not shown) to have a pressure of about $1\times10^{-5}$ Torr.

(2) The gate valve 3306 was opened to carry the substrate into the transport chamber 3302 and deposition chamber 3320 previously evacuated by means of a vacuum exhaust pump (not shown). The substrate 3390 was set in the manner the back thereof was brought into close contact with the substrate heater 3310, and was heated while raising temperature at a rate of 15° C./sec., to bring the substrate temperature to 250° C. Then, the inside of the deposition chamber 3320 was evacuated by means of a vacuum exhaust pump (not shown) to have a pressure of about $3\times10^{-6}$ Torr.

(3) 42 sccm of Ar gas was fed into it through the gas feed pipe 3324, and a conductance valve (not shown) was operated to control the pressure so as to be 4 mTorr. Electric current was flowed to the toroidal coil 3323, and 375 V of a DC power was applied from the sputter power source 3325 to cause Ar plasma.

(4) The target shutter 3326 was opened, and the intermediate layer 199 (FIG. 2) of Al—Si (95:5) with a layer thickness of 0.015 μm was formed on the surface of the stainless steel sheet, whereupon the target shutter 3326 was closed to extinguish the plasma.

(5) The substrate heater 3310 was lifted, and the substrate temperature was lowered to 100° C. or below while dropping temperature at a rate of 6° C./sec. in an atmosphere of $H_2$ gas used as substrate cooling gas. Thereafter, the gate valve 3307 was opened to carry the substrate into the transport chamber 3303 and deposition chamber 3330 previously evacuated by means of a vacuum exhaust pump (not shown). The substrate 3390 was set in the manner the back thereof was brought into close contact with the substrate heater 3311, and was heated while raising temperature at a rate of 16° C./sec., to bring the substrate temperature to 290° C. Then, the inside of the deposition chamber 3330 was evacuated by means of a vacuum exhaust pump (not shown) to have a pressure of about $2 \times 10^{-6}$ Torr.

(6) 38 sccm of Ar gas was fed into it through the gas feed pipe 3334, and a conductance valve (not shown) was operated to control the pressure so as to be 4 mTorr. Electric current was flowed to the toroidal coil 3333, and 380 V of a DC power was applied from the sputter power source 3335 to cause Ar plasma. Next, the target shutter 3336 was opened, and a light-reflecting layer 101 (FIG. 2) of Ag with a layer thickness of 0.6 µm was formed on the surface of the intermediate layer 199 of Al—Si (95:5), whereupon the target shutter 3336 was closed to extinguish the plasma.

(7) The substrate heater 3311 was lifted, and the substrate temperature was lowered to 100° C. or below while dropping temperature at a rate of 8° C./sec. in an atmosphere of $H_2$ gas used as substrate cooling gas. Thereafter, the gate valve 3308 was opened to carry the substrate into the transport chamber 3304 and deposition chamber 3340 previously evacuated by means of a vacuum exhaust pump (not shown). The substrate 3390 was set in the manner the back thereof was brought into close contact with the substrate heater 3312, and was heated while raising temperature at a rate of 13° C./sec., to bring the substrate temperature to 315° C. Then, the inside of the deposition chamber 3340 was evacuated by means of a vacuum exhaust pump (not shown) to have a pressure of about $3 \times 10^{-6}$ Torr.

(8) 45 sccm of Ar gas was fed into it through the gas feed pipe 3344, and a conductance valve (not shown) was operated to control the pressure so as to be 4 mTorr. Electric current was flowed to the toroidal coil 3343, and 385 V of a DC power was applied from the sputter power source 3345 to cause Ar plasma. Next, the target shutter 3346 was opened, and a reflection enhancing layer 102 of ZnO with a layer thickness of 1.5 µm was formed on the surface of the light-reflecting layer 101 of Ag, whereupon the target shutter 3346 was closed to extinguish the plasma.

(9) The substrate heater 3312 was lifted, and the substrate temperature was lowered to 100° C. or below while dropping temperature at a rate of 16° C./sec. in an atmosphere of $H_2$ gas used as substrate cooling gas. Thereafter, the gate valve 3309 was opened to carry the substrate into the unload chamber 3305 previously evacuated by means of a vacuum exhaust pump (not shown).

Thus, the production of the photovoltaic device base member (190 in FIG. 2) of the present Example was completed. Samples of this photovoltaic device base member are called "SC2".

Reference Example C2-1

This example is different from Example C2 in that, after the light-reflecting layer 101 of Ag was formed, the reflection enhancing layer 102 of ZnO was formed without the step of lowering the substrate temperature to 100° C. or below. Except this point, the procedure of Example C2 was repeated to produce samples. The samples of the photovoltaic device base member of this example are called "SC2-1".

For every two kinds of the samples of the photovoltaic device base member, i.e., SC2 and SC2-1, five samples were prepared. In respect of these samples of the photovoltaic device base member, a bending peel test was carried out in the same manner as in Example C1 to examine their environmental resistance. Light reflectance was also measured and, from the measurements obtained, total reflectance and scattered reflectance were evaluated in the same manner as in Example C1. The results obtained are shown together in Table C2.

In the results of the bending peel test, shown in Table C2, letter symbol "A" indicates an instance where no peeling occurs at all, and "C" an instance where peeling only partly occurs. The results of total reflectance and scattered reflectance shown in Table C2 are indicated for each sample of the photovoltaic device base member by standardizing the results of the sample SC2-1 on the basis of the results of the sample SC2 which are regarded as 1.

TABLE C2

| Sample | Bending peel test | Total reflectance | Scattered reflectance |
|--------|-------------------|-------------------|----------------------|
| SC2    | A                 | 1.00              | 1.0                  |
| SC2-1  | C                 | 0.79              | 0.80                 |

As is seen from the results shown in Table C2, the photovoltaic device base member SC2 of Example C2 is superior to the photovoltaic device base member SC2-1 of Reference Example in the light-reflecting properties and the environmental resistance required as base members, at the same time. It is also seen that $H_2$ gas is effective as the substrate cooling gas.

EXAMPLE C3

This example is different from Example C1 in that the light-reflecting layer was formed using Ar gas as the substrate cooling gas in place of He gas.

Like Example C1, the base member 190 that constitutes the photovoltaic device shown in FIG. 2 was produced using the apparatus of a multi-chamber-separated system as shown in FIG. 6. More specifically, the intermediate layer 199, light-reflecting layer 101 and reflection enhancing layer 102 were formed on the substrate 100.

Their production process will be described below, following its procedure. To the apparatus shown in FIG. 6, the material gas feeding system (not shown) is connected through gas feed pipes. The material gas cylinders are all purified in an ultra-high purity. As the material gas cylinders, an $H_2$ gas cylinder, an Ar gas cylinder and an He gas cylinder were connected thereto. Al—Si (95:5), Ag and ZnO were used as targets. These are so provided that sputtering can be carried out in vacuum.

As the substrate (100 in FIG. 2), a stainless steel sheet of 0.5 mm thick and 50×50 mm² was used, which was subjected to ultrasonic cleaning with acetone and isopropanol, followed by hot-air drying. As the sputter power source, the DC powder source 3325 was connected, and an intermediate layer 199 of Al—Si (95:5) was formed on the substrate by DC magnetron sputtering. Then the subsequent processing was carried out.

The above production process will be described below following its procedure with reference to FIG. 6.

(1) A substrate 3390 (corresponding to 100 in FIG. 2) having been cleaned was placed on the substrate transporting rail 3313 provided in the load chamber 3301, and the inside of the load chamber 3301 was evacuated by means of a vacuum exhaust pump (not shown) to have a pressure of about 1×10⁻⁵ Torr.

(2) The gate valve 3306 was opened to carry the substrate into the transport chamber 3302 and deposition chamber 3320 previously evacuated by means of a vacuum exhaust pump (not shown). The substrate 3390 was set in the manner the back thereof was brought into close contact with the substrate heater 3310, and was heated while raising temperature at a rate of 11° C./sec., to bring the substrate temperature to 220° C. Then, the inside of the deposition chamber 3320 was evacuated by means of a vacuum exhaust pump (not shown) to have a pressure of about 3×10⁻⁶ Torr.

(3) 37 sccm of Ar gas was fed into it through the gas feed pipe 3324, and a conductance valve (not shown) was operated to control the pressure so as to be 4 mTorr. Electric current was flowed to the toroidal coil 3323, and 375 V of a DC power was applied from the sputter power source 3325 to cause Ar plasma.

(4) The target shutter 3326 was opened, and the intermediate layer 199 (FIG. 2) of Al—Si (95:5) with a layer thickness of 0.008 μm was formed on the surface of the stainless steel sheet, whereupon the target shutter 3326 was closed to extinguish the plasma.

(5) The substrate heater 3310 was lifted, and the substrate temperature was lowered to 100° C. or below while dropping temperature at a rate of 4° C./sec. in an atmosphere of Ar gas used as substrate cooling gas. Thereafter, the gate valve 3307 was opened to carry the substrate into the transport chamber 3303 and deposition chamber 3330 previously evacuated by means of a vacuum exhaust pump (not shown). The substrate 3390 was set in the manner the back thereof was brought into close contact with the substrate heater 3311, and was heated while raising temperature at a rate of 17° C./sec., to bring the substrate temperature to 290° C. Then, the inside of the deposition chamber 3330 was evacuated by means of a vacuum exhaust pump (not shown) to have a pressure of about 2×10⁻⁶ Torr.

(6) 42 sccm of Ar gas was fed into it through the gas feed pipe 3334, and a conductance valve (not shown) was operated to control the pressure so as to be 4 mTorr. Electric current was flowed to the toroidal coil 3333, and 380 V of a DC power was applied from the sputter power source 3335 to cause Ar plasma. Next, the target shutter 3336 was opened, and a light-reflecting layer 101 (FIG. 2) of Ag with a layer thickness of 0.7 μm was formed on the surface of the intermediate layer 199 of Al—Si (95:5), whereupon the target shutter 3336 was closed to extinguish the plasma.

(7) The substrate heater 3311 was lifted, and the substrate temperature was lowered to 100° C. or below while dropping temperature at a rate of 3° C./sec. in an atmosphere of Ar gas used as substrate cooling gas. Thereafter, the gate valve 3308 was opened to carry the substrate into the transport chamber 3304 and deposition chamber 3340 previously evacuated by means of a vacuum exhaust pump (not shown). The substrate 3390 was set in the manner the back thereof was brought into close contact with the substrate heater 3312, and was heated while raising temperature at a rate of 13° C./sec., to bring the substrate temperature to 310° C. Then, the inside of the deposition chamber 3340 was evacuated by means of a vacuum exhaust pump (not shown) to have a pressure of about 3×10⁻⁶ Torr.

(8) 44 sccm of Ar gas was fed into it through the gas feed pipe 3344, and a conductance valve (not shown) was operated to control the pressure so as to be 4 mTorr. Electric current was flowed to the toroidal coil 3343, and 380 V of a DC power was applied from the sputter power source 3345 to cause Ar plasma. Next, the target shutter 3346 was opened, and a reflection enhancing layer 102 of ZnO with a layer thickness of 1.1 μm was formed on the surface of the light-reflecting layer 101 of Ag, whereupon the target shutter 3346 was closed to extinguish the plasma.

(9) The substrate heater 3312 was lifted, and the substrate temperature was lowered to 100° C. or below while dropping temperature at a rate of 5° C./sec. in an atmosphere of Ar gas used as substrate cooling gas. Thereafter, the gate valve 3309 was opened to carry the substrate into the unload chamber 3305 previously evacuated by means of a vacuum exhaust pump (not shown).

Thus, the production of the photovoltaic device base member (190 in FIG. 2) of the present Example was completed. Samples of this photovoltaic device base member are called "SC3".

Reference Example C3-1

This example is different from Example C3 in that the intermediate layer 199 of Al—Si (95:5) was not formed and, after the light-reflecting layer 101 of Ag was formed, the reflection enhancing layer 102 of ZnO was formed without the step of lowering the substrate temperature to 100° C. or below. Except for these points, the procedure of Example C3 was repeated to produce samples. The samples of the photovoltaic device base member of this example are called "SC3-1".

For every two kinds of the samples of the photovoltaic device base member, i.e., SC3 and SC3-1, five samples were prepared. In respect of these samples of the photovoltaic device base member, a bending peel test was carried out in the same manner as in Example C1 to examine their environmental resistance. Light reflectance was also measured and, from the measurements obtained, total reflectance and scattered reflectance were evaluated in the same manner as in Example C1. The results obtained are shown together in Table C3.

In the results of the bending peel test, shown in Table C3, letter symbol "A" indicates an instance where no peeling occurs at all, and "C" an instance where peeling only partly occurs. The results of total reflectance and scattered reflectance shown in Table C3 are indicated for each sample of the photovoltaic device base member by standardizing the results of the sample SC3-1 on the basis of the results of the sample SC3 which are regarded as 1.

TABLE C3

| Sample | Bending peel test | Total reflectance | Scattered reflectance |
| --- | --- | --- | --- |
| SC3 | A | 1.00 | 1.0 |
| SC3-1 | C | 0.80 | 0.79 |

As is seen from the results shown in Table C3, the photovoltaic device base member SC3 of Example C3 is superior to the photovoltaic device base member SC3-1 of Reference Examples C3-1 in the light-reflecting properties and the environmental resistance required as base members, at the same time. It is also seen that Ar gas is effective as the substrate cooling gas.

EXAMPLE C4

This example is different from Example C1 in that the Ar gas used alone when the reflection enhancing layer 102 of ZnO was replaced with Ar gas and O₂ gas used in combination, to produce the photovoltaic device base member.

Like Example C1, the base member 190 that constitutes the photovoltaic device shown in FIG. 2 was produced using the apparatus of a multi-chamber-separated system as shown in FIG. 6. More specifically, the intermediate layer 199, light-reflecting layer 101 and reflection enhancing layer 102 were formed on the substrate 100.

Their production process will be described below, following its procedure. To the apparatus shown in FIG. 6, the material gas feeding system (not shown) is connected through gas feed pipes. The material gas cylinders are all purified in an ultra-high purity. As the material gas cylinders, an $H_2$ gas cylinder, an Ar gas cylinder and an He gas cylinder were connected thereto. Al—Si (95:5), Ag and ZnO were used as targets. These are so provided that sputtering can be carried out in vacuum.

As the substrate (100 in FIG. 2), a stainless steel sheet of 0.5 mm thick and 50×50 mm$^2$ was used, which was subjected to ultrasonic cleaning with acetone and isopropanol, followed by hot-air drying. As the sputter power source, the DC power source 3325 was connected, and an intermediate layer 199 of Al—Si (95:5) was formed on the substrate by DC magnetron sputtering. Then the subsequent processing was carried out.

The above production process will be described below following its procedure with reference to FIG. 6.

(1) A substrate 3390 (corresponding to 100 in FIG. 2) having been cleaned was placed on the substrate transporting rail 3313 provided in the load chamber 3301, and the inside of the load chamber 3301 was evacuated by means of a vacuum exhaust pump (not shown) to have a vacuum pressure of about 1×10$^{-5}$ Torr.

(2) The gate valve 3306 was opened to carry the substrate into the transport chamber 3302 and deposition chamber 3320 previously evacuated by means of a vacuum exhaust pump (not shown). The substrate 3390 was set in the manner the back thereof was brought into close contact with the substrate heater 3310, and was heated while raising temperature at a rate of 12° C./sec., to bring the substrate temperature to 290° C. Then, the inside of the deposition chamber 3320 was evacuated by means of a vacuum exhaust pump (not shown) to have a pressure of about 3×10$^{-6}$ Torr.

(3) 45 sccm of Ar gas was fed into it through the gas feed pipe 3324, and a conductance valve (not shown) was operated to control the pressure so as to be 3 mTorr. Electric current was flowed to the toroidal coil 3323, and 370 V of a DC power was applied from the sputter power source 3325 to cause Ar plasma.

(4) The target shutter 3326 was opened, and the intermediate layer 199 (FIG. 2) of Al—Si (95:5) with a layer thickness of 0.01 μm was formed on the surface of the stainless steel sheet, whereupon the target shutter 3326 was closed to extinguish the plasma.

(5) The substrate heater 3310 was lifted, and the substrate temperature was lowered to 100° C. or below while dropping temperature at a rate of 7° C./sec. in an atmosphere of He gas used as substrate cooling gas. Thereafter, the gate valve 3307 was opened to carry the substrate into the transport chamber 3303 and deposition chamber 3330 previously evacuated by means of a vacuum exhaust pump (not shown). The substrate 3390 was set in the manner the back thereof was brought into close contact with the substrate heater 3311, and was heated while raising temperature at a rate of 16° C./sec., to bring the substrate temperature to 290° C. Then, the inside of the deposition chamber 3330 was evacuated by means of a vacuum exhaust pump (not shown) to have a pressure of about 2×10$^{-6}$ Torr.

(6) 52 sccm of Ar gas was fed into it through the gas feed pipe 3334, and a conductance valve (not shown) was operated to control the pressure so as to be 4 mTorr. Electric current was flowed to the toroidal coil 3333, and 375 V of a DC power was applied from the sputter power source 3335 to cause Ar plasma. Next, the target shutter 3336 was opened, and a light-reflecting layer 101 (FIG. 2) of Ag with a layer thickness of 0.6 μm was formed on the surface of the intermediate layer 199 of Al—Si (95:5), whereupon the target shutter 3336 was closed to extinguish the plasma.

(7) The substrate heater 3311 was lifted, and the substrate temperature was lowered to 100° C. or below while dropping temperature at a rate of 5° C./sec. in an atmosphere of He gas used as substrate cooling gas. Thereafter, the gate valve 3308 was opened to carry the substrate into the transport chamber 3304 and deposition chamber 3340 previously evacuated by means of a vacuum exhaust pump (not shown). The substrate 3390 was set in the manner the back thereof was brought into close contact with the substrate heater 3312, and was heated while raising temperature at a rate of 17° C./sec., to bring the substrate temperature to 315° C. Then, the inside of the deposition chamber 3340 was evacuated by means of a vacuum exhaust pump (not shown) to have a pressure of about 3×10$^{-6}$ Torr.

(8) 42 sccm of Ar gas and 42 sccm of $O_2$ gas were fed into it through the gas feed pipe 3344, and a conductance valve (not shown) was operated to control the pressure so as to be 2 mTorr. Electric current was flowed to the toroidal coil 3343, and 380 V of a DC power was applied from the sputter power source 3345 to cause Ar/$O_2$ plasma. Next, the target shutter 3346 was opened, and a reflection enhancing layer 102 (FIG. 2) of ZnO with a layer thickness of 1.5 μm was formed on the surface of the light-reflecting layer 101 of Ag, whereupon the target shutter 3346 was closed to extinguish the plasma.

(9) The substrate heater 3312 was lifted, and the substrate temperature was lowered to 100° C. or below while dropping temperature at a rate of 20° C./sec. in an atmosphere of He gas used as substrate cooling gas. Thereafter, the gate valve 3309 was opened to carry the substrate into the unload chamber 3305 previously evacuated by means of a vacuum exhaust pump (not shown).

Thus, the production of the photovoltaic device base member (190 in FIG. 2) of the present Example was completed. Samples of this photovoltaic device base member are called "SC4".

Reference Example C4-1

This example is different from Example C4 in that the intermediate layer 199 of Al—Si (95:5) was not formed and, after the light-reflecting layer 101 of Ag was formed, the reflection enhancing layer 102 of ZnO was formed without the step of lowering the substrate temperature to 100° C. or below. Except these points, the procedure of Example C4 was repeated to produce samples. The samples of the photovoltaic device base member of this example are called "SC4-1".

For every two kinds of the samples of the photovoltaic device base member, i.e., SC4 and SC4-1, four samples were prepared. In respect of these samples of the photovoltaic device base member, a bending peel test was carried out in the same manner as in Example C1 to examine their environmental resistance. Light reflectance was also measured and, from the measurements obtained, total reflectance and scattered reflectance were evaluated in the same manner as in Example C1. The results obtained are shown together in Table C4.

In the results of the bending peel test, shown in Table C4, letter symbol "A" indicates an instance where no peeling occurs at all, and "C" an instance where peeling only partly occurs. The results of total reflectance and scattered reflectance shown in Table C4 are indicated for each sample of the photovoltaic device base member by standardizing the results of the sample SC4-1 on the basis of the results of the sample SC4 which are regarded as 1.

TABLE C4

| Sample | Bending peel test | Total reflectance | Scattered reflectance |
|---|---|---|---|
| SC4 | A | 1.00 | 1.0 |
| SC4-1 | C | 0.80 | 0.81 |

As is seen from the results shown in Table C4, the photovoltaic device base member SC4 of Example C4 is superior to the photovoltaic device base member SC4-1 of Reference Examples C4-1 in the light-reflecting properties and the environmental resistance required as base members, at the same time.

EXAMPLE C5

In the present Example, the photovoltaic device as shown in FIG. 2 was produced using a photovoltaic device base member (sample) formed in the same manner as in Example C1, and using the apparatus employing a multi-chamber-separated system as shown in FIG. 9.

The apparatus 400 shown in FIG. 9 can carry out both MWPCVD and RFPCVD. Using this apparatus, semiconductor layers (103, 151, 104, 161, 105) and other layers were formed on the reflection enhancing layer 102 according to the layer configuration as shown in FIG. 2.

Their production process will be described below with reference to FIG. 9, following its procedure. To the apparatus shown in FIG. 9, a material gas feeding system (not shown) is connected through gas feed pipes. The material gas cylinders are all purified in an ultra-high purity. As the material gas cylinders, an $SiH_4$ gas cylinder, a $CH_4$ gas cylinder, a $GeH_4$ gas cylinder, an $Si_2H_6$ gas cylinder, a $PH_3/H_2$ (dilution: 0.1%) gas cylinder, a $B_2H_6/H_2$ (dilution: 0.2%) gas cylinder, an $H_2$ gas cylinder, an He gas cylinder, an $SiCl_2H_2$ gas cylinder and an $SiH_4/H_2$ (dilution: 1%) gas cylinder were connected thereto.

(1) A base member 490 (corresponding to 190 in FIG. 2) comprising the substrate and the intermediate layer 199, light-reflecting layer 101 and reflection enhancing layer 102 formed thereon was placed on the base member transporting rail 413 provided in the load chamber 401, and the inside of the load chamber 401 was evacuated by means of a vacuum exhaust pump (not shown) to have a pressure of about $1 \times 10^{-5}$ Torr.

(2) The gate valve 406 was opened to carry the base member into the transport chamber 402 and deposition chamber 417 previously evacuated by means of a vacuum exhaust pump (not shown). The base member 490 was heated in the manner the back thereof was brought into close contact with the base member heater 410. Then, the inside of the deposition chamber 417 was evacuated by means of a vacuum exhaust pump (not shown) to have a pressure of about $1 \times 10^{-5}$ Torr.

(3) After preparation for film formation was completed in this way, $H_2$ gas was fed into the deposition chamber 417 through the gas feed pipe 429. Then, the valves 441, 431 and 430 were opened, and $H_2$ gas flow rate was controlled by means of the mass flow controller 436 so as to be 300 sccm. The pressure inside the deposition chamber 417 was controlled by means of a conductance valve (not shown) so as to be 1.1 Torr. The base member heater 410 was set so as to bring the base member temperature to 350° C.

(4) At the time the base member temperature became stable, an RF n-type layer 103 comprised of μc-Si was formed.

To form the RF n-type layer 103 comprised of μc-Si, the valves 443, 433, 444 and 434 were operated to feed $SiH_4$ gas and $PH_3/H_2$ gas into the deposition chamber 417 through the gas feed pipe 429. Here, $SiH_4$ gas flow rate, $H_2$ gas flow rate and $PH_3/H_2$ gas flow rate were controlled by means of the mass flow controllers 438, 436 and 439 so as to be 2 sccm, 120 sccm and 200 sccm, respectively, and the pressure inside the deposition chamber 417 was controlled so as to be 1.1 Torr.

Next, the power of the RF power source 422 was set to 0.05 W/cm², and RF power was fed to the plasma forming cup 420 to cause glow discharge to take place. Thus, the formation of the RF n-type layer on the base member was started, and an RF n-type layer with a layer thickness of 18 nm was formed, whereupon the RF power source was turned off to stop the glow discharge to complete the formation of the RF n-type layer 103. The $SiH_4$ gas, $PH_3/H_2$ gas and $H_2$ gas were stopped from flowing into the deposition chamber 417, and then the inside of the deposition chamber and the inside of the gas pipe were evacuated to have a pressure of $1 \times 10^{-5}$ Torr.

Subsequently, an RF i-type layer 151 comprised of a-Si, an MW i-type layer 104 comprised of a-SiGe, an RF i-type layer 161 comprised of a-Si and an RF p-type layer 105 comprised of a-SiC were successively formed in the following way.

(5) First, the gate valve 407 was opened to carry the base member into the transport chamber 403 and i-type layer deposition chamber 418 previously evacuated by means of a vacuum exhaust pump (not shown). The base member was heated in the manner the back thereof was brought into close contact with the base member heater 411. Then, the inside of the i-type layer deposition chamber 418 was evacuated by means of a vacuum exhaust pump (not shown) to have a pressure of about $1 \times 10^{-5}$ Torr.

(6) To form the RF i-type layer, the base member heater 411 was set so as to bring the base member temperature to 280° C. At the time the base member was well heated, the valves 464, 454, 450, 463 and 453 were slowly opened to flow $Si_2H_6$ gas and $H_2$ gas into the i-type layer deposition chamber 418 through the gas feed pipe 449. Here, $Si_2H_6$ gas flow rate and $H_2$ gas flow rate were controlled by means of the corresponding mass flow controllers 459 and 458 so as to be 4 sccm and 110 sccm, respectively. The pressure inside the i-type layer deposition chamber 418 was controlled so as to be 0.6 Torr by adjusting the opening of the conductance valve (not shown).

Next, the power of the RF power source 424 was set to 0.008 W/cm² and was applied to the bias rod 428 to cause glow discharge to take place, and the shutter 427 was opened. Thus, the formation of the i-type layer on the RF n-type layer was started, and an i-type layer with a layer thickness of 10 nm was formed, whereupon the RF glow discharge was stopped and the output from the RF power source was stopped to complete the formation of the RF i-type layer 151.

The valves 464, 454, 453 and 450 were closed to stop the $Si_2H_6$ gas and $H_2$ gas from flowing into the i-type layer deposition chamber 418, and then the inside of the i-type layer deposition chamber 418 and the inside of the gas pipe were evacuated to have a pressure of 1×10⁻⁵ Torr.

(7) To form the MW i-type layer, the base member heater 411 was set so as to bring the base member temperature to 380° C. At the time the base member was well heated, the valves 461, 451, 450, 462, 452, 463 and 453 were slowly opened to flow SiH$_4$ gas, GeH$_4$ gas and H$_2$ gas into the i-type layer deposition chamber 418 through the gas feed pipe 449. Here, SiH$_4$ gas flow rate, GeH$_4$ gas flow rate and H$_2$ gas flow rate were controlled by means of the corresponding mass flow controllers 456, 457 and 458 so as to be 45 sccm, 39 sccm and 160 sccm, respectively. The pressure inside the i-type layer deposition chamber 418 was controlled so as to be 5 mTorr by adjusting the opening of the conductance valve (not shown). Next, the power of the RF power source 424 was set to 0.30 W/cm$^2$, and was applied to the bias rod 428.

Thereafter, the power of a microwave power source (2.45 GHz) (not shown) was set to 0.08 W/cm$^2$, and the microwave power was fed into the i-type layer deposition chamber 418 through the waveguide 426 and microwave introducing window 425 to cause glow discharge to take place, and the shutter 427 was opened. Thus, the formation of the MW i-type layer on the RF i-type layer was started, and an i-type layer with a layer thickness of 0.17 μm was formed, whereupon the microwave glow discharge was stopped and the output from the bias power source 424 was stopped to complete the formation of the MW i-type layer 104. The valves 451, 452 and 453 were closed to stop the SiH$_4$ gas, GeH$_4$ gas and H$_2$ gas from flowing into the i-type layer deposition chamber 418, and then the inside of the i-type layer deposition chamber 418 and the inside of the gas pipe were evacuated to have a pressure of 1×10⁻⁵ Torr.

(8) To form the RF i-type layer, the base member heater 411 was set so as to bring the base member temperature to 250° C. At the time the base member was well heated, the valves 464, 454, 450, 463 and 453 were slowly opened to flow Si$_2$H$_6$ gas and H$_2$ gas into the i-type layer deposition chamber 418 through the gas feed pipe 449. Here, Si$_2$H$_6$ gas flow rate and H$_2$ gas flow rate were controlled by means of the corresponding mass flow controllers 459 and 458 so as to be 3 sccm and 90 sccm, respectively. The pressure inside the i-type layer deposition chamber 418 was controlled so as to be 0.7 Torr by adjusting the opening of the conductance valve (not shown).

Next, the power of the RF power source 424 was set to 0.007 W/cm$^2$ and was applied to the bias rod 428 to cause glow discharge to take place, and the shutter 427 was opened. Thus, the formation of the RF i-type layer on the MW i-type layer was started, and an i-type layer with a layer thickness of 20 nm was formed, whereupon the RF glow discharge was stopped and the output from the RF power source 424 was stopped to complete the formation of the RF i-type layer 161. The valves 464, 454, 453 and 450 were closed to stop the Si$_2$H$_6$ gas and H$_2$ gas from flowing into the i-type layer deposition chamber 418, and then the inside of the i-type layer deposition chamber 418 and the inside of the gas pipe were evacuated to have a pressure of 1×10⁻⁵ Torr.

(9) To form the RF p-type layer 105 comprised of a-SiC, first, the gate valve 408 was opened to carry the base member into the transport chamber 404 and p-type layer deposition chamber 419 previously evacuated by means of a vacuum exhaust pump (not shown). The base member was heated in the manner the back thereof was brought into close contact with the base member heater 412. Then, the inside of the p-type layer deposition chamber 419 was evacuated by means of the vacuum exhaust pump (not shown) to have a pressure of about 1×10⁻⁵ Torr.

The base member heater 412 was set so as to bring the base member temperature to 230° C. At the time the base member temperature became stable, the valves 481, 471, 470, 482, 472, 483, 473, 484 and 474 were operated to feed H$_2$ gas, SiH$_4$/H$_2$ gas, B$_2$H$_6$/H$_2$ gas and CH$_4$ gas into the deposition chamber 419 through the gas feed pipe 469. Here, H$_2$ gas flow rate, SiH$_4$/H$_2$ gas flow rate, B$_2$H$_6$/H$_2$ gas flow rate and CH$_4$ gas flow rate were controlled by means of the mass flow controllers 476, 477, 478 and 479 so as to be 60 sccm, 2 sccm, 15 sccm and 0.3 sccm, respectively, and the pressure inside the deposition chamber 419 was controlled so as to be 1.8 Torr by adjusting the opening of the conductance valve (not shown).

Next, the power of the RF power source 423 was set to 0.07 W/cm$^2$, and RF power was fed to the plasma forming cup 421 to cause glow discharge to take place. Thus, the formation of the RF p-type layer on the i-type layer was started, and an RF p-type layer with a layer thickness of 10 nm was formed, whereupon the RF power source was turned off to stop the glow discharge to complete the formation of the RF p-type layer 105.

The valves 472, 482, 473, 483, 474, 484, 471, 481 and 470 were closed to stop the SiH$_4$/H$_2$ gas, B$_2$H$_6$/H$_2$ gas, CH$_4$ gas and H$_2$ gas from flowing into the p-type layer deposition chamber 419, and then the inside of the p-type layer deposition chamber 419 and the inside of the gas pipe were evacuated to have a pressure of 1×10⁻⁵ Torr.

(10) The gate valve 409 was opened to carry the base member into the unload chamber 405 previously evacuated by means of a vacuum exhaust pump (not shown), and a leak valve (not shown) was opened to let gases escape from the unload chamber 405.

(11) On the RF p-type layer 105, ITO was deposited by vacuum deposition in a layer thickness of 70 nm as the transparent conductive layer 112.

(12) On the transparent conductive layer 112, a mask with a comb-shaped opening was placed, and the comb-shaped collector electrode 113 with a flat structure, comprised of Cr(40 nm)/Ag(1,000 nm)/Cr(40 nm) was deposited by vacuum deposition.

Thus, the fabrication of the photovoltaic device of the present Example was completed. This photovoltaic device is herein called SCC5.

Reference Example C5-1

This example is different from Example C5 in that the intermediate layer 199 of Al—Si (95:5) was not formed on the substrate and, after the light-reflecting layer 101 of Ag was formed, the reflection enhancing layer 102 of ZnO was formed without the step of lowering the substrate temperature to 100° C. or below. Except these points, the procedure of Example C5 was repeated to produce photovoltaic devices. Samples of the photovoltaic device of this example are called "SCC5-1".

For every two kinds of the samples of the photovoltaic device, i.e., SCC5 and SCC5-1, seven samples were prepared. In respect of these samples of the photovoltaic device, a bending peel test was carried out in the manner as described below, to examine their environmental resistance. Characteristics of initial photoelectric conversion efficiency (photoelectromotive force/incident light intensity), stated specifically, photoelectric conversion efficiency, short-circuit current and open-end voltage were evaluated in the same manner as in Example A1. The results obtained are shown together in Table C5.

The bending peel test was carried out in the following way: The respective photovoltaic devices were left to stand for 200 hours in an environment of a high-temperature and high-humidity atmosphere (temperature: 80° C.; humidity: 83% RH), and thereafter put to a bending test repeated thirty times. In addition, to the part thus bended, a weight of 10 kg was dropped twelve times at a height of 50 cm, and any peeling in the device was observed using a scanning electron microscope (SEM), manufactured by Hitachi Ltd. (model: S-4500; magnifications: 50,000×).

In the results of the bending peel test, shown in Table C5, letter symbol "A" indicates an instance where no peeling occurs at all, and "C" an instance where peeling partly occurs. The results of evaluation on the characteristics of initial photoelectric conversion efficiency shown in Table C5 are indicated by standardizing the results of the photovoltaic device SCC5-1 on the basis of the results of the photovoltaic device SCC5 which are regarded as 1.

TABLE C5

| Sample | Bending peel test | Total reflectance | Scattered reflectance | Open-end voltage |
|---|---|---|---|---|
| SCC5 | A | 1.00 | 1.00 | 1.00 |
| SCC5-1 | C | 0.88 | 0.92 | 0.96 |

As is seen from the results shown in Table C5, the photovoltaic device SCC5 obtained in Example C5 by the process of the present invention is superior to the photovoltaic devices SCC5-1 of Reference Example C5-1 in all the environmental resistance and characteristics of initial photoelectric conversion efficiency at the same time.

EXAMPLE C6

In the present Example, the photovoltaic device as shown in FIG. 2 was produced using a photovoltaic device base member (sample) formed in the same manner as in Example C4, and using the apparatus employing a multi-chamber-separated system as shown in FIG. 9.

The apparatus 400 shown in FIG. 9 can carry out both MWPCVD and RFPCVD. Using this apparatus, semiconductor layers (103, 151, 104, 161, 105) and other layers were formed on the reflection enhancing layer 102 according to the layer configuration as shown in FIG. 2.

Their production process will be described below with reference to FIG. 9, following its procedure. To the apparatus shown in FIG. 9, a material gas feeding system (not shown) is connected through gas feed pipes. The material gas cylinders are all purified in an ultra-high purity. As the material gas cylinders, an $SiH_4$ gas cylinder, a $CH_4$ gas cylinder, a $GeH_4$ gas cylinder, an $Si_2H_6$ gas cylinder, a $PH_3/H_2$ (dilution: 0.1%) gas cylinder, a $B_2H_6/H_2$ (dilution: 0.2%) gas cylinder, an $H_2$ gas cylinder, an He gas cylinder, an $SiCl_2H_2$ gas cylinder and an $SiH_4/H_2$ (dilution: 1%) gas cylinder were connected thereto.

(1) The base member 490 (corresponding to 190 in FIG. 2) comprising the substrate and the intermediate layer 199, light-reflecting layer 101 and reflection enhancing layer 102 formed thereon, obtained in Example C4 was placed on the base member transporting rail 413 provided in the load chamber 401, and the inside of the load chamber 401 was evacuated by means of a vacuum exhaust pump (not shown) to have a pressure of about $1\times10^{-5}$ Torr.

(2) The gate valve 406 was opened to carry the base member into the transport chamber 402 and deposition chamber 417 previously evacuated by means of a vacuum exhaust pump (not shown). The base member 490 was heated in the manner the back thereof was brought into close contact with the base member heater 410. Then, the inside of the deposition chamber 417 was evacuated by means of a vacuum exhaust pump (not shown) to have a pressure of about $1\times10^{-5}$ Torr.

(3) After preparation for film formation was completed in this way, $H_2$ gas was fed into the deposition chamber 417 through the gas feed pipe 429. Then, the valves 441, 431 and 430 were opened, and $H_2$ gas flow rate was controlled by means of the mass flow controller 436 so as to be 300 sccm. The pressure inside the deposition chamber 417 was controlled by means of a conductance valve (not shown) so as to be 1.2 Torr. The base member heater 410 was set so as to bring the base member temperature to 350° C.

(4) At the time the base member temperature became stable, an RF n-type layer 103 comprised of $\mu$c-Si was formed.

To form the RF n-type layer 103 comprised of $\mu$c-Si, the valves 443, 433, 444 and 434 were operated to feed $SiH_4$ gas and $PH_3/H_2$ gas into the deposition chamber 417 through the gas feed pipe 429. Here, $SiH_4$ gas flow rate, $H_2$ gas flow rate and $PH_3/H_2$ gas flow rate were controlled by means of the mass flow controllers 438, 436 and 439 so as to be 2 sccm, 100 sccm and 190 sccm, respectively, and the pressure inside the deposition chamber 417 was controlled so as to be 1.2 Torr.

Next, the power of the RF power source 422 was set to 0.06 W/cm², and RF power was fed to the plasma forming cup 420 to cause glow discharge to take place. Thus, the formation of the RF n-type layer on the base member was started, and an RF n-type layer with a layer thickness of 20 nm was formed, whereupon the RF power source was turned off to stop the glow discharge to complete the formation of the RF n-type layer 103. The $SiH_4$ gas, $PH_3/H_2$ gas and $H_2$ gas were stopped from flowing into the deposition chamber 417, and then the inside of the deposition chamber and the inside of the gas pipe were evacuated to have a pressure of $1\times10^{-5}$ Torr.

Subsequently, an RF i-type layer 151 comprised of a-Si, an MW i-type layer 104 comprised of a-SiGe, an RF i-type layer 161 comprised of a-Si and an RF p-type layer 105 comprised of a-SiC were successively formed in the following way (see the layer configuration shown in FIG. 2).

(5) First, the gate valve 407 was opened to carry the base member into the transport chamber 403 and i-type layer deposition chamber 418 previously evacuated by means of a vacuum exhaust pump (not shown). The base member was heated in the manner the back thereof was brought into close contact with the base member heater 411. Then, the inside of the i-type layer deposition chamber 418 was evacuated by means of a vacuum exhaust pump (not shown) to have a pressure of about $1\times10^{-5}$ Torr.

(6) To form the RF i-type layer, the base member heater 411 was set so as to bring the base member temperature to 280° C. At the time the base member was well heated, the valves 464, 454, 450, 463 and 453 were slowly opened to flow $Si_2H_6$ gas and $H_2$ gas into the i-type layer deposition chamber 418 through the gas feed pipe 449. Here, $Si_2H_6$ gas flow rate and $H_2$ gas flow rate were controlled by means of the corresponding mass flow controllers 459 and 458 so as to be 4 sccm and 100 sccm, respectively. The pressure inside the i-type layer deposition chamber 418 was controlled so as to be 0.5 Torr by adjusting the opening of the conductance valve (not shown).

Next, the power of the RF power source 424 was set to 0.007 W/cm² and was applied to the bias rod 428 to cause glow discharge to take place, and the shutter 427 was opened. Thus, the formation of the i-type layer on the RF n-type layer on the i-type layer was started, and an i-type layer with a layer thickness of 10 nm was formed, whereupon the RF glow discharge was stopped and the output from the RF power source was stopped to complete the formation of the RF i-type layer 151.

The valves 464, 454, 453 and 450 were closed to stop the $Si_2H_6$ gas and $H_2$ gas from flowing into the i-type layer deposition chamber 418, and then the inside of the i-type layer deposition chamber 418 and the inside of the gas pipe were evacuated to have a pressure of $1 \times 10^{-5}$ Torr.

(7) To form the MW i-type layer, the base member heater 411 was set so as to bring the base member temperature to 380° C. At the time the base member was well heated, the valves 461, 451, 450, 462, 452, 463 and 453 were slowly opened to flow $SiH_4$ gas, $GeH_4$ gas and $H_2$ gas into the i-type layer deposition chamber 418 through the gas feed pipe 449. Here, $SiH_4$ gas flow rate, $GeH_4$ gas flow rate and $H_2$ gas flow rate were controlled by means of the corresponding mass flow controllers 456, 457 and 458 so as to be 48 scam, 46 scam and 160 scam, respectively. The pressure inside the i-type layer deposition chamber 418 was controlled so as to be 5 mTorr by adjusting the opening of the conductance valve (not shown). Next, the power of the RF power source 424 was set to 0.30 W/cm², and was applied to the bias rod 428.

Thereafter, the power of a microwave power source (2.45 GHz) (not shown) was set to 0.09 W/cm², and the microwave power was fed into the i-type layer deposition chamber 418 through the waveguide 426 and microwave introducing window 425 to cause glow discharge to take place, and the shutter 427 was opened. Thus, the formation of the MW i-type layer on the RF i-type layer was started, and an i-type layer with a layer thickness of 0.17 µm was formed, whereupon the microwave glow discharge was stopped and the output from the bias power source 424 was stopped to complete the formation of the MW i-type layer 104. The valves 451, 452 and 453 were closed to stop the $SiH_4$ gas, $GeH_4$ gas and $H_2$ gas from flowing into the i-type layer deposition chamber 418, and then the inside of the i-type layer deposition chamber 418 and the inside of the gas pipe were evacuated to have a pressure of $1 \times 10^{-5}$ Torr.

(8) To form the RF i-type layer, the base member heater 411 was set so as to bring the base member temperature to 240° C. At the time the base member was well heated, the valves 464, 454, 450, 463 and 453 were slowly opened to flow $Si_2H_6$ gas and $H_2$ gas into the i-type layer deposition chamber 418 through the gas feed pipe 449. Here, $Si_2H_6$ gas flow rate and $H_2$ gas flow rate were controlled by means of the corresponding mass flow controllers 459 and 458 so as to be 3.5 sccm and 100 sccm, respectively. The pressure inside the i-type layer deposition chamber 418 was controlled so as to be 0.5 Torr by adjusting the opening of the conductance valve (not shown).

Next, the power of the RF power source 424 was set to 0.007 W/cm² and was applied to the bias rod 428 to cause glow discharge to take place, and the shutter 427 was opened. Thus, the formation of the RF i-type layer on the MW i-type layer was started, and an i-type layer with a layer thickness of 20 nm was formed, whereupon the RF glow discharge was stopped and the output from the RF power source 424 was stopped to complete the formation of the RF i-type layer 161. The valves 464, 454, 453 and 450 were closed to stop the $Si_2H_6$ gas and $H_2$ gas from flowing into the i-type layer deposition chamber 418, and then the inside of the i-type layer deposition chamber 418 and the inside of the gas pipe were evacuated to have a pressure of $1 \times 10^{-5}$ Torr.

(9) To form the RF p-type layer 105 comprised of a-SiC, first, the gate valve 408 was opened to carry the base member into the transport chamber 404 and p-type layer deposition chamber 419 previously evacuated by means of a vacuum exhaust pump (not shown). The base member was heated in the manner the back thereof was brought into close contact with the base member heater 412. Then, the inside of the p-type layer deposition chamber 419 was evacuated by means of the vacuum exhaust pump (not shown) to have a pressure of about $1 \times 10^{-5}$ Torr.

The base member heater 412 was set so as to bring the base member temperature to 230° C. At the time the base member temperature became stable, the valves 481, 471, 470, 482, 472, 483, 473, 484 and 474 were operated to feed $H_2$ gas, $SiH_4/H_2$ gas, $B_2H_6/H_2$ gas and $CH_4$ gas into the deposition chamber 419 through the gas feed pipe 469. Here, $H_2$ gas flow rate, $SiH_4/H_2$ gas flow rate, $B_2H_6/H_2$ gas flow rate and $CH_4$ gas flow rate were controlled by means of the mass flow controllers 476, 477, 478 and 479 so as to be 70 sccm, 2 sccm, 16 sccm and 0.2 sccm, respectively, and the pressure inside the deposition chamber 419 was controlled so as to be 1.7 Torr by adjusting the opening of the conductance valve (not shown).

Next, the power of the RF power source 423 was set to 0.07 W/cm², and RF power was fed to the plasma forming cup 421 to cause glow discharge to take place. Thus, the formation of the RF p-type layer on the i-type layer was started, and an RF p-type layer with a layer thickness of 10 nm was formed, whereupon the RF power source was turned off to stop the glow discharge to complete the formation of the RF p-type layer 105.

The valves 472, 482, 473, 483, 474, 484, 471, 481 and 470 were closed to stop the $SiH_4/H_2$ gas, $B_2H_6/H_2$ gas, $CH_4$ gas and $H_2$ gas from flowing into the p-type layer deposition chamber 419, and then the inside of the p-type layer deposition chamber 419 and the inside of the gas pipe were evacuated to have a pressure of $1 \times 10^{-5}$ Torr.

(10) The gate valve 409 was opened to carry the base member into the unload chamber 405 previously evacuated by means of a vacuum exhaust pump (not shown), and a leak valve (not shown) was opened to let gases escape from the unload chamber 405.

(11) On the RF p-type layer 105, ITO was deposited by vacuum deposition in a layer thickness of 70 nm as the transparent conductive layer 112.

(12) On the transparent conductive layer 112, a mask with a comb-shaped opening was placed, and the comb-shaped collector electrode 113 with a flat structure, comprised of Cr(40 nm)/Ag(1,000 nm)/Cr(40 nm) was deposited by vacuum deposition.

Thus, the fabrication of the photovoltaic device of the present Example was completed. This photovoltaic device is herein called SCC6.

Reference Example C6-1

This example is different from Example C6 in that the base member sample of Reference Example C4-1 was used in which the intermediate layer 199 of Al—Si (95:5) was not formed and, after the light-reflecting layer 101 of Ag was formed, the reflection enhancing layer 102 of ZnO was formed without the step of lowering the substrate temperature to 100° C. or below. Except for these points, the procedure of Example C6 was repeated to produce photovoltaic devices. Samples of the photovoltaic device of this example are called "SCC6-1".

For every two kinds of the samples of the photovoltaic device, i.e., SCC6 and SCC6-1, six samples were prepared. In respect of these samples of the photovoltaic device, a bending peel test was carried out in the manner as described below, to examine their environmental resistance. Characteristics of initial photoelectric conversion efficiency (photoelectromotive force/incident light intensity), stated specifically, photoelectric conversion efficiency, short-circuit current and open-end voltage were evaluated in the same manner as in Example A1. The results obtained are shown together in Table C6.

The bending peel test was carried out in the following way: The respective photovoltaic devices were left to stand for 200 hours in an environment of a high-temperature and high-humidity atmosphere (temperature: 82° C.; humidity: 85% RH), and thereafter put to a bending test repeated thirty times. In addition, to the part thus bended, a weight of 10 kg was dropped fourteen times at a height of 50 cm, and any peeling in the device was observed using a scanning electron microscope (SEM), manufactured by Hitachi Ltd. (model: S-4500; magnifications: 50,000×).

In the results of the bending peel test, shown in Table C6, letter symbol "A" indicates an instance where no peeling occurs at all, and "C" an instance where peeling partly occurs. The results of evaluation on the characteristics of initial photoelectric conversion efficiency shown in Table C6 are indicated by standardizing the results of the photovoltaic device SCC6-1 on the basis of the results of the photovoltaic device SCC6 which are regarded as 1.

TABLE C6

| Sample | Bending peel test | Total reflectance | Scattered reflectance | Open-end voltage |
|---|---|---|---|---|
| SCC6 | A | 1.00 | 1.00 | 1.00 |
| SCC561 | C | 0.84 | 0.90 | 0.92 |

As is seen from the results shown in Table C6, the photovoltaic device SCC6 obtained in Example C6 by the process of the present invention is superior to the photovoltaic devices SCC6-1 of Reference Example in all the environmental resistance and characteristics of initial photoelectric conversion efficiency at the same time.

EXAMPLE C7

In the present Example, the base member 290 constituting the photovoltaic device as shown in FIG. 4 (i.e., the base member comprising the substrate 200 and the layers of intermediate layer 299, light-reflecting layer 201 and reflection enhancing layer 202 formed on the substrate) was produced using the apparatus of a multi-chamber-separated system as shown in FIG. 6. Next, using this photovoltaic device base member 290, the photovoltaic device as shown in FIG. 4 was produced using the apparatus of a multi-chamber-separated system as shown in FIG. 9.

The process of forming the photovoltaic device base member will be described below with reference to FIG. 6.

To the apparatus shown in FIG. 6, a material gas feeding system (not shown) is connected through gas feed pipes. The material gas cylinders are all purified in an ultra-high purity. As the material gas cylinders, an $H_2$ gas cylinder, an Ar gas cylinder and an He gas cylinder were connected thereto. Al—Si (95:5), Ag and ZnO were used as targets. These are so provided that sputtering can be carried out in vacuum.

As the substrate (200 in FIG. 4), a stainless steel sheet of 0.5 mm thick and 50×50 mm$^2$ was used, which was subjected to ultrasonic cleaning with acetone and isopropanol, followed by hot-air drying. As the sputter power source, the DC power source 325 was connected, and an intermediate layer 299 of Al—Si (95:5) was formed on the substrate by DC magnetron sputtering. Then the subsequent processing was carried out.

The process of forming the photovoltaic device base member will be described below with reference to FIG. 6.

(1) A substrate 3390 (corresponding to 200 in FIG. 4) having been cleaned was placed on the substrate transporting rail 3313 provided in the load chamber 3301, and the inside of the load chamber 3301 was evacuated by means of a vacuum exhaust pump (not shown) to have a pressure of about $1 \times 10^{-5}$ Torr.

(2) The gate valve 3306 was opened to carry the substrate into the transport chamber 3302 and deposition chamber 3320 previously evacuated by means of a vacuum exhaust pump (not shown). The substrate 3390 was set in the manner the back thereof was brought into close contact with the substrate heater 3310, and was heated while raising temperature at a rate of 27° C./sec., to bring the substrate temperature to 250° C. Then, the inside of the deposition chamber 3320 was evacuated by means of a vacuum exhaust pump (not shown) to have a pressure of about $3 \times 10^{-6}$ Torr.

(3) 48 sccm of Ar gas was fed into it through the gas feed pipe 3324, and a conductance valve (not shown) was operated to control the pressure so as to be 4 mTorr. Electric current was flowed to the toroidal coil 3323, and 380 V of a DC power was applied from the sputter power source 3325 to cause Ar plasma.

(4) The target shutter 3326 was opened, and the intermediate layer 299 (FIG. 4) of Al—Si (95:5) with a layer thickness of 0.012 μm was formed on the surface of the stainless steel sheet, whereupon the target shutter 3326 was closed to extinguish the plasma.

(5) The substrate heater 3310 was lifted, and the substrate temperature was lowered to 100° C. or below while dropping temperature at a rate of 20° C./sec. in an atmosphere of He gas used as substrate cooling gas. Thereafter, the gate valve 3307 was opened to carry the substrate into the transport chamber 3303 and deposition chamber 3330 previously evacuated by means of a vacuum exhaust pump (not shown). The substrate 3390 was set in the manner the back thereof was brought into close contact with the substrate heater 3311, and was heated while raising temperature at a rate of 15° C./sec., to bring the substrate temperature to 290° C. Then, the inside of the deposition chamber 3330 was evacuated by means of a vacuum exhaust pump (not shown) to have a pressure of about $2 \times 10^{-6}$ Torr.

(6) 35 sccm of Ar gas was fed into it through the gas feed pipe 3334, and a conductance valve (not shown) was operated to control the pressure so as to be 4 mTorr. Electric current was flowed to the toroidal coil 3333, and 380 V of a DC power was applied from the sputter power source 3335 to cause Ar plasma. Next, the target shutter 3336 was opened, and a light-reflecting layer 201 (FIG. 4) of Ag with a layer thickness of 0.7 μm was formed on the surface of the intermediate layer 299 of Al—Si (95:5), whereupon the target shutter 3336 was closed to extinguish the plasma.

(7) The substrate heater 3311 was lifted, and the substrate temperature was lowered to 100° C. or below while dropping temperature at a rate of 15° C./sec. in an atmosphere of He gas used as substrate cooling gas. Thereafter, the gate valve 3308 was opened to carry the substrate into the transport chamber 3304 and deposition chamber 3340 previously evacuated by means of a vacuum exhaust pump (not shown). The substrate 3390 was set in the manner the back thereof was brought into close contact with the substrate heater 3312, and was heated while raising temperature at a rate of 15° C./sec., to bring the substrate temperature to 315° C. Then, the inside of the deposition chamber 3340 was evacuated by means of a vacuum exhaust pump (not shown) to have a pressure of about $3\times10^{-6}$ Torr.

(8) 42 sccm of Ar gas was fed into it through the gas feed pipe 3344, and a conductance valve (not shown) was operated to control the pressure so as to be 4 mTorr. Electric current was flowed to the toroidal coil 3343, and 380 V of a DC power was applied from the sputter power source 3345 to cause Ar plasma. Next, the target shutter 3346 was opened, and a reflection enhancing layer 202 of ZnO with a layer thickness of 1.5 µm was formed on the surface of the light-reflecting layer 101 of Ag, whereupon the target shutter 3346 was closed to extinguish the plasma.

(9) The substrate heater 3312 was lifted, and the substrate temperature was lowered to 100° C. or below while dropping temperature at a rate of 17° C./sec. in an atmosphere of He gas used as substrate cooling gas. Thereafter, the gate valve 3309 was opened to carry the substrate into the unload chamber 3305 previously evacuated by means of a vacuum exhaust pump (not shown).

Thus, the production of the photovoltaic device base member (290 in FIG. 4) of the present Example was completed. Samples of this photovoltaic device base member are called "SC7".

Subsequently, using the photovoltaic device base member produced through the steps (1) to (9) in Example C7, the triple type photovoltaic device as shown in FIG. 4 was produced using the apparatus employing a multi-chamber-separated system as shown in FIG. 9.

In the following, the process for producing the photovoltaic device will be described.

(10) The base member (490 in FIG. 9) comprising the substrate and the intermediate layer 299, light-reflecting layer 201 and reflection enhancing layer 202 formed thereon was placed on the base member transporting rail 413 provided in the load chamber 401, and the inside of the load chamber 401 was evacuated by means of a vacuum exhaust pump (not shown) to have a pressure of about $1\times10^{-5}$ Torr.

(11) The gate valve 406 was opened to carry the base member into the transport chamber 402 and deposition chamber 417 previously evacuated by means of a vacuum exhaust pump (not shown). The base member 490 was heated in the manner the back thereof was brought into close contact with the base member heater 410. Then, the inside of the deposition chamber 417 was evacuated by means of a vacuum exhaust pump (not shown) to have a pressure of about $1\times10^{-5}$ Torr.

(12) After preparation for film formation was completed in this way, H₂ gas was fed into the deposition chamber 417 through the gas feed pipe 429. Then, the valves 441, 431 and 430 were opened, and H₂ gas flow rate was controlled by means of the mass flow controller 436 so as to be 500 sccm. The pressure inside the deposition chamber 417 was controlled by means of a conductance valve (not shown) so as to be 1.3 Torr. The base member heater 410 was set so as to bring the base member temperature to 350° C.

(13) At the time the base member temperature became stable, an RF n-type layer 203 comprised of µc-Si was formed.

To form the RF n-type layer 203 comprised of µc-Si, the valves 443, 433, 444 and 434 were operated to feed SiH₄ gas and PH₃/H₂ gas into the deposition chamber 417 through the gas feed pipe 429. Here, SiH₄ gas flow rate, H₂ gas flow rate and PH₃/H₂ gas flow rate were controlled by means of the mass flow controllers 438, 436 and 439 so as to be 2 sccm, 100 sccm and 200 sccm, respectively, and the pressure inside the deposition chamber 417 was controlled so as to be 1.3 Torr.

Next, the power of the RF power source 422 was set to 0.05 W/cm², and RF power was fed to the plasma forming cup 420 to cause glow discharge to take place. Thus, the formation of the RF n-type layer on the base member was started, and an RF n-type layer with a layer thickness of 20 nm was formed, whereupon the RF power source was turned off to stop the glow discharge to complete the formation of the RF n-type layer 203. The SiH₄ gas, PH₃/H₂ gas and H₂ gas were stopped from flowing into the deposition chamber 417, and then the inside of the deposition chamber and the inside of the gas pipe were evacuated to have a pressure of $1\times10^{-5}$ Torr.

(14) Subsequently, following the procedure in Example C5, an RF i-type layer 251 comprised of a-Si (corresponding to the RF i-type layer 151), an MW i-type layer 204 comprised of a-SiGe (corresponding to the MW i-type layer 104), an RF i-type layer 261 comprised of a-Si (corresponding to the RF i-type layer 161), an RF p-type layer 205 comprised of a-SiC (corresponding to the RF p-type layer 105), an RF n-type layer 206 comprised of µc-Si (corresponding to the RF n-type layer 103), an RF i-type layer 252 comprised of a-Si (corresponding to the RF i-type layer 151), an MW i-type layer 207 comprised of a-SiGe (corresponding to the MW i-type layer 104), an RF i-type layer 262 comprised of a-Si (corresponding to the RF i-type layer 161), an RF p-type layer 208 comprised of a-SiC (corresponding to the RF p-type layer 105), an RF n-type layer 209 comprised of µc-Si (corresponding to the RF n-type layer 103), an RF i-type layer 210 comprised of a-Si (corresponding to the RF i-type layer 161), and an RF p-type layer 211 comprised of a-SiC (corresponding to the RF p-type layer 105) were successively formed.

(15) On the RF p-type layer 211, ITO was deposited by vacuum deposition in a layer thickness of 70 nm as the transparent conductive layer 212.

(16) On the transparent conductive layer 212, a mask with a comb-shaped opening was placed, and the comb-shaped collector electrode 213 with a flat structure, comprised of Cr(40 nm)/Ag(1,000 nm)/Cr(40 nm) was deposited by vacuum deposition.

Thus, the fabrication of the photovoltaic device of the present Example was completed. This photovoltaic device is herein called SCC7. Conditions for forming the respective semiconductor layers RF n-type layers, RF i-type layers, MW i-type layers and RF p-type layers are shown together in Table C7.

TABLE C7

| | SiH₄ Flow rate (sccm) | Si₂H₆ Flow rate (sccm) | CH₄ Flow rate (sccm) | GeH₄ Flow rate (sccm) | H₂ Flow rate (sccm) | PH₃/H₂ Flow rate (sccm) | B₂H₆/H₂ Flow rate (sccm) | SiH₄/H₂ Flow rate (sccm) | Pressure (Torr) | MW power (W/cm²) | RF power (W/cm²) | Base member temp. (°C.) | Layer thickness (nm) |
|---|---|---|---|---|---|---|---|---|---|---|---|---|---|
| RF n-type layer: (203) | 2.0 | — | — | — | 100 | 220 | — | — | 1.3 | — | 0.05 | 350 | 20 |
| RF i-type layer: (251) | — | 4.0 | — | — | 100 | — | — | — | 0.7 | — | 0.008 | 300 | 10 |
| MW i-type layer: (204) | 40 | — | — | 42 | 150 | — | — | — | 0.011 | 0.12 | 0.31 | 370 | 110 |
| RF i-type layer: (261) | — | 4.0 | — | — | 100 | — | — | — | 0.65 | — | 0.008 | 300 | 23 |
| RF p-type layer: (205) | — | — | 0.1 | — | 80 | — | 9 | 2 | 1.8 | — | 0.07 | 300 | 10 |
| RF n-type layer: (206) | 1.1 | — | — | — | 40 | 290 | — | — | 1.1 | — | 0.04 | 300 | 10 |
| RF i-type layer: (252) | — | 4.0 | — | — | 100 | — | — | — | 0.75 | — | 0.008 | 300 | 10 |
| MW i-type layer: (207) | 34 | — | — | 29 | 160 | — | — | — | 0.010 | 0.12 | 0.3 | 350 | 100 |
| RF i-type layer: (262) | — | 3.5 | — | — | 90 | — | — | — | 0.7 | — | 0.008 | 280 | 23 |
| RF p-type layer: (208) | — | — | 0.2 | — | 80 | — | 9 | 2 | 1.7 | — | 0.07 | 260 | 10 |
| RF n-type layer: (209) | 0.8 | — | — | — | 50 | 250 | — | — | 1.05 | — | 0.04 | 230 | 10 |
| RF i-type layer: (210) | — | 2.5 | — | — | 60 | — | — | — | 0.8 | — | 0.007 | 190 | 90 |
| RF p-type layer: (211) | — | — | 0.4 | — | 90 | — | 8 | 2 | 1.6 | — | 0.07 | 170 | 10 |

Reference Example C7-1

This example is different from Example C7 in that the intermediate layer 199 of Al—Si (95:5) was not formed on the substrate and, after the light-reflecting layer 201 of Ag was formed, the reflection enhancing layer 202 of ZnO was formed without the step of lowering the substrate temperature to 100° C. or below. Except for these points, the procedure of Example C7 was repeated to produce photovoltaic devices. Samples of the photovoltaic device of this example are called "SCC7-1".

For every two kinds of the samples of the photovoltaic device, i.e., SCC7 and SCC7-1, seven samples were prepared. In respect of these samples of the photovoltaic device, a bending peel test was carried out in the manner as described below, to examine their environmental resistance. Characteristics of initial photoelectric conversion efficiency (photoelectromotive force/incident light intensity) (in respect of photoelectric conversion efficiency and short-circuit current) were evaluated in the same manner as in Example A1. Photo-deterioration characteristics were also evaluated in the manner as described below. The results obtained are shown together in Table C8.

The bending peel test was carried out in the following way: The respective photovoltaic devices were left to stand for 280 hours in an environment of a high-temperature and high-humidity atmosphere (temperature: 83° C.; humidity: 85% RH), and thereafter put to a bending test repeated thirty times. In addition, to the part thus bended, a weight of 10 kg was dropped twelve times at a height of 50 cm, and any peeling in the device was observed using a scanning electron microscope (SEM), manufactured by Hitachi Ltd. (model: S-4500; magnifications: 50,000×).

To examine the photo-deterioration characteristics, photoelectric conversion efficiency was evaluated after photovoltaic devices having a temperature of 50° C. were irradiated by light for 1,100 hours under 1 sun of 100 mW/cm².

In the results of the bending peel test, shown in Table C8, letter symbol "A" indicates an instance where no peeling occurs at all, and "C" an instance where peeling partly occurs. The results of evaluation on the characteristics of initial photoelectric conversion efficiency and photo-deterioration characteristics also shown in Table C8 are indicated by standardizing the results of the photovoltaic device SCC7-1 on the basis of the results of the photovoltaic device SCC7 which are regarded as 1.

TABLE C8

| Sample | Bending peel test | Total reflectance | Scattered reflectance | Photo-deterioration characteristics |
|---|---|---|---|---|
| SCC7 | A | 1.00 | 1.00 | 1.00 |
| SCC7-1 | C | 0.84 | 0.90 | 0.93 |

As is seen from the results shown in Table C8, the photovoltaic device SCC7 obtained in Example C7 by the process of the present invention is superior to the photovoltaic devices SCC7-1 of Reference Example C7-1 in all the environmental resistance, characteristics of initial photoelectric conversion efficiency and photo-deterioration characteristics at the same time.

EXAMPLE C8

In the present Example, the triple type photovoltaic device as shown in FIG. 4 was produced using the fabrication apparatus employing a roll-to-roll system as shown in FIGS. 8 and 10.

As the substrate, a belt-like stainless steel sheet of 300 m long, 30 cm wide and 0.2 mm thick was used.

The process of forming the photovoltaic device base member will be described below with reference to FIG. 8.

The apparatus for continuously forming the photovoltaic device base member as shown in FIG. 8 is successively provided with the substrate feed-out chamber 3610, a plurality of deposition chambers 3611 to 3614 and the substrate wind-up chamber 3684, which are connected through separating paths 3615, 3616, 3617, 3618 and 3619 between them. Each deposition chamber has an exhaust vent, through which the inside thereof can be evacuated.

The belt-like substrate 3621 is passed through these deposition chambers and separating paths after it is sent out of the substrate feed-out chamber, and is wound up in the substrate wind-up chamber. At the same time, the apparatus is so designed that gases can be fed into the respective deposition chambers and separating paths through their gas inlets, gases can be drawn out through the respective exhaust vents and the respective layers can be formed.

The intermediate layer of Al—Si (95:5) is formed in the deposition chamber 3612, the light-reflecting layer of Ag in the deposition chamber 3613, and the reflection enhancing layer of ZnO in the deposition chamber 3614. The deposition chambers are respectively provided in their insides with the halogen lamp heaters 3640, 3641, 3642 and 3643 for heating the substrate on the back thereof, and the substrate is temperature-raised or heated to the stated temperature in each deposition chamber. The separating paths 3617, 3618 and 3619 have also the function to lower temperature so that the substrate temperature is dropped at a given rate after the semiconductor layers are respectively formed in the deposition chambers. In particular, in the present Example, the substrate temperature is lowered to 100° C. or below in the separating path 3618 after the light-reflecting layer is formed in the deposition chamber 3613.

In the deposition chamber 3612, DC magnetron sputtering is carried out, in which Ar gas is fed into the chamber through the gas inlet 3632 and Al—Si (95:5) is used as the target 3650.

In the deposition chamber 3613, DC magnetron sputtering is carried out, in which Ar gas is fed into the chamber through the gas inlet 3634 and Ag is used as the target 3660.

In the deposition chamber 3614, DC magnetron sputtering or RF magnetron sputtering is carried out, in which Ar gas is fed into the chamber through the gas inlet 3636 and ZnO is used as the target 3670.

After the photovoltaic device base member is formed on the belt substrate under conditions shown in Table C9, the substrate (formed into the base member) is wound up in the substrate wind-up chamber 3684.

The process of producing the photovoltaic device will be described below with reference to FIG. 10.

The triple type photovoltaic device having the layer configuration as shown in FIG. 4 was produced under conditions as shown in Table C10 below, using the apparatus employing a roll-to-roll system as shown in FIG. 10.

The belt base member comprising the photovoltaic device base member obtained in the manner as described above was set in the load chamber 5010 for introducing the belt base member. This belt base member was passed through all the deposition chambers and all the gas gates and connected to the belt base member wind-up jig in the unload chamber 5150. The respective deposition chambers were evacuated to $10^{-3}$ Torr or below by means of an exhaust system (not shown). The desired materials gases were fed into the respective deposition chambers from the deposited film forming mixing systems 5024, 5034, 5044, 5054, 5064, 5074, 5084, 5094, 5104, 5114, 5124, 5134 and 5144. To the gas gates 5201, 5202, 5203, 5204, 5205, 5206, 5207, 5208, 5209, 5210, 5211, 5212, 5213 and 5214, gas was fed from the respective gate gas feeding system. The base member was heated by means of the base member heater in each deposition system, and the degree of vacuum was controlled by adjusting the opening of the exhaust valve of each exhaust system. After the base member temperature and degree of vacuum became stable, the belt base member was begun to be transported, and RF power or MW (frequency: 2.45 GHz) power for generating plasma was supplied to each deposition chamber. In this way, the triple type photovoltaic device having three pin structures as shown in FIG. 4, which were superposingly formed on the belt base member 290, was formed.

Next, on the RF p-type layer 211, ITO was deposited by vacuum deposition in a layer thickness of 70 nm as the transparent conductive layer 212.

Next, on the transparent conductive layer 212, a mask with a comb-shaped opening was placed, and the comb-shaped collector electrode 213 with a flat structure, comprised of Cr(40 nm)/Ag(1,000 nm)/Cr(40 nm) was deposited by vacuum deposition.

Thus, the fabrication of the photovoltaic device of the present Example was completed. This photovoltaic device is herein called SCC8. Conditions for forming the photovoltaic device base member in the present Example are shown in Table C9. Conditions for forming the respective semiconductor layers RF n-type layers, RF i-type layers, MW i-type layers and RF p-type layers are shown in Table C10.

TABLE C9

Photovoltaic device base member forming conditions
(Example C8; apparatus used: FIG. 8)

|  | Intermediate layer: Al—Si (95:5) | Light-reflecting layer: Ag | Reflection enhancing layer: ZnO |
|---|---|---|---|
| Temp. rise rate: (°C./sec.) | 20 | 15 | 15 |
| Substrate temp.: (°C.) | 260 | 280 | 300 |
| Ar gas flow rate: (sccm) | 38 | 30 | 35 |
| Pressure: (mTorr) | 3 | 3 | 4 |
| Target species | Al—Si (95:5) | Ag | ZnO |
| Type of sputtering: | DC | DC | DC |
| Sputter voltage: (V) | 370 | 380 | 385 |
| Layer thickness: ($\mu$m) | 0.01 | 0.62 | 1.0 |
| Substrate cooling gas: | He | $H_2$ | He |
| Temp. drop rate: (°C./sec.) | 10 | 10 | 15 |

TABLE C10

|  | $SiH_4$ Flow rate (sccm) | $Si_2H_6$ Flow rate (sccm) | $CH_4$ Flow rate (sccm) | $GeH_4$ Flow rate (sccm) | $H_2$ Flow rate (sccm) | $PH_3/H_2$ Flow rate (sccm) | $B_2H_6/H_2$ Flow rate (sccm) | $SiH_4/H_2$ Flow rate (sccm) | Pressure (Torr) | MW power (W/cm$^2$) | RF power (W/cm$^2$) | Base member temp. (°C.) | Layer thickness (nm) |
|---|---|---|---|---|---|---|---|---|---|---|---|---|---|
| RF n-type layer: (203) | 2.0 | — | — | — | 100 | 220 | — | — | 1.3 | — | 0.05 | 350 | 20 |
| RF i-type layer: (251) | — | 4.0 | — | — | 100 | — | — | — | 0.8 | — | 0.008 | 300 | 10 |
| MW i-type layer: (204) | 68 | — | — | 69 | 250 | — | — | — | 0.005 | 0.08 | 0.28 | 380 | 100 |

TABLE C10-continued

|  | SiH₄ Flow rate (sccm) | Si₂H₆ Flow rate (sccm) | CH₄ Flow rate (sccm) | GeH₄ Flow rate (sccm) | H₂ Flow rate (sccm) | PH₃/H₂ Flow rate (sccm) | B₂H₆/H₂ Flow rate (sccm) | SiH₄/H₂ Flow rate (sccm) | Pressure (Torr) | MW power (W/cm²) | RF power (W/cm²) | Base member temp. (°C.) | Layer thickness (nm) |
|---|---|---|---|---|---|---|---|---|---|---|---|---|---|
| RF i-type layer: (261) | — | 4.0 | — | — | 100 | — | — | — | 0.55 | — | 0.008 | 300 | 23 |
| RF p-type layer: (205) | — | — | 0.1 | — | 80 | — | 9 | 2 | 1.8 | — | 0.07 | 300 | 10 |
| RF n-type layer: (206) | 1.1 | — | — | — | 40 | 290 | — | — | 1.1 | — | 0.04 | 300 | 10 |
| RF i-type layer: (252) | — | 4.0 | — | — | 90 | — | — | — | 0.75 | — | 0.008 | 300 | 10 |
| MW i-type layer: (207) | 53 | — | — | 49 | 250 | — | — | — | 0.005 | 0.06 | 0.28 | 360 | 98 |
| RF i-type layer: (262) | — | 3.5 | — | — | 90 | — | — | — | 0.5 | — | 0.008 | 280 | 23 |
| RF p-type layer: (208) | — | — | 0.2 | — | 80 | — | 9 | 2 | 1.7 | — | 0.07 | 260 | 10 |
| RF n-type layer: (209) | 0.8 | — | — | — | 50 | 250 | — | — | 1.05 | — | 0.04 | 230 | 10 |
| RF i-type layer: (210) | — | 7.0 | — | — | 80 | — | — | — | 0.7 | — | 0.007 | 190 | 90 |
| RF p-type layer: (211) | — | — | 0.4 | — | 90 | — | 8 | 2 | 1.6 | — | 0.07 | 170 | 10 |

Reference Example C8-1

This example is different from Example C8 in that the substrate was used in which the intermediate layer 299 of Al—Si (95:5) was not formed on the substrate and, after the light-reflecting layer 201 of Ag was formed, the reflection enhancing layer 202 of ZnO was formed without the step of lowering the substrate temperature to 100° C. or below. Except for these points, the procedure of Example C8 was repeated to produce photovoltaic devices as shown in FIG. 4. Samples of the photovoltaic device of this example are called "SCC8-1".

For every two kinds of the samples of the photovoltaic device, i.e., SCC8 and SCC8-1, seven samples were prepared. In respect of these samples of the photovoltaic device, a bending peel test was carried out in the same manner as in Example C7 to examine their environmental resistance. Characteristics of initial photoelectric conversion efficiency (photoelectromotive force/incident light intensity) (in respect of photoelectric conversion efficiency and short-circuit current) were evaluated in the same manner as in Example C7. Photo-deterioration characteristics were also evaluated in the manner as described below. The results obtained are shown together in Table C11.

To examine the photo-deterioration characteristics, photoelectric conversion efficiency was evaluated after photovoltaic devices having a temperature of 52° C. were irradiated by light for 1,250 hours under 1 sun of 100 mW/cm².

In the results of the bending peel test, shown in Table C11, letter symbol "A" indicates an instance where no peeling occurs at all, and "C" an instance where peeling partly occurs. The results of evaluation on the characteristics of initial photoelectric conversion efficiency and photo-deterioration characteristics also shown in Table C11 are indicated by standardizing the results of the photovoltaic device SCC8-1 on the basis of the results of the photovoltaic device SCC8 which are regarded as 1.

TABLE C11

| Sample | Bending peel test | Total reflectance | Scattered reflectance | Photo-deterioration characteristics |
|---|---|---|---|---|
| SCC7 | A | 1.00 | 1.00 | 1.00 |
| SCC7-1 | C | 0.83 | 0.90 | 0.92 |

As is seen from the results shown in Table C11, the photovoltaic device SCC8 obtained in Example C8 by the process of the present invention is superior to the photovoltaic devices SCC8-1 of Reference Example C8-1 in all the environmental resistance, characteristics of initial photoelectric conversion efficiency and photo-deterioration characteristics at the same time.

EXAMPLE C9

In the present Example, the rate of temperature rise at the time of the formation of the intermediate layer, light-reflecting layer and reflection enhancing layer was changed in the range of from 2° C./sec. to 150° C./sec. to examine how it affects the initial photoelectric conversion characteristics and so forth in photovoltaic devices. Al—Si (95:5) was used as the target used to form the intermediate layer.

In the present Example, triple type photovoltaic devices having the structure as shown in FIG. 4 were produced in the same manner as in Example C8 except that the photovoltaic device base member was formed under conditions shown in Table C12 and the semiconductor layers were formed under conditions shown in Table C13, using the apparatus for continuously forming the photovoltaic device base member as shown in FIG. 8 and the apparatus for continuously forming the photovoltaic device semiconductor layers as shown in FIG. 10. Stated specifically, eight samples were prepared under different conditions for the rate of temperature rise.

In respect of the samples of the photovoltaic device thus obtained, environmental resistance, characteristics of initial photoelectric conversion efficiency and photo-deterioration characteristics were evaluated in the same manner as in Example C8 to obtain the results as shown in Table C14.

The results of evaluation on the bending peel test, photoelectric conversion efficiency, short-circuit current and photo-deterioration characteristics as shown in Table C14 are indicated by standardizing the results obtained for the photovoltaic device produced in this example, on the basis of the measurement results of the sample obtained when the temperature was raised at a rate of 2° C./sec. In the table, "C" indicates 1.0 or more to less than 1.4; "B", 1.4 or more to less than 1.8; and "A", 1.8 or more.

As is seen from the results shown in Table C14, the rate of temperature rise at the time of the formation of the photovoltaic device base member is preferably in the range of from 10° C./sec. to 100° C./sec. in view of the bending peel test (environmental resistance), the photoelectric conversion efficiency, the short-circuit current and the photo-deterioration characteristics.

TABLE C12

Photovoltaic device base member forming conditions
(Example C9; apparatus used: FIG. 8)

|  | Intermediate layer: Al—Si (95:5) | Light-reflecting layer: Ag | Reflection enhancing layer: ZnO |
|---|---|---|---|
| Temp. rise rate: (°C./sec.) | 2–150 | 2–150 | 2–150 |
| Substrate temp.: (°C.) | 255 | 290 | 310 |
| Ar gas flow rate: (sccm) | 42 | 40 | 35 |
| Pressure: (mTorr) | 3 | 3 | 4 |
| Target species | Al—Si (95:5) | Ag | ZnO |
| Type of sputtering: | DC | DC | DC |
| Sputter voltage: (V) | 375 | 390 | 385 |
| Layer thickness: ($\mu$m) | 0.015 | 0.45 | 1.0 |
| Substrate cooling gas: | He | He | He |
| Temp. drop rate: (°C./sec.) | 10 | 10 | 15 |

TABLE C14

|  | Temp. rise rate: (°C./sec.) | | | | | | | |
|---|---|---|---|---|---|---|---|---|
|  | 2 | 8 | 10 | 40 | 70 | 100 | 120 | 150 |
| Environmental resistance bending peel test: | B | A | A | A | A | A | B | C |
| Photoelectric conversion efficiency: | C | A | A | A | A | A | B | C |
| Short-circuit current: | C | B | A | A | A | A | B | C |
| Open-end voltage: | C | A | A | A | A | A | A | C |

EXAMPLE C10

In the present Example, the rate of temperature drop after the formation of the intermediate layer, light-reflecting layer and reflection enhancing layer was changed in the range of from 0.2° C./sec. to 90° C./sec. to examine how it affects the initial photoelectric conversion characteristics and so forth in photovoltaic devices. Al—Si (95:5) was used as the target used to form the intermediate layer.

In the present Example, triple type photovoltaic devices having the structure as shown in FIG. 4 were produced in the same manner as in Example C8 except that the photovoltaic device base member was formed under conditions shown in Table C15 and the semiconductor layers were formed under

TABLE C13

|  | SiH$_4$ Flow rate (sccm) | Si$_2$H$_6$ Flow rate (sccm) | CH$_4$ Flow rate (sccm) | GeH$_4$ Flow rate (sccm) | H$_2$ Flow rate (sccm) | PH$_3$/H$_2$ Flow rate (sccm) | B$_2$H$_6$/H$_2$ Flow rate (sccm) | SiH$_4$/H$_2$ Flow rate (sccm) | Pressure (Torr) | MW power (W/cm$^2$) | RF power (W/cm$^2$) | Base member temp. (°C.) | Layer thickness (nm) |
|---|---|---|---|---|---|---|---|---|---|---|---|---|---|
| RF n-type layer: (203) | 2.0 | — | — | — | 100 | 220 | — | — | 1.3 | — | 0.05 | 350 | 20 |
| RF i-type layer: (251) | — | 4.0 | — | — | 100 | — | — | — | 0.7 | — | 0.008 | 300 | 10 |
| MW i-type layer: (204) | 68 | — | — | 71 | 290 | — | — | — | 0.009 | 0.12 | 0.31 | 370 | 100 |
| RF i-type layer: (261) | — | 4.0 | — | — | 100 | — | — | — | 0.65 | — | 0.008 | 300 | 23 |
| RF p-type layer: (205) | — | — | 0.1 | — | 80 | — | 9 | 2 | 1.8 | — | 0.07 | 300 | 10 |
| RF n-type layer: (206) | 1.1 | — | — | — | 40 | 290 | — | — | 1.1 | — | 0.04 | 300 | 10 |
| RF i-type layer: (252) | — | 4.0 | — | — | 90 | — | — | — | 0.75 | — | 0.008 | 300 | 10 |
| MW i-type layer: (207) | 55 | — | — | 49 | 280 | — | — | — | 0.009 | 0.10 | 0.3 | 350 | 98 |
| RF i-type layer: (262) | — | 3.5 | — | — | 90 | — | — | — | 0.7 | — | 0.008 | 280 | 23 |
| RF p-type layer: (208) | — | — | 0.2 | — | 80 | — | 9 | 2 | 1.7 | — | 0.07 | 260 | 10 |
| RF n-type layer: (209) | 0.8 | — | — | — | 50 | 250 | — | — | 1.05 | — | 0.04 | 230 | 10 |
| RF i-type layer: (210) | — | 6.0 | — | — | 60 | — | — | — | 0.5 | — | 0.007 | 190 | 90 |
| RF p-type layer: (211) | — | — | 0.4 | — | 90 | — | 8 | 2 | 1.6 | — | 0.07 | 170 | 10 | conditions shown in Table C16, using the apparatus for continuously forming the photovoltaic device base member as shown in FIG. 8 and the apparatus for continuously forming the photovoltaic device semiconductor layers as shown in FIG. 10. Stated specifically, eight samples were prepared under different conditions for the rate of temperature rise.

In respect of the samples of the photovoltaic device thus obtained, environmental resistance, characteristics of initial photoelectric conversion efficiency and photo-deterioration characteristics were evaluated in the same manner as in Example C8 to obtain the results as shown in Table C17.

The results of evaluation on the bending peel test, photoelectric conversion efficiency, short-circuit current and photo-deterioration characteristics as shown in Table C17 are indicated by standardizing the results obtained for the photovoltaic device produced in this example, on the basis of the measurement results of the sample obtained when the temperature was lowered at a rate of 0.2° C./sec. In the table, "C" indicates 1.0 or more to less than 1.4; "B", 1.4 or more to less than 1.8; and "A", 1.8 or more.

As is seen from the results shown in Table C17, the rate of temperature drop at the time of the formation of the photovoltaic device base member is preferably in the range of from 1° C./sec. to 50° C./sec. in view of the bending peel test (environmental resistance), the photoelectric conversion efficiency, the short-circuit current and the photo-deterioration characteristics.

TABLE C15

Photovoltaic device base member forming conditions
(Example C10; apparatus used: FIG. 8)

|  | Intermediate layer: Al—Si (95:5) | Light-reflecting layer: Ag | Reflection enhancing layer: ZnO |
|---|---|---|---|
| Temp. rise rate: (°C./sec.) | 40 | 15 | 15 |
| Substrate temp.: (°C.) | 280 | 290 | 320 |
| Ar gas flow rate: (sccm) | 35 | 40 | 50 |
| Pressure: (mTorr) | 4 | 3 | 4 |
| Target species | Al—Si (95:5) | Ag | ZnO |
| Type of sputtering: | DC | DC | DC |
| Sputter voltage: (V) | 375 | 380 | 390 |
| Layer thickness: (μm) | 0.02 | 0.7 | 1.8 |
| Substrate cooling gas: | He | $H_2$ | He |
| Temp. drop rate: (°C./sec.) | 0.2–90 | 0.2–90 | 0.2–90 |

TABLE C16

|  | $SiH_4$ Flow rate (sccm) | $Si_2H_6$ Flow rate (sccm) | $CH_4$ Flow rate (sccm) | $GeH_4$ Flow rate (sccm) | $H_2$ Flow rate (sccm) | $PH_3/H_2$ Flow rate (sccm) | $B_2H_6/H_2$ Flow rate (sccm) | $SiH_4/H_2$ Flow rate (sccm) | Pressure (Torr) | MW power (W/cm²) | RF power (W/cm²) | Base member temp. (°C.) | Layer thickness (nm) |
|---|---|---|---|---|---|---|---|---|---|---|---|---|---|
| RF n-type layer: (203) | 2.0 | — | — | — | 100 | 220 | — | — | 1.3 | — | 0.05 | 350 | 20 |
| RF i-type layer: (251) | — | 4.0 | — | — | 100 | — | — | — | 0.8 | — | 0.008 | 300 | 10 |
| MW i-type layer: (204) | 58 | — | — | 61 | 250 | — | — | — | 0.010 | 0.10 | 0.32 | 370 | 100 |
| RF i-type layer: (261) | — | 4.0 | — | — | 105 | — | — | — | 0.55 | — | 0.008 | 300 | 23 |
| RF p-type layer: (205) | — | — | 0.1 | — | 80 | — | 9 | 2 | 1.8 | — | 0.07 | 300 | 10 |
| RF n-type layer: (206) | 1.1 | — | — | — | 30 | 290 | — | — | 1.2 | — | 0.04 | 300 | 10 |
| RF i-type layer: (252) | — | 4.0 | — | — | 90 | — | — | — | 0.75 | — | 0.008 | 300 | 10 |
| MW i-type layer: (207) | 55 | — | — | 50 | 230 | — | — | — | 0.013 | 0.10 | 0.3 | 350 | 98 |
| RF i-type layer: (262) | — | 3.5 | — | — | 90 | — | — | — | 0.7 | — | 0.008 | 280 | 23 |
| RF p-type layer: (208) | — | — | 0.2 | — | 80 | — | 9 | 2 | 1.7 | — | 0.07 | 260 | 10 |
| RF n-type layer: (209) | 0.8 | — | — | — | 50 | 250 | — | — | 1.05 | — | 0.04 | 230 | 10 |
| RF i-type layer: (210) | — | 7.0 | — | — | 200 | — | — | — | 0.7 | — | 0.007 | 190 | 90 |
| RF p-type layer: (211) | — | — | 0.4 | — | 90 | — | 8 | 2 | 1.6 | — | 0.07 | 170 | 10 |

TABLE C17

|  | Temp. drop rate: (°C./sec.) | | | | | | | |
|---|---|---|---|---|---|---|---|---|
|  | 0.2 | 0.8 | 1 | 10 | 30 | 50 | 70 | 90 |
| Environmental resistance bending peel test: | B | A | A | A | A | A | A | B |
| Photoelectric conversion efficiency: | C | A | A | A | A | A | B | C |
| Short-circuit current: | C | B | A | A | A | A | A | C |
| Photoelectric conversion efficiency after photodeterioration: | C | A | A | A | A | A | A | C |

Example C11

In the present Example, the layer thickness of the intermediate layer was changed in the range of from 0.0002 μm to 0.2 μm to examine how it affects the initial photoelectric conversion characteristics and so forth in photovoltaic devices obtained. Al—Si (95:5) was used as the target used to form the intermediate layer.

In the present Example, triple type photovoltaic devices having the structure as shown in FIG. 4 were produced in the same manner as in Example C8 except that the photovoltaic device base member was formed under conditions shown in Table C18 and the semiconductor layers were formed under conditions shown in Table C19, using the apparatus for continuously forming the photovoltaic device base member as shown in FIG. 8 and the apparatus for continuously forming the photovoltaic device semiconductor layers as shown in FIG. 10. Stated specifically, eight samples having different layer thicknesses were prepared.

In respect of the samples of the photovoltaic device thus obtained, environmental resistance, characteristics of initial photoelectric conversion efficiency and photo-deterioration characteristics were evaluated in the same manner as in Example C8 to obtain the results as shown in Table C20.

The results of evaluation on the bending peel test, photoelectric conversion efficiency, short-circuit current and photo-deterioration characteristics as shown in Table C20 are indicated by standardizing the results obtained for the photovoltaic device produced in this example, on the basis of the measurement results of the sample obtained when the intermediate layer was formed in a thickness of 0.0002 μm. In the table, "C" indicates 1.0 or more to less than 1.4; "B", 1.4 or more to less than 1.8; and "A", 1.8 or more.

As is seen from the results shown in Table C20, the layer thickness of the intermediate layer at the time of the formation of the photovoltaic device base member is preferably in the range of from 0.001 μm to 0.1 μm in view of the bending peel test (environmental resistance), the photoelectric conversion efficiency, the short-circuit current and the photo-deterioration characteristics.

TABLE C18

Photovoltaic device base member forming conditions
(Example C11; apparatus used: FIG. 8)

|  | Intermediate layer: Al—Si (95:5) | Light-reflecting layer: Ag | Reflection enhancing layer: ZnO |
|---|---|---|---|
| Temp. rise rate: (°C./sec.) | 40 | 15 | 15 |
| Substrate temp.: (°C.) | 290 | 290 | 320 |
| Ar gas flow rate: (sccm) | 35 | 40 | 50 |
| Pressure: (mTorr) | 3 | 3 | 4 |
| Target species | Al—Si (95:5) | Ag | ZnO |
| Type of sputtering: | DC | DC | DC |
| Sputter voltage: (V) | 375 | 380 | 390 |
| Layer thickness: (μm) | .0002–0.2 | 0.6 | 1.8 |
| Substrate cooling gas: | He | $H_2$ | He |
| Temp. drop rate: (°C./sec.) | 30 | 50 | 50 |

TABLE C19

|  | $SiH_4$ Flow rate (sccm) | $Si_2H_6$ Flow rate (sccm) | $CH_4$ Flow rate (sccm) | $GeH_4$ Flow rate (sccm) | $H_2$ Flow rate (sccm) | $PH_3/H_2$ Flow rate (sccm) | $B_2H_6/H_2$ Flow rate (sccm) | $SiH_4/H_2$ Flow rate (sccm) | Pressure (Torr) | MW power (W/cm²) | RF power (W/cm²) | Base member temp. (°C.) | Layer thickness (nm) |
|---|---|---|---|---|---|---|---|---|---|---|---|---|---|
| RF n-type layer: (203) | 2.0 | — | — | — | 100 | 220 | — | — | 1.3 | — | 0.05 | 350 | 20 |
| RF i-type layer: (251) | — | 4.0 | — | — | 100 | — | — | — | 0.8 | — | 0.008 | 300 | 10 |
| MW i-type layer: (204) | 68 | — | — | 71 | 350 | — | — | — | 0.010 | 0.10 | 0.32 | 370 | 100 |
| RF i-type layer: (261) | — | 4.0 | — | — | 105 | — | — | — | 0.55 | — | 0.008 | 300 | 23 |
| RF p-type layer: (205) | — | — | 0.1 | — | 80 | — | 9 | 2 | 1.8 | — | 0.07 | 300 | 10 |
| RF n-type layer: (206) | 1.1 | — | — | — | 30 | 290 | — | — | 1.2 | — | 0.04 | 300 | 10 |
| RF i-type layer: (252) | — | 4.0 | — | — | 90 | — | — | — | 0.75 | — | 0.008 | 300 | 10 |
| MW i-type layer: (207) | 55 | — | — | 50 | 280 | — | — | — | 0.010 | 0.10 | 0.3 | 350 | 98 |
| RF i-type layer: (262) | — | 4.5 | — | — | 90 | — | — | — | 0.7 | — | 0.008 | 280 | 23 |
| RF p-type layer: (208) | — | — | 0.2 | — | 80 | — | 9 | 2 | 1.7 | — | 0.07 | 260 | 10 |
| RF n-type layer: (209) | 0.8 | — | — | — | 50 | 250 | — | — | 1.05 | — | 0.04 | 230 | 10 |
| RF i-type layer: (210) | — | 7.0 | — | — | 280 | — | — | — | 0.7 | — | 0.007 | 190 | 90 |
| RF p-type layer: (211) | — | — | 0.4 | — | 90 | — | 8 | 2 | 1.6 | — | 0.07 | 170 | 10 |

TABLE C20

| Intermediate layer: Al—Si (95:5) layer thickness (μm) | | | | | | | | |
|---|---|---|---|---|---|---|---|---|
|  | 0.0002 | 0.0007 | 0.001 | 0.01 | 0.07 | 0.1 | 0.15 | 0.2 |
| Environmental resistance bending peel test: | B | A | A | A | A | A | A | B |
| Photoelectric conversion efficiency: | B | A | A | A | A | A | B | C |
| Short-circuit current: | C | B | A | A | A | A | A | B |
| Photoelectric | B | A | A | A | A | A | A | B |

TABLE C20-continued

| Intermediate layer: Al—Si (95:5) layer thickness ($\mu$m) | | | | | | | |
|---|---|---|---|---|---|---|---|
| 0.0002 | 0.0007 | 0.001 | 0.01 | 0.07 | 0.1 | 0.15 | 0.2 | conversion efficiency after photo-deterioration

EXAMPLE D1

In the present Example, the base member 190 that constitutes the photovoltaic device shown in FIG. 2 was produced using the apparatus of a multi-chamber-separated system as shown in FIG. 5. More specifically, the intermediate layer 199, light-reflecting layer 101 and reflection enhancing layer 102 were formed on the substrate 100.

Their production process will be described below, following its procedure. To the apparatus shown in FIG. 5, a material gas feeding system (not shown) is connected through gas feed pipes. The material gas cylinders are all purified in an ultra-high purity. As the material gas cylinders, an $H_2$ gas cylinder, an Ar gas cylinder and an He gas cylinder were connected thereto. ZnO and Ag were used as targets. These are so provided that sputtering can be carried out in vacuum.

As the substrate (100 in FIG. 2), a stainless steel sheet of 0.5 mm thick and 50×50 mm² was used, which was subjected to ultrasonic cleaning with acetone and isopropanol, followed by hot-air drying. As the sputter power source, the DC power source 325 was connected, and an intermediate layer 199 of ZnO was formed on the substrate by DC magnetron sputtering. Then the subsequent processing was carried out.

The above production process will be described below in detail, following its procedure with reference to FIG. 5.

(1) A substrate 390 (corresponding to 100 in FIG. 2) having been cleaned was placed on the substrate transporting rail 313 provided in the load chamber 301, and the inside of the load chamber 301 was evacuated by means of a vacuum exhaust pump (not shown) to have a pressure of about $1 \times 10^{-5}$ Torr.

(2) The gate valve 306 was opened to carry the substrate into the transport chamber 302 and deposition chamber 320 previously evacuated by means of a vacuum exhaust pump (not shown). The substrate 390 was set in the manner the back thereof was brought into close contact with the substrate heater 310, and was heated while raising temperature at a rate of 12° C./sec., to bring the substrate temperature to 130° C. Then, the inside of the deposition chamber 320 was evacuated by means of a vacuum exhaust pump (not shown) to have a pressure of about $3 \times 10^{-6}$ Torr.

(3) 35 sccm of Ar gas was fed into it through the gas feed pipe 324, and a conductance valve (not shown) was operated to control the pressure so as to be 5 mTorr. Electric current was flowed to the toroidal coil 323, and 380 V of a DC power was applied from the sputter power source 325 to cause Ar plasma.

(4) The target shutter 326 was opened, and the intermediate layer 199 of ZnO with a layer thickness of 0.01 $\mu$m was formed on the surface of the stainless steel sheet, whereupon the target shutter 326 was closed to extinguish the plasma.

(5) The substrate heater 310 was lifted, and the substrate temperature was lowered to 100° C. or below while dropping temperature at a rate of 4° C./sec. in an atmosphere of He gas used as substrate cooling gas. Thereafter, the gate valve 307 was opened to carry the substrate into the transport chamber 303 and deposition chamber 330 previously evacuated by means of a vacuum exhaust pump (not shown). The substrate 390 was set in the manner the back thereof was brought into close contact with the substrate heater 311, and was heated while raising temperature at a rate of 16° C./sec., to bring the substrate temperature to 290° C. Then, the inside of the deposition chamber 330 was evacuated by means of a vacuum exhaust pump (not shown) to have a pressure of about $2 \times 10^{-6}$ Torr.

(6) 50 sccm of Ar gas was fed into it through the gas feed pipe 334, and a conductance valve (not shown) was operated to control the pressure so as to be 5 mTorr. Electric current was flowed to the toroidal coil 333, and 380 V of a DC power was applied from the sputter power source 335 to cause Ar plasma. Next, the target shutter 336 was opened, and a light-reflecting layer 101 of Ag with a layer thickness of 0.5 $\mu$m was formed on the surface of the intermediate layer 199 of ZnO, whereupon the target shutter 336 was closed to extinguish the plasma.

(7) The substrate heater 311 was lifted, and the substrate temperature was lowered to 100° C. or below while dropping temperature at a rate of 5° C./sec. in an atmosphere of He gas used as substrate cooling gas. Thereafter, the gate valve 307 was again opened to carry the substrate into the transport chamber 302 and deposition chamber 320 previously evacuated by means of a vacuum exhaust pump (not shown). The substrate 390 was set in the manner the back thereof was brought into close contact with the substrate heater 310, and was heated while raising temperature at a rate of 15° C./sec., to bring the substrate temperature to 290° C. Then, the inside of the deposition chamber 320 was evacuated by means of a vacuum exhaust pump (not shown) to have a pressure of about $3 \times 10^{-6}$ Torr.

(8) 40 sccm of Ar gas was fed into it through the gas feed pipe 324, and a conductance valve (not shown) was operated to control the pressure so as to be 4 mTorr. Electric current was flowed to the toroidal coil 323, and 385 V of a DC power was applied from the sputter power source 325 to cause Ar plasma. Next, the target shutter 326 was opened, and a reflection enhancing layer 102 of ZnO with a layer thickness of 1.2 $\mu$m was formed on the surface of the light-reflecting layer 101 of Ag, whereupon the target shutter 326 was closed to extinguish the plasma.

(9) The substrate heater 310 was lifted, and the substrate temperature was lowered to 100° C. or below while dropping temperature at a rate of 6° C./sec. in an atmosphere of He gas used as substrate cooling gas. Thereafter, the gate valves 307 and 308 were opened to carry the substrate into the transport chamber 303 unload chamber 304 previously evacuated by means of a vacuum exhaust pump (not shown).

Thus, the production of the photovoltaic device base member (190 in FIG. 2) of the present Example was completed. Samples of this photovoltaic device base member are called "SD1".

Reference Example D1-1

This example is different from Example D1 only in that the substrate temperature was set to 10° C. when the intermediate layer 199 of ZnO was formed. Except for this point, the procedure of Example D1 was repeated to produce base member samples. The samples of the photovoltaic device base member of this example are called "SD1-1".

Reference Example D1-2

This example is different from Example D1 only in that the substrate temperature was set to 60° C. when the intermediate layer 199 of ZnO was formed. Except for this point, the procedure of Example D1 was repeated to produce samples. The samples of the photovoltaic device base member of this example are called "SD1-2".

Reference Example D1-3

This example is different from Example D1 only in that the substrate temperature was set to 150° C. when the light-reflecting layer 101 of Ag was formed. Except for this point, the procedure of Example D1 was repeated to produce samples. The samples of the photovoltaic device base member of this example are called "SD1-3".

Reference Example D1-4

This example is different from Example D1 only in that the substrate temperature was set to 550° C. when the light-reflecting layer 101 of Ag was formed. Except for this point, the procedure of Example D1 was repeated to produce samples. The samples of the photovoltaic device base member of this example are called "SD1-4".

Reference Example D1-5

This example is different from Example D1 only in that, after the light-reflecting layer 101 of Ag was formed, the reflection enhancing layer 102 of ZnO was formed without the step of lowering the substrate temperature to 100° C. or below. Except for this point, the procedure of Example D1 was repeated to produce samples. The samples of the photovoltaic device base member of this example are called "SD1-5".

Reference Example D1-6

This example is different from Example D1 only in that the substrate temperature was set to 150° C. when the reflection enhancing layer 102 of ZnO was formed. Except for this point, the procedure of Example D1 was repeated to produce samples. The samples of the photovoltaic device base member of this example are called "SD1-6".

Reference Example D1-7

This example is different from Example D1 only in that the substrate temperature was set to 450° C. when the reflection enhancing layer 102 of ZnO was formed. Except for this point, the procedure of Example D1 was repeated to produce samples. The samples of the photovoltaic device base member of this example are called "SD1-7".

For every eight kinds of the samples of the photovoltaic device base member, i.e., SD1 and SD1-1 to SD1-7, five samples were prepared. In respect of these samples of the photovoltaic device base member, a bending peel test was carried out in the same manner as in Example C1 to examine their environmental resistance to obtain the results as shown together in Table D1. Light reflectance was also measured and, from the measurements obtained, total reflectance and scattered reflectance were evaluated in the same manner as in Example C1 to obtain the results as shown together in Table D1.

In the results of the bending peel test, shown in Table D1, letter symbol "A" indicates an instance where no peeling occurs at all, and "B" an instance where peeling only partly occurs. The results of total reflectance and scattered reflectance shown in Table D1 are indicated for each sample by standardizing the results of the samples SD1-1 to SD1-7 on the basis of the results of the sample SD1 which are regarded as 1.

TABLE D1

| Sample | Bending peel test | Total reflectance | Scattered reflectance |
|---|---|---|---|
| SD1 | A | 1.00 | 1.0 |
| SD1-1 | B | 1.00 | 1.0 |
| SD1-2 | B | 1.00 | 1.0 |
| SD1-3 | A | 1.00 | 0.59 |
| SD1-4 | A | 0.98 | 0.91 |
| SD1-5 | A | 0.82 | 0.82 |
| SD1-6 | A | 0.93 | 0.78 |
| SD1-7 | A | 0.88 | 0.92 |

As is seen from the results shown in Table D1, the photovoltaic device base member SD1 of Example D1 is superior to the photovoltaic device base members SD1-1 to SD1-7 of Reference Examples D1-1 to D1-7 in the light-reflecting properties and the environmental resistance required as base members, at the same time.

EXAMPLE D2

This example is different from Example D1 in that the light-reflecting layer was formed using $H_2$ gas as the substrate cooling gas in place of He gas.

Like Example D1, the base member 190 that constitutes the photovoltaic device shown in FIG. 2 was produced using the apparatus of a multi-chamber-separated system as shown in FIG. 5. More specifically, the intermediate layer 199, light-reflecting layer 101 and reflection enhancing layer 102 were formed on the substrate 100.

Their production process will be described below, following its procedure. To the apparatus shown in FIG. 5, the material gas feeding system (not shown) is connected through gas feed pipes. The material gas cylinders are all purified in an ultra-high purity. As the material gas cylinders, an $H_2$ gas cylinder, an Ar gas cylinder and an He gas cylinder were connected thereto. ZnO and Ag were used as targets. These are so provided that sputtering can be carried out in vacuum.

As the substrate (100 in FIG. 2), a stainless steel sheet of 0.5 mm thick and 50×50 mm$^2$ was used, which was subjected to ultrasonic cleaning with acetone and isopropanol, followed by hot-air drying. As the sputter power source, the DC power source 325 was connected, and an intermediate layer 199 of ZnO was formed on the substrate by DC magnetron sputtering. Then the subsequent processing was carried out.

The above production process will be described below in detail, following its procedure with reference to FIG. 5.

(1) A substrate 390 (corresponding to 100 in FIG. 2) having been cleaned was placed on the substrate transporting rail 313 provided in the load chamber 301, and the inside of the load chamber 301 was evacuated by means of a vacuum exhaust pump (not shown) to have a pressure of about $1 \times 10^{-5}$ Torr.

(2) The gate valve 306 was opened to carry the substrate into the transport chamber 302 and deposition chamber 320 previously evacuated by means of a vacuum exhaust pump (not shown). The substrate 390 was set in the manner the back thereof was brought into close contact with the substrate heater 310, and was heated while raising temperature at a rate of 15° C./sec., to bring the substrate temperature to 250° C. Then, the inside of the deposition chamber 320 was evacuated by means of a vacuum exhaust pump (not shown) to have a pressure of about $3 \times 10^{-5}$ Torr.

(3) 40 sccm of Ar gas was fed into it through the gas feed pipe 324, and a conductance valve (not shown) was operated to control the pressure so as to be 4 mTorr. Electric current was flowed to the toroidal coil 323, and 375 V of a DC power was applied from the sputter power source 325 to cause Ar plasma.

(4) The target shutter 326 was opened, and the intermediate layer 199 (FIG. 2) of ZnO with a layer thickness of 0.015 μm was formed on the surface of the stainless steel sheet, whereupon the target shutter 326 was closed to extinguish the plasma.

(5) The substrate heater 310 was lifted, and the substrate temperature was lowered to 100° C. or below while dropping temperature at a rate of 6° C./sec. in an atmosphere of H$_2$ gas used as substrate cooling gas. Thereafter, the gate valve 307 was opened to carry the substrate into the transport chamber 303 and deposition chamber 330 previously evacuated by means of a vacuum exhaust pump (not shown). The substrate 390 was set in the manner the back thereof was brought into close contact with the substrate heater 311, and was heated while raising temperature at a rate of 15° C./sec., to bring the substrate temperature to 290° C. Then, the inside of the deposition chamber 330 was evacuated by means of a vacuum exhaust pump (not shown) to have a pressure of about $2 \times 10^{-6}$ Torr.

(6) 35 sccm of Ar gas was fed into it through the gas feed pipe 334, and a conductance valve (not shown) was operated to control the pressure so as to be 4 mTorr. Electric current was flowed to the toroidal coil 333, and 380 V of a DC power was applied from the sputter power source 335 to cause Ar plasma. Next, the target shutter 336 was opened, and a light-reflecting layer 101 (FIG. 2) of Ag with a layer thickness of 0.6 μm was formed on the surface of the intermediate layer 199 of ZnO, whereupon the target shutter 336 was closed to extinguish the plasma.

(7) The substrate heater 311 was lifted, and the substrate temperature was lowered to 100° C. or below while dropping temperature at a rate of 8° C./sec. in an atmosphere of He gas used as substrate cooling gas. Thereafter, the gate valve 307 was again opened to carry the substrate into the transport chamber 302 and deposition chamber 320 previously evacuated by means of a vacuum exhaust pump (not shown). The substrate 390 was set in the manner the back thereof was brought into close contact with the substrate heater 310, and was heated while raising temperature at a rate of 12° C./sec., to bring the substrate temperature to 310° C. Then, the inside of the deposition chamber 320 was evacuated by means of a vacuum exhaust pump (not shown) to have a pressure of about $3 \times 10^{-6}$ Torr.

(8) 55 sccm of Ar gas was fed into it through the gas feed pipe 324, and a conductance valve (not shown) was operated to control the pressure so as to be 4 mTorr. Electric current was flowed to the toroidal coil 323, and 385 V of a DC power was applied from the sputter power source 325 to cause Ar plasma. Next, the target shutter 326 was opened, and a reflection enhancing layer 102 of ZnO with a layer thickness of 1.5 μm was formed on the surface of the light-reflecting layer 101 of Ag, whereupon the target shutter 326 was closed to extinguish the plasma.

(9) The substrate heater 310 was lifted, and the substrate temperature was lowered to 100° C. or below while dropping temperature at a rate of 15° C./sec. in an atmosphere of H$_2$ gas used as substrate cooling gas. Thereafter, the gate valves 307 and 308 were opened to carry the substrate into the transport chamber 303 and unload chamber 304 previously evacuated by means of a vacuum exhaust pump (not shown).

Thus, the production of the photovoltaic device base member (190 in FIG. 2) of the present Example was completed. Samples of this photovoltaic device base member are called "SD2".

Reference Example D2-1

This example is different from Example D2 in that, after the light-reflecting layer 101 of Ag was formed, the reflection enhancing layer 102 of ZnO was formed without the step of lowering the substrate temperature to 100° C. or below. Except for this point, the procedure of Example D2 was repeated to produce samples. The samples of the photovoltaic device base member of this example are called "SD2-1".

For every two kinds of the samples of the photovoltaic device base member, i.e., SD2 and SD2-1, five samples were prepared. In respect of these samples of the photovoltaic device base member, a bending peel test was carried out in the same manner as in Example D1 to examine their environmental resistance. Light reflectance was also measured and, from the measurements obtained, total reflectance and scattered reflectance were evaluated in the same manner as in Example D1. The results obtained are shown together in Table D2.

In the results of the bending peel test, shown in Table D2, letter symbol "A" indicates an instance where no peeling occurs at all, and "C" an instance where peeling only partly occurs. The results of total reflectance and scattered reflectance shown in Table D2 are indicated for each sample of the photovoltaic device base member by standardizing the results of the sample SD2-1 on the basis of the results of the sample SD2 which are regarded as 1.

TABLE D2

| Sample | Bending peel test | Total reflectance | Scattered reflectance |
|---|---|---|---|
| SD2 | A | 1.00 | 1.0 |
| SD2-1 | C | 0.79 | 0.81 |

As is seen from the results shown in Table D2, the photovoltaic device base member SD2 of Example D2 is superior to the photovoltaic device base member SD2-1 of Reference Example D2-1 in the light-reflecting properties and the environmental resistance required as base members, at the same time. It is also seen that H$_2$ gas is effective as the substrate cooling gas.

EXAMPLE D3

This example is different from Example D1 in that the light-reflecting layer was formed using Ar gas as the substrate cooling gas in place of He gas.

Like Example D1, the base member 190 that constitutes the photovoltaic device shown in FIG. 2 was produced using the apparatus of a multi-chamber-separated system as shown in FIG. 5. More specifically, the intermediate layer 199, light-reflecting layer 101 and reflection enhancing layer 102 were formed on the substrate 100.

Their production process will be described below, following its procedure. To the apparatus shown in FIG. 5, the material gas feeding system (not shown) is connected through gas feed pipes. The material gas cylinders are all purified in an ultra-high purity. As the material gas cylinders, an H$_2$ gas cylinder, an Ar gas cylinder and an He gas cylinder were connected thereto. ZnO and Ag were used as targets. These are so provided that sputtering can be carried out in vacuum.

As the substrate (100 in FIG. 2), a stainless steel sheet of 0.5 mm thick and 50×50 mm² was used, which was subjected to ultrasonic cleaning with acetone and isopropanol, followed by hot-air drying. As the sputter power source, the DC power source 325 was connected, and an intermediate layer 199 of ZnO was formed on the substrate by DC magnetron sputtering. Then the subsequent processing was carried out.

The above production process will be described below following its procedure with reference to FIG. 5.

(1) A substrate 390 (corresponding to 100 in FIG. 2) having been cleaned was placed on the substrate transporting rail 313 provided in the load chamber 301, and the inside of the load chamber 301 was evacuated by means of a vacuum exhaust pump (not shown) to have a pressure of about 1×10⁻⁵ Torr.

(2) The gate valve 306 was opened to carry the substrate into the transport chamber 302 and deposition chamber 320 previously evacuated by means of a vacuum exhaust pump (not shown). The substrate 390 was set in the manner the back thereof was brought into close contact with the substrate heater 310, and was heated while raising temperature at a rate of 10° C./sec., to bring the substrate temperature to 220° C. Then, the inside of the deposition chamber 320 was evacuated by means of a vacuum exhaust pump (not shown) to have a pressure of about 3×10⁻⁶ Torr.

(3) 35 sccm of Ar gas was fed into it through the gas feed pipe 324, and a conductance valve (not shown) was operated to control the pressure so as to be 4 mTorr. Electric current was flowed to the toroidal coil 323, and 370 V of a DC power was applied from the sputter power source 325 to cause Ar plasma.

(4) The target shutter 326 was opened, and the intermediate layer 199 (FIG. 2) of ZnO with a layer thickness of 0.008 μm was formed on the surface of the stainless steel sheet, whereupon the target shutter 326 was closed to extinguish the plasma.

(5) The substrate heater 310 was lifted, and the substrate temperature was lowered to 100° C. or below while dropping temperature at a rate of 3° C./sec. in an atmosphere of Ar gas used as substrate cooling gas. Thereafter, the gate valve 307 was opened to carry the substrate into the transport chamber 303 and deposition chamber 330 previously evacuated by means of a vacuum exhaust pump (not shown). The substrate 390 was set in the manner the back thereof was brought into close contact with the substrate heater 311, and was heated while raising temperature at a rate of 16° C./sec., to bring the substrate temperature to 290° C. Then, the inside of the deposition chamber 330 was evacuated by means of a vacuum exhaust pump (not shown) to have a pressure of about 2×10⁻⁶ Torr.

(6) 45 sccm of Ar gas was fed into it through the gas feed pipe 334, and a conductance valve (not shown) was operated to control the pressure so as to be 4 mTorr. Electric current was flowed to the toroidal coil 33, and 380 V of a DC power was applied from the sputter power source 335 to cause Ar plasma. Next, the target shutter 336 was opened, and a light-reflecting layer 101 (FIG. 2) of Ag with a layer thickness of 0.7 μm was formed on the surface of the intermediate layer 199 of ZnO, whereupon the target shutter 336 was closed to extinguish the plasma.

(7) The substrate heater 311 was lifted, and the substrate temperature was lowered to 100° C. or below while dropping temperature at a rate of 3° C./sec. in an atmosphere of Ar gas used as substrate cooling gas. Thereafter, the gate valve 307 was again opened to carry the substrate into the transport chamber 302 and deposition chamber 320 previously evacuated by means of a vacuum exhaust pump (not shown). The substrate 390 was set in the manner the back thereof was brought into close contact with the substrate heater 310, and was heated while raising temperature at a rate of 12° C./sec., to bring the substrate temperature to 310° C. Then, the inside of the deposition chamber 320 was evacuated by means of a vacuum exhaust pump (not shown) to have a pressure of about 3×10⁻⁶ Torr.

(8) 40 sccm of Ar gas was fed into it through the gas feed pipe 324, and a conductance valve (not shown) was operated to control the pressure so as to be 5 mTorr. Electric current was flowed to the toroidal coil 323, and 385 V of a DC power was applied from the sputter power source 325 to cause Ar plasma. Next, the target shutter 326 was opened, and a reflection enhancing layer 102 of ZnO with a layer thickness of 1.1 μm was formed on the surface of the light-reflecting layer 101 of Ag, whereupon the target shutter 326 was closed to extinguish the plasma.

(9) The substrate heater 310 was lifted, and the substrate temperature was lowered to 100° C. or below while dropping temperature at a rate of 5° C./sec. in an atmosphere of Ar gas used as substrate cooling gas. Thereafter, the gate valves 307 and 308 were opened to carry the substrate into the transport chamber 303 unload chamber 304 previously evacuated by means of a vacuum exhaust pump (not shown).

Thus, the production of the photovoltaic device base member (190 in FIG. 2) of the present Example was completed. Samples of this photovoltaic device base member are called "SD3".

Reference Example D3-1

This example is different from Example D3 in that the intermediate layer 199 of ZnO was not formed and, after the light-reflecting layer 101 of Ag was formed, the reflection enhancing layer 102 of ZnO was formed without the step of lowering the substrate temperature to 100° C. or below. Except for these points, the procedure of Example D3 was repeated to produce samples. The samples of the photovoltaic device base member of this example are called "SD3-1".

For every two kinds of the samples of the photovoltaic device base member, i.e., SD3 and SD3-1, five samples were prepared. In respect of these samples of the photovoltaic device base member, a bending peel test was carried out in the same manner as in Example D1 to examine their environmental resistance. Light reflectance was also measured and, from the measurements obtained, total reflectance and scattered reflectance were evaluated in the same manner as in Example D1. The results obtained are shown together in Table D3.

In the results of the bending peel test, shown in Table D3, letter symbol "A" indicates an instance where no peeling occurs at all, and "C" an instance where peeling partly occurs. The results of total reflectance and scattered reflectance shown in Table D3 are indicated for each sample of the photovoltaic device base member by standardizing the results of the sample SD3-1 on the basis of the results of the sample SD3 which are regarded as 1.

TABLE D3

| Sample | Bending peel test | Total reflectance | Scattered reflectance |
| --- | --- | --- | --- |
| SD3 | A | 1.00 | 1.0 |
| SD3-1 | C | 0.80 | 0.80 |

As is seen from the results shown in Table D3, the photovoltaic device base member SD3 of Example D3 is superior to the photovoltaic device base member SD3-1 of Reference Examples D3-1 in the light-reflecting properties and the environmental resistance required as base members, at the same time. It is also seen that Ar gas is effective as the substrate cooling gas.

EXAMPLE D4

This example is different from Example D1 in that the Ar gas used alone when the reflection enhancing layer 102 of ZnO was replaced with Ar gas and $O_2$ gas used in combination, to produce the photovoltaic device base member.

Like Example D1, the base member 190 that constitutes the photovoltaic device shown in FIG. 2 was produced using the apparatus of a multi-chamber-separated system as shown in FIG. 5. More specifically, the intermediate layer 199, light-reflecting layer 101 and reflection enhancing layer 102 were formed on the substrate 100.

Their production process will be described below, following its procedure. To the apparatus shown in FIG. 5, the material gas feeding system (not shown) is connected through gas feed pipes. The material gas cylinders are all purified in an ultra-high purity. As the material gas cylinders, an $H_2$ gas cylinder, an Ar gas cylinder and an He gas cylinder were connected thereto. ZnO and Ag were used as targets. These are so provided that sputtering can be carried out in vacuum.

As the substrate (100 in FIG. 2), a stainless steel sheet of 0.5 mm thick and 50×50 mm² was used, which was subjected to ultrasonic cleaning with acetone and isopropanol, followed by hot-air drying. As the sputter power source, the DC power source 325 was connected, and an intermediate layer 199 of ZnO was formed on the substrate by DC magnetron sputtering. Then the subsequent processing was carried out.

The above production process will be described below following its procedure with reference to FIG. 5.

(1) A substrate 390 (corresponding to 100 in FIG. 2) having been cleaned was placed on the substrate transporting rail 313 provided in the load chamber 301, and the inside of the load chamber 301 was evacuated by means of a vacuum exhaust pump (not shown) to have a vacuum pressure of about $1 \times 10^{-5}$ Torr.

(2) The gate valve 306 was opened to carry the substrate into the transport chamber 302 and deposition chamber 320 previously evacuated by means of a vacuum exhaust pump (not shown). The substrate 390 was set in the manner the back thereof was brought into close contact with the substrate heater 310, and was heated while raising temperature at a rate of 13° C./sec., to bring the substrate temperature to 290° C. Then, the inside of the deposition chamber 320 was evacuated by means of a vacuum exhaust pump (not shown) to have a pressure of about $3 \times 10^{-6}$ Torr.

(3) 50 sccm of Ar gas and 50 sccm of $O_2$ gas were fed into it through the gas feed pipe 324, and a conductance valve (not shown) was operated to control the pressure so as to be 2 mTorr. Electric current was flowed to the toroidal coil 323, and 370 V of a DC power was applied from the sputter power source 325 to cause Ar/$O_2$ plasma.

(4) The target shutter 326 was opened, and the intermediate layer 199 (FIG. 2) of ZnO with a layer thickness of 0.01 μm was formed on the surface of the stainless steel sheet, whereupon the target shutter 326 was closed to extinguish the plasma.

(5) The substrate heater 310 was lifted, and the substrate temperature was lowered to 100° C. or below while dropping temperature at a rate of 6° C./sec. in an atmosphere of He gas used as substrate cooling gas. Thereafter, the gate valve 307 was opened to carry the substrate into the transport chamber 303 and deposition chamber 330 previously evacuated by means of a vacuum exhaust pump (not shown). The substrate 390 was set in the manner the back thereof was brought into close contact with the substrate heater 311, and was heated while raising temperature at a rate of 15° C./sec., to bring the substrate temperature to 290° C. Then, the inside of the deposition chamber 330 was evacuated by means of a vacuum exhaust pump (not shown) to have a pressure of about $2 \times 10^{-6}$ Torr.

(6) 55 sccm of Ar gas was fed into it through the gas feed pipe 334, and a conductance valve (not shown) was operated to control the pressure so as to be 4 mTorr. Electric current was flowed to the toroidal coil 323, and 380 V of a DC power was applied from the sputter power source 335 to cause Ar plasma. Next, the target shutter 336 was opened, and a light-reflecting layer 101 (FIG. 2) of Ag with a layer thickness of 0.6 μm was formed on the surface of the intermediate layer 199 of ZnO, whereupon the target shutter 336 was closed to extinguish the plasma.

(7) The substrate heater 311 was lifted, and the substrate temperature was lowered to 100° C. or below while dropping temperature at a rate of 5° C./sec. in an atmosphere of He gas used as substrate cooling gas. Thereafter, the gate valve 307 was again opened to carry the substrate into the transport chamber 302 and deposition chamber 320 previously evacuated by means of a vacuum exhaust pump (not shown). The substrate 390 was set in the manner the back thereof was brought into close contact with the substrate heater 310, and was heated while raising temperature at a rate of 18° C./sec., to bring the substrate temperature to 315° C. Then, the inside of the deposition chamber 320 was evacuated by means of a vacuum exhaust pump (not shown) to have a pressure of about $3 \times 10^{-6}$ Torr.

(8) 40 sccm of Ar gas and 40 sccm of $O_2$ gas were fed into it through the gas feed pipe 324, and a conductance valve (not shown) was operated to control the pressure so as to be 2 mTorr. Electric current was flowed to the toroidal coil 323, and 380 V of a DC power was applied from the sputter power source 325 to cause Ar/$O_2$ plasma. Next, the target shutter 326 was opened, and a reflection enhancing layer 102 (FIG. 2) of ZnO with a layer thickness of 1.5 μm was formed on the surface of the light-reflecting layer 101 of Ag, whereupon the target shutter 326 was closed to extinguish the plasma.

(9) The substrate heater 310 was lifted, and the substrate temperature was lowered to 100° C. or below while dropping temperature at a rate of 20° C./sec. in an atmosphere of He gas used as substrate cooling gas. Thereafter, the gate valves 307 and 308 were opened to carry the substrate into the transport chamber 303 unload chamber 304 previously evacuated by means of a vacuum exhaust pump (not shown).

Thus, the production of the photovoltaic device base member (190 in FIG. 2) of the present Example was completed. Samples of this photovoltaic device base member are called "SD4".

Reference Example D4-1

This example is different from Example D4 in that the intermediate layer 199 of ZnO was not formed and, after the light-reflecting layer 101 of Ag was formed, the reflection enhancing layer 102 of ZnO was formed without the step of lowering the substrate temperature to 100° C. or below. Except for these points, the procedure of Example D4 was repeated to produce samples. The samples of the photovoltaic device base member of this example are called "SD4-1".

For every two kinds of the samples of the photovoltaic device base member, i.e., SD4 and SD4-1, four samples were prepared. In respect of these samples of the photovoltaic device base member, a bending peel test was carried out in the same manner as in Example D1 to examine their environmental resistance. Light reflectance was also measured and, from the measurements obtained, total reflectance and scattered reflectance were evaluated in the same manner as in Example D1. The results obtained are shown together in Table D4.

In the results of the bending peel test, shown in Table D4, letter symbol "A" indicates an instance where no peeling occurs at all, and "C" an instance where peeling only partly occurs. The results of total reflectance and scattered reflectance shown in Table D4 are indicated for each sample of the photovoltaic device base member by standardizing the results of the sample SD4-1 on the basis of the results of the sample SD4 which are regarded as 1.

TABLE D4

| Sample | Bending peel test | Total reflectance | Scattered reflectance |
|--------|-------------------|-------------------|-----------------------|
| SD4    | A                 | 1.00              | 1.0                   |
| SD4-1  | C                 | 0.81              | 0.82                  |

As is seen from the results shown in Table D4, the photovoltaic device base member SD4 of Example D4 is superior to the photovoltaic device base member SD4-1 of Reference Examples D4-1 in the light-reflecting properties and the environmental resistance required as base members, at the same time.

EXAMPLE D5

In the present Example, the photovoltaic device as shown in FIG. 2 was produced using a photovoltaic device base member (sample) formed in the same manner as in Example D1, and using the apparatus employing a multi-chamber-separated system as shown in FIG. 9.

The apparatus 400 shown in FIG. 9 can carry out both MWPCVD and RFPCVD. Using this apparatus, semiconductor layers (103, 151, 104, 161, 105) and other layers were formed on the reflection enhancing layer 102 according to the layer configuration as shown in FIG. 2.

Their production process will be described below with reference to FIG. 9, following its procedure. To the apparatus shown in FIG. 9, a material gas feeding system (not shown) is connected through gas feed pipes. The material gas cylinders are all purified in an ultra-high purity. As the material gas cylinders, an $SiH_4$ gas cylinder, a $CH_4$ gas cylinder, a $GeH_4$ gas cylinder, an $Si_2H_6$ gas cylinder, a $PH_3/H_2$ (dilution: 0.1%) gas cylinder, a $B_2H_6/H_2$ (dilution: 0.2%) gas cylinder, an $H_2$ gas cylinder, an He gas cylinder, an $SiCl_2H_2$ gas cylinder and an $SiH_4/H_2$ (dilution: 1%) gas cylinder were connected thereto.

(1) A base member 490 (corresponding to 190 in FIG. 2) comprising the substrate and the intermediate layer 199, light-reflecting layer 101 and reflection enhancing layer 102 formed thereon was placed on the base member transporting rail 413 provided in the load chamber 401, and the inside of the load chamber 401 was evacuated by means of a vacuum exhaust pump (not shown) to have a pressure of about $1 \times 10^{-5}$ Torr.

(2) The gate valve 406 was opened to carry the base member into the transport chamber 402 and deposition chamber 417 previously evacuated by means of a vacuum exhaust pump (not shown). The base member 490 was heated in the manner the back thereof was brought into close contact with the base member heater 410. Then, the inside of the deposition chamber 417 was evacuated by means of a vacuum exhaust pump (not shown) to have a pressure of about $1 \times 10^{-5}$ Torr.

(3) After preparation for film formation was completed in this way, $H_2$ gas was fed into the deposition chamber 417 through the gas feed pipe 429. Then, the valves 441, 431 and 430 were opened, and $H_2$ gas flow rate was controlled by means of the mass flow controller 436 so as to be 300 sccm. The pressure inside the deposition chamber 417 was controlled by means of a conductance valve (not shown) so as to be 1.3 Torr. The base member heater 410 was set so as to bring the base member temperature to 350° C.

(4) At the time the base member temperature became stable, an RF n-type layer 103 comprised of $\mu$c-Si was formed.

To form the RF n-type layer 103 comprised of $\mu$c-Si, the valves 443, 433, 444 and 434 were operated to feed $SiH_4$ gas and $PH_3/H_2$ gas into the deposition chamber 417 through the gas feed pipe 429. Here, $SiH_4$ gas flow rate, $H_2$ gas flow rate and $PH_3/H_2$ gas flow rate were controlled by means of the mass flow controllers 438, 436 and 439 so as to be 2 sccm, 120 sccm and 200 sccm, respectively, and the pressure inside the deposition chamber 417 was controlled so as to be 1.1 Torr.

Next, the power of the RF power source 422 was set to 0.05 W/cm², and RF power was fed to the plasma forming cup 420 to cause glow discharge to take place. Thus, the formation of the RF n-type layer on the base member was started, and an RF n-type layer with a layer thickness of 18 nm was formed, whereupon the RF power source was turned off to stop the glow discharge to complete the formation of the RF n-type layer 103. The $SiH_4$ gas, $PH_3/H_2$ gas and $H_2$ gas were stopped from flowing into the deposition chamber 417, and then the inside of the deposition chamber and the inside of the gas pipe were evacuated to have a pressure of $1 \times 10^{-5}$ Torr.

Subsequently, an RF i-type layer 151 comprised of a-Si, an MW i-type layer 104 comprised of a-SiGe, an RF i-type layer 161 comprised of a-Si and an RF p-type layer 105 comprised of a-SiC were successively formed in the following way.

(5) First, the gate valve 407 was opened to carry the base member into the transport chamber 403 and i-type layer deposition chamber 418 previously evacuated by means of a vacuum exhaust pump (not shown). The base member was heated in the manner the back thereof was brought into close contact with the base member heater 411. Then, the inside of the i-type layer deposition chamber 418 was evacuated by means of a vacuum exhaust pump (not shown) to have a pressure of about $1 \times 10^{-5}$ Torr.

(6) To form the RF i-type layer, the base member heater 411 was set so as to bring the base member temperature to 290° C. At the time the base member was well heated, the valves 464, 454, 450, 463 and 453 were slowly opened to flow $Si_2H_6$ gas and $H_2$ gas into the i-type layer deposition chamber 418 through the gas feed pipe 449. Here, $Si_2H_6$ gas flow rate and $H_2$ gas flow rate were controlled by means of the corresponding mass flow controllers 459 and 458 so as to be 4 sccm and 120 sccm, respectively. The pressure inside the i-type layer deposition chamber 418 was controlled so as to be 0.7 Torr by adjusting the opening of the conductance valve (not shown).

Next, the power of the RF power source 424 was set to 0.008 W/cm$^2$ and was applied to the bias rod 428 to cause glow discharge to take place, and the shutter 427 was opened. Thus, the formation of the i-type layer on the RF n-type layer was started, and an i-type layer with a layer thickness of 10 nm was formed, whereupon the RF glow discharge was stopped and the output from the RF power source was stopped to complete the formation of the RF i-type layer 151.

The valves 464, 454, 453 and 450 were closed to stop the Si$_2$H$_6$ gas and H$_2$ gas from flowing into the i-type layer deposition chamber 418, and then the inside of the i-type layer deposition chamber 418 and the inside of the gas pipe were evacuated to have a pressure of 1×10$^{-5}$ Torr.

(7) To form the MW i-type layer, the base member heater 411 was set so as to bring the base member temperature to 380° C. At the time the base member was well heated, the valves 461, 451, 450, 462, 452, 463 and 453 were slowly opened to flow SiH$_4$ gas, GeH$_4$ gas and H$_2$ gas into the i-type layer deposition chamber 418 through the gas feed pipe 449. Here, SiH$_4$ gas flow rate, GeH$_4$ gas flow rate and H$_2$ gas flow rate were controlled by means of the corresponding mass flow controllers 456, 457 and 458 so as to be 45 scam, 37 sccm and 150 scam, respectively. The pressure inside the i-type layer deposition chamber 418 was controlled so as to be 5 mTorr by adjusting the opening of the conductance valve (not shown). Next, the power of the RF power source 424 was set to 0.30 W/cm$^2$, and was applied to the bias rod 428.

Thereafter, the power of a microwave power source (2.45 GHz) (not shown) was set to 0.10 W/cm$^2$, and the microwave power was fed into the i-type layer deposition chamber 418 through the waveguide 426 and microwave introducing window 425 to cause glow discharge to take place, and the shutter 427 was opened. Thus, the formation of the MW i-type layer on the RF i-type layer was started, and an i-type layer with a layer thickness of 0.17 μm was formed, whereupon the microwave glow discharge was stopped and the output from the bias power source 424 was stopped to complete the formation of the MW i-type layer 104. The valves 451, 452 and 453 were closed to stop the SiH$_4$ gas, GeH$_4$ gas and H$_2$ gas from flowing into the i-type layer deposition chamber 418, and then the inside of the i-type layer deposition chamber 418 and the inside of the gas pipe were evacuated to have a pressure of 1×10$^{-5}$ Torr.

(8) To form the RF i-type layer, the base member heater 411 was set so as to bring the base member temperature to 250° C. At the time the base member was well heated, the valves 464, 454, 450, 463 and 453 were slowly opened to flow Si$_2$H$_6$ gas and H$_2$ gas into the i-type layer deposition chamber 418 through the gas feed pipe 449. Here, Si$_2$H$_6$ gas flow rate and H$_2$ gas flow rate were controlled by means of the corresponding mass flow controllers 459 and 458 so as to be 3 sccm and 90 sccm, respectively. The pressure inside the i-type layer deposition chamber 418 was controlled so as to be 0.7 Torr by adjusting the opening of the conductance valve (not shown).

Next, the power of the RF power source 424 was set to 0.007 W/cm$^2$ and was applied to the bias rod 428 to cause glow discharge to take place, and the shutter 427 was opened. Thus, the formation of the RF i-type layer on the MW i-type layer was started, and an i-type layer with a layer thickness of 20 nm was formed, whereupon the RF glow discharge was stopped and the output from the RF power source 424 was stopped to complete the formation of the RF i-type layer 161. The valves 464, 454, 453 and 450 were closed to stop the Si$_2$H$_6$ gas and H$_2$ gas from flowing into the i-type layer deposition chamber 418, and then the inside of the i-type layer deposition chamber 418 and the inside of the gas pipe were evacuated to have a pressure of 1×10$^{-5}$ Torr.

(9) To form the RF p-type layer 105 comprised of a-SiC, first, the gate valve 408 was opened to carry the base member into the transport chamber 404 and p-type layer deposition chamber 419 previously evacuated by means of a vacuum exhaust pump (not shown). The base member was heated in the manner the back thereof was brought into close contact with the base member heater 412. Then, the inside of the p-type layer deposition chamber 419 was evacuated by means of the vacuum exhaust pump (not shown) to have a pressure of about 1×10$^{-5}$ Torr.

The base member heater 412 was set so as to bring the base member temperature to 220° C. At the time the base member temperature became stable, the valves 481, 471, 470, 482, 472, 483, 473, 484 and 474 were operated to feed H$_2$ gas, SiH$_4$/H$_2$ gas, B$_2$H$_6$/H$_2$ gas and CH$_4$ gas into the deposition chamber 419 through the gas feed pipe 469. Here, H$_2$ gas flow rate, SiH$_4$/H$_2$ gas flow rate, B$_2$H$_6$/H$_2$ gas flow rate and CH$_4$ gas flow rate were controlled by means of the mass flow controllers 476, 477, 478 and 479 so as to be 60 sccm, 2 sccm, 10 sccm and 0.3 sccm, respectively, and the pressure inside the deposition chamber 419 was controlled so as to be 1.8 Torr by adjusting the opening of the conductance valve (not shown).

Next, the power of the RF power source 423 was set to 0.07 W/cm$^2$, and RF power was fed to the plasma forming cup 421 to cause glow discharge to take place. Thus, the formation of the RF p-type layer on the i-type layer was started, and an RF p-type layer with a layer thickness of 10 nm was formed, whereupon the RF power source was turned off to stop the glow discharge to complete the formation of the RF p-type layer 105.

The valves 472, 482, 473, 483, 474, 484, 471, 481 and 470 were closed to stop the SiH$_4$/H$_2$ gas, B$_2$H$_6$/H$_2$ gas, CH$_4$ gas and H$_2$ gas from flowing into the p-type layer deposition chamber 419, and then the inside of the p-type layer deposition chamber 419 and the inside of the gas pipe were evacuated to have a pressure of 1×10$^{-5}$ Torr.

(10) The gate valve 409 was opened to carry the base member into the unload chamber 405 previously evacuated by means of a vacuum exhaust pump (not shown), and a leak valve (not shown) was opened to let gases escape from the unload chamber 405.

(11) On the RF p-type layer 105, ITO was deposited by vacuum deposition in a layer thickness of 70 nm as the transparent conductive layer 112.

(12) On the transparent conductive layer 112, a mask with a comb-shaped opening was placed, and the comb-shaped collector electrode 113 with a flat structure, comprised of Cr(40 nm)/Ag(1,000 nm)/Cr(40 nm) was deposited by vacuum deposition.

Thus, the fabrication of the photovoltaic device of the present Example was completed. This photovoltaic device is herein called SCD5.

Reference Example D5-1

This example is different from Example D5 in that the intermediate layer 199 of ZnO was not formed on the substrate and, after the light-reflecting layer 101 of Ag was formed, the reflection enhancing layer 102 of ZnO was formed without the step of lowering the substrate temperature to 100° C. or below. Except for these points, the procedure of Example D5 was repeated to produce photovoltaic devices. Samples of the photovoltaic device of this example are called "SCD5-1".

For every two kinds of the samples of the photovoltaic device, i.e., SCD5 and SCD5-1, six samples were prepared. In respect of these samples of the photovoltaic device, a bending peel test was carried out in the manner as described below, to examine their environmental resistance. Characteristics of initial photoelectric conversion efficiency (photoelectromotive force/incident light intensity), stated specifically, photoelectric conversion efficiency, short-circuit current and open-end voltage were evaluated in the same manner as in Example A1. The results obtained are shown together in Table D5.

The bending peel test was carried out in the following way: The respective photovoltaic devices were left to stand for 200 hours in an environment of a high-temperature and high-humidity atmosphere (temperature: 80° C.; humidity: 80% RH), and thereafter put to a bending test repeated thirty times. In addition, to the part thus bended, a weight of 10 kg was dropped ten times at a height of 50 cm, and any peeling in the device was observed using a scanning electron microscope (SEM), manufactured by Hitachi Ltd. (model: S-4500; magnifications: 50,000×).

In the results of the bending peel test, shown in Table D5, letter symbol "A" indicates an instance where no peeling occurs at all, and "C" an instance where peeling partly occurs. The results of evaluation on the characteristics of initial photoelectric conversion efficiency shown in Table D5 are indicated by standardizing the results of the photovoltaic device SCD5-1 on the basis of the results of the photovoltaic device SCD5 which are regarded as 1.

TABLE D5

| Sample | Bending peel test | Total reflectance | Scattered reflectance | Open-end voltage |
| --- | --- | --- | --- | --- |
| SCD5 | A | 1.00 | 1.00 | 1.00 |
| SCD5-1 | C | 0.89 | 0.93 | 0.96 |

As is seen from the results shown in Table D5, the photovoltaic device SCD5 obtained in Example D5 by the process of the present invention is superior to the photovoltaic devices SCD5-1 of Reference Example D5-1 in all the environmental resistance and characteristics of initial photoelectric conversion efficiency at the same time.

EXAMPLE D5

In the present Example, the photovoltaic device as shown in FIG. 2 was produced using a photovoltaic device base member (sample) formed in the same manner as in Example D4, and using the apparatus employing a multi-chamber-separated system as shown in FIG. 9.

The apparatus 400 shown in FIG. 9 can carry out both MWPCVD and RFPCVD. Using this apparatus, semiconductor layers (103, 151, 104, 161, 105) and other layers were formed on the reflection enhancing layer 102 according to the layer configuration as shown in FIG. 2.

Their production process will be described below with reference to FIG. 9, following its procedure. To the apparatus shown in FIG. 9, a material gas feeding system (not shown) is connected through gas feed pipes. The material gas cylinders are all purified in an ultra-high purity. As the material gas cylinders, an $SiH_4$ gas cylinder, a $CH_4$ gas cylinder, a $GeH_4$ gas cylinder, an $Si_2H_6$ gas cylinder, a $PH_3/H_2$ (dilution: 0.1%) gas cylinder, a $B_2H_6/H_2$ (dilution: 0.2%) gas cylinder, an $H_2$ gas cylinder, an He gas cylinder, an $SiCl_2H_2$ gas cylinder and an $SiH_4/H_2$ (dilution: 1%) gas cylinder were connected thereto.

(1) The base member 490 (corresponding to 190 in FIG. 2) comprising the substrate and the intermediate layer 199, light-reflecting layer 101 and reflection enhancing layer 102 formed thereon, obtained in Example D4 was placed on the base member transporting rail 413 provided in the load chamber 401, and the inside of the load chamber 401 was evacuated by means of a vacuum exhaust pump (not shown) to have a pressure of about $1 \times 10^{-5}$ Torr.

(2) The gate valve 406 was opened to carry the base member into the transport chamber 402 and deposition chamber 417 previously evacuated by means of a vacuum exhaust pump (not shown). The base member 490 was heated in the manner the back thereof was brought into close contact with the base member heater 410. Then, the inside of the deposition chamber 417 was evacuated by means of a vacuum exhaust pump (not shown) to have a pressure of about $1 \times 10^{-5}$ Torr.

(3) After preparation for film formation was completed in this way, $H_2$ gas was fed into the deposition chamber 417 through the gas feed pipe 429. Then, the valves 441, 431 and 430 were opened, and $H_2$ gas flow rate was controlled by means of the mass flow controller 436 so as to be 300 sccm. The pressure inside the deposition chamber 417 was controlled by means of a conductance valve (not shown) so as to be 1.1 Torr. The base member heater 410 was set so as to bring the base member temperature to 350° C.

(4) At the time the base member temperature became stable, an RF n-type layer 103 comprised of $\mu$c-Si was formed.

To form the RF n-type layer 103 comprised of $\mu$c-Si, the valves 443, 433, 444 and 434 were operated to feed $SiH_4$ gas and $PH_3/H_2$ gas into the deposition chamber 417 through the gas feed pipe 429. Here, $SiH_4$ gas flow rate, $H_2$ gas flow rate and $PH_3/H_2$ gas flow rate were controlled by means of the mass flow controllers 438, 436 and 439 so as to be 2 scam, 120 scam and 190 scam, respectively, and the pressure inside the deposition chamber 417 was controlled so as to be 1.1 Torr.

Next, the power of the RF power source 422 was set to 0.06 W/cm², and RF power was fed to the plasma forming cup 420 to cause glow discharge to take place. Thus, the formation of the RF n-type layer on the base member was started, and an RF n-type layer with a layer thickness of 20 nm was formed, whereupon the RF power source was turned off to stop the glow discharge to complete the formation of the RF n-type layer 103. The $SiH_4$ gas, $PH_3/H_2$ gas and $H_2$ gas were stopped from flowing into the deposition chamber 417, and then the inside of the deposition chamber and the inside of the gas pipe were evacuated to have a pressure of $1 \times 10^{-5}$ Torr.

Subsequently, an RF i-type layer 151 comprised of a-Si, an MW i-type layer 104 comprised of a-SiGe, an RF i-type layer 161 comprised of a-Si and an RF p-type layer 105 comprised of a-SiC were successively formed in the following way (see the layer configuration shown in FIG. 2).

(5) First, the gate valve 407 was opened to carry the base member into the transport chamber 403 and i-type layer deposition chamber 418 previously evacuated by means of a vacuum exhaust pump (not shown). The base member was heated in the manner the back thereof was brought into close contact with the base member heater 411. Then, the inside of the i-type layer deposition chamber 418 was evacuated by means of a vacuum exhaust pump (not shown) to have a pressure of about $1 \times 10^{-5}$ Torr.

(6) To form the RF i-type layer, the base member heater 411 was set so as to bring the base member temperature to 280° C. At the time the base member was well heated, the valves 464, 454, 450, 463 and 453 were slowly opened to flow $Si_2H_6$ gas and $H_2$ gas into the i-type layer deposition chamber 418 through the gas feed pipe 449. Here, $Si_2H_6$ gas flow rate and $H_2$ gas flow rate were controlled by means of the corresponding mass flow controllers 459 and 458 so as to be 4 sccm and 110 sccm, respectively. The pressure inside the i-type layer deposition chamber 418 was controlled so as to be 0.6 Torr by adjusting the opening of the conductance valve (not shown).

Next, the power of the RF power source 424 was set to 0.007 $W/cm^2$ and was applied to the bias rod 428 to cause glow discharge to take place, and the shutter 427 was opened. Thus, the formation of the i-type layer on the RF n-type layer on the i-type layer was started, and an i-type layer with a layer thickness of 10 nm was formed, whereupon the RF glow discharge was stopped and the output from the RF power source was stopped to complete the formation of the RF i-type layer 151.

The valves 464, 454, 453 and 450 were closed to stop the $Si_2H_6$ gas and $H_2$ gas from flowing into the i-type layer deposition chamber 418, and then the inside of the i-type layer deposition chamber 418 and the inside of the gas pipe were evacuated to have a pressure of $1 \times 10^{-5}$ Torr.

(7) To form the MW i-type layer, the base member heater 411 was set so as to bring the base member temperature to 380° C. At the time the base member was well heated, the valves 461, 451, 450, 462, 452, 463 and 453 were slowly opened to flow $SiH_4$ gas, $GeH_4$ gas and $H_2$ gas into the i-type layer deposition chamber 418 through the gas feed pipe 449. Here, $SiH_4$ gas flow rate, $GeH_4$ gas flow rate and $H_2$ gas flow rate were controlled by means of the corresponding mass flow controllers 456, 457 and 458 so as to be 48 sccm, 45 sccm and 180 sccm, respectively. The pressure inside the i-type layer deposition chamber 418 was controlled so as to be 6 mTorr by adjusting the opening of the conductance valve (not shown). Next, the power of the RF power source 424 was set to 0.30 $W/cm^2$, and was applied to the bias rod 428.

Thereafter, the power of a microwave power source (2.45 GHz) (not shown) was set to 0.09 $W/cm^2$, and the microwave power was fed into the i-type layer deposition chamber 418 through the waveguide 426 and microwave introducing window 425 to cause glow discharge to take place, and the shutter 427 was opened. Thus, the formation of the MW i-type layer on the RF i-type layer was started, and an i-type layer with a layer thickness of 0.17 $\mu$m was formed, whereupon the microwave glow discharge was stopped and the output from the bias power source 424 was stopped to complete the formation of the MW i-type layer 104. The valves 451, 452 and 453 were closed to stop the $SiH_4$ gas, $GeH_4$ gas and $H_2$ gas from flowing into the i-type layer deposition chamber 418, and then the inside of the i-type layer deposition chamber 418 and the inside of the gas pipe were evacuated to have a pressure of $1 \times 10^{-5}$ Torr.

(8) To form the RF i-type layer, the base member heater 411 was set so as to bring the base member temperature to 250° C. At the time the base member was well heated, the valves 464, 454, 450, 463 and 453 were slowly opened to flow $Si_2H_6$ gas and $H_2$ gas into the i-type layer deposition chamber 418 through the gas feed pipe 449. Here, $Si_2H_6$ gas flow rate and $H_2$ gas flow rate were controlled by means of the corresponding mass flow controllers 459 and 458 so as to be 3.5 sccm and 110 sccm, respectively. The pressure inside the i-type layer deposition chamber 418 was controlled so as to be 0.5 Torr by adjusting the opening of the conductance valve (not shown).

Next, the power of the RF power source 424 was set to 0.007 $W/cm^2$ and was applied to the bias rod 428 to cause glow discharge to take place, and the shutter 427 was opened. Thus, the formation of the RF i-type layer on the MW i-type layer was started, and an i-type layer with a layer thickness of 20 nm was formed, whereupon the RF glow discharge was stopped and the output from the RF power source 424 was stopped to complete the formation of the RF i-type layer 161. The valves 464, 454, 453 and 450 were closed to stop the $Si_2H_6$ gas and $H_2$ gas from flowing into the i-type layer deposition chamber 418, and then the inside of the i-type layer deposition chamber 418 and the inside of the gas pipe were evacuated to have a pressure of $1 \times 10^{-5}$ Torr.

(9) To form the RF p-type layer 105 comprised of a-SiC, first, the gate valve 408 was opened to carry the base member into the transport chamber 404 and p-type layer deposition chamber 419 previously evacuated by means of a vacuum exhaust pump (not shown). The base member was heated in the manner the back thereof was brought into close contact with the base member heater 412. Then, the inside of the p-type layer deposition chamber 419 was evacuated by means of the vacuum exhaust pump (not shown) to have a pressure of about $1 \times 10^{-5}$ Torr.

The base member heater 412 was set so as to bring the base member temperature to 230° C. At the time the base member temperature became stable, the valves 481, 471, 470, 482, 472, 483, 473, 484 and 474 were operated to feed $H_2$ gas, $SiH_4/H_2$ gas, $B_2H_6/H_2$ gas and $CH_4$ gas into the deposition chamber 419 through the gas feed pipe 469. Here, $H_2$ gas flow rate, $SiH_4/H_2$ gas flow rate, $B_2H_6/H_2$ gas flow rate and $CH_4$ gas flow rate were controlled by means of the mass flow controllers 476, 477, 478 and 479 so as to be 70 sccm, 2 sccm, 10 sccm and 0.2 sccm, respectively, and the pressure inside the deposition chamber 419 was controlled so as to be 1.7 Torr by adjusting the opening of the conductance valve (not shown).

Next, the power of the RF power source 423 was set to 0.07 $W/cm^2$, and RF power was fed to the plasma forming cup 421 to cause glow discharge to take place. Thus, the formation of the RF p-type layer on the i-type layer was started, and an RF p-type layer with a layer thickness of 10 nm was formed, whereupon the RF power source was turned off to stop the glow discharge to complete the formation of the RF p-type layer 105.

The valves 472, 482, 473, 483, 474, 484, 471, 481 and 470 were closed to stop the $SiH_4/H_2$ gas, $B_2H_6/H_2$ gas, $CH_4$ gas and $H_2$ gas from flowing into the p-type layer deposition chamber 419, and then the inside of the p-type layer deposition chamber 419 and the inside of the gas pipe were evacuated to have a pressure of $1 \times 10^{-5}$ Torr.

(10) The gate valve 409 was opened to carry the base member into the unload chamber 405 previously evacuated by means of a vacuum exhaust pump (not shown), and a leak valve (not shown) was opened to let gases escape from the unload chamber 405.

(11) On the RF p-type layer 105, ITO was deposited by vacuum deposition in a layer thickness of 70 nm as the transparent conductive layer 112.

(12) On the transparent conductive layer 112, a mask with a comb-shaped opening was placed, and the comb-shaped collector electrode 113 with a flat structure, comprised of Cr(40 nm)/Ag(1,000 nm)/Cr(40 nm) was deposited by vacuum deposition.

Thus, the fabrication of the photovoltaic device of the present Example was completed. This photovoltaic device is herein called SCD6.

Reference Example D6-1

This example is different from Example D6 in that the base member sample of Reference Example D4-1 was used in which the intermediate layer 199 of ZnO was not formed and, after the light-reflecting layer 101 of Ag was formed, the reflection enhancing layer 102 of ZnO was formed without the step of lowering the substrate temperature to 100° C. or below. Except for these points, the procedure of Example D6 was repeated to produce photovoltaic devices. Samples of the photovoltaic device of this example are called "SCD6-1".

For every two kinds of the samples of the photovoltaic device, i.e., SCD6 and SCD6-1, six samples were prepared. In respect of these samples of the photovoltaic device, a bending peel test was carried out in the manner as described below, to examine their environmental resistance. Characteristics of initial photoelectric conversion efficiency (photoelectromotive force/incident light intensity), stated specifically, photoelectric conversion efficiency, short-circuit current and open-end voltage were evaluated in the same manner as in Example A1. The results obtained are shown together in Table D6.

The bending peel test was carried out in the following way: The respective photovoltaic devices were left to stand for 200 hours in an environment of a high-temperature and high-humidity atmosphere (temperature: 80° C; humidity: 85% RH), and thereafter put to a bending test repeated thirty times. In addition, to the part thus bended, a weight of 10 kg was dropped thirteen times at a height of 50 cm, and any peeling in the device was observed using a scanning electron microscope (SEM), manufactured by Hitachi Ltd. (model: S-4500; magnifications: 50,000×).

In the results of the bending peel test, shown in Table D6, letter symbol "A" indicates an instance where no peeling occurs at all, and "C" an instance where peeling partly occurs. The results of evaluation on the characteristics of initial photoelectric conversion efficiency shown in Table D6 are indicated by standardizing the results of the photovoltaic device SCD6-1 on the basis of the results of the photovoltaic device SCD6 which are regarded as 1.

TABLE D6

| Sample | Bending peel test | Total reflectance | Scattered reflectance | Open-end voltage |
|---|---|---|---|---|
| SCD6 | A | 1.00 | 1.00 | 1.00 |
| SCD6-1 | C | 0.85 | 0.90 | 0.93 |

As is seen from the results shown in Table D5, the photovoltaic device SCD6 obtained in Example D6 by the process of the present invention is superior to the photovoltaic devices SCD6-1 of Reference Example D6-1 in all the environmental resistance and characteristics of initial photoelectric conversion efficiency at the same time.

EXAMPLE D7

In the present Example, the base member 290 constituting the photovoltaic device as shown in FIG. 4 (i.e., the base member comprising the substrate 200 and the layers of intermediate layer 299, light-reflecting layer 201 and reflection enhancing layer 202 formed on the substrate) was produced using the apparatus of a multi-chamber-separated system as shown in FIG. 5. Next, using this photovoltaic device base member 290, the photovoltaic device as shown in FIG. 4 was produced using the apparatus of a multi-chamber-separated system as shown in FIG. 9.

The process of forming the photovoltaic device base member will be described below with reference to FIG. 5.

To the apparatus shown in FIG. 5, a material gas feeding system (not shown) is connected through gas feed pipes. The material gas cylinders are all purified in an ultra-high purity. As the material gas cylinders, an $H_2$ gas cylinder, an Ar gas cylinder and an He gas cylinder were connected thereto. ZnO and Ag were used as targets. These are so provided that sputtering can be carried out in vacuum.

As the substrate (200 in FIG. 4), a stainless steel sheet of 0.5 mm thick and 50×50 mm$^2$ was used, which was subjected to ultrasonic cleaning with acetone and isopropanol, followed by hot-air drying. As the sputter power source, the DC power source 325 was connected, and an intermediate layer 299 of ZnO was formed on the substrate by DC magnetron sputtering. Then the subsequent processing was carried out.

The process of forming the photovoltaic device base member will be described below with reference to FIG. 5.

(1) A substrate 390 (corresponding to 200 in FIG. 4) having been cleaned was placed on the substrate transporting rail 313 provided in the load chamber 301, and the inside of the load chamber 301 was evacuated by means of a vacuum exhaust pump (not shown) to have a pressure of about $1×10^{-5}$ Torr.

(2) The gate valve 306 was opened to carry the substrate into the transport chamber 302 and deposition chamber 320 previously evacuated by means of a vacuum exhaust pump (not shown). The substrate 390 was set in the manner the back thereof was brought into close contact with the substrate heater 310, and was heated while raising temperature at a rate of 25° C./sec., to bring the substrate temperature to 250° C. Then, the inside of the deposition chamber 320 was evacuated by means of a vacuum exhaust pump (not shown) to have a pressure of about $3×10^{-6}$ Torr.

(3) 45 sccm of Ar gas was fed into it through the gas feed pipe 324, and a conductance valve (not shown) was operated to control the pressure so as to be 4 mTorr. Electric current was flowed to the toroidal coil 323, and 380 V of a DC power was applied from the sputter power source 325 to cause Ar plasma.

(4) The target shutter 326 was opened, and the intermediate layer 299 (FIG. 4) of ZnO with a layer thickness of 0.012 μm was formed on the surface of the stainless steel sheet, whereupon the target shutter 326 was closed to extinguish the plasma.

(5) The substrate heater 310 was lifted, and the substrate temperature was lowered to 100° C. or below while dropping temperature at a rate of 20° C./sec. in an atmosphere of He gas used as substrate cooling gas. Thereafter, the gate valve 307 was opened to carry the substrate into the transport chamber 303 and deposition chamber 330 previously evacuated by means of a vacuum exhaust pump (not shown). The substrate 390 was set in the manner the back thereof was brought into close contact with the substrate heater 311, and was heated while raising temperature at a rate of 15° C./sec., to bring the substrate temperature to 290° C. Then, the inside of the deposition chamber 330 was evacuated by means of a vacuum exhaust pump (not shown) to have a pressure of about $2×10^{-6}$ Torr.

(6) 35 sccm of Ar gas was fed into it through the gas feed pipe 334, and a conductance valve (not shown) was operated to control the pressure so as to be 4 mTorr. Electric current was flowed to the toroidal coil 323, and 380 V of a DC power was applied from the sputter power source 335 to cause Ar plasma. Next, the target shutter 336 was opened, and a light-reflecting layer 201 (FIG. 4) of Ag with a layer thickness of 0.7 $\mu$m was formed on the surface of the intermediate layer 299 of ZnO, whereupon the target shutter 336 was closed to extinguish the plasma.

(7) The substrate heater 311 was lifted, and the substrate temperature was lowered to 100° C. or below while dropping temperature at a rate of 15° C./sec. in an atmosphere of He gas used as substrate cooling gas. Thereafter, the gate valve 307 was again opened to carry the substrate into the transport chamber 302 and deposition chamber 320 previously evacuated by means of a vacuum exhaust pump (not shown). The substrate 390 was set in the manner the back thereof was brought into close contact with the substrate heater 310, and was heated while raising temperature at a rate of 15° C./sec., to bring the substrate temperature to 315° C. Then, the inside of the deposition chamber 320 was evacuated by means of a vacuum exhaust pump (not shown) to have a pressure of about $3\times10^{-6}$ Torr.

(8) 45 sccm of Ar gas was fed into it through the gas feed pipe 324, and a conductance valve (not shown) was operated to control the pressure so as to be 4 mTorr. Electric current was flowed to the toroidal coil 323, and 385 V of a DC power was applied from the sputter power source 325 to cause Ar plasma. Next, the target shutter 326 was opened, and a reflection enhancing layer 202 (FIG. 4) of ZnO with a layer thickness of 1.5 $\mu$m was formed on the surface of the light-reflecting layer 101 of Ag, whereupon the target shutter 326 was closed to extinguish the plasma.

(9) The substrate heater 310 was lifted, and the substrate temperature was lowered to 100° C. or below while dropping temperature at a rate of 16° C./sec. in an atmosphere of He gas used as substrate cooling gas. Thereafter, the gate valves 307 and 308 were opened to carry the substrate into the transport chamber 303 unload chamber 304 previously evacuated by means of a vacuum exhaust pump (not shown).

Thus, the production of the photovoltaic device base member (290 in FIG. 4) of the present Example was completed. Samples of this photovoltaic device base member are called "SD7".

Subsequently, using the base member having the light-reflecting layer and reflection enhancing layer formed through the steps (1) to (9) in Example D7, the triple type photovoltaic device as shown in FIG. 4 was produced using the apparatus employing a multi-chamber-separated system as shown in FIG. 9.

In the following, the process for producing the photovoltaic device will be described.

(10) The base member (490 in FIG. 9) comprising the substrate and the intermediate layer 299, light-reflecting layer 201 and reflection enhancing layer 202 formed thereon was placed on the base member transporting rail 413 provided in the load chamber 401, and the inside of the load chamber 401 was evacuated by means of a vacuum exhaust pump (not shown) to have a pressure of about $1\times10^{-5}$ Torr.

(11) The gate valve 406 was opened to carry the base member into the transport chamber 402 and deposition chamber 417 previously evacuated by means of a vacuum exhaust pump (not shown). The base member 490 was heated in the manner the back thereof was brought into close contact with the base member heater 410. Then, the inside of the deposition chamber 417 was evacuated by means of a vacuum exhaust pump (not shown) to have a pressure of about $1\times10^{-5}$ Torr.

(12) After preparation for film formation was completed in this way, H$_2$ gas was fed into the deposition chamber 417 through the gas feed pipe 429. Then, the valves 441, 431 and 430 were opened, and H$_2$ gas flow rate was controlled by means of the mass flow controller 436 so as to be 500 sccm. The pressure inside the deposition chamber 417 was controlled by means of a conductance valve (not shown) so as to be 1.3 Torr. The base member heater 410 was set so as to bring the base member temperature to 350° C.

(13) At the time the base member temperature became stable, an RF n-type layer 203 comprised of $\mu$c-Si was formed.

To form the RF n-type layer 203 comprised of $\mu$c-Si, the valves 443, 433, 444 and 434 were operated to feed SiH$_4$ gas and PH$_3$/H$_2$ gas into the deposition chamber 417 through the gas feed pipe 429. Here, SiH$_4$ gas flow rate, H$_2$ gas flow rate and PH$_3$/H$_2$ gas flow rate were controlled by means of the mass flow controllers 438, 436 and 439 so as to be 2 sccm, 100 sccm and 200 sccm, respectively, and the pressure inside the deposition chamber 417 was controlled so as to be 1.3 Torr.

Next, the power of the RF power source 422 was set to 0.05 W/cm$^2$, and RF power was fed to the plasma forming cup 420 to cause glow discharge to take place. Thus, the formation of the RF n-type layer on the base member was started, and an RF n-type layer with a layer thickness of 20 nm was formed, whereupon the RF power source was turned off to stop the glow discharge to complete the formation of the RF n-type layer 203. The SiH$_4$ gas, PH$_3$/H$_2$ gas and H$_2$ gas were stopped from flowing into the deposition chamber 417, and then the inside of the deposition chamber and the inside of the gas pipe were evacuated to have a pressure of $1\times10^{-5}$ Torr.

(14) Subsequently, following the procedure in Example D5, an RF i-type layer 251 comprised of a-Si (corresponding to the RF i-type layer 151), an MW i-type layer 204 comprised of a-SiGe (corresponding to the MW i-type layer 104), an RF i-type layer 261 comprised of a-Si (corresponding to the RF i-type layer 161), an RF p-type layer 205 comprised of a-SiC (corresponding to the RF p-type layer 105), an RF n-type layer 206 comprised of $\mu$c-Si (corresponding to the RF n-type layer 103), an RF i-type layer 252 comprised of a-Si (corresponding to the RF i-type layer 151), an MW i-type layer 207 comprised of a-SiGe (corresponding to the MW i-type layer 104), an RF i-type layer 262 comprised of a-Si (corresponding to the RF i-type layer 161), an RF p-type layer 208 comprised of a-SiC (corresponding to the RF p-type layer 105), an RF n-type layer 209 comprised of $\mu$c-Si (corresponding to the RF n-type layer 103), an RF i-type layer 210 comprised of a-Si (corresponding to the RF i-type layer 161), and an RF p-type layer 211 comprised of a-SiC (corresponding to the RF p-type layer 105) were successively formed.

(15) On the RF p-type layer 211, ITO was deposited by vacuum deposition in a layer thickness of 70 nm as the transparent conductive layer 212.

(16) On the transparent conductive layer 212, a mask with a comb-shaped opening was placed, and the comb-shaped collector electrode 213 with a flat structure, comprised of Cr(40 nm)/Ag(1,000 nm)/Cr(40 nm) was deposited by vacuum deposition.

Thus, the fabrication of the photovoltaic device of the present Example was completed. This photovoltaic device is herein called SCD7. Conditions for forming the respective semiconductor layers RF n-type layers, RF i-type layers, MW i-type layers and RF p-type layers are shown together in Table D7.

TABLE D7

| | SiH$_4$ Flow rate (sccm) | Si$_2$H$_6$ Flow rate (sccm) | CH$_4$ Flow rate (sccm) | GeH$_4$ Flow rate (sccm) | H$_2$ Flow rate (sccm) | PH$_3$/H$_2$ Flow rate (sccm) | B$_2$H$_6$/H$_2$ Flow rate (sccm) | SiH$_4$/H$_2$ Flow rate (sccm) | Pressure (Torr) | MW power (W/cm$^2$) | RF power (W/cm$^2$) | Base member temp. (°C.) | Layer thickness (nm) |
|---|---|---|---|---|---|---|---|---|---|---|---|---|---|
| RF n-type layer: (203) | 2.0 | — | — | — | 100 | 220 | — | — | 1.3 | — | 0.05 | 350 | 20 |
| RF i-type layer: (251) | — | 4.0 | — | — | 100 | — | — | — | 0.7 | — | 0.008 | 300 | 10 |
| MW i-type layer: (204) | 40 | — | — | 42 | 100 | — | — | — | 0.011 | 0.12 | 0.31 | 370 | 110 |
| RF i-type layer: (261) | — | 4.0 | — | — | 100 | — | — | — | 0.75 | — | 0.008 | 300 | 23 |
| RF p-type layer: (205) | — | — | 0.1 | — | 80 | — | 9 | 2 | 1.8 | — | 0.07 | 300 | 10 |
| RF n-type layer: (206) | 1.1 | — | — | — | 40 | 290 | — | — | 1.1 | — | 0.04 | 300 | 10 |
| RF i-type layer: (252) | — | 4.0 | — | — | 100 | — | — | — | 0.75 | — | 0.008 | 300 | 10 |
| NW i-type layer: (207) | 34 | — | — | 28 | 120 | — | — | — | 0.012 | 0.12 | 0.3 | 350 | 100 |
| RF i-type layer: (262) | — | 3.5 | — | — | 90 | — | — | — | 0.7 | — | 0.008 | 280 | 23 |
| RF p-type layer: (208) | — | — | 0.2 | — | 80 | — | 9 | 2 | 1.7 | — | 0.07 | 260 | 10 |
| RF n-type layer: (209) | 0.8 | — | — | — | 50 | 250 | — | — | 1.05 | — | 0.04 | 230 | 10 |
| RF i-type layer: (210) | — | 1.5 | — | — | 60 | — | — | — | 0.8 | — | 0.007 | 190 | 90 |
| RF p-type layer: (211) | — | — | 0.4 | — | 90 | — | 8 | 2 | 1.6 | — | 0.07 | 170 | 10 |

Reference Example D7-1

This example is different from Example D7 in that the intermediate layer 199 of ZnO was not formed on the substrate and, after the light-reflecting layer 201 of Ag was formed, the reflection enhancing layer 202 of ZnO was formed without the step of lowering the substrate temperature to 100° C. or below. Except for these points, the procedure of Example D7 was repeated to produce photovoltaic devices. Samples of the photovoltaic device of this example are called "SCD7-1".

For every two kinds of the samples of the photovoltaic device, i.e., SD7 and SD7-1, six samples were prepared. In respect of these samples of the photovoltaic device, a bending peel test was carried out in the manner as described below, to examine their environmental resistance. Characteristics of initial photoelectric conversion efficiency (photoelectromotive force/incident light power) (in respect of photoelectric conversion efficiency and short-circuit current) were evaluated in the same manner as in Example A1. Photo-deterioration characteristics were also evaluated in the manner as described below. The results obtained are shown together in Table D8.

The bending peel test was carried out in the following way: The respective photovoltaic devices were left to stand for 250 hours in an environment of a high-temperature and high-humidity atmosphere (temperature: 80° C.; humidity: 85% RH), and thereafter put to a bending test repeated thirty times. In addition, to the part thus bended, a weight of 10 kg was dropped ten times at a height of 50 cm, and any peeling in the device was observed using a scanning electron microscope (SEM), manufactured by Hitachi Ltd. (model: S-4500; magnifications: 50,000×).

To examine the photo-deterioration characteristics, photoelectric conversion efficiency was evaluated after photovoltaic devices having a temperature of 50° C. was irradiated by light for 1,000 hours under 1 sun of 100 mW/cm$^2$.

In the results of the bending peel test, shown in Table D8, letter symbol "A" indicates an instance where no peeling occurs at all, and "C" an instance where peeling partly occurs. The results of evaluation on the characteristics of initial photoelectric conversion efficiency and photo-deterioration characteristics also shown in Table D8 are indicated by standardizing the results of the photovoltaic device SCD7-1 on the basis of the results of the photovoltaic device SCD7 which are regarded as 1.

TABLE D8

| Sample | Bending peel test | Total reflectance | Scattered reflectance | Photo-deterioration characteristics |
|---|---|---|---|---|
| SCD7 | A | 1.00 | 1.00 | 1.00 |
| SCD7-1 | C | 0.85 | 0.90 | 0.94 |

As is seen from the results shown in Table D8, the photovoltaic device SCD7 obtained in Example D7 by the process of the present invention is superior to the photovoltaic devices SCD7-1 of Reference Example in all the environmental resistance, characteristics of initial photoelectric conversion efficiency and photo-deterioration characteristics at the same time.

EXAMPLE D8

In the present Example, the triple type photovoltaic device as shown in FIG. 4 was produced using the fabrication apparatus employing a roll-to-roll system as shown in FIGS. 8 and 10.

As the substrate, a belt-like stainless steel sheet of 300 m long, 30 cm wide and 0.2 mm thick was used.

The process of forming the photovoltaic device base member will be described below with reference to FIG. 8.

The apparatus for continuously forming the photovoltaic device base member as shown in FIG. 8 is successively provided with the substrate feed-out chamber 3610, a plurality of deposition chambers 3611 to 3614 and the substrate wind-up chamber 3684, which are connected through separating paths 3615, 3616, 3617, 3618 and 3619 between them. Each deposition chamber has an exhaust vent, through which the inside thereof can be evacuated.

The belt-like substrate 3621 is passed through these deposition chambers and separating paths after it is sent out of the substrate feed-out chamber, and is wound up in the substrate wind-up chamber. At the same time, the apparatus is so designed that gases can be fed into the respective deposition chambers and separating paths through their gas inlets, gases can be drawn out through the respective exhaust vents and the respective layers can be formed.

The intermediate layer of ZnO is formed in the deposition chamber 3612, the light-reflecting layer of Ag in the deposition chamber 3613, and the reflection enhancing layer of ZnO in the deposition chamber 3614. The deposition chambers are respectively provided in their insides with the halogen lamp heaters 3640, 3641, 3642 and 3643 for heating the substrate on the back thereof, and the substrate is temperature-raised or heated to the stated temperature in each deposition chamber. The separating paths 3617, 3618 and 3619 have also the function to lower temperature so that the substrate temperature is dropped at a given rate after the semiconductor layers are respectively formed in the deposition chambers. In particular, in the present Example, the substrate temperature is lowered to 100° C. or below in the separating path 3618 after the light-reflecting layer is formed in the deposition chamber 3613.

In the deposition chamber 3612, DC magnetron sputtering is carried out, in which Ar gas is fed into the chamber through the gas inlet 3632 and ZnO is used as the target 3650.

In the deposition chamber 3613, DC magnetron sputtering is carried out, in which Ar gas is fed into the chamber through the gas inlet 3634 and Ag is used as the target 3660.

In the deposition chamber 3614, DC magnetron sputtering or RF magnetron sputtering is carried out, in which Ar gas is fed into the chamber through the gas inlet 3636 and ZnO is used as the target 3670.

After the photovoltaic device base member is formed on the belt substrate under conditions shown in Table A9, the substrate (formed into the base member) is wound up in the substrate wind-up chamber 3684.

The process of producing the photovoltaic device will be described below with reference to FIG. 10.

The triple type photovoltaic device having the layer configuration as shown in FIG. 4 was produced under conditions as shown in Table D10 below, using the apparatus employing a roll-to-roll system as shown in FIG. 10.

The belt base member comprising the photovoltaic device base member obtained in the manner as described above was set in the load chamber 5010 for introducing the belt base member. This belt base member was passed through all the deposition chambers and all the gas gates and connected to the belt base member wind-up jig in the unload chamber 5150. The respective deposition chambers were evacuated to $10^{-3}$ Torr or below by means of an exhaust system (not shown). The desired materials gases were fed into the respective deposition chambers from the deposited film forming mixing systems 5024, 5034, 5044, 5054, 5064, 5074, 5084, 5094, 5104, 5114, 5124, 5134 and 5144. To the gas gates 5201, 5202, 5203, 5204, 5205, 5206, 5207, 5208, 5209, 5210, 5211, 5212, 5213 and 5214, gas was fed from the respective gate gas feeding system. The base member was heated by means of the base member heater in each deposition system, and the degree of vacuum was controlled by adjusting the opening of the exhaust valve of each exhaust system. After the base member temperature and degree of vacuum became stable, the belt base member was begun to be transported, and RF power or MW (frequency: 2.45 GHz) power for generating plasma was supplied to each deposition chamber. In this way, the triple type photovoltaic device having three pin structures as shown in FIG. 4, which were superposingly formed on the belt base member 290, was formed.

Next, on the RF p-type layer 211, ITO was deposited by vacuum deposition in a layer thickness of 70 nm as the transparent conductive layer 212.

Next, on the transparent conductive layer 212, a mask with a comb-shaped opening was placed, and the comb-shaped collector electrode 213 with a flat structure, comprised of Cr(40 nm)/Ag(1,000 nm)/Cr(40 nm) was deposited by vacuum deposition.

Thus, the fabrication of the photovoltaic device of the present Example was completed. This photovoltaic device is herein called SCD8. Conditions for forming the photovoltaic device base member in the present Example are shown in Table D9. Conditions for forming the respective semiconductor layers RF n-type layers, RF i-type layers, MW i-type layers and RF p-type layers are shown in Table D10.

TABLE D9

Photovoltaic device base member forming conditions
(Example D8; apparatus used: FIG. 8)

|  | Intermediate layer: ZnO | Light-reflecting layer: Ag | Reflection enhancing layer: ZnO |
|---|---|---|---|
| Temp. rise rate: (°C./sec.) | 20 | 15 | 15 |
| Substrate temp.: (°C.) | 260 | 280 | 300 |
| Ar gas flow rate: (sccm) | 35 | 30 | 35 |
| Pressure: (mTorr) | 4 | 3 | 4 |
| Target species: | ZnO | Ag | ZnO |
| Type of sputtering: | DC | DC | DC |
| Sputter voltage: (V) | 380 | 380 | 385 |
| Layer thickness: (μm) | 0.01 | 0.62 | 1.0 |
| Substrate cooling gas: | He | $H_2$ | He |
| Temp. drop rate: (°C./sec.) | 10 | 10 | 15 |

TABLE D10

| | $SiH_4$ Flow rate (sccm) | $Si_2H_6$ Flow rate (sccm) | $CH_4$ Flow rate (sccm) | $GeH_4$ Flow rate (sccm) | $H_2$ Flow rate (sccm) | $PH_3/H_2$ Flow rate (sccm) | $B_2H_6/H_2$ Flow rate (sccm) | $SiH_4/H_2$ Flow rate (sccm) | Pressure (Torr) | MW power (W/cm²) | RF power (W/cm²) | Base member temp. (°C.) | Layer thickness (nm) |
|---|---|---|---|---|---|---|---|---|---|---|---|---|---|
| RF n-type layer: (203) | 2.0 | — | — | — | 100 | 220 | — | — | 1.3 | — | 0.05 | 350 | 20 |
| RF i-type layer: (251) | — | 4.0 | — | — | 100 | — | — | — | 0.8 | — | 0.008 | 300 | 10 |

TABLE D10-continued

|  | SiH$_4$ Flow rate (sccm) | Si$_2$H$_6$ Flow rate (sccm) | CH$_4$ Flow rate (sccm) | GeH$_4$ Flow rate (sccm) | H$_2$ Flow rate (sccm) | PH$_3$/ H$_2$ Flow rate (sccm) | B$_2$H$_6$/ H$_2$ Flow rate (sccm) | SiH$_4$/ H$_2$ Flow rate (sccm) | Pressure (Torr) | MW power (W/cm$^2$) | RF power (W/cm$^2$) | Base member temp. (°C.) | Layer thickness (nm) |
|---|---|---|---|---|---|---|---|---|---|---|---|---|---|
| MW i-type layer: (204) | 58 | — | — | 59 | 200 | — | — | — | 0.005 | 0.07 | 0.28 | 380 | 100 |
| RF i-type layer: (261) | — | 4.0 | — | — | 100 | — | — | — | 0.55 | — | 0.008 | 300 | 23 |
| RF p-type layer: (205) | — | — | 0.1 | — | 80 | — | 9 | 2 | 1.8 | — | 0.07 | 300 | 10 |
| RF n-type layer: (206) | 1.1 | — | — | — | 40 | 290 | — | — | 1.1 | — | 0.04 | 300 | 10 |
| RF i-type layer: (252) | — | 4.0 | — | — | 90 | — | — | — | 0.75 | — | 0.008 | 300 | 10 |
| MW i-type layer: (207) | 43 | — | — | 39 | 200 | — | — | — | 0.005 | 0.05 | 0.28 | 360 | 98 |
| RF i-type layer: (262) | — | 3.5 | — | — | 90 | — | — | — | 0.5 | — | 0.008 | 280 | 23 |
| RF p-type layer: (208) | — | — | 0.2 | — | 80 | — | 9 | 2 | 1.7 | — | 0.07 | 260 | 10 |
| RF n-type layer: (209) | 0.8 | — | — | — | 50 | 250 | — | — | 1.05 | — | 0.04 | 230 | 10 |
| RF i-type layer: (210) | — | 2.0 | — | — | 80 | — | — | — | 0.7 | — | 0.007 | 190 | 90 |
| RF p-type layer: (211) | — | — | 0.4 | — | 90 | — | 8 | 2 | 1.6 | — | 0.07 | 170 | 10 |

Reference Example D8-1

This example is different from Example D8 in that the base member sample was used in which the intermediate layer 299 of ZnO was not formed on the substrate and, after the light-reflecting layer 201 of Ag was formed, the reflection enhancing layer 202 of ZnO was formed without the step of lowering the substrate temperature to 100° C. or below. Except for these points, the procedure of Example D8 was repeated to produce photovoltaic devices as shown in FIG. 4. Samples of the photovoltaic device of this example are called "SCD8-1".

For every two kinds of the samples of the photovoltaic device, i.e., SD8 and SD8-1, seven samples were prepared. In respect of these samples of the photovoltaic device, a bending peel test was carried out in the same manner as described below to examine their environmental resistance. Characteristics of initial photoelectric conversion efficiency (photoelectromotive force/incident light intensity) (in respect of photoelectric conversion efficiency and short-circuit current) were evaluated in the same manner as in Example A1. Photo-deterioration characteristics were also evaluated in the manner as described below. The results obtained are shown together in Table D11.

The bending peel test was carried out in the following way: The respective photovoltaic devices were left to stand for 250 hours in an environment of a high-temperature and high-humidity atmosphere (temperature: 82° C.; humidity: 85% RH), and thereafter put to a bending test repeated thirty times. In addition, to the part thus bended, a weight of 10 kg was dropped ten times at a height of 50 cm, and any peeling in the device was observed using a scanning electron microscope (SEM), manufactured by Hitachi Ltd. (model: S-4500; magnifications: 50,000×).

To examine the photo-deterioration characteristics, photoelectric conversion efficiency was evaluated after photovoltaic devices having a temperature of 50° C. was irradiated by light for 1,200 hours under 1 sun of 100 mW/cm$^2$.

In the results of the bending peel test, shown in Table D11, letter symbol "A" indicates an instance where no peeling occurs at all, and "C" an instance where peeling partly occurs. The results of evaluation on the characteristics of initial photoelectric conversion efficiency and photo-deterioration characteristics also shown in Table D11 are indicated by standardizing the results of the photovoltaic device SCD8-1 on the basis of the results of the photovoltaic device SCD8 which are regarded as 1.

TABLE D11

| Sample | Bending peel test | Total reflectance | Scattered reflectance | Photo-deterioration characteristics |
|---|---|---|---|---|
| SCD8 | A | 1.00 | 1.00 | 1.00 |
| SCD8-1 | C | 0.84 | 0.90 | 0.93 |

As is seen from the results shown in Table D11, the photovoltaic device SCD8 obtained in Example D8 by the process of the present invention is superior to the photovoltaic devices SCD8-1 of Reference Example D8-1 in all the environmental resistance, characteristics of initial photoelectric conversion efficiency and photo-deterioration characteristics at the same time.

EXAMPLE D9

In the present Example, the rate of temperature rise at the time of the formation of the intermediate layer, light-reflecting layer and reflection enhancing layer was changed in the range of from 2° C./sec. to 150° C./sec. to examine how it affects the initial photoelectric conversion characteristics and so forth in photovoltaic devices. ZnO was used as the target used to form the intermediate layer.

In the present Example, triple type photovoltaic devices having the structure as shown in FIG. 4 were produced in the same manner as in Example D8 except that the photovoltaic device base member was formed under conditions shown in Table D12 and the semiconductor layers were formed under conditions shown in Table D13, using the apparatus for continuously forming the photovoltaic device base member as shown in FIG. 8 and the apparatus for continuously forming the photovoltaic device semiconductor layers as shown in FIG. 10. Stated specifically, eight samples were prepared under different conditions for the rate of temperature rise.

In respect of the samples of the photovoltaic device thus obtained, environmental resistance, characteristics of initial photoelectric conversion efficiency and photo-deterioration characteristics were evaluated in the same manner as in Example D8 to obtain the results as shown in Table D14.

The results of evaluation on the bending peel test, photoelectric conversion efficiency, short-circuit current and photo-deterioration characteristics as shown in Table D14 are indicated by standardizing the results obtained for the photovoltaic device produced in this example, on the basis of the measurement results of the sample obtained when the temperature was raised at a rate of 2° C./sec. In the table, "C" indicates 1.0 or more to less than 1.4; "B", 1.4 or more to less than 1.8; and "A", 1.8 or more.

As is seen from the results shown in Table D14, the rate of temperature rise at the time of the formation of the photovoltaic device base member is preferably in the range of from 10° C./sec. to 100° C./sec. in view of the bending peel test (environmental resistance), the photoelectric conversion efficiency, the short-circuit current and the photo-deterioration characteristics.

TABLE D12

Photovoltaic device base member forming conditions
(Example D; apparatus used: FIG. 8)

| | Intermediate layer: ZnO | Light-reflecting layer: Ag | Reflection enhancing layer: ZnO |
|---|---|---|---|
| Temp. rise rate: (°C./sec.) | 2–150 | 2–150 | 2–150 |
| Substrate temp.: (°C.) | 250 | 290 | 310 |
| Ar gas flow rate: (sccm) | 40 | 40 | 35 |
| Pressure: (mTorr) | 3 | 3 | 4 |
| Target species: | ZnO | Ag | ZnO |
| Type of sputtering: | DC | DC | DC |
| Sputter voltage: (V) | 380 | 390 | 385 |
| Layer thickness: ($\mu$m) | 0.015 | 0.45 | 1.0 |
| Substrate cooling gas: | He | He | He |
| Temp. drop rate: (°C./sec.) | 10 | 10 | 15 |

TABLE D13

| | $SiH_4$ Flow rate (sccm) | $Si_2H_6$ Flow rate (sccm) | $CH_4$ Flow rate (sccm) | $GeH_4$ Flow rate (sccm) | $H_2$ Flow rate (sccm) | $PH_3/H_2$ Flow rate (sccm) | $B_2H_6/H_2$ Flow rate (sccm) | $SiH_4/H_2$ Flow rate (sccm) | Pressure (Torr) | MW power (W/cm$^2$) | RF power (W/cm$^2$) | Base member temp. (°C.) | Layer thickness (nm) |
|---|---|---|---|---|---|---|---|---|---|---|---|---|---|
| RF n-type layer: (203) | 2.0 | — | — | — | 100 | 220 | — | — | 1.3 | — | 0.05 | 350 | 20 |
| RF i-type layer: (251) | — | 4.0 | — | — | 100 | — | — | — | 0.7 | — | 0.008 | 300 | 10 |
| MW i-type layer: (204) | 58 | — | — | 61 | 270 | — | — | — | 0.010 | 0.12 | 0.31 | 370 | 100 |
| RF i-type layer: (261) | — | 4.0 | — | — | 100 | — | — | — | 0.65 | — | 0.008 | 300 | 23 |
| RF p-type layer: (205) | — | — | 0.1 | — | 80 | — | 9 | 2 | 1.8 | — | 0.07 | 300 | 10 |
| RF n-type layer: (206) | 1.1 | — | — | — | 40 | 290 | — | — | 1.1 | — | 0.04 | 300 | 10 |
| RF i-type layer: (252) | — | 4.0 | — | — | 90 | — | — | — | 0.75 | — | 0.008 | 300 | 10 |
| MW i-type layer: (207) | 45 | — | — | 39 | 250 | — | — | — | 0.013 | 0.10 | 0.3 | 350 | 98 |
| RF i-type layer: (262) | — | 3.5 | — | — | 90 | — | — | — | 0.7 | — | 0.008 | 280 | 23 |
| RF p-type layer: (208) | — | — | 0.2 | — | 80 | — | 9 | 2 | 1.7 | — | 0.07 | 260 | 10 |
| RF n-type layer: (209) | 0.8 | — | — | — | 50 | 250 | — | — | 1.05 | — | 0.04 | 230 | 10 |
| RF i-type layer: (210) | — | 2.0 | — | — | 60 | — | — | — | 0.5 | — | 0.007 | 190 | 90 |
| RF p-type layer: (211) | — | — | 0.4 | — | 90 | — | 8 | 2 | 1.6 | — | 0.07 | 170 | 10 |

TABLE D14

| | Temp. rise rate: (°C./sec.) | | | | | | | |
|---|---|---|---|---|---|---|---|---|
| | 2 | 8 | 10 | 40 | 70 | 100 | 120 | 150 |
| Environmental resistance bending peel test: | B | A | A | A | A | A | B | C |
| Photoelectric conversion efficiency: | C | B | A | A | A | A | B | C |
| Short-circuit current: | C | B | A | A | A | A | C | C |
| Photoelectric conversion efficiency after photodeterioration: | C | A | A | A | A | A | B | C |

EXAMPLE D10

In the present Example, the rate of temperature drop after the formation of the intermediate layer, light-reflecting layer and reflection enhancing layer was changed in the range of from 0.2° C./sec. to 90° C./sec. to examine how it affects the initial photoelectric conversion characteristics and so forth in photovoltaic devices. ZnO was used as the target used to form the intermediate layer.

In the present Example, triple type photovoltaic devices having the structure as shown in FIG. 4 were produced in the same manner as in Example D8 except that the photovoltaic device base member was formed under conditions shown in Table D15 and the semiconductor layers were formed under conditions shown in Table D16, using the apparatus for continuously forming the photovoltaic device base member as shown in FIG. 8 and the apparatus for continuously forming the photovoltaic device semiconductor layers as shown in FIG. 10. Stated specifically, eight samples were prepared under different conditions for the rate of temperature rise.

In respect of the samples of the photovoltaic device thus obtained, environmental resistance, characteristics of initial photoelectric conversion efficiency and photo-deterioration characteristics were evaluated in the same manner as in Example D8 to obtain the results as shown in Table D17.

The results of evaluation on the bending peel test, photoelectric conversion efficiency, short-circuit current and photo-deterioration characteristics as shown in Table D17 are indicated by standardizing the results obtained for the photovoltaic device produced in this example, on the basis of the measurement results of the sample obtained when the temperature was lowered at a rate of 0.2° C./sec. In the table, "C" indicates 1.0 or more to less than 1.4; "B", 1.4 or more to less than 1.8; and "A", 1.8 or more.

As is seen from the results shown in Table D17, the rate of temperature drop at the time of the formation of the photovoltaic device base member is preferably in the range of from 1° C./sec. to 50° C./sec. in view of the bending peel test (environmental resistance), the photoelectric conversion efficiency, the short-circuit current and the photo-deterioration characteristics.

TABLE D15

Photovoltaic device base member forming conditions
(Example C10; apparatus used: FIG. 8)

|  | Intermediate layer: ZnO | Light-reflecting layer: Ag | Reflection enhancing layer: ZnO |
|---|---|---|---|
| Temp. rise rate: (°C./sec.) | 50 | 15 | 15 |
| Substrate temp.: (°C.) | 290 | 290 | 320 |
| Ar gas flow rate: (sccm) | 35 | 40 | 50 |
| Pressure: (mTorr) | 3 | 3 | 4 |
| Target species: | ZnO | Ag | ZnO |
| Type of sputtering: | DC | DC | DC |
| Sputter voltage: (V) | 380 | 380 | 390 |
| Layer thickness: ($\mu$m) | 0.02 | 0.7 | 1.8 |
| Substrate cooling gas: | He | $H_2$ | He |
| Temp. drop rate: (°C./sec.) | 0.2–90 | 0.2–90 | 0.2–90 |

TABLE D16

| | $SiH_4$ Flow rate (sccm) | $Si_2H_6$ Flow rate (sccm) | $CH_4$ Flow rate (sccm) | $GeH_4$ Flow rate (sccm) | $H_2$ Flow rate (sccm) | $PH_3/H_2$ Flow rate (sccm) | $B_2H_6/H_2$ Flow rate (sccm) | $SiH_4/H_2$ Flow rate (sccm) | Pressure (Torr) | MW power (W/cm$^2$) | RF power (W/cm$^2$) | Base member temp. (°C.) | Layer thickness (nm) |
|---|---|---|---|---|---|---|---|---|---|---|---|---|---|
| RF n-type layer: (203) | 2.0 | — | — | — | 100 | 220 | — | — | 1.3 | — | 0.05 | 350 | 20 |
| RF i-type layer: (251) | — | 4.0 | — | — | 100 | — | — | — | 0.8 | — | 0.008 | 300 | 10 |
| MW i-type layer: (204) | 58 | — | — | 61 | 220 | — | — | — | 0.010 | 0.10 | 0.32 | 370 | 100 |
| RF i-type layer: (261) | — | 4.0 | — | — | 105 | — | — | — | 0.55 | — | 0.008 | 300 | 23 |
| RF p-type layer: (205) | — | — | 0.1 | — | 80 | — | 9 | 2 | 1.8 | — | 0.07 | 300 | 10 |
| RF n-type layer: (206) | 1.1 | — | — | — | 30 | 290 | — | — | 1.2 | — | 0.04 | 300 | 10 |
| RF i-type layer: (252) | — | 4.0 | — | — | 90 | — | — | — | 0.75 | — | 0.008 | 300 | 10 |
| MW i-type layer: (207) | 45 | — | — | 40 | 220 | — | — | — | 0.013 | 0.10 | 0.3 | 350 | 98 |
| RF i-type layer: (262) | — | 3.5 | — | — | 90 | — | — | — | 0.7 | — | 0.008 | 280 | 23 |
| RF p-type layer: (208) | — | — | 0.2 | — | 80 | — | 9 | 2 | 1.7 | — | 0.07 | 260 | 10 |
| RF n-type layer: (209) | 0.8 | — | — | — | 50 | 250 | — | — | 1.05 | — | 0.04 | 230 | 10 |
| RF i-type layer: (210) | — | 4.0 | — | — | 180 | — | — | — | 0.7 | — | 0.007 | 190 | 90 |
| RF p-type layer: (211) | — | — | 0.4 | — | 90 | — | 8 | 2 | 1.6 | — | 0.07 | 170 | 10 |

TABLE D17

| | Temp. rise rate: (°C./sec.) | | | | | | | |
|---|---|---|---|---|---|---|---|---|
| | 0.2 | 0.8 | 1 | 10 | 30 | 50 | 70 | 90 |
| Environmental resistance bending peel test: | B | A | A | A | A | A | A | B |
| Photoelectric conversion efficiency: | C | A | A | A | A | A | B | C |

TABLE D17-continued

| | Temp. rise rate: (°C./sec.) | | | | | | | |
|---|---|---|---|---|---|---|---|---|
| | 0.2 | 0.8 | 1 | 10 | 30 | 50 | 70 | 90 |
| Short-circuit current: | C | B | A | A | A | A | B | C |
| Photoelectric conversion efficiency after photodeterioration: | C | B | A | A | A | A | A | B |

EXAMPLE D11

In the present Example, the layer thickness of the intermediate layer was changed in the range of from 0.0002 $\mu$m to 0.2 $\mu$m to examine how it affects the initial photoelectric conversion characteristics and so forth in photovoltaic devices obtained. ZnO was used as the target used to form the intermediate layer.

In the present Example, triple type photovoltaic devices having the structure as shown in FIG. 4 were produced in the same manner as in Example D8 except that the photovoltaic device base member was formed under conditions shown in Table D18 and the semiconductor layers were formed under conditions shown in Table D19, using the apparatus for continuously forming the photovoltaic device base member as shown in FIG. 8 and the apparatus for continuously forming the photovoltaic device semiconductor layers as shown in FIG. 10. Stated specifically, eight samples having different layer thicknesses were prepared.

In respect of the samples of the photovoltaic device thus obtained, environmental resistance, characteristics of initial photoelectric conversion efficiency and photo-deterioration characteristics were evaluated in the same manner as in Example D8 to obtain the results as shown in Table D20.

The results of evaluation on the bending peel test, photoelectric conversion efficiency, short-circuit current and photo-deterioration characteristics as shown in Table D20 are indicated by standardizing the results obtained for the photovoltaic device produced in this example, on the basis of the measurement results of the sample obtained when the intermediate layer was formed in a thickness of 0.0002 $\mu$m. In the table, "C" indicates 1.0 or more to less than 1.4; "B", 1.4 or more to less than 1.8; and "A", 1.8 or more.

As is seen from the results shown in Table D20, the layer thickness of the intermediate layer at the time of the formation of the photovoltaic device base member is preferably in the range of from 0.001 $\mu$m to 0.1 $\mu$m in view of the bending peel test (environmental resistance), the photoelectric conversion efficiency, the short-circuit current and the photo-deterioration characteristics.

TABLE D18

Photovoltaic device base member forming conditions
(Example D11; apparatus used: FIG. 8)

| | Intermediate layer: ZnO | Light-reflecting layer: Ag | Reflection enhancing layer: ZnO |
|---|---|---|---|
| Temp. rise rate: (°C./sec.) | 50 | 15 | 15 |
| Substrate temp.: (°C.) | 290 | 290 | 320 |
| Ar gas flow rate: (sccm) | 35 | 40 | 50 |
| Pressure: (mTorr) | 3 | 3 | 4 |
| Target species: | ZnO | Ag | ZnO |
| Type of sputtering: | DC | DC | DC |
| Sputter voltage: (V) | 370 | 380 | 390 |
| Layer thickness: ($\mu$m) | 0.0002–0.2 | 0.6 | 1.8 |
| Substrate cooling gas: | He | $H_2$ | He |
| Temp. drop rate: (°C./sec.) | 30 | 50 | 50 |

TABLE D19

| | $SiH_4$ Flow rate (sccm) | $Si_2H_6$ Flow rate (sccm) | $CH_4$ Flow rate (sccm) | $GeH_4$ Flow rate (sccm) | $H_2$ Flow rate (sccm) | $PH_3/H_2$ Flow rate (sccm) | $B_2H_6/H_2$ Flow rate (sccm) | $SiH_4/H_2$ Flow rate (sccm) | Pressure (Torr) | MW power (W/cm$^2$) | RF power (W/cm$^2$) | Base member temp. (°C.) | Layer thickness (nm) |
|---|---|---|---|---|---|---|---|---|---|---|---|---|---|
| RF n-type layer: (203) | 2.0 | — | — | — | 100 | 220 | — | — | 1.3 | — | 0.05 | 350 | 20 |
| RF i-type layer: (251) | — | 4.0 | — | — | 100 | — | — | — | 0.8 | — | 0.008 | 300 | 10 |
| MW i-type layer: (204) | 58 | — | — | 61 | 250 | — | — | — | 0.011 | 0.10 | 0.32 | 370 | 100 |
| RF i-type layer: (261) | — | 4.0 | — | — | 105 | — | — | — | 0.55 | — | 0.008 | 300 | 23 |
| RF p-type layer: (205) | — | — | 0.1 | — | 80 | — | 9 | 2 | 1.8 | — | 0.07 | 300 | 10 |
| RF n-type layer: (206) | 1.1 | — | — | — | 30 | 290 | — | — | 1.2 | — | 0.04 | 300 | 10 |
| RF i-type layer: (252) | — | 4.0 | — | — | 90 | — | — | — | 0.75 | — | 0.008 | 300 | 10 |
| MW i-type layer: (207) | 45 | — | — | 40 | 250 | — | — | — | 0.010 | 0.10 | 0.3 | 350 | 98 |
| RF i-type layer: (262) | — | 4.5 | — | — | 90 | — | — | — | 0.7 | — | 0.008 | 280 | 23 |
| RF p-type layer: (208) | — | — | 0.2 | — | 80 | — | 9 | 2 | 1.7 | — | 0.07 | 260 | 10 |
| RF n-type layer: (209) | 0.8 | — | — | — | 50 | 250 | — | — | 1.05 | — | 0.04 | 230 | 10 |

TABLE D19-continued

| | SiH$_4$ Flow rate (sccm) | Si$_2$H$_6$ Flow rate (sccm) | CH$_4$ Flow rate (sccm) | GeH$_4$ Flow rate (sccm) | H$_2$ Flow rate (sccm) | PH$_3$/H$_2$ Flow rate (sccm) | B$_2$H$_6$/H$_2$ Flow rate (sccm) | SiH$_4$/H$_2$ Flow rate (sccm) | Pressure (Torr) | MW power (W/cm$^2$) | RF power (W/cm$^2$) | Base member temp. (°C.) | Layer thickness (nm) |
|---|---|---|---|---|---|---|---|---|---|---|---|---|---|
| RF i-type layer: (210) | — | 4.0 | — | — | 280 | — | — | — | 0.7 | — | 0.007 | 190 | 90 |
| RF p-type layer: (211) | — | — | 0.4 | — | 90 | — | 8 | 2 | 1.6 | — | 0.07 | 170 | 10 |

TABLE D20

| | Intermediate layer: ZnO layer thickness (μm) | | | | | | | |
|---|---|---|---|---|---|---|---|---|
| | 0.0002 | 0.0007 | 0.001 | 0.01 | 0.07 | 0.1 | 0.15 | 0.2 |
| Environmental resistance bending peel test: | B | A | A | A | A | A | A | B |
| Photoelectric conversion efficiency: | C | A | A | A | A | A | B | C |
| Short-circuit current: | C | B | A | A | A | A | B | C |
| Photoelectric conversion efficiency after photo-deterioration: | B | A | A | A | A | A | A | B |

EXAMPLE E1

In the present Example, the base member 190 that constitutes the photovoltaic device shown in FIG. 2 was produced using the apparatus of a multi-chamber-separated system as shown in FIG. 6. More specifically, the intermediate layer 199, light-reflecting layer 101 and reflection enhancing layer 102 were formed on the substrate 100.

Their production process will be described below, following its procedure. To the apparatus shown in FIG. 6, a material gas feeding system (not shown) is connected through gas feed pipes. The material gas cylinders are all purified in an ultra-high purity. As the material gas cylinders, an H$_2$ gas cylinder, an Ar gas cylinder and an He gas cylinder were connected thereto. ZnO—Ag (99:1), Ag and ZnO were used as targets. These are so provided that sputtering can be carried out in vacuum.

As the substrate (100 in FIG. 2), a stainless steel sheet of 0.5 mm thick and 50×50 mm$^2$ was used, which was subjected to ultrasonic cleaning with acetone and isopropanol, followed by hot-air drying. As the sputter power source, the DC power source 3325 was connected, and an intermediate layer 199 of ZnO—Ag (99:1) was formed on the substrate by DC magnetron sputtering. Then the subsequent processing was carried out.

The above production process will be described below in detail, following its procedure with reference to FIG. 6.

(1) A substrate 3390 (corresponding to 100 in FIG. 2) having been cleaned was placed on the substrate transporting rail 3313 provided in the load chamber 3301, and the inside of the load chamber 3301 was evacuated by means of a vacuum exhaust pump (not shown) to have a pressure of about 1×10$^{-5}$ Torr.

(2) The gate valve 3306 was opened to carry the substrate into the transport chamber 3302 and deposition chamber 3320 previously evacuated by means of a vacuum exhaust pump (not shown). The substrate 3390 was set in the manner the back thereof was brought into close contact with the substrate heater 3310, and was heated while raising temperature at a rate of 13° C./sec., to bring the substrate temperature to 180° C. Then, the inside of the deposition chamber 3320 was evacuated by means of a vacuum exhaust pump (not shown) to have a pressure of about 3×10$^{-6}$ Torr.

(3) 38 sccm of Ar gas was fed into it through the gas feed pipe 3324, and a conductance valve (not shown) was operated to control the pressure so as to be 3 mTorr. Electric current was flowed to the toroidal coil 3323, and 380 V of a DC power was applied from the sputter power source 3325 to cause Ar plasma.

(4) The target shutter 3326 was opened, and the intermediate layer 199 of ZnO—Ag (99:1) with a layer thickness of 0.01 μm was formed on the surface of the stainless steel sheet, whereupon the target shutter 3326 was closed to extinguish the plasma.

(5) The substrate heater 3310 was lifted, and the substrate temperature was lowered to 100° C. or below while dropping temperature at a rate of 7° C./sec. in an atmosphere of He gas used as substrate cooling gas. Thereafter, the gate valve 3307 was opened to carry the substrate into the transport chamber 3303 and deposition chamber 3330 previously evacuated by means of a vacuum exhaust pump (not shown). The substrate 3390 was set in the manner the back thereof was brought into close contact with the substrate heater 3311, and was heated while raising temperature at a rate of 13° C./sec., to bring the substrate temperature to 290° C. Then, the inside of the deposition chamber 3330 was evacuated by means of a vacuum exhaust pump (not shown) to have a pressure of about 2×10$^{-6}$ Torr.

(6) 42 sccm of Ar gas was fed into it through the gas feed pipe 3334, and a conductance valve (not shown) was operated to control the pressure so as to be 4 mTorr. Electric current was flowed to the toroidal coil 3333, and 380 V of a DC power was applied from the sputter power source 3335 to cause Ar plasma. Next, the target shutter 3336 was opened, and a light-reflecting layer 101 of Ag with a layer thickness of 0.6 μm was formed on the surface of the intermediate layer 199 of ZnO—Ag (99:1), whereupon the target shutter 3336 was closed to extinguish the plasma.

(7) The substrate heater 3311 was lifted, and the substrate temperature was lowered to 100° C. or below while dropping temperature at a rate of 6° C./sec. in an atmosphere of He gas used as substrate cooling gas. Thereafter, the gate valve 3308 was opened to carry the substrate into the transport chamber 3304 and deposition chamber 3340 previously evacuated by means of a vacuum exhaust pump (not shown). The substrate 3390 was set in the manner the back thereof was brought into close contact with the substrate heater 3312, and was heated while raising temperature at a rate of 13° C./sec., to bring the substrate temperature to 290° C. Then, the inside of the deposition chamber 3340 was evacuated by means of a vacuum exhaust pump (not shown) to have a pressure of about $3 \times 10^{-6}$ Torr.

(8) 43 sccm of Ar gas was fed into it through the gas feed pipe 3344, and a conductance valve (not shown) was operated to control the pressure so as to be 4 mTorr. Electric current was flowed to the toroidal coil 3343, and 385 V of a DC power was applied from the sputter power source 3345 to cause Ar plasma. Next, the target shutter 3346 was opened, and a reflection enhancing layer 102 of ZnO with a layer thickness of 1.2 μm was formed on the surface of the light-reflecting layer 101 of Ag, whereupon the target shutter 3346 was closed to extinguish the plasma.

(9) The substrate heater 3312 was lifted, and the substrate temperature was lowered to 100° C. or below while dropping temperature at a rate of 7° C./sec. in an atmosphere of He gas used as substrate cooling gas. Thereafter, the gate valve 3309 was opened to carry the substrate into the unload chamber 3305 previously evacuated by means of a vacuum exhaust pump (not shown).

Thus, the production of the photovoltaic device base member (190 in FIG. 2) of the present Example was completed. Samples of this photovoltaic device base member are called "SE1".

Reference Example E1-1

This example is different from Example E1 only in that the substrate temperature was set to 10° C. when the intermediate layer 199 of ZnO—Ag (99:1) was formed. Except for this point, the procedure of Example E1 was repeated to produce base member samples. The samples of the photovoltaic device base member of this example are called "SE1-1".

Reference Example E1-2

This example is different from Example E1 only in that the substrate temperature was set to 60° C. when the intermediate layer 199 of ZnO—Ag (99:1) was formed. Except for this point, the procedure of Example E1 was repeated to produce samples. The samples of the photovoltaic device base member of this example are called "SE1-2".

Reference Example E1-3

This example is different from Example E1 only in that the substrate temperature was set to 150° C. when the light-reflecting layer 101 of Ag was formed. Except for this point, the procedure of Example E1 was repeated to produce samples. The samples of the photovoltaic device base member of this example are called "SE1-3".

Reference Example E1-4

This example is different from Example E1 only in that the substrate temperature was set to 550° C. when the light-reflecting layer 101 of Ag was formed. Except for this point, the procedure of Example E1 was repeated to produce samples. The samples of the photovoltaic device base member of this example are called "SE1-4".

Reference Example E1-5

This example is different from Example E1 only in that, after the light-reflecting layer 101 of Ag was formed, the reflection enhancing layer 102 of ZnO was formed without the step of lowering the substrate temperature to 100° C. or below. Except for this point, the procedure of Example E1 was repeated to produce samples. The samples of the photovoltaic device base member of this example are called "SE1-5".

Reference Example E1-6

This example is different from Example E1 only in that the substrate temperature was set to 150° C. when the reflection enhancing layer 102 of ZnO was formed. Except for this point, the procedure of Example E1 was repeated to produce samples. The samples of the photovoltaic device base member of this example are called "SE1-6".

Reference Example E1-7

This example is different from Example E1 only in that the substrate temperature was set to 450° C. when the reflection enhancing layer 102 of ZnO was formed. Except for this point, the procedure of Example E1 was repeated to produce samples. The samples of the photovoltaic device base member of this example are called "SE1-7".

For every eight kinds of the samples of the photovoltaic device base member, i.e., SE1 and SE1-1 to SE1-7, five samples were prepared. In respect of these samples of the photovoltaic device base member, a bending peel test was carried out to examine their environmental resistance to obtain the results as shown in Table E1.

The bending peel test was carried out in the following way: The respective photovoltaic device base members were left to stand for 130 hours in an environment of a high-temperature and high-humidity atmosphere (temperature: 82° C.; humidity: 82% RH), and thereafter put to a bending test repeated twenty times. In addition, to the part thus bended, a weight of 10 kg was dropped twelve times at a height of 50 cm, and any peeling in the base member was observed using a scanning electron microscope (SEM), manufactured by Hitachi Ltd. (model: S-4500; magnifications: 50,000×).

In the results of the bending peel test, shown in Table E, letter symbol "A" indicates an instance where no peeling occurs at all, and "B" an instance where peeling only partly occurs.

In respect of the above samples, light reflectance was also measured and, from the measurements obtained, total reflectance and scattered reflectance were evaluated in the same manner as in Example A1 to obtain the results as shown together in Table E1.

The results of total reflectance and scattered reflectance shown in Table E1 are indicated for each sample of the photovoltaic device base member by standardizing the results of the samples SE1-1 to SE1-7 on the basis of the results of the sample SE1 which are regarded as 1.

TABLE E1

| Sample | Bending peel test | Total reflectance | Scattered reflectance |
|--------|-------------------|-------------------|----------------------|
| SE1    | A | 1.00 | 1.00 |
| SE1-1  | B | 1.00 | 1.00 |
| SE1-2  | B | 1.00 | 1.00 |
| SE1-3  | A | 1.00 | 0.59 |
| SE1-4  | A | 0.96 | 0.90 |
| SE1-5  | A | 0.82 | 0.80 |
| SE1-6  | A | 0.91 | 0.76 |
| SE1-7  | A | 0.86 | 0.90 |

As is seen from the results shown in Table E1, the photovoltaic device base member SE1 of Example E1 is superior to the photovoltaic device base members SE1-1 to SE1-7 of Reference Examples E1-1 to E1-7 in the light-reflecting properties and the environmental resistance required as base members, at the same time.

EXAMPLE E2

This example is different from Example E1 in that the base member that constitutes the photovoltaic device shown in FIG. 2 was produced by changing conditions on the following two items.

(a) The ZnO—Ag (99:1) target was replaced with a ZnO—Fe (99.5:0.5) target.

(b) As the substrate cooling gas, the He gas was replaced with $H_2$ gas.

Like Example E1, the base member 190 that constitutes the photovoltaic device shown in FIG. 4 was produced using the apparatus of a multi-chamber-separated system as shown in FIG. 6. More specifically, the intermediate layer 199, light-reflecting layer 101 and reflection enhancing layer 102 were formed on the substrate 100.

Their production process will be described below, following its procedure. To the apparatus shown in FIG. 6, the material gas feeding system (not shown) is connected through gas feed pipes. The material gas cylinders are all purified in an ultra-high purity. As the material gas cylinders, an $H_2$ gas cylinder, an Ar gas cylinder and an He gas cylinder were connected thereto. ZnO—Fe (99.5:0.5), Ag and ZnO were used as targets. These are so provided that sputtering can be carried out in vacuum.

As the substrate (100 in FIG. 2), a stainless steel sheet of 0.5 mm thick and 50×50 mm² was used, which was subjected to ultrasonic cleaning with acetone and isopropanol, followed by hot-air drying. As the sputter power source, the DC power source 3325 was connected, and an intermediate layer 199 of ZnO—Fe (99.5:0.5) was formed on the substrate by DC magnetron sputtering. Then the subsequent processing was carried out.

The above production process will be described below in detail, following its procedure with reference to FIG. 6.

(1) A substrate 3390 (corresponding to 100 in FIG. 2) having been cleaned was placed on the substrate transporting rail 3313 provided in the load chamber 3301, and the inside of the load chamber 3301 was evacuated by means of a vacuum exhaust pump (not shown) to have a pressure of about $1 \times 10^{-5}$ Torr.

(2) The gate valve 3306 was opened to carry the substrate into the transport chamber 3302 and deposition chamber 3320 previously evacuated by means of a vacuum exhaust pump (not shown). The substrate 3390 was set in the manner the back thereof was brought into close contact with the substrate heater 3310, and was heated while raising temperature at a rate of 15° C./sec., to bring the substrate temperature to 250° C. Then, the inside of the deposition chamber 3320 was evacuated by means of a vacuum exhaust pump (not shown) to have a pressure of about $3 \times 10^{-6}$ Torr.

(3) 45 sccm of Ar gas was fed into it through the gas feed pipe 3324, and a conductance valve (not shown) was operated to control the pressure so as to be 4 mTorr. Electric current was flowed to the toroidal coil 3323, and 385 V of a DC power was applied from the sputter power source 3325 to cause Ar plasma.

(4) The target shutter 3326 was opened, and the intermediate layer 199 (FIG. 2) of ZnO—Fe (99.5:0.5) with a layer thickness of 0.015 µm was formed on the surface of the stainless steel sheet, whereupon the target shutter 3326 was closed to extinguish the plasma.

(5) The substrate heater 3310 was lifted, and the substrate temperature was lowered to 100° C. or below while dropping temperature at a rate of 7° C./sec. in an atmosphere of $H_2$ gas used as substrate cooling gas. Thereafter, the gate valve 3307 was opened to carry the substrate into the transport chamber 3303 and deposition chamber 3330 previously evacuated by means of a vacuum exhaust pump (not shown). The substrate 3390 was set in the manner the back thereof was brought into close contact with the substrate heater 3311, and was heated while raising temperature at a rate of 17° C./sec., to bring the substrate temperature to 290° C. Then, the inside of the deposition chamber 3330 was evacuated by means of a vacuum exhaust pump (not shown) to have a pressure of about $2 \times 10^{-6}$ Torr.

(6) 39 sccm of Ar gas was fed into it through the gas feed pipe 3334, and a conductance valve (not shown) was operated to control the pressure so as to be 4 mTorr. Electric current was flowed to the toroidal coil 3343, and 380 V of a DC power was applied from the sputter power source 3335 to cause Ar plasma. Next, the target shutter 3336 was opened, and a light-reflecting layer 101 (FIG. 2) of Ag with a layer thickness of 0.5 µm was formed on the surface of the intermediate layer 199 of ZnO—Fe (99.5:0.5), whereupon the target shutter 3336 was closed to extinguish the plasma.

(7) The substrate heater 3311 was lifted, and the substrate temperature was lowered to 100° C. or below while dropping temperature at a rate of 8° C./sec. in an atmosphere of $H_2$ gas used as substrate cooling gas. Thereafter, the gate valve 3308 was opened to carry the substrate into the transport chamber 3304 and deposition chamber 3340 previously evacuated by means of a vacuum exhaust pump (not shown). The substrate 3390 was set in the manner the back thereof was brought into close contact with the substrate heater 3312, and was heated while raising temperature at a rate of 13° C./sec., to bring the substrate temperature to 315° C. Then, the inside of the deposition chamber 3340 was evacuated by means of a vacuum exhaust pump (not shown) to have a pressure of about $3 \times 10^{-6}$ Torr.

(8) 45 sccm of Ar gas was fed into it through the gas feed pipe 3344, and a conductance valve (not shown) was operated to control the pressure so as to be 4 mTorr. Electric current was flowed to the toroidal coil 3343, and 385 V of a DC power was applied from the sputter power source 3345 to cause Ar plasma. Next, the target shutter 3346 was opened, and a reflection enhancing layer 102 (FIG. 2) of ZnO with a layer thickness of 1.5 µm was formed on the surface of the light-reflecting layer 101 of Ag, whereupon the target shutter 3346 was closed to extinguish the plasma.

(9) The substrate heater 3312 was lifted, and the substrate temperature was lowered to 100° C. or below while dropping temperature at a rate of 16° C./sec. in an atmosphere of $H_2$ gas used as substrate cooling gas. Thereafter, the gate valve 3309 was opened to carry the substrate into the unload chamber 3305 previously evacuated by means of a vacuum exhaust pump (not shown).

Thus, the production of the photovoltaic device base member (190 in FIG. 2) of the present Example was completed. Samples of this photovoltaic device base member are called "SE2".

Reference Example E2-1

This example is different from Example E2 in that the intermediate layer 199 of ZnO—Fe (99.5:0.5) was not formed and, after the light-reflecting layer 101 of Ag was formed, the reflection enhancing layer 102 of ZnO was formed without the step of lowering the substrate temperature to 100° C. or below. Except for these points, the procedure of Example E2 was repeated to produce samples. The samples of the photovoltaic device base member of this example are called "SE2-1".

For every two kinds of the samples of the photovoltaic device base member, i.e., SE2 and SE2-1, five samples were prepared. In respect of these samples of the photovoltaic device base member, a bending peel test was carried out in the same manner as in Example E1 to examine their environmental resistance. Light reflectance was also measured and, from the measurements obtained, total reflectance and scattered reflectance were evaluated in the same manner as in Example E1. The results obtained are shown together in Table E2.

In the results of the bending peel test, shown in Table E2, letter symbol "A" indicates an instance where no peeling occurs at all, and "C" an instance where peeling only partly occurs. The results of total reflectance and scattered reflectance shown in Table E2 are indicated for each sample of the photovoltaic device base member by standardizing the results of the sample SE2-1 on the basis of the results of the sample SE2 which are regarded as 1.

TABLE E2

| Sample | Bending peel test | Total reflectance | Scattered reflectance |
| --- | --- | --- | --- |
| SE2 | A | 1.00 | 1.00 |
| SE2-1 | C | 0.78 | 0.79 |

As is seen from the results shown in Table E2, the photovoltaic device base member SE2 of Example E2 is superior to the photovoltaic device base member SE2-1 of Reference Example E2-1 in the light-reflecting properties and the environmental resistance required as base members, at the same time. It is also seen that $H_2$ gas is effective as the substrate cooling gas.

EXAMPLE E3

This example is different from Example E1 in that the photovoltaic device base member was produced by changing conditions on the following two items.
(a) The ZnO—Ag (99:1) target was replaced with a ZnO—Ni (99.5:0.5) target.
(b) As the substrate cooling gas, the He gas was replaced with Ar gas.

Like Example E1, the base member 190 that constitutes the photovoltaic device shown in FIG. 2 was produced using the apparatus of a multi-chamber-separated system as shown in FIG. 6. More specifically, the intermediate layer 199, light-reflecting layer 101 and reflection enhancing layer 102 were formed on the substrate 100.

Their production process will be described below, following its procedure. To the apparatus shown in FIG. 6, the material gas feeding system (not shown) is connected through gas feed pipes. The material gas cylinders are all purified in an ultra-high purity. As the material gas cylinders, an $H_2$ gas cylinder, an Ar gas cylinder and an He gas cylinder were connected thereto. ZnO—Ni (99.5:0.5), Ag and ZnO were used as targets. These are so provided that sputtering can be carried out in vacuum.

As the substrate (100 in FIG. 2), a stainless steel sheet of 0.5 mm thick and 50×50 mm² was used, which was subjected to ultrasonic cleaning with acetone and isopropanol, followed by hot-air drying. As the sputter power source, the DC power source 3325 was connected, and an intermediate layer 199 of ZnO—Ni (99.5:0.5) was formed on the substrate by DC magnetron sputtering. Then the subsequent processing was carried out.

The above production process will be described below following its procedure with reference to FIG. 6.

(1) A substrate 3390 (corresponding to 100 in FIG. 2) having been cleaned was placed on the substrate transporting rail 3313 provided in the load chamber 3301, and the inside of the load chamber 3301 was evacuated by means of a vacuum exhaust pump (not shown) to have a pressure of about $1 \times 10^{-5}$ Torr.

(2) The gate valve 3306 was opened to carry the substrate into the transport chamber 3302 and deposition chamber 3320 previously evacuated by means of a vacuum exhaust pump (not shown). The substrate 3390 was set in the manner the back thereof was brought into close contact with the substrate heater 3310, and was heated while raising temperature at a rate of 13° C./sec., to bring the substrate temperature to 210° C. Then, the inside of the deposition chamber 3320 was evacuated by means of a vacuum exhaust pump (not shown) to have a pressure of about $3 \times 10^{-6}$ Torr.

(3) 39 sccm of Ar gas was fed into it through the gas feed pipe 3324, and a conductance valve (not shown) was operated to control the pressure so as to be 3 mTorr. Electric current was flowed to the toroidal coil 3323, and 375 V of a DC power was applied from the sputter power source 3325 to cause Ar plasma.

(4) The target shutter 3326 was opened, and the intermediate layer 199 (FIG. 2) of ZnO—Ni (99.5:0.5) with a layer thickness of 0.008 μm was formed on the surface of the stainless steel sheet, whereupon the target shutter 3326 was closed to extinguish the plasma.

(5) The substrate heater 3310 was lifted, and the substrate temperature was lowered to 100° C. or below while dropping temperature at a rate of 3° C./sec. in an atmosphere of Ar gas used as substrate cooling gas. Thereafter, the gate valve 3307 was opened to carry the substrate into the transport chamber 3303 and deposition chamber 3330 previously evacuated by means of a vacuum exhaust pump (not shown). The substrate 3390 was set in the manner the back thereof was brought into close contact with the substrate heater 3311, and was heated while raising temperature at a rate of 17° C./sec., to bring the substrate temperature to 290° C. Then, the inside of the deposition chamber 3330 was evacuated by means of a vacuum exhaust pump (not shown) to have a pressure of about $2 \times 10^{-6}$ Torr.

(6) 41 sccm of Ar gas was fed into it through the gas feed pipe 3334, and a conductance valve (not shown) was operated to control the pressure so as to be 3 mTorr. Electric current was flowed to the toroidal coil 3333, and 380 V of a DC power was applied from the sputter power source 3335 to cause Ar plasma. Next, the target shutter 3336 was opened, and a light-reflecting layer 101 (FIG. 2) of Ag with a layer thickness of 0.7 μm was formed on the surface of the intermediate layer 199 of ZnO—Ni (99.5:0.5), whereupon the target shutter 3336 was closed to extinguish the plasma.

(7) The substrate heater 3311 was lifted, and the substrate temperature was lowered to 100° C. or below while dropping temperature at a rate of 3° C./sec. in an atmosphere of Ar gas used as substrate cooling gas. Thereafter, the gate valve 3308 was opened to carry the substrate into the transport chamber 3304 and deposition chamber 3340 previously evacuated by means of a vacuum exhaust pump (not shown). The substrate 3390 was set in the manner the back thereof was brought into close contact with the substrate heater 3312, and was heated while raising temperature at a rate of 14° C./sec., to bring the substrate temperature to 310° C. Then, the inside of the deposition chamber 3340 was evacuated by means of a vacuum exhaust pump (not shown) to have a pressure of about $3 \times 10^{-6}$ Torr.

(8) 42 sccm of Ar gas was fed into it through the gas feed pipe 3344, and a conductance valve (not shown) was operated to control the pressure so as to be 4 mTorr. Electric current was flowed to the toroidal coil 3343, and 380 V of a DC power was applied from the sputter power source 3345 to cause Ar plasma. Next, the target shutter 3346 was opened, and a reflection enhancing layer 102 of ZnO with a layer thickness of 1.1 μm was formed on the surface of the light-reflecting layer 101 of Ag, whereupon the target shutter 3346 was closed to extinguish the plasma.

(9) The substrate heater 3312 was lifted, and the substrate temperature was lowered to 100° C. or below while dropping temperature at a rate of 5° C./sec. in an atmosphere of Ar gas used as substrate cooling gas. Thereafter, the gate valve 3309 was opened to carry the substrate into the unload chamber 3305 previously evacuated by means of a vacuum exhaust pump (not shown).

Thus, the production of the photovoltaic device base member (190 in FIG. 2) of the present Example was completed. Samples of this photovoltaic device base member are called "SE3".

Reference Example E3-1

This example is different from Example E3 in that the intermediate layer 199 of ZnO—Ni (99.5:0.5) was not formed and, after the light-reflecting layer 101 of Ag was formed, the reflection enhancing layer 102 of ZnO was formed without the step of lowering the substrate temperature to 100° C. or below. Except for these points, the procedure of Example E3 was repeated to produce samples. The samples of the photovoltaic device base member of this example are called "SE3-1".

For every two kinds of the samples of the photovoltaic device base member, i.e., SE3 and SE3-1, five samples were prepared. In respect of these samples of the photovoltaic device base member, a bending peel test was carried out in the same manner as in Example E1 to examine their environmental resistance. Light reflectance was also measured and, from the measurements obtained, total reflectance and scattered reflectance were evaluated in the same manner as in Example E1. The results obtained are shown together in Table E3.

In the results of the bending peel test, shown in Table E3, letter symbol "A" indicates an instance where no peeling occurs at all, and "C" an instance where peeling only partly occurs. The results of total reflectance and scattered reflectance shown in Table E3 are indicated for each sample of the photovoltaic device base member by standardizing the results of the sample SE3-1 on the basis of the results of the sample SE3 which are regarded as 1.

TABLE E3

| Sample | Bending peel test | Total reflectance | Scattered reflectance |
|---|---|---|---|
| SE3 | A | 1.00 | 1.00 |
| SE3-1 | C | 0.79 | 0.78 |

As is seen from the results shown in Table E3, the photovoltaic device base member SE3 of Example E3 is superior to the photovoltaic device base member SE3-1 of Reference Examples E3-1 in the light-reflecting properties and the environmental resistance required as base members, at the same time. It is also seen that Ar gas is effective as the substrate cooling gas.

EXAMPLE E4

This example is different from Example E1 in that the photovoltaic device base member was produced by changing conditions on the following two items.

(a) The ZnO—Ag (99:1) target was replaced with a ZnO—Ag—Cr (99:0.5:0.5) target.
(b) The Ar gas used alone when the reflection enhancing layer 102 of ZnO was replaced with Ar gas and $O_2$ gas used in combination.

Like Example E1, the base member 190 that constitutes the photovoltaic device shown in FIG. 2 was produced using the apparatus of a multi-chamber separate system as shown in FIG. 6. More specifically, the intermediate layer 199, light-reflecting layer 101 and reflection enhancing layer 102 were formed on the substrate 100.

Their production process will be described below, following its procedure. To the apparatus shown in FIG. 6, the material gas feeding system (not shown) is connected through gas feed pipes. The material gas cylinders are all purified in an ultra-high purity. As the material gas cylinders, an $H_2$ gas cylinder, an Ar gas cylinder and an He gas cylinder were connected thereto. ZnO—Ag—Cr (99:0.5:0.5), Ag and ZnO were used as targets. These are so provided that sputtering can be carried out in vacuum.

As the substrate (100 in FIG. 2), a stainless steel sheet of 0.5 mm thick and 50×50 mm² was used, which was subjected to ultrasonic cleaning with acetone and isopropanol, followed by hot-air drying. As the sputter power source, the DC power source 3325 was connected, and an intermediate layer 199 of ZnO—Ag—Cr (99:0.5:0.5) was formed on the substrate by DC magnetron sputtering. Then the subsequent processing was carried out.

The above production process will be described below following its procedure with reference to FIG. 6.

(1) A substrate 3390 (corresponding to 100 in FIG. 2) having been cleaned was placed on the substrate transporting rail 3313 provided in the load chamber 3301, and the inside of the load chamber 3301 was evacuated by means of a vacuum exhaust pump (not shown) to have a vacuum pressure of about $1\times10^{-5}$ Torr.

(2) The gate valve 3306 was opened to carry the substrate into the transport chamber 3302 and deposition chamber 3320 previously evacuated by means of a vacuum exhaust pump (not shown). The substrate 3390 was set in the manner the back thereof was brought into close contact with the substrate heater 3310, and was heated while raising temperature at a rate of 15° C./sec., to bring the substrate temperature to 290° C. Then, the inside of the deposition chamber 3320 was evacuated by means of a vacuum exhaust pump (not shown) to have a pressure of about $3\times10^{-6}$ Torr.

(3) 42 sccm of Ar gas was fed into it through the gas feed pipe 3324, and a conductance valve (not shown) was operated to control the pressure so as to be 3 mTorr. Electric current was flowed to the toroidal coil 3323, and 385 V of a DC power was applied from the sputter power source 3325 to cause Ar plasma.

(4) The target shutter 3326 was opened, and the intermediate layer 199 (FIG. 2) of ZnO—Ag—Cr (99:0.5:0.5) with a layer thickness of 0.01 μm was formed on the surface of the stainless steel sheet, whereupon the target shutter 3326 was closed to extinguish the plasma.

(5) The substrate heater 3310 was lifted, and the substrate temperature was lowered to 100° C. or below while dropping temperature at a rate of 8° C./sec. in an atmosphere of He gas used as substrate cooling gas. Thereafter, the gate valve 3307 was opened to carry the substrate into the transport chamber 3303 and deposition chamber 3330 previously evacuated by means of a vacuum exhaust pump (not shown). The substrate 3390 was set in the manner the back thereof was brought into close contact with the substrate heater 3311, and was heated while raising temperature at a rate of 17° C./sec., to bring the substrate temperature to 290° C. Then, the inside of the deposition chamber 3330 was evacuated by means of a vacuum exhaust pump (not shown) to have a pressure of about $2 \times 10^{-6}$ Torr.

(6) 48 sccm of Ar gas was fed into it through the gas feed pipe 3334, and a conductance valve (not shown) was operated to control the pressure so as to be 4 mTorr. Electric current was flowed to the toroidal coil 3333, and 375 V of a DC power was applied from the sputter power source 3335 to cause Ar plasma. Next, the target shutter 3336 was opened, and a light-reflecting layer 101 (FIG. 2) of Ag with a layer thickness of 0.6 μm was formed on the surface of the intermediate layer 199 of ZnO—Ag—Cr (99:0.5:0.5), whereupon the target shutter 3336 was closed to extinguish the plasma.

(7) The substrate heater 3311 was lifted, and the substrate temperature was lowered to 100° C. or below while dropping temperature at a rate of 80° C./sec. in an atmosphere of He gas used as substrate cooling gas. Thereafter, the gate valve 3308 was opened to carry the substrate into the transport chamber 3304 and deposition chamber 3340 previously evacuated by means of a vacuum exhaust pump (not shown). The substrate 3390 was set in the manner the back thereof was brought into close contact with the substrate heater 3312, and was heated while raising temperature at a rate of 15° C./sec., to bring the substrate temperature to 310° C. Then, the inside of the deposition chamber 3340 was evacuated by means of a vacuum exhaust pump (not shown) to have a pressure of about $3 \times 10^{-6}$ Torr.

(8) 41 sccm of Ar gas and 41 sccm of $O_2$ gas were fed into it through the gas feed pipe 3344, and a conductance valve (not shown) was operated to control the pressure so as to be 2 mTorr. Electric current was flowed to the toroidal coil 3343, and 380 V of a DC power was applied from the sputter power source 3345 to cause $Ar/O_2$ plasma. Next, the target shutter 3346 was opened, and a reflection enhancing layer 102 (FIG. 2) of ZnO with a layer thickness of 1.5 μm was formed on the surface of the light-reflecting layer 101 of Ag, whereupon the target shutter 3346 was closed to extinguish the plasma.

(9) The substrate heater 3312 was lifted, and the substrate temperature was lowered to 100° C. or below while dropping temperature at a rate of 22° C./sec. in an atmosphere of He gas used as substrate cooling gas. Thereafter, the gate valve 3309 was opened to carry the substrate into the unload chamber 3305 previously evacuated by means of a vacuum exhaust pump (not shown).

Thus, the production of the photovoltaic device base member (190 in FIG. 2) of the present Example was completed. Samples of this photovoltaic device base member are called "SE4".

Reference Example E4-1

This example is different from Example E4 in that the intermediate layer 199 of ZnO—Ag—Cr (99:0.5:0.5) was not formed and, after the light-reflecting layer 101 of Ag was formed, the reflection enhancing layer 102 of ZnO was formed without the step of lowering the substrate temperature to 100° C. or below. Except for these points, the procedure of Example E4 was repeated to produce samples. The samples of the photovoltaic device base member of this example are called "SE4-1".

For every two kinds of the samples of the photovoltaic device base member, i.e., SE4 and SE4-1, five samples were prepared. In respect of these samples of the photovoltaic device base member, a bending peel test was carried out in the same manner as in Example E1 to examine their environmental resistance. Light reflectance was also measured and, from the measurements obtained, total reflectance and scattered reflectance were evaluated in the same manner as in Example E1. The results obtained are shown together in Table E4.

In the results of the bending peel test, shown in Table E4, letter symbol "A" indicates an instance where no peeling occurs at all, and "C" an instance where peeling only partly occurs. The results of total reflectance and scattered reflectance shown in Table E4 are indicated for each sample of the photovoltaic device base member by standardizing the results of the sample SE4-1 on the basis of the results of the sample SE4 which are regarded as 1.

TABLE E4

| Sample | Bending peel test | Total reflectance | Scattered reflectance |
|--------|-------------------|-------------------|----------------------|
| SE4    | A                 | 1.00              | 1.00                 |
| SE4-1  | C                 | 0.79              | 0.80                 |

As is seen from the results shown in Table E4, the photovoltaic device base member SE4 of Example E4 is superior to the photovoltaic device base member SE4-1 of Reference Examples E4-1 in the light-reflecting properties and the environmental resistance required as base members, at the same time.

EXAMPLE E5

In the present Example, the photovoltaic device as shown in FIG. 2 was produced using a photovoltaic device base member (sample) formed in the same manner as in Example E1, and using the apparatus employing a multi-chamber-separated system as shown in FIG. 9.

The apparatus 400 shown in FIG. 9 can carry out both MWPCVD and RFPCVD. Using this apparatus, semiconductor layers (103, 151, 104, 161, 105) and other layers were formed on the reflection enhancing layer 102 according to the layer configuration as shown in FIG. 2.

Their production process will be described below with reference to FIG. 9, following its procedure. To the apparatus shown in FIG. 9, a material gas feeding system (not shown) is connected through gas feed pipes. The material gas cylinders are all purified in an ultra-high purity. As the material gas cylinders, an $SiH_4$ gas cylinder, a $CH_4$ gas cylinder, a $GeH_4$ gas cylinder, an $Si_2H_6$ gas cylinder, a $PH_3/H_2$ (dilution: 0.1%) gas cylinder, a $B_2H_6/H_2$ (dilution: 0.2%) gas cylinder, an $H_2$ gas cylinder, an He gas cylinder, an $SiCl_2H_2$ gas cylinder and an $SiH_4/H_2$ (dilution: 1%) gas cylinder were connected thereto.

(1) A base member 490 (corresponding to 190 in FIG. 2) comprising the substrate and the intermediate layer 199, light-reflecting layer 101 and reflection enhancing layer 102 formed thereon was placed on the base member transporting rail 413 provided in the load chamber 401, and the inside of the load chamber 401 was evacuated by means of a vacuum exhaust pump (not shown) to have a pressure of about $1 \times 10^{-5}$ Torr.

(2) The gate valve 406 was opened to carry the base member into the transport chamber 402 and deposition chamber 417 previously evacuated by means of a vacuum exhaust pump (not shown). The base member 490 was heated in the manner the back thereof was brought into close contact with the base member heater 410. Then, the inside of the deposition chamber 417 was evacuated by means of a vacuum exhaust pump (not shown) to have a pressure of about $1 \times 10^{-5}$ Torr.

(3) After preparation for film formation was completed in this way, $H_2$ gas was fed into the deposition chamber 417 through the gas feed pipe 429. Then, the valves 441, 431 and 430 were opened, and $H_2$ gas flow rate was controlled by means of the mass flow controller 436 so as to be 300 sccm. The pressure inside the deposition chamber 417 was controlled by means of a conductance valve (not shown) so as to be 1.3 Torr. The base member heater 410 was set so as to bring the base member temperature to 350° C.

(4) At the time the base member temperature became stable, an RF n-type layer 103 comprised of $\mu$c-Si was formed.

To form the RF n-type layer 103 comprised of $\mu$c-Si, the valves 443, 433, 444 and 434 were operated to feed $SiH_4$ gas and $PH_3/H_2$ gas into the deposition chamber 417 through the gas feed pipe 429. Here, $SiH_4$ gas flow rate, $H_2$ gas flow rate and $PH_3/H_2$ gas flow rate were controlled by means of the mass flow controllers 438, 436 and 439 so as to be 2 sccm, 140 sccm and 200 sccm, respectively, and the pressure inside the deposition chamber 417 was controlled so as to be 1.3 Torr.

Next, the power of the RF power source 422 was set to 0.05 W/cm², and RF power was fed to the plasma forming cup 420 to cause glow discharge to take place. Thus, the formation of the RF n-type layer on the base member was started, and an RF n-type layer with a layer thickness of 16 nm was formed, whereupon the RF power source was turned off to stop the glow discharge to complete the formation of the RF n-type layer 103. The $SiH_4$ gas, $PH_3/H_2$ gas and $H_2$ gas were stopped from flowing into the deposition chamber 417, and then the inside of the deposition chamber and the inside of the gas pipe were evacuated to have a pressure of $1 \times 10^{-5}$ Torr.

Subsequently, an RF i-type layer 151 comprised of a-Si, an MW i-type layer 104 comprised of a-SiGe, an RF i-type layer 161 comprised of a-Si and an RF p-type layer 105 comprised of a-SiC were successively formed in the following way.

(5) First, the gate valve 407 was opened to carry the base member into the transport chamber 403 and i-type layer deposition chamber 418 previously evacuated by means of a vacuum exhaust pump (not shown). The base member was heated in the manner the back thereof was brought into close contact with the base member heater 411. Then, the inside of the i-type layer deposition chamber 418 was evacuated by means of a vacuum exhaust pump (not shown) to have a pressure of about $1 \times 10^{-5}$ Torr.

(6) To form the RF i-type layer, the base member heater 411 was set so as to bring the base member temperature to 275° C. At the time the base member was well heated, the valves 464, 454, 450, 463 and 453 were slowly opened to flow $Si_2H_6$ gas and $H_2$ gas into the i-type layer deposition chamber 418 through the gas feed pipe 449. Here, $Si_2H_6$ gas flow rate and $H_2$ gas flow rate were controlled by means of the corresponding mass flow controllers 459 and 458 so as to be 4 sccm and 120 sccm, respectively. The pressure inside the i-type layer deposition chamber 418 was controlled so as to be 0.5 Torr by adjusting the opening of the conductance valve (not shown).

Next, the power of the RF power source 424 was set to 0.008 W/cm² and was applied to the bias rod 428 to cause glow discharge to take place, and the shutter 427 was opened. Thus, the formation of the i-type layer on the RF n-type layer was started, and an i-type layer with a layer thickness of 10 nm was formed, whereupon the RF glow discharge was stopped and the output from the RF power source was stopped to complete the formation of the RF i-type layer 151.

The valves 464, 454, 453 and 450 were closed to stop the $Si_2H_6$ gas and $H_2$ gas from flowing into the i-type layer deposition chamber 418, and then the inside of the i-type layer deposition chamber 418 and the inside of the gas pipe were evacuated to have a pressure of $1 \times 10^{-5}$ Torr.

(7) To form the MW i-type layer, the base member heater 411 was set so as to bring the base member temperature to 380° C. At the time the base member was well heated, the valves 461, 451, 450, 462, 452, 463 and 453 were slowly opened to flow $SiH_4$ gas, $GeH_4$ gas and $H_2$ gas into the i-type layer deposition chamber 418 through the gas feed pipe 449. Here, $SiH_4$ gas flow rate, $GeH_4$ gas flow rate and $H_2$ gas flow rate were controlled by means of the corresponding mass flow controllers 456, 457 and 458 so as to be 45 scam, 40 sccm and 180 sccm, respectively. The pressure inside the i-type layer deposition chamber 418 was controlled so as to be 4 mTorr by adjusting the opening of the conductance valve (not shown).

Next, the power of the RF power source 424 was set to 0.30 W/cm², and was applied to the bias rod 428. Thereafter, the power of a microwave power source (2.45 GHz) (not shown) was set to 0.08 W/cm², and the microwave power was fed into the i-type layer deposition chamber 418 through the waveguide 426 and microwave introducing window 425 to cause glow discharge to take place, and the shutter 427 was opened. Thus, the formation of the MW i-type layer on the RF i-type layer was started, and an i-type layer with a layer thickness of 0.17 $\mu$m was formed, whereupon the microwave glow discharge was stopped and the output from the bias power source 424 was stopped to complete the formation of the MW i-type layer 104.

The valves 451, 452 and 453 were closed to stop the $SiH_4$ gas, $GeH_4$ gas and $H_2$ gas from flowing into the i-type layer deposition chamber 418, and then the inside of the i-type layer deposition chamber 418 and the inside of the gas pipe were evacuated to have a pressure of $1 \times 10^{-5}$ Torr.

(8) To form the RF i-type layer, the base member heater 411 was set so as to bring the base member temperature to 240° C. At the time the base member was well heated, the valves 464, 454, 450, 463 and 453 were slowly opened to flow $Si_2H_6$ gas and $H_2$ gas into the i-type layer deposition chamber 418 through the gas feed pipe 449. Here, $Si_2H_6$ gas flow rate and $H_2$ gas flow rate were controlled by means of the corresponding mass flow controllers 459 and 458 so as to be 3 sccm and 100 sccm, respectively. The pressure inside the i-type layer deposition chamber 418 was controlled so as to be 0.6 Torr by adjusting the opening of the conductance valve (not shown).

Next, the power of the RF power source 424 was set to 0.007 W/cm² and was applied to the bias rod 428 to cause glow discharge to take place, and the shutter 427 was opened. Thus, the formation of the RF i-type layer on the MW i-type layer was started, and an i-type layer with a layer thickness of 20 nm was formed, whereupon the RF glow discharge was stopped and the output from the RF power source 424 was stopped to complete the formation of the RF i-type layer 161. The valves 464, 454, 453 and 450 were closed to stop the $Si_2H_6$ gas and $H_2$ gas from flowing into the i-type layer deposition chamber 418, and then the inside of the i-type layer deposition chamber 418 and the inside of the gas pipe were evacuated to have a pressure of $1 \times 10^{-5}$ Torr.

(9) To form the RF p-type layer 105 comprised of a-SiC, first, the gate valve 408 was opened to carry the base member into the transport chamber 404 and p-type layer deposition chamber 419 previously evacuated by means of a vacuum exhaust pump (not shown). The base member was heated in the manner the back thereof was brought into close contact with the base member heater 412. Then, the inside of the p-type layer deposition chamber 419 was evacuated by means of the vacuum exhaust pump (not shown) to have a pressure of about $1\times10^{-5}$ Torr.

The base member heater 412 was set so as to bring the base member temperature to 230° C. At the time the base member temperature became stable, the valves 481, 471, 470, 482, 472, 483, 473, 484 and 474 were operated to feed $H_2$ gas, $SiH_4/H_2$ gas, $B_2H^6/H_2$ gas and $CH_4$ gas into the deposition chamber 419 through the gas feed pipe 469. Here, $H_2$ gas flow rate, $SiH_4/H_2$ gas flow rate, $B_2H_6/H_2$ gas flow rate and $CH_4$ gas flow rate were controlled by means of the mass flow controllers 476, 477, 478 and 479 so as to be 80 sccm, 3 sccm, 15 sccm and 0.3 sccm, respectively, and the pressure inside the deposition chamber 419 was controlled so as to be 1.8 Torr by adjusting the opening of the conductance valve (not shown).

Next, the power of the RF power source 423 was set to 0.07 W/cm$^2$, and RF power was fed to the plasma forming cup 421 to cause glow discharge to take place. Thus, the formation of the RF p-type layer on the i-type layer was started, and an RF p-type layer with a layer thickness of 10 nm was formed, whereupon the RF power source was turned off to stop the glow discharge to complete the formation of the RF p-type layer 105.

The valves 472, 482, 473, 483, 474, 484, 471, 481 and 470 were closed to stop the $SiH_4/H_2$ gas, $B_2H_6/H_2$ gas, $CH_4$ gas and $H_2$ gas from flowing into the p-type layer deposition chamber 419, and then the inside of the p-type layer deposition chamber 419 and the inside of the gas pipe were evacuated to have a pressure of $1\times10^{-5}$ Torr.

(10) The gate valve 409 was opened to carry the base member into the unload chamber 405 previously evacuated by means of a vacuum exhaust pump (not shown), and a leak valve (not shown) was opened to let gases escape from the unload chamber 405.

(11) On the RF p-type layer 105, ITO was deposited by vacuum deposition in a layer thickness of 70 nm as the transparent conductive layer 112.

(12) On the transparent conductive layer 112, a mask with a comb-shaped opening was placed, and the comb-shaped collector electrode 113 with a flat structure, comprised of Cr(40 nm)/Ag(1,000 nm)/Cr(40 nm) was deposited by vacuum deposition.

Thus, the fabrication of the photovoltaic device of the present Example was completed. This photovoltaic device is herein called SCE5.

Reference Example E5-1

This example is different from Example E5 in that the intermediate layer 199 of ZnO—Ag (99:1) was not formed on the substrate and, after the light-reflecting layer 101 of Ag was formed, the reflection enhancing layer 102 of ZnO was formed without the step of lowering the substrate temperature to 100° C. or below. Except for these points, the procedure of Example E5 was repeated to produce photovoltaic devices. Samples of the photovoltaic device of this example are called "SCE5-1".

For every two kinds of the samples of the photovoltaic device, i.e., SCE5 and SCE5-1, seven samples were prepared. In respect of these samples of the photovoltaic device, a bending peel test was carried out in the manner as described below, to examine their environmental resistance. Characteristics of initial photoelectric conversion efficiency (photoelectromotive force/incident light intensity), stated specifically, photoelectric conversion efficiency, short-circuit current and open-end voltage were evaluated in the same manner as in Example A1. The results obtained are shown together in Table E5.

The bending peel test was carried out in the following way: The respective photovoltaic devices were left to stand for 250 hours in an environment of a high-temperature and high-humidity atmosphere (temperature: 82° C.; humidity: 83% RH), and thereafter put to a bending test repeated thirty times. In addition, to the part thus bended, a weight of 10 kg was dropped twelve times at a height of 50 cm, and any peeling in the device was observed using a scanning electron microscope (SEM), manufactured by Hitachi Ltd. (model: S-4500; magnifications: 50,000×).

In the results of the bending peel test, shown in Table E5, letter symbol "A" indicates an instance where no peeling occurs at all, and "C" an instance where peeling partly occurs. The results of evaluation on the characteristics of initial photoelectric conversion efficiency shown in Table E5 are indicated by standardizing the results of the photovoltaic device SCE5-1 on the basis of the results of the photovoltaic device SCE5 which are regarded as 1.

TABLE E5

| Sample | Bending peel test | Total reflectance | Scattered reflectance | Open-and voltage |
|---|---|---|---|---|
| SE5 | A | 1.00 | 1.00 | 1.00 |
| SE5-1 | C | 0.87 | 0.91 | 0.96 |

As is seen from the results shown in Table E5, the photovoltaic device SCE5 obtained in Example E5 by the process of the present invention is superior to the photovoltaic devices SCE5-1 of Reference Example E5-1 in all the environmental resistance and characteristics of initial photoelectric conversion efficiency at the same time.

EXAMPLE E6

In the present Example, the photovoltaic device as shown in FIG. 2 was produced using a photovoltaic device base member (sample) formed in the same manner as in Example E4, and using the apparatus employing a multi-chamber-separated system as shown in FIG. 9.

The apparatus 400 shown in FIG. 9 can carry out both MWPCVD and RFPCVD. Using this apparatus, semiconductor layers (103, 151, 104, 161, 105) and other layers were formed on the reflection enhancing layer 102 according to the layer configuration as shown in FIG. 2.

Their production process will be described below with reference to FIG. 9, following its procedure. To the apparatus shown in FIG. 9, a material gas feeding system (not shown) is connected through gas feed pipes. The material gas cylinders are all purified in an ultra-high purity. As the material gas cylinders, an $SiH_4$ gas cylinder, a $CH_4$ gas cylinder, a $GeH_4$ gas cylinder, an $Si_2H_6$ gas cylinder, a $PH_3/H_2$ (dilution: 0.1%) gas cylinder, a $B_2H_6/H_2$ (dilution: 0.2%) gas cylinder, an $H_2$ gas cylinder, an He gas cylinder, an $SiCl_2H_2$ gas cylinder and an $SiH_4/H_2$ (dilution: 1%) gas cylinder were connected thereto.

(1) The base member 490 (corresponding to 190 in FIG. 2) comprising the substrate and the intermediate layer 199, light-reflecting layer 101 and reflection enhancing layer 102 formed thereon, obtained in Example E4 was placed on the base member transporting rail 413 provided in the load chamber 401, and the inside of the load chamber 401 was evacuated by means of a vacuum exhaust pump (not shown) to have a pressure of about $1\times10^{-5}$ Torr.

(2) The gate valve 406 was opened to carry the base member into the transport chamber 402 and deposition chamber 417 previously evacuated by means of a vacuum exhaust pump (not shown). The base member 490 was heated in the manner the back thereof was brought into close contact with the base member heater 410. Then, the inside of the deposition chamber 417 was evacuated by means of a vacuum exhaust pump (not shown) to have a pressure of about $1\times10^{-5}$ Torr.

(3) After preparation for film formation was completed in this way, $H_2$ gas was fed into the deposition chamber 417 through the gas feed pipe 429. Then, the valves 441, 431 and 430 were opened, and $H_2$ gas flow rate was controlled by means of the mass flow controller 436 so as to be 300 sccm. The pressure inside the deposition chamber 417 was controlled by means of a conductance valve (not shown) so as to be 1.3 Torr. The base member heater 410 was set so as to bring the base member temperature to 350° C.

(4) At the time the base member temperature became stable, an RF n-type layer 103 comprised of $\mu$c-Si was formed.

To form the RF n-type layer 103 comprised of $\mu$c-Si, the valves 443, 433, 444 and 434 were operated to feed $SiH_4$ gas and $PH_3/H_2$ gas into the deposition chamber 417 through the gas feed pipe 429. Here, $SiH_4$ gas flow rate, $H_2$ gas flow rate and $PH_3/H_2$ gas flow rate were controlled by means of the mass flow controllers 438, 436 and 439 so as to be 3 sccm, 100 sccm and 190 sccm, respectively, and the pressure inside the deposition chamber 417 was controlled so as to be 1.2 Torr.

Next, the power of the RF power source 422 was set to 0.06 W/cm$^2$, and RF power was fed to the plasma forming cup 420 to cause glow discharge to take place. Thus, the formation of the RF n-type layer on the base member was started, and an RF n-type layer with a layer thickness of 20 nm was formed, whereupon the RF power source was turned off to stop the glow discharge to complete the formation of the RF n-type layer 103. The $SiH_4$ gas, $PH_3/H_2$ gas and $H_2$ gas were stopped from flowing into the deposition chamber 417, and then the inside of the deposition chamber and the inside of the gas pipe were evacuated to have a pressure of $1\times10^{-5}$ Torr.

Subsequently, an RF i-type layer 151 comprised of a-Si, an MW i-type layer 104 comprised of a-SiGe, an RF i-type layer 161 comprised of a-Si and an RF p-type layer 105 comprised of a-SiC were successively formed in the following way (see the layer configuration shown in FIG. 2).

(5) First, the gate valve 407 was opened to carry the base member into the transport chamber 403 and i-type layer deposition chamber 418 previously evacuated by means of a vacuum exhaust pump (not shown). The base member was heated in the manner the back thereof was brought into close contact with the base member heater 411. Then, the inside of the i-type layer deposition chamber 418 was evacuated by means of a vacuum exhaust pump (not shown) to have a pressure of about $1\times10^{-5}$ Torr.

(6) To form the RF i-type layer, the base member heater 411 was set so as to bring the base member temperature to 280° C. At the time the base member was well heated, the valves 464, 454, 450, 463 and 453 were slowly opened to flow $Si_2H_6$ gas and $H_2$ gas into the i-type layer deposition chamber 418 through the gas feed pipe 449. Here, $Si_2H_6$ gas flow rate and $H_2$ gas flow rate were controlled by means of the corresponding mass flow controllers 459 and 458 so as to be 4 sccm and 120 sccm, respectively. The pressure inside the i-type layer deposition chamber 418 was controlled so as to be 0.5 Torr by adjusting the opening of the conductance valve (not shown).

Next, the power of the RF power source 424 was set to 0.007 W/cm$^2$ and was applied to the bias rod 428 to cause glow discharge to take place, and the shutter 427 was opened. Thus, the formation of the i-type layer on the RF n-type layer on the i-type layer was started, and an i-type layer with a layer thickness of 10 nm was formed, whereupon the RF glow discharge was stopped and the output from the RF power source was stopped to complete the formation of the RF i-type layer 151.

The valves 464, 454, 453 and 450 were closed to stop the $Si_2H_6$ gas and $H_2$ gas from flowing into the i-type layer deposition chamber 418, and then the inside of the i-type layer deposition chamber 418 and the inside of the gas pipe were evacuated to have a pressure of $1\times10^{-5}$ Torr.

(7) To form the MW i-type layer, the base member heater 411 was set so as to bring the base member temperature to 380° C. At the time the base member was well heated, the valves 461, 451, 450, 462, 452, 463 and 453 were slowly opened to flow $SiH_4$ gas, $GeH_4$ gas and $H_2$ gas into the i-type layer deposition chamber 418 through the gas feed pipe 449. Here, $SiH_4$ gas flow rate, $GeH_4$ gas flow rate and $H_2$ gas flow rate were controlled by means of the corresponding mass flow controllers 456, 457 and 458 so as to be 47 sccm, 45 sccm and 190 sccm, respectively. The pressure inside the i-type layer deposition chamber 418 was controlled so as to be 5 mTorr by adjusting the opening of the conductance valve (not shown).

Next, the power of the RF power source 424 was set to 0.30 W/cm$^2$, and was applied to the bias rod 428. Thereafter, the power of a microwave power source (2.45 GHz) (not shown) was set to 0.08 W/cm$^2$, and the microwave power was fed into the i-type layer deposition chamber 418 through the waveguide 426 and microwave introducing window 425 to cause glow discharge to take place, and the shutter 427 was opened. Thus, the formation of the MW i-type layer on the RF i-type layer was started, and an i-type layer with a layer thickness of 0.17 $\mu$m was formed, whereupon the microwave glow discharge was stopped and the output from the bias power source 424 was stopped to complete the formation of the MW i-type layer 104. The valves 451, 452 and 453 were closed to stop the $SiH_4$ gas, $GeH_4$ gas and $H_2$ gas from flowing into the i-type layer deposition chamber 418, and then the inside of the i-type layer deposition chamber 418 and the inside of the gas pipe were evacuated to have a pressure of $1\times10^{-5}$ Torr.

(8) To form the RF i-type layer, the base member heater 411 was set so as to bring the base member temperature to 240° C. At the time the base member was well heated, the valves 464, 454, 450, 463 and 453 were slowly opened to flow $Si_2H_6$ gas and $H_2$ gas into the i-type layer deposition chamber 418 through the gas feed pipe 449. Here, $Si_2H_6$ gas flow rate and $H_2$ gas flow rate were controlled by means of the corresponding mass flow controllers 459 and 458 so as to be 3.5 sccm and 90 sccm, respectively. The pressure inside the i-type layer deposition chamber 418 was controlled so as to be 0.5 Torr by adjusting the opening of the conductance valve (not shown).

Next, the power of the RF power source 424 was set to 0.007 W/cm$^2$ and was applied to the bias rod 428 to cause glow discharge to take place, and the shutter 427 was opened. Thus, the formation of the RF i-type layer on the MW i-type layer was started, and an i-type layer with a layer thickness of 20 nm was formed, whereupon the RF glow discharge was stopped and the output from the RF power source 424 was stopped to complete the formation of the RF i-type layer 161. The valves 464, 454, 453 and 450 were closed to stop the $Si_2H_6$ gas and $H_2$ gas from flowing into the i-type layer deposition chamber 418, and then the inside of the i-type layer deposition chamber 418 and the inside of the gas pipe were evacuated to have a pressure of $1\times10^{-5}$ Torr.

(9) To form the RF p-type layer 105 comprised of a-SiC, first, the gate valve 408 was opened to carry the base member into the transport chamber 404 and p-type layer deposition chamber 419 previously evacuated by means of a vacuum exhaust pump (not shown). The base member was heated in the manner the back thereof was brought into close contact with the base member heater 412. Then, the inside of the p-type layer deposition chamber 419 was evacuated by means of the vacuum exhaust pump (not shown) to have a pressure of about $1\times10^{-5}$ Torr.

The base member heater 412 was set so as to bring the base member temperature to 230° C. At the time the base member temperature became stable, the valves 481, 471, 470, 482, 472, 483, 473, 484 and 474 were operated to feed $H_2$ gas, $SiH_4/H_2$ gas, $B_2H_6/H_2$ gas and $CH_4$ gas into the deposition chamber 419 through the gas feed pipe 469. Here, $H_2$ gas flow rate, $SiH_4/H_2$ gas flow rate, $B_2H_6/H_2$ gas flow rate and $CH_4$ gas flow rate were controlled by means of the mass flow controllers 476, 477, 478 and 479 so as to be 70 sccm, 2 sccm, 16 sccm and 0.2 sccm, respectively, and the pressure inside the deposition chamber 419 was controlled so as to be 1.8 Torr by adjusting the opening of the conductance valve (not shown).

Next, the power of the RF power source 423 was set to 0.07 W/cm$^2$, and RF power was fed to the plasma forming cup 421 to cause glow discharge to take place. Thus, the formation of the RF p-type layer on the i-type layer was started, and an RF p-type layer with a layer thickness of 10 nm was formed, whereupon the RF power source was turned off to stop the glow discharge to complete the formation of the RF p-type layer 105.

The valves 472, 482, 473, 483, 474, 484, 471, 481 and 470 were closed to stop the $SiH_4/H_2$ gas, $B_2H_6/H_2$ gas, $CH_4$ gas and $H_2$ gas from flowing into the p-type layer deposition chamber 419, and then the inside of the p-type layer deposition chamber 419 and the inside of the gas pipe were evacuated to have a pressure of $1\times10^{-5}$ Torr.

(10) The gate valve 409 was opened to carry the base member into the unload chamber 405 previously evacuated by means of a vacuum exhaust pump (not shown), and a leak valve (not shown) was opened to let gases escape from the unload chamber 405.

(11) On the RF p-type layer 105, ITO was deposited by vacuum deposition in a layer thickness of 70 nm as the transparent conductive layer 112.

(12) On the transparent conductive layer 112, a mask with a comb-shaped opening was placed, and the comb-shaped collector electrode 113 with a flat structure, comprised of Cr(40 nm)/Ag(1,000 nm)/Cr(40 nm) was deposited by vacuum deposition.

Thus, the fabrication of the photovoltaic device of the present Example was completed. This photovoltaic device is herein called SCE6.

Reference Example E6-1

This example is different from Example E6 in that the base member sample of Reference Example E4-1 was used in which the intermediate layer 199 of ZnO—Ag—Cr (99:0.5:0.5) was not formed and, after the light-reflecting layer 101 of Ag was formed, the reflection enhancing layer 102 of ZnO was formed without the step of lowering the substrate temperature to 100° C. or below. Except these points, the procedure of Example E6 was repeated to produce photovoltaic devices. Samples of the photovoltaic device of this example are called "SCE6-1".

For every two kinds of the samples of the photovoltaic device, i.e., SCE6 and SCE6-1, six samples were prepared. In respect of these samples of the photovoltaic device, a bending peel test was carried out in the manner as described below, to examine their environmental resistance. Characteristics of initial photoelectric conversion efficiency (photoelectromotive force/incident light intensity), stated specifically, photoelectric conversion efficiency, short-circuit current and open-end voltage were evaluated in the same manner as in Example A1. The results obtained are shown together in Table E6.

The bending peel test was carried out in the following way: The respective photovoltaic devices were left to stand for 250 hours in an environment of a high-temperature and high-humidity atmosphere (temperature: 84° C.; humidity: 85% RH), and thereafter put to a bending test repeated thirty times. In addition, to the part thus bended, a weight of 10 kg was dropped fifteen times at a height of 50 cm, and any peeling in the device was observed using a scanning electron microscope (SEM), manufactured by Hitachi Ltd. (model: S-4500; magnifications: 50,000×).

In the results of the bending peel test, shown in Table E6, letter symbol "A" indicates an instance where no peeling occurs at all, and "C" an instance where peeling partly occurs. The results of evaluation on the characteristics of initial photoelectric conversion efficiency shown in Table E6 are indicated by standardizing the results of the photovoltaic device SCE6-1 on the basis of the results of the photovoltaic device SCE6 which are regarded as 1.

TABLE E6

| Sample | Bending peel test | Total reflectance | Scattered reflectance | Open-end voltage |
| --- | --- | --- | --- | --- |
| SCE6 | A | 1.00 | 1.00 | 1.00 |
| SCE6-1 | C | 0.83 | 0.90 | 0.91 |

As is seen from the results shown in Table E6, the photovoltaic device SCE6 obtained in Example E6 by the process of the present invention is superior to the photovoltaic devices SCE6-1 of Reference Example E6-1 in all the environmental resistance and characteristics of initial photoelectric conversion efficiency at the same time.

EXAMPLE E7

In the present Example, the base member 290 constituting the photovoltaic device as shown in FIG. 4 (i.e., the base member comprising the substrate 200 and the layers of intermediate layer 299, light-reflecting layer 201 and reflection enhancing layer 202 formed on the substrate) was produced using the apparatus of a multi-chamber-separated system as shown in FIG. 6. Next, using this photovoltaic device base member 290, the photovoltaic device as shown in FIG. 4 was produced using the apparatus of a multi-chamber-separated system as shown in FIG. 9.

The process of forming the photovoltaic device base member will be described below with reference to FIG. 6.

To the apparatus shown in FIG. 6, a material gas feeding system (not shown) is connected through gas feed pipes. The material gas cylinders are all purified in an ultra-high purity. As the material gas cylinders, an $H_2$ gas cylinder, an Ar gas cylinder and an He gas cylinder were connected thereto. ZnO—Ag—Cr—Cu (99.1:0.3:0.3:0.3), Ag and ZnO were used as targets. These are so provided that sputtering can be carried out in vacuum.

As the substrate (200 in FIG. 4), a stainless steel sheet of 0.5 mm thick and 50×50 mm² was used, which was subjected to ultrasonic cleaning with acetone and isopropanol, followed by hot-air drying. As the sputter power source, the DC power source 325 was connected, and an intermediate layer 299 of ZnO—Ag—Cr—Cu (99.1:0.3:0.3:0.3) was formed on the substrate by DC magnetron sputtering. Then the subsequent processing was carried out.

The process of forming the photovoltaic device base member will be described below with reference to FIG. 6.

(1) A substrate 3390 (corresponding to 200 in FIG. 4) having been cleaned was placed on the substrate transporting rail 3313 provided in the load chamber 3301, and the inside of the load chamber 3301 was evacuated by means of a vacuum exhaust pump (not shown) to have a pressure of about $1 \times 10^{-5}$ Torr.

(2) The gate valve 3306 was opened to carry the substrate into the transport chamber 3302 and deposition chamber 3320 previously evacuated by means of a vacuum exhaust pump (not shown). The substrate 3390 was set in the manner the back thereof was brought into close contact with the substrate heater 3310, and was heated while raising temperature at a rate of 29° C./sec., to bring the substrate temperature to 250° C. Then, the inside of the deposition chamber 3320 was evacuated by means of a vacuum exhaust pump (not shown) to have a pressure of about $3 \times 10^{-6}$ Torr.

(3) 44 sccm of Ar gas was fed into it through the gas feed pipe 3324, and a conductance valve (not shown) was operated to control the pressure so as to be 4 mTorr. Electric current was flowed to the toroidal coil 3323, and 380 V of a DC power was applied from the sputter power source 3325 to cause Ar plasma.

(4) The target shutter 3326 was opened, and the intermediate layer 299 (FIG. 4) of ZnO—Ag—Cr—Cu (99.1:0.3:0.3:0.3) with a layer thickness of 0.012 μm was formed on the surface of the stainless steel sheet, whereupon the target shutter 3326 was closed to extinguish the plasma.

(5) The substrate heater 3310 was lifted, and the substrate temperature was lowered to 100° C. or below while dropping temperature at a rate of 20° C./sec. in an atmosphere of He gas used as substrate cooling gas. Thereafter, the gate valve 3307 was opened to carry the substrate into the transport chamber 3303 and deposition chamber 3330 previously evacuated by means of a vacuum exhaust pump (not shown). The substrate 3390 was set in the manner the back thereof was brought into close contact with the substrate heater 3311, and was heated while raising temperature at a rate of 15° C./sec., to bring the substrate temperature to 290° C. Then, the inside of the deposition chamber 3330 was evacuated by means of a vacuum exhaust pump (not shown) to have a pressure of about $2 \times 10^{-6}$ Torr.

(6) 37 sccm of Ar gas was fed into it through the gas feed pipe 3334, and a conductance valve (not shown) was operated to control the pressure so as to be 4 mTorr. Electric current was flowed to the toroidal coil 3333, and 380 V of a DC power was applied from the sputter power source 3335 to cause Ar plasma. Next, the target shutter 3336 was opened, and a light-reflecting layer 201 (FIG. 4) of Ag with a layer thickness of 0.7 μm was formed on the surface of the intermediate layer 299 of ZnO—Ag—Cr—Cu (99.1:0.3:0.3:0.3), whereupon the target shutter 3336 was closed to extinguish the plasma.

(7) The substrate heater 3311 was lifted, and the substrate temperature was lowered to 100° C. or below while dropping temperature at a rate of 15° C./sec. in an atmosphere of He gas used as substrate cooling gas. Thereafter, the gate valve 3308 was opened to carry the substrate into the transport chamber 3304 and deposition chamber 3340 previously evacuated by means of a vacuum exhaust pump (not shown). The substrate 3390 was set in the manner the back thereof was brought into close contact with the substrate heater 3312, and was heated while raising temperature at a rate of 15° C./sec., to bring the substrate temperature to 315° C. Then, the inside of the deposition chamber 3340 was evacuated by means of a vacuum exhaust pump (not shown) to have a pressure of about $3 \times 10^{-6}$ Torr.

(8) 40 sccm of Ar gas was fed into it through the gas feed pipe 3344, and a conductance valve (not shown) was operated to control the pressure so as to be 4 mTorr. Electric current was flowed to the toroidal coil 3343, and 380 V of a DC power was applied from the sputter power source 3345 to cause Ar plasma. Next, the target shutter 3346 was opened, and a reflection enhancing layer 202 (FIG. 4) of ZnO with a layer thickness of 1.5 μm was formed on the surface of the light-reflecting layer 101 of Ag, whereupon the target shutter 3346 was closed to extinguish the plasma.

(9) The substrate heater 3312 was lifted, and the substrate temperature was lowered to 100° C. or below while dropping temperature at a rate of 16° C./sec. in an atmosphere of He gas used as substrate cooling gas. Thereafter, the gate valve 3309 was opened to carry the substrate into the unload chamber 3305 previously evacuated by means of a vacuum exhaust pump (not shown).

Thus, the production of the photovoltaic device base member (290 in FIG. 4) of the present Example was completed. Samples of this photovoltaic device base member are called "SE7".

Subsequently, using the photovoltaic device base member formed through the steps (1) to (9) in Example E7, the triple type photovoltaic device as shown in FIG. 4 was produced using the apparatus employing a multi-chamber-separated system as shown in FIG. 9.

In the following, the process for producing the photovoltaic device will be described.

(10) The base member (490 in FIG. 9) comprising the substrate and the intermediate layer 299, light-reflecting layer 201 and reflection enhancing layer 202 formed thereon was placed on the base member transporting rail 413 provided in the load chamber 401, and the inside of the load chamber 401 was evacuated by means of a vacuum exhaust pump (not shown) to have a pressure of about $1 \times 10^{-5}$ Torr.

(11) The gate valve 406 was opened to carry the base member into the transport chamber 402 and deposition chamber 417 previously evacuated by means of a vacuum exhaust pump (not shown). The base member 490 was heated in the manner the back thereof was brought into close contact with the base member heater 410. Then, the inside of the deposition chamber 418 was evacuated by means of a vacuum exhaust pump (not shown) to have a pressure of about $1 \times 10^{-5}$ Torr.

(12) After preparation for film formation was completed in this way, $H_2$ gas was fed into the deposition chamber 417 through the gas feed pipe 429. Then, the valves 441, 431 and 430 were opened, and $H_2$ gas flow rate was controlled by means of the mass flow controller 436 so as to be 500 sccm. The pressure inside the deposition chamber 417 was controlled by means of a conductance valve (not shown) so as to be 1.3 Torr. The base member heater 410 was set so as to bring the base member temperature to 350° C.

(13) At the time the base member temperature became stable, an RF n-type layer 203 comprised of μc-Si was formed.

To form the RF n-type layer 203 comprised of μc-Si, the valves 443, 433, 444 and 434 were operated to feed $SiH_4$ gas and $PH_3/H_2$ gas into the deposition chamber 417 through the gas feed pipe 429. Here, $SiH_4$ gas flow rate, $H_2$ gas flow rate and $PH_3/H_2$ gas flow rate were controlled by means of the mass flow controllers 438, 436 and 439 so as to be 2 sccm, 100 sccm and 200 sccm, respectively, and the pressure inside the deposition chamber 417 was controlled so as to be 1.3 Torr.

Next, the power of the RF power source 422 was set to 0.05 W/cm², and RF power was fed to the plasma forming cup 420 to cause glow discharge to take place. Thus, the formation of the RF n-type layer on the base member was started, and an RF n-type layer with a layer thickness of 20 nm was formed, whereupon the RF power source was turned off to stop the glow discharge to complete the formation of the RF n-type layer 203. The $SiH_4$ gas, $PH_3/H_2$ gas and $H_2$ gas were stopped from flowing into the deposition chamber 417, and then the inside of the deposition chamber and the inside of the gas pipe were evacuated to have a pressure of $1\times10^{-5}$ Torr.

(14) Subsequently, following the procedure in Example E5, an RF i-type layer 251 comprised of a-Si (corresponding to the RF i-type layer 151), an MW i-type layer 204 comprised of a-SiGe (corresponding to the MW i-type layer 104), an RF i-type layer 261 comprised of a-Si (corresponding to the RF i-type layer 161), an RF p-type layer 205 comprised of a-SiC (corresponding to the RF p-type layer 105), an RF n-type layer 206 comprised of μc-Si (corresponding to the RF n-type layer 103), an RF i-type layer 252 comprised of a-Si (corresponding to the RF i-type layer 151), an MW i-type layer 207 comprised of a-SiGe (corresponding to the MW i-type layer 104), an RF i-type layer 262 comprised of a-Si (corresponding to the RF i-type layer 161), an RF p-type layer 208 comprised of a-SiC (corresponding to the RF p-type layer 105), an RF n-type layer 209 comprised of μc-Si (corresponding to the RF n-type layer 103), an RF i-type layer 210 comprised of a-Si (corresponding to the RF i-type layer 161), and an RF p-type layer 211 comprised of a-SiC (corresponding to the RF p-type layer 105) were successively formed.

(15) On the RF p-type layer 211, ITO was deposited by vacuum deposition in a layer thickness of 70 nm as the transparent conductive layer 212.

(16) On the transparent conductive layer 212, a mask with a comb-shaped opening was placed, and the comb-shaped collector electrode 213 with a flat structure, comprised of Cr(40 nm)/Ag(1,000 nm)/Cr(40 nm) was deposited by vacuum deposition.

Thus, the fabrication of the photovoltaic device of the present Example was completed. This photovoltaic device is herein called SCE7. Conditions for forming the respective semiconductor layers RF n-type layers, RF i-type layers, MW i-type layers and RF p-type layers are shown together in Table E7.

TABLE E7

| | $SiH_4$ Flow rate (sccm) | $Si_2H_6$ Flow rate (sccm) | $CH_4$ Flow rate (sccm) | $GeH_4$ Flow rate (sccm) | $H_2$ Flow rate (sccm) | $PH_3/H_2$ Flow rate (sccm) | $B_2H_6/H_2$ Flow rate (sccm) | $SiH_4/H_2$ Flow rate (sccm) | Pressure (Torr) | MW power (W/cm²) | RF power (W/cm²) | Base member temp. (°C.) | Layer thickness (nm) |
|---|---|---|---|---|---|---|---|---|---|---|---|---|---|
| RF n-type layer: (203) | 2.0 | — | — | — | 100 | 220 | — | — | 1.3 | — | 0.05 | 350 | 20 |
| RF i-type layer: (251) | — | 4.0 | — | — | 100 | — | — | — | 0.7 | — | 0.008 | 300 | 10 |
| MW i-type layer: (204) | 40 | — | — | 42 | 180 | — | — | — | 0.011 | 0.12 | 0.31 | 370 | 110 |
| RF i-type layer: (261) | — | 4.0 | — | — | 100 | — | — | — | 0.65 | — | 0.008 | 300 | 23 |
| RF p-type layer: (205) | — | — | 0.1 | — | 80 | — | 9 | 2 | 1.8 | — | 0.07 | 300 | 10 |
| RF n-type layer: (206) | 1.1 | — | — | — | 40 | 290 | — | — | 1.1 | — | 0.04 | 300 | 10 |
| RF i-type layer: (252) | — | 4.0 | — | — | 100 | — | — | — | 0.75 | — | 0.008 | 300 | 10 |
| MW i-type layer: (207) | 34 | — | — | 30 | 170 | — | — | — | 0.010 | 0.12 | 0.3 | 350 | 100 |
| RF i-type layer: (262) | — | 3.5 | — | — | 90 | — | — | — | 0.6 | — | 0.008 | 280 | 23 |
| RF p-type layer: (208) | — | — | 0.2 | — | 80 | — | 9 | 2 | 1.7 | — | 0.07 | 260 | 10 |
| RF n-type layer: (209) | 0.8 | — | — | — | 50 | 250 | — | — | 1.05 | — | 0.04 | 230 | 10 |
| RF i-type layer: (210) | — | 2.5 | — | — | 60 | — | — | — | 0.8 | — | 0.007 | 190 | 90 |
| RF p-type layer: (211) | — | — | 0.4 | — | 90 | — | 8 | 2 | 1.6 | — | 0.07 | 170 | 10 |

Reference Example E7-1

This example is different from Example E7 in that the intermediate layer 199 of ZnO—Ag—Cr—Cu (99.1:0.3:0.3:0.3) was not formed on the substrate and, after the light-reflecting layer 201 of Ag was formed, the reflection enhancing layer 202 of ZnO was formed without the step of lowering the substrate temperature to 100° C. or below. Except for these points, the procedure of Example E7 was repeated to produce photovoltaic devices. Samples of the photovoltaic device of this example are called "SCE7-1".

For every two kinds of the samples of the photovoltaic device, i.e., SCE7 and SCE7-1, seven samples were prepared. In respect of these samples of the photovoltaic device, a bending peel test was carried out in the manner as described below, to examine their environmental resistance. Characteristics of initial photoelectric conversion efficiency (photoelectromotive force/incident light intensity) (in respect of photoelectric conversion efficiency and short-circuit current) were evaluated in the same manner as in Example A1. Photo-deterioration characteristics were also evaluated in the manner as described below. The results obtained are shown together in Table E8.

The bending peel test was carried out in the following way: The respective photovoltaic devices were left to stand for 280 hours in an environment of a high-temperature and high-humidity atmosphere (temperature: 84° C.; humidity: 85% RH), and thereafter put to a bending test repeated thirty times. In addition, to the part thus bended, a weight of 10 kg was dropped fourteen times at a height of 50 cm, and any peeling in the device was observed using a scanning electron microscope (SEM), manufactured by Hitachi Ltd. (model: S-4500; magnifications: 50,000×).

To examine the photo-deterioration characteristics, photoelectric conversion efficiency was evaluated after photovoltaic devices having a temperature of 50° C. were irradiated by light for 1,150 hours under 1 sun of 100 mW/cm$^2$.

In the results of the bending peel test, shown in Table E8, letter symbol "A" indicates an instance where no peeling occurs at all, and "C" an instance where peeling partly occurs. The results of evaluation on the characteristics of initial photoelectric conversion efficiency and photo-deterioration characteristics also shown in Table E8 are indicated by standardizing the results of the photovoltaic device SCE7-1 on the basis of the results of the photovoltaic device SCE7 which are regarded as 1.

TABLE E8

| Sample | Bending peel test | Total reflectance | Scattered reflectance | Photo-deterioration characteristics |
|---|---|---|---|---|
| SCE7 | A | 1.00 | 1.00 | 1.00 |
| SCE7-1 | C | 0.83 | 0.90 | 0.92 |

As is seen from the results shown in Table E8, the photovoltaic device SCE7 obtained in Example E7 by the process of the present invention is superior to the photovoltaic devices SCE7-1 of Reference Example E7-1 in all the environmental resistance, characteristics of initial photoelectric conversion efficiency and photo-deterioration characteristics at the same time.

EXAMPLE E8

In the present Example, the triple type photovoltaic device as shown in FIG. 4 was produced using the fabrication apparatus employing a roll-to-roll system as shown in FIGS. 8 and 10.

As the substrate, a belt-like stainless steel sheet of 300 m long, 30 cm wide and 0.2 mm thick was used.

The process of forming the photovoltaic device base member will be described below with reference to FIG. 8.

The apparatus for continuously forming the photovoltaic device base member as shown in FIG. 8 is successively provided with the substrate feed-out chamber 3610, a plurality of deposition chambers 3611 to 3614 and the substrate wind-up chamber 3684, which are connected through separating paths 3615, 3616, 3617, 3618 and 3619 between them. Each deposition chamber has an exhaust vent, through which the inside thereof can be evacuated.

The belt-like substrate 3621 is passed through these deposition chambers and separating paths after it is sent out of the substrate feed-out chamber, and is wound up in the substrate wind-up chamber. At the same time, the apparatus is so designed that gases can be fed into the respective deposition chambers and separating paths through their gas inlets, gases can be drawn out through the respective exhaust vents and the respective layers can be formed.

The intermediate layer of ZnO—Ag—Fe—Ni (99.1:0.3:0.3:0.3) is formed in the deposition chamber 3612, the light-reflecting layer of Ag in the deposition chamber 3613, and the reflection enhancing layer of ZnO in the deposition chamber 3614. The deposition chambers are respectively provided in their insides with the halogen lamp heaters 3640, 3641, 3642 and 3643 for heating the substrate on the back thereof, and the substrate is temperature-raised or heated to the stated temperature in each deposition chamber. The separating paths 3617, 3618 and 3619 have also the function to lower temperature so that the substrate temperature is dropped at a given rate after the semiconductor layers are respectively formed in the deposition chambers. In particular, in the present Example, the substrate temperature is lowered to 100° C. or below in the separating path 3618 after the light-reflecting layer is formed in the deposition chamber 3613.

In the deposition chamber 3612, DC magnetron sputtering is carried out, in which Ar gas is fed into the chamber through the gas inlet 3632 and ZnO—Ag—Fe—Ni (99.1:0.3:0.3:0.3) is used as the target 3650.

In the deposition chamber 3613, DC magnetron sputtering is carried out, in which Ar gas is fed into the chamber through the gas inlet 3634 and Ag is used as the target 3660. In the deposition chamber 3614, DC magnetron sputtering or RF magnetron sputtering is carried out, in which Ar gas is fed into the chamber through the gas inlet 3636 and ZnO is used as the target 3670.

After the photovoltaic device base member is formed on the belt substrate under conditions shown in Table E9, the substrate (formed into the base member) is wound up in the substrate wind-up chamber 3684.

The process of producing the photovoltaic device will be described below with reference to FIG. 10.

The triple type photovoltaic device having the layer configuration as shown in FIG. 4 was produced under conditions as shown in Table E10 below, using the apparatus employing a roll-to-roll system as shown in FIG. 10.

The belt base member comprising the photovoltaic device base member obtained in the manner as described above was set in the load chamber 5010 for introducing the belt base member. This belt base member was passed through all the deposition chambers and all the gas gates and connected to the belt base member wind-up jig in the unload chamber 5150. The respective deposition chambers were evacuated to 10$^{-3}$ Torr or below by means of an exhaust system (not shown). The desired materials gases were fed into the respective deposition chambers from the deposited film forming mixing systems 5024, 5034, 5044, 5054, 5064, 5074, 5084, 5094, 5104, 5114, 5124, 5134 and 5144. To the gas gates 5201, 5202, 5203, 5204, 5205, 5206, 5207, 5208, 5209, 5210, 5211, 5212, 5213 and 5214, gas was fed from the respective gate gas feeding system. The base member was heated by means of the base member heater in each deposition system, and the degree of vacuum was controlled by adjusting the opening of the exhaust valve of each exhaust system. After the base member temperature and degree of vacuum became stable, the belt base member was begun to be transported, and RF power or MW (frequency: 2.45 GHz) power for generating plasma was supplied to each deposition chamber. In this way, the triple type photovoltaic device having three pin structures as shown in FIG. 4, which were superposingly formed on the belt base member 290, was formed.

Next, on the RF p-type layer 211, ITO was deposited by vacuum deposition in a layer thickness of 70 nm as the transparent conductive layer 212.

Next, on the transparent conductive layer 212, a mask with a comb-shaped opening was placed, and the comb-shaped collector electrode 213 with a flat structure, comprised of Cr(40 nm)/Ag(1,000 nm)/Cr(40 nm) was deposited by vacuum deposition.

Thus, the fabrication of the photovoltaic device of the present Example was completed. This photovoltaic device is herein called SCE8. Conditions for forming the photovoltaic device base member in the present Example are shown in Table E9. Conditions for forming the respective semiconductor layers RF n-type layers, RF i-type layers, MW i-type layers and RF p-type layers are shown in Table E10.

TABLE E9

Photovoltaic device base member forming conditions
(Example E8; apparatus used: FIG. 8)

|  | Intermediate layer: ZnO—Ag—Fe—Ni (99.1:0.3:0.3:0.3) | Light-reflecting layer: Ag | Reflection enhancing layer: ZnO |
|---|---|---|---|
| Temp. rise rate: (°C./sec.) | 20 | 15 | 15 |
| Substrate temp.: (°C.) | 250 | 280 | 300 |
| Ar gas flow rate: (sccm) | 38 | 30 | 35 |
| Pressure: (mTorr) | 3 | 3 | 4 |
| Target species: | ZnO—Ag—Fe—Ni (99.1:0.3:0.3:0.3) | Ag | ZnO |
| Type of sputtering: | DC | DC | DC |
| Sputter voltage: (V) | 380 | 380 | 385 |
| Layer thickness: ($\mu$m) | 0.01 | 0.62 | 1.0 |
| Substrate cooling gas: | He | $H_2$ | He |
| Temp. drop rate: (°C./sec.) | 10 | 10 | 15 |

TABLE E10

| | $SiH_4$ Flow rate (sccm) | $Si_2H_6$ Flow rate (sccm) | $CH_4$ Flow rate (sccm) | $GeH_4$ Flow rate (sccm) | $H_2$ Flow rate (sccm) | $PH_3/H_2$ Flow rate (sccm) | $B_2H_6/H_2$ Flow rate (sccm) | $SiH_4/H_2$ Flow rate (sccm) | Pressure (Torr) | MW power (W/cm$^2$) | RF power (W/cm$^2$) | Base member temp. (°C.) | Layer thickness (nm) |
|---|---|---|---|---|---|---|---|---|---|---|---|---|---|
| RF n-type layer: (203) | 2.0 | — | — | — | 100 | 220 | — | — | 1.3 | — | 0.05 | 350 | 20 |
| RF i-type layer: (251) | — | 4.0 | — | — | 100 | — | — | — | 0.8 | — | 0.008 | 300 | 10 |
| MW i-type layer: (204) | 68 | — | — | 70 | 300 | — | — | — | 0.005 | 0.08 | 0.28 | 380 | 100 |
| RF i-type layer: (261) | — | 4.0 | — | — | 100 | — | — | — | 0.55 | — | 0.008 | 300 | 23 |
| RF p-type layer: (205) | — | — | 0.1 | — | 80 | — | 9 | 2 | 1.8 | — | 0.07 | 300 | 10 |
| RF n-type layer: (206) | 1.1 | — | — | — | 40 | 290 | — | — | 1.1 | — | 0.04 | 300 | 10 |
| RF i-type layer: (252) | — | 4.0 | — | — | 90 | — | — | — | 0.75 | — | 0.008 | 300 | 10 |
| MW i-type layer: (207) | 53 | — | — | 50 | 300 | — | — | — | 0.005 | 0.06 | 0.28 | 360 | 98 |
| RF i-type layer: (262) | — | 3.5 | — | — | 90 | — | — | — | 0.5 | — | 0.008 | 280 | 23 |
| RF p-type layer: (208) | — | — | 0.2 | — | 80 | — | 9 | 2 | 1.7 | — | 0.07 | 260 | 10 |
| RF n-type layer: (209) | 0.8 | — | — | — | 50 | 250 | — | — | 1.05 | — | 0.04 | 230 | 10 |
| RF i-type layer: (210) | — | 7.0 | — | — | 100 | — | — | — | 0.7 | — | 0.007 | 190 | 90 |
| RF p-type layer: (211) | — | — | 0.4 | — | 90 | — | 8 | 2 | 1.6 | — | 0.07 | 170 | 10 |

Reference Example E8-1

This example is different from Example E8 in that the substrate was used in which the intermediate layer 299 of ZnO—Ag—Fe—Ni (99.1:0.3:0.3:0.3) was not formed on the substrate and, after the light-reflecting layer 201 of Ag was formed, the reflection enhancing layer 202 of ZnO was formed without the step of lowering the substrate temperature to 100° C. or below. Except these points, the procedure of Example E8 was repeated to produce photovoltaic devices as shown in FIG. 4. Samples of the photovoltaic device of this example are called "SCE8-1".

For every two kinds of the samples of the photovoltaic device, i.e., SCE8 and SCE8-1, seven samples were prepared. In respect of these samples of the photovoltaic device, a bending peel test was carried out in the same manner as as described below, to examine their environmental resistance. Characteristics of initial photoelectric conversion efficiency (photoelectromotive force/incident light intensity) (in respect of photoelectric conversion efficiency and short-circuit current) were evaluated in the same manner as in Example A1. Photo-deterioration characteristics were also evaluated in the manner as described below. The results obtained are shown together in Table E11.

The bending peel test was carried out in the following way: The respective photovoltaic devices were left to stand for 380 hours in an environment of a high-temperature and high-humidity atmosphere (temperature: 85° C.; humidity: 85% RH), and thereafter put to a bending test repeated thirty times. In addition, to the part thus bended, a weight of 10 kg was dropped fourteen times at a height of 50 cm, and any peeling in the device was observed using a scanning electron microscope (SEM), manufactured by Hitachi Ltd. (model: S-4500; magnifications: 50,000×).

To examine the photo-deterioration characteristics, photoelectric conversion efficiency was evaluated after photovoltaic devices having a temperature of 52° C. were irradiated by light for 1,350 hours under 1 sun of 100 mW/cm$^2$.

In the results of the bending peel test, shown in Table E11, letter symbol "A" indicates an instance where no peeling occurs at all, and "C" an instance where peeling partly occurs. The results of evaluation on the characteristics of initial photoelectric conversion efficiency and photo-deterioration characteristics also shown in Table E11 are indicated by standardizing the results of the photovoltaic device SCE8-1 on the basis of the results of the photovoltaic device SCE8 which are regarded as 1.

TABLE E11

| Sample | Bending peel test | Total reflectance | Scattered reflectance | Photo-deterioration characteristics |
|---|---|---|---|---|
| SCE8 | A | 1.00 | 1.00 | 1.00 |
| SCE8-1 | C | 0.82 | 0.90 | 0.91 |

As is seen from the results shown in Table E11, the photovoltaic device SCE8 obtained in Example E8 by the process of the present invention is superior to the photovoltaic devices SCE8-1 of Reference Example E8-1 in all the environmental resistance, characteristics of initial photoelectric conversion efficiency and photo-deterioration characteristics at the same time.

EXAMPLE E9

In the present Example, the rate of temperature rise at the time of the formation of the intermediate layer, light-reflecting layer and reflection enhancing layer was changed in the range of from 2° C./sec. to 150° C./sec. to examine how it affects the initial photoelectric conversion characteristics and so forth in photovoltaic devices. ZnO—Cu—Fe—Cr (99.1:0.3:0.3:0.3) was used as the target used to form the intermediate layer.

In the present Example, triple type photovoltaic devices having the structure as shown in FIG. 4 were produced in the same manner as in Example E8 except that the photovoltaic device base member was formed under conditions shown in Table E12 and the semiconductor layers were formed under conditions shown in Table E13, using the apparatus for continuously forming the photovoltaic device base member as shown in FIG. 8 and the apparatus for continuously forming the photovoltaic device semiconductor layers as shown in FIG. 10. Stated specifically, eight samples were prepared under different conditions for the rate of temperature rise.

In respect of the samples of the photovoltaic device thus obtained, environmental resistance, characteristics of initial photoelectric conversion efficiency and photo-deterioration characteristics were evaluated in the same manner as in Example E8 to obtain the results as shown in Table E14.

The results of evaluation on the bending peel test, photoelectric conversion efficiency, short-circuit current and photo-deterioration characteristics as shown in Table E14 are indicated by standardizing the results obtained for the photovoltaic device produced in this example, on the basis of the measurement results of the sample obtained when the temperature was raised at a rate of 2° C./sec. In the table, "C" indicates 1.0 or more to less than 1.4; "B", 1.4 or more to less than 1.8; and "A", 1.8 or more.

As is seen from the results shown in Table E14, the rate of temperature rise at the time of the formation of the photovoltaic device base member is preferably in the range of from 10° C./sec. to 100° C./sec. in view of the bending peel test (environmental resistance), the photoelectric conversion efficiency, the short-circuit current and the photo-deterioration characteristics.

TABLE E12

Photovoltaic device base member forming conditions
(Example E9; apparatus used: FIG. 8)

| | Intermediate layer: ZnO—Cu—Fe—Cr (99.1:0.3:0.3:0.3) | Light-reflecting layer: Ag | Reflection enhancing layer: ZnO |
|---|---|---|---|
| Temp. rise rate: (°C./sec.) | 2–150 | 2–150 | 2–150 |
| Substrate temp.: (°C.) | 255 | 290 | 310 |
| Ar gas glow rate: (sccm) | 38 | 40 | 35 |
| Pressure: (mTorr) | 4 | 3 | 4 |
| Target species: | ZnO—Cu—Fe—Cr (99.1:0.3:0.3:0.3) | Ag | ZnO |
| Type of sputtering: | DC | DC | DC |
| Sputter voltage: (V) | 375 | 390 | 385 |
| Layer thickness: (μm) | 0.015 | 0.45 | 1.0 |
| Substrate cooling gas: | He | He | He |
| Temp. drop rate: (°C./sec.) | 10 | 10 | 15 |

TABLE E13

| | SiH$_4$ Flow rate (sccm) | Si$_2$H$_6$ Flow rate (sccm) | CH$_4$ Flow rate (sccm) | GeH$_4$ Flow rate (sccm) | H$_2$ Flow rate (sccm) | PH$_3$/H$_2$ Flow rate (sccm) | B$_2$H$_6$/H$_2$ Flow rate (sccm) | SiH$_4$/H$_2$ Flow rate (sccm) | Pressure (Torr) | MW power (W/cm$^2$) | RF power (W/cm$^2$) | Base member temp. (°C.) | Layer thickness (nm) |
|---|---|---|---|---|---|---|---|---|---|---|---|---|---|
| RF n-type layer: (203) | 2.0 | — | — | — | 100 | 220 | — | — | 1.3 | — | 0.05 | 350 | 20 |
| RF i-type layer: (251) | — | 4.0 | — | — | 100 | — | — | — | 0.7 | — | 0.008 | 300 | 10 |
| MW i-type layer: (204) | 68 | — | — | 71 | 320 | — | — | — | 0.008 | 0.11 | 0.31 | 370 | 100 |
| RF i-type layer: (261) | — | 4.0 | — | — | 100 | — | — | — | 0.65 | — | 0.008 | 300 | 23 |
| RF p-type layer: (205) | — | — | 0.1 | — | 80 | — | 9 | 2 | 1.8 | — | 0.07 | 300 | 10 |
| RF n-type layer: (206) | 1.1 | — | — | — | 40 | 290 | — | — | 1.1 | — | 0.04 | 300 | 10 |
| RF i-type layer: (252) | — | 4.0 | — | — | 90 | — | — | — | 0.75 | — | 0.008 | 300 | 10 |
| MW i-type layer: (207) | 55 | — | — | 50 | 310 | — | — | — | 0.008 | 0.10 | 0.3 | 350 | 98 |
| RF i-type layer: (262) | — | 3.5 | — | — | 90 | — | — | — | 0.7 | — | 0.008 | 280 | 23 |
| RF p-type layer: (208) | — | — | 0.2 | — | 80 | — | 9 | 2 | 1.7 | — | 0.07 | 260 | 10 |
| RF n-type layer: (209) | 0.8 | — | — | — | 50 | 250 | — | — | 1.05 | — | 0.04 | 230 | 10 |
| RF i-type layer: (210) | — | 7.0 | — | — | 150 | — | — | — | 0.5 | — | 0.007 | 190 | 90 |
| RF p-type layer: (211) | — | — | 0.4 | — | 90 | — | 8 | 2 | 1.6 | — | 0.07 | 170 | 10 |

TABLE E14

| | Temp. rise rate: (°C./sec.) | | | | | | | |
|---|---|---|---|---|---|---|---|---|
| | 2 | 8 | 10 | 40 | 70 | 100 | 120 | 150 |
| Environmental resistance bending peel test: | B | A | A | A | A | A | B | C |
| Photoelectric conversion efficiency: | B | A | A | A | A | A | B | C |
| Short-circuit current: | C | B | A | A | A | A | A | C |
| Photoelectric conversion efficiency after photodeterioration: | B | A | A | A | A | A | A | C |

EXAMPLE E10

In the present Example, the rate of temperature drop after the formation of the intermediate layer, light-reflecting layer and reflection enhancing layer was changed in the range of from 0.2° C./sec. to 90° C./sec. to examine how it affects the initial photoelectric conversion characteristics and so forth in photovoltaic devices. ZnO—Cu—Fe—Ni (99.1:0.3:0.3:0.3) was used as the target used to form the intermediate layer.

In the present Example, triple type photovoltaic devices having the structure as shown in FIG. 4 were produced in the same manner as in Example E8 except that the photovoltaic device base member was formed under conditions shown in Table E15 and the semiconductor layers were formed under conditions shown in Table E16, using the apparatus for continuously forming the photovoltaic device base member as shown in FIG. 8 and the apparatus for continuously forming the photovoltaic device semiconductor layers as shown in FIG. 10. Stated specifically, eight samples were prepared under different conditions for the rate of temperature rise.

In respect of the samples of the photovoltaic device thus obtained, environmental resistance, characteristics of initial photoelectric conversion efficiency and photo-deterioration characteristics were evaluated in the same manner as in Example E8 to obtain the results as shown in Table E17.

The results of evaluation on the bending peel test, photoelectric conversion efficiency, short-circuit current and photo-deterioration characteristics as shown in Table E17 are indicated by standardizing the results obtained for the photovoltaic device produced in this example, on the basis of the measurement results of the sample obtained when the temperature was lowered at a rate of 0.2° C./sec. In the table, "C" indicates 1.0 or more to less than 1.4; "B", 1.4 or more to less than 1.8; and "A", 1.8 or more. As is seen from the results shown in Table E17, the rate of temperature drop at the time of the formation of the photovoltaic device base member is preferably in the range of from 1° C./sec. to 50° C./sec. in view of the bending peel test (environmental resistance), the photoelectric conversion efficiency, the short-circuit current and the photo-deterioration characteristics.

TABLE E15

Photovoltaic device base member forming conditions
(Example E10; apparatus used: FIG. 8)

| | Intermediate layer: ZnO—Cu—Fe—Ni (99.1:0.3:0.3:0.3) | Light-reflecting layer: Ag | Reflection enhancing layer: ZnO |
|---|---|---|---|
| Temp. rise rate: (°C./sec.) | 38 | 15 | 15 |
| Substrate temp.: (°C.) | 280 | 290 | 320 |
| Ar gas flow rate: (sccm) | 38 | 40 | 50 |
| Pressure: (mTorr) | 3 | 3 | 4 |

TABLE E15-continued

Photovoltaic device base member forming conditions
(Example E10; apparatus used: FIG. 8)

|  | Intermediate layer: ZnO—Cu—Fe—Ni (99.1:0.3:0.3:0.3) | Light-reflecting layer: Ag | Reflection enhancing layer: ZnO |
|---|---|---|---|
| Target species: | ZnO—Cu—Fe—Ni (99.1:0.3:0.3:0.3) | Ag | ZnO |
| Type of sputtering: | DC | DC | DC |
| Sputter voltage: (V) | 379 | 380 | 390 |
| Layer thickness: ($\mu$m) | 0.02 | 0.7 | 1.8 |
| Substrate cooling gas: | He | $H_2$ | He |
| Temp. drop rate: (°C./sec.) | 0.2–90 | 0.2–90 | 0.2–90 | to 0.2 $\mu$m to examine how it affects the initial photoelectric conversion characteristics and so forth in photovoltaic devices obtained. ZnO—Ag—Fe—Ni (99.1:0.3:0.3:0.3) was used as the target used to form the intermediate layer.

In the present Example, triple type photovoltaic devices having the structure as shown in FIG. 4 were produced in the same manner as in Example E8 except that the photovoltaic device base member was formed under conditions shown in Table E18 and the semiconductor layers were formed under conditions shown in Table E19, using the apparatus for continuously forming the photovoltaic device base member as shown in FIG. 8 and the apparatus for continuously forming the photovoltaic device semiconductor layers as shown in FIG. 10. Stated specifically, eight samples having different layer thicknesses were prepared.

In respect of the samples of the photovoltaic device thus obtained, environmental resistance, characteristics of initial photoelectric conversion efficiency and photo-deterioration characteristics were evaluated in the same manner as in Example E8 to obtain the results as shown in Table E20.

TABLE E16

|  | $SiH_4$ Flow rate (sccm) | $Si_2H_6$ Flow rate (sccm) | $CH_4$ Flow rate (sccm) | $GeH_4$ Flow rate (sccm) | $H_2$ Flow rate (sccm) | $PH_3/H_2$ Flow rate (sccm) | $B_2H_6/H_2$ Flow rate (sccm) | $SiH_4/H_2$ Flow rate (sccm) | Pressure (Torr) | MW power (W/cm$^2$) | RF power (W/cm$^2$) | Base member temp. (°C.) | Layer thickness (nm) |
|---|---|---|---|---|---|---|---|---|---|---|---|---|---|
| RF n-type layer: (203) | 2.0 | — | — | — | 100 | 220 | — | — | 1.3 | — | 0.05 | 350 | 20 |
| RF i-type layer: (251) | — | 4.0 | — | — | 100 | — | — | — | 0.8 | — | 0.008 | 300 | 10 |
| MW i-type layer: (204) | 68 | — | — | 71 | 350 | — | — | — | 0.010 | 0.11 | 0.32 | 370 | 100 |
| RF i-type layer: (261) | — | 4.0 | — | — | 105 | — | — | — | 0.55 | — | 0.008 | 300 | 23 |
| RF p-type layer: (205) | — | — | 0.1 | — | 80 | — | 9 | 2 | 1.8 | — | 0.07 | 300 | 10 |
| RF n-type layer: (206) | 1.1 | — | — | — | 30 | 290 | — | — | 1.2 | — | 0.04 | 300 | 10 |
| RF i-type layer: (252) | — | 4.0 | — | — | 90 | — | — | — | 0.75 | — | 0.008 | 300 | 10 |
| MW i-type layer: (207) | 65 | — | — | 60 | 330 | — | — | — | 0.013 | 0.11 | 0.3 | 350 | 98 |
| RF i-type layer: (262) | — | 3.5 | — | — | 90 | — | — | — | 0.7 | — | 0.008 | 280 | 23 |
| RF p-type layer: (208) | — | — | 0.2 | — | 80 | — | 9 | 2 | 1.7 | — | 0.07 | 260 | 10 |
| RF n-type layer: (209) | 0.8 | — | — | — | 50 | 250 | — | — | 1.05 | — | 0.04 | 230 | 10 |
| RF i-type layer: (210) | — | 9.0 | — | — | 300 | — | — | — | 0.7 | — | 0.007 | 190 | 90 |
| RF p-type layer: (211) | — | — | 0.4 | — | 90 | — | 8 | 2 | 1.6 | — | 0.07 | 170 | 10 |

TABLE E17

|  | Temp. rise rate: (°C./sec.) | | | | | | | |
|---|---|---|---|---|---|---|---|---|
|  | 0.2 | 0.8 | 1 | 10 | 30 | 50 | 70 | 90 |
| Environmental resistance bending peel test: | B | A | A | A | A | A | A | B |
| Photoelectric conversion efficiency: | C | A | A | A | A | A | B | C |
| Short-circuit current: | C | B | A | A | A | A | A | B |
| Photoelectric conversion efficiency after photodeterioration: | B | A | A | A | A | A | B | B |

EXAMPLE E11

In the present Example, the layer thickness of the intermediate layer was changed in the range of from 0.0002 $\mu$m The results of evaluation on the bending peel test, photoelectric conversion efficiency, short-circuit current and photo-deterioration characteristics as shown in Table E20 are indicated by standardizing the results obtained for the photovoltaic device produced in this example, on the basis of the measurement results of the sample obtained when the intermediate layer was formed in a thickness of 0.0002 $\mu$m. In the table, "C" indicates 1.0 or more to less than 1.4; "B", 1.4 or more to less than 1.8; and "A", 1.8 or more.

As is seen from the results shown in Table E20, the layer thickness of the intermediate layer at the time of the formation of the photovoltaic device base member is preferably in the range of from 0.001 $\mu$m to 0.1 $\mu$m in view of the bending peel test (environmental resistance), the photoelectric conversion efficiency, the short-circuit current and the photo-deterioration characteristics.

TABLE E18

Photovoltaic device base member forming conditions
(Example E11; apparatus used: FIG. 8)

|  | Intermediate layer: ZnO—Ag—Fe—Ni (99.1:0.3:0.3:0.3) | Light-reflecting layer: Ag | Reflection enhancing layer: ZnO |
|---|---|---|---|
| Temp. rise rate: (°C./sec.) | 38 | 15 | 15 |
| Substrate temp.: (°C.) | 290 | 290 | 320 |
| Ar gas flow rate: (sccm) | 38 | 40 | 50 |
| Pressure: (mTorr) | 4 | 3 | 4 |
| Target species: | ZnO—Ag—Fe—Ni (99.1:0.3:0.3:0.3) | Ag | ZnO |
| Type of sputtering: | DC | DC | DC |
| Sputter voltage: (V) | 385 | 380 | 390 |
| Layer thickness: ($\mu$m) | 0.0002–0.2 | 0.6 | 1.8 |
| Substrate cooling gas: | He | $H_2$ | He |
| Temp. drop rate: (°C./sec.) | 30 | 50 | 50 |

TABLE E19

|  | $SiH_4$ Flow rate (sccm) | $Si_2H_6$ Flow rate (sccm) | $CH_4$ Flow rate (sccm) | $GeH_4$ Flow rate (sccm) | $H_2$ Flow rate (sccm) | $PH_3/H_2$ Flow rate (sccm) | $B_2H_6/H_2$ Flow rate (sccm) | $SiH_4/H_2$ Flow rate (sccm) | Pressure (Torr) | MW power (W/cm$^2$) | RF power (W/cm$^2$) | Base member temp. (°C.) | Layer thickness (nm) |
|---|---|---|---|---|---|---|---|---|---|---|---|---|---|
| RF n-type layer: (203) | 2.0 | — | — | — | 100 | 220 | — | — | 1.3 | — | 0.05 | 350 | 20 |
| RF i-type layer: (251) | — | 4.0 | — | — | 100 | — | — | — | 0.8 | — | 0.008 | 300 | 10 |
| MW i-type layer: (204) | 78 | — | — | 81 | 380 | — | — | — | 0.010 | 0.11 | 0.32 | 370 | 100 |
| RF i-type layer: (261) | — | 4.0 | — | — | 105 | — | — | — | 0.55 | — | 0.008 | 300 | 23 |
| RF p-type layer: (205) | — | — | 0.1 | — | 80 | — | 9 | 2 | 1.8 | — | 0.07 | 300 | 10 |
| RF n-type layer: (206) | 1.1 | — | — | — | 30 | 290 | — | — | 1.2 | — | 0.04 | 300 | 10 |
| RF i-type layer: (252) | — | 4.0 | — | — | 90 | — | — | — | 0.75 | — | 0.008 | 300 | 10 |
| MW i-type layer: (207) | 65 | — | — | 60 | 380 | — | — | — | 0.010 | 0.10 | 0.3 | 350 | 98 |
| RF i-type layer: (262) | — | 4.5 | — | — | 90 | — | — | — | 0.7 | — | 0.008 | 280 | 23 |
| RF p-type layer: (208) | — | — | 0.2 | — | 80 | — | 9 | 2 | 1.7 | — | 0.07 | 260 | 10 |
| RF n-type layer: (209) | 0.8 | — | — | — | 50 | 250 | — | — | 1.05 | — | 0.04 | 230 | 10 |
| RF i-type layer: (210) | — | 7.0 | — | — | 320 | — | — | — | 0.7 | — | 0.007 | 190 | 90 |
| RF p-type layer: (211) | — | — | 0.4 | — | 90 | — | 8 | 2 | 1.6 | — | 0.07 | 170 | 10 |

TABLE E20

Intermediate layer: ZnO—Ag—Fe—Ni
(99.1:0.3:0.3:0.3) layer thickness ($\mu$m)

|  | 0.0002 | 0.0007 | 0.001 | 0.01 | 0.07 | 0.1 | 0.15 | 0.2 |
|---|---|---|---|---|---|---|---|---|
| Environmental resistance bending peel test: | B | B | A | A | A | A | A | B |
| Photoelectric conversion efficiency | B | A | A | A | A | A | A | C |
| Short-circuit current: | B | A | A | A | A | A | B | B |
| Photoelectric conversion efficiency after photo-deterioration: | B | A | A | A | A | A | A | B |

EXAMPLE E12

In the present Example, the layer thickness of the intermediate layer was changed in the range of from 0.0002 $\mu$m to 0.2 $\mu$m to examine how it affects the initial photoelectric conversion characteristics and so forth in photovoltaic devices obtained. ZnO—Ag—Cr—Cu (99.1:0.3:0.3:0.3) was used as the target used to form the intermediate layer.

In the present Example, triple type photovoltaic devices having the structure as shown in FIG. 4 were produced in the same manner as in Example E8 except that the photovoltaic device base member was formed under conditions shown in Table E21 and the semiconductor layers were formed under conditions shown in Table E22, using the apparatus for continuously forming the photovoltaic device base member as shown in FIG. 8 and the apparatus for continuously forming the photovoltaic device semiconductor layers as shown in FIG. 10. Stated specifically, eight samples having different layer thicknesses were prepared.

In respect of the samples of the photovoltaic device thus obtained, environmental resistance, characteristics of initial photoelectric conversion efficiency and photo-deterioration characteristics were evaluated in the same manner as in Example E8 to obtain the results as shown in Table E23.

The results of evaluation on the bending peel test, photoelectric conversion efficiency, short-circuit current and photo-deterioration characteristics as shown in Table E23 are indicated by standardizing the results obtained for the photovoltaic device produced in this example, on the basis of the measurement results of the sample obtained when the intermediate layer was formed in a thickness of 0.0002 $\mu$m. In the table, "C" indicates 1.0 or more to less than 1.4; "B", 1.4 or more to less than 1.8; and "A", 1.8 or more.

As is seen from the results shown in Table E23, the layer thickness of the intermediate layer at the time of the formation of the photovoltaic device base member is preferably in the range of from 0.001 $\mu$m to 0.1 $\mu$m in view of the bending peel test (environmental resistance), the photoelectric conversion efficiency, the short-circuit current and the photo-deterioration characteristics.

TABLE E21

Photovoltaic device base member forming conditions (Example E12; apparatus used: FIG. 8)

|  | Intermediate layer: ZnO—Ag—Cr—Cu (99.1:0.3:0.3:0.3) | Light-reflecting layer: Ag | Reflection enhancing layer: ZnO |
|---|---|---|---|
| Temp. rise rate: (°C./sec.) | 38 | 15 | 15 |
| Substrate temp.: (°C.) | 280 | 290 | 320 |
| Ar gas flow rate: (sccm) | 38 | 40 | 50 |
| Pressure: (mTorr) | 3 | 3 | 4 |
| Target species: | ZnO—Ag—Cr—Cu (99.1:0.3:0.3:0.3) | Ag | ZnO |
| Type of sputtering: | DC | DC | DC |
| Sputter voltage: (V) | 380 | 380 | 390 |
| Layer thickness: ($\mu$m) | 0.0002–0.2 | 0.6 | 1.8 |
| Substrate cooling gas: | He | $H_2$ | He |
| Temp. drop rate: (°C./sec.) | 30 | 50 | 50 |

TABLE E22

| | $SiH_4$ Flow rate (sccm) | $Si_2H_6$ Flow rate (sccm) | $CH_4$ Flow rate (sccm) | $GeH_4$ Flow rate (sccm) | $H_2$ Flow rate (sccm) | $PH_3/H_2$ Flow rate (sccm) | $B_2H_6/H_2$ Flow rate (sccm) | $SiH_4/H_2$ Flow rate (sccm) | Pressure (Torr) | MW power (W/cm$^2$) | RF power (W/cm$^2$) | Base member temp. (°C.) | Layer thickness (nm) |
|---|---|---|---|---|---|---|---|---|---|---|---|---|---|
| RF n-type layer: (203) | 2.0 | — | — | — | 100 | 220 | — | — | 1.3 | — | 0.05 | 350 | 20 |
| RF i-type layer: (251) | — | 4.0 | — | — | 100 | — | — | — | 0.8 | — | 0.008 | 300 | 10 |
| MW i-type layer: (204) | 78 | — | — | 79 | 400 | — | — | — | 0.011 | 0.11 | 0.32 | 370 | 100 |
| RF i-type layer: (261) | — | 4.0 | — | — | 105 | — | — | — | 0.55 | — | 0.008 | 300 | 23 |
| RF p-type layer: (205) | — | — | 0.1 | — | 80 | — | 9 | 2 | 1.8 | — | 0.07 | 300 | 10 |
| RF n-type layer: (206) | 1.1 | — | — | — | 30 | 290 | — | — | 1.2 | — | 0.04 | 300 | 10 |
| RF i-type layer: (252) | — | 4.0 | — | — | 90 | — | — | — | 0.75 | — | 0.008 | 300 | 10 |
| MW i-type layer: (207) | 65 | — | — | 58 | 400 | — | — | — | 0.010 | 0.11 | 0.3 | 350 | 98 |
| RF i-type layer: (262) | — | 4.5 | — | — | 90 | — | — | — | 0.7 | — | 0 008 | 280 | 23 |
| RF p-type layer: (208) | — | — | 0.2 | — | 80 | — | 9 | 2 | 1.7 | — | 0.07 | 260 | 10 |
| RF n-type layer: (209) | 0.8 | — | — | — | 50 | 250 | — | — | 1.05 | — | 0.04 | 230 | 10 |
| RF i-type layer: (210) | — | 7.0 | — | — | 420 | — | — | — | 0.7 | — | 0.007 | 190 | 90 |
| RF p-type layer: (211) | — | — | 0.4 | — | 90 | — | 8 | 2 | 1.6 | — | 0.07 | 170 | 10 |

TABLE E23

| | Intermediate layer: ZnO—Ag—Cr—Cu (99.1:0.3:0.3:0.3) layer thickness ($\mu$m) | | | | | | | |
|---|---|---|---|---|---|---|---|---|
| | 0.0002 | 0.0007 | 0.001 | 0.01 | 0.07 | 0.1 | 0.15 | 0.2 |
| Environmental resistance bending peel test: | B | B | A | A | A | A | A | B |
| Photoelectric conversion efficiency: | B | A | A | A | A | A | A | C |

TABLE E23-continued

| | Intermediate layer: ZnO—Ag—Cr—Cu (99.1:0.3:0.3:0.3) layer thickness (μm) | | | | | | | |
|---|---|---|---|---|---|---|---|---|
| | 0.0002 | 0.0007 | 0.001 | 0.01 | 0.07 | 0.1 | 0.15 | 0.2 |
| Short-circuit current: | B | B | A | A | A | A | B | B |
| Photoelectric conversion efficiency after photo-deterioration: | B | A | A | A | A | A | A | B |

EXAMPLE E13

In the present Example, using ZnO—Ag as the target used to form the intermediate layer, the concentration of Ag was changed in the range of from 0.0001% to 10% to examine how it affects the initial photoelectric conversion characteristics and so forth in photovoltaic devices obtained.

In the present Example, triple type photovoltaic devices having the structure as shown in FIG. 4 were produced in the same manner as in Example E8 except that the photovoltaic device base member was formed under conditions shown in Table E24 and the semiconductor layers were formed under conditions shown in Table E25, using the apparatus for continuously forming the photovoltaic device base member as shown in FIG. 8 and the apparatus for continuously forming the photovoltaic device semiconductor layers as shown in FIG. 10. Stated specifically, eight samples having different Ag concentrations in the target used to form the intermediate layer were prepared.

In respect of the samples of the photovoltaic device thus obtained, environmental resistance, characteristics of initial photoelectric conversion efficiency and photo-deterioration characteristics were evaluated in the same manner as in Example E8 to obtain the results as shown in Table E26.

The results of evaluation on the bending peel test, photoelectric conversion efficiency, short-circuit current and photo-deterioration characteristics as shown in Table E26 are indicated by standardizing the results obtained for the photovoltaic device produced in this example, on the basis of the measurement results of the sample obtained when the Ag contained in ZnO in the target used to form the intermediate layer is in a concentration of 0.0001%. In the table, "C" indicates 1.0 or more to less than 1.4; "B", 1.4 or more to less than 1.8; and "A", 1.8 or more.

As is seen from the results shown in Table E26, in the target used to form the intermediate layer at the time of the formation of the photovoltaic device base member, the concentration of the Ag contained in ZnO is preferably in the range of from 0.001% to 1% in view of the bending peel test (environmental resistance), the photoelectric conversion efficiency, the short-circuit current and the photo-deterioration characteristics.

TABLE E24

Photovoltaic device base member forming conditions
(Example E13; apparatus used: FIG. 8)

| | Intermediate layer: ZnO—Ag (99.1:0.3:0.3:0.3) | Light-reflecting layer: Ag | Reflection enhancing layer: ZnO |
|---|---|---|---|
| Temp. rise rate: (°C./sec.) | 38 | 15 | 15 |
| Substrate temp.: (°C.) | 270 | 290 | 320 |
| Ar gas flow rate: (sccm) | 45 | 40 | 50 |
| Pressure: (mTorr) | 4 | 3 | 4 |
| Target species: (metal conc.: %) | ZnO—Ag (0.0001–10) | Ag | ZnO |
| Type of sputtering: | DC | DC | DC |
| Sputter voltage: (V) | 375 | 380 | 390 |
| Layer thickness: (μm) | 0.01 | 0.6 | 1.8 |
| Substrate cooling gas: | He | $H_2$ | He |
| Temp. drop rate: (°C./sec.) | 30 | 50 | 50 |

TABLE E25

| | $SiH_4$ Flow rate (sccm) | $Si_2H_6$ Flow rate (sccm) | $CH_4$ Flow rate (sccm) | $GeH_4$ Flow rate (sccm) | $H_2$ Flow rate (sccm) | $PH_3/H_2$ Flow rate (sccm) | $B_2H_6/H_2$ Flow rate (sccm) | $SiH_4/H_2$ Flow rate (sccm) | Pressure (Torr) | MW power (W/cm²) | RF power (W/cm²) | Base member temp. (°C.) | Layer thickness (nm) |
|---|---|---|---|---|---|---|---|---|---|---|---|---|---|
| RF n-type layer: (203) | 2.0 | — | — | — | 100 | 220 | — | — | 1.3 | — | 0.05 | 350 | 20 |
| RF i-type layer: (251) | — | 4.0 | — | — | 100 | — | — | — | 0.8 | — | 0.008 | 300 | 10 |
| MW i-type layer: (204) | 68 | — | — | 69 | 350 | — | — | — | 0.011 | 0.11 | 0.32 | 370 | 100 |
| RF i-type layer: (261) | — | 4.0 | — | — | 105 | — | — | — | 0.55 | — | 0.008 | 300 | 23 |
| RF p-type layer: (205) | — | — | 0.1 | — | 80 | — | 9 | 2 | 1.8 | — | 0.07 | 300 | 10 |
| RF n-type layer: (206) | 1.1 | — | — | — | 30 | 290 | — | — | 1.2 | — | 0.04 | 300 | 10 |
| RF i-type layer: (252) | — | 4.0 | — | — | 90 | — | — | — | 0.75 | — | 0.008 | 300 | 10 |

TABLE E25-continued

| | SiH$_4$ Flow rate (sccm) | Si$_2$H$_6$ Flow rate (sccm) | CH$_4$ Flow rate (sccm) | GeH$_4$ Flow rate (sccm) | H$_2$ Flow rate (sccm) | PH$_3$/H$_2$ Flow rate (sccm) | B$_2$H$_6$/H$_2$ Flow rate (sccm) | SiH$_4$/H$_2$ Flow rate (sccm) | Pressure (Torr) | MW power (W/cm$^2$) | RF power (W/cm$^2$) | Base member temp. (°C.) | Layer thickness (nm) |
|---|---|---|---|---|---|---|---|---|---|---|---|---|---|
| MW i-type layer: (207) | 63 | — | — | 59 | 350 | — | — | — | 0.010 | 0.11 | 0.3 | 350 | 98 |
| RF i-type layer: (262) | — | 4.5 | — | — | 90 | — | — | — | 0.7 | — | 0.008 | 280 | 23 |
| RF p-type layer: (208) | — | — | 0.2 | — | 80 | — | 9 | 2 | 1.7 | — | 0.07 | 260 | 10 |
| RF n-type layer: (209) | 0.8 | — | — | — | 50 | 250 | — | — | 1.05 | — | 0.04 | 230 | 10 |
| RF i-type layer: (210) | — | 7.0 | — | — | 200 | — | — | — | 0.7 | — | 0.007 | 190 | 90 |
| RF p-type layer: (211) | — | — | 0.4 | — | 90 | — | 8 | 2 | 1.6 | — | 0.07 | 170 | 10 |

TABLE E26

| | Intermediate layer: ZnO—Ag (metal concentration: %) | | | | | | | |
|---|---|---|---|---|---|---|---|---|
| | 0.0002 | 0.0007 | 0.001 | 0.01 | 0.07 | 0.1 | 0.15 | 0.2 |
| Environmental resistance bending peel test: | A | A | A | A | A | A | A | B |
| Photoelectric conversion efficiency | B | A | A | A | A | A | A | C |
| Short-circuit current: | B | B | A | A | A | A | B | B |
| Photoelectric conversion efficiency after photo-deterioration: | A | A | A | A | A | A | A | B |

EXAMPLE E14

In the present Example, using ZnO—Fe as the target used to form the intermediate layer, the concentration of Fe was changed in the range of from 0.0001% to 10% to examine how it affects the initial photoelectric conversion characteristics and so forth in photovoltaic devices obtained.

In the present Example, triple type photovoltaic devices having the structure as shown in FIG. 4 were produced in the same manner as in Example E8 except that the photovoltaic device base member was formed under conditions shown in Table E27 and the semiconductor layers were formed under conditions shown in Table E28, using the apparatus for continuously forming the photovoltaic device base member as shown in FIG. 8 and the apparatus for continuously forming the photovoltaic device semiconductor layers as shown in FIG. 10. Stated specifically, eight samples having different Ni concentrations in the target used to form the intermediate layer were prepared.

In respect of the samples of the photovoltaic device thus obtained, environmental resistance, characteristics of initial photoelectric conversion efficiency and photo-deterioration characteristics were evaluated in the same manner as in Example E8 to obtain the results as shown in Table E29.

The results of evaluation on the bending peel test, photoelectric conversion efficiency, short-circuit current and photo-deterioration characteristics as shown in Table E29 are indicated by standardizing the results obtained for the photovoltaic device produced in this example, on the basis of the measurement results of the sample obtained when the Fe contained in ZnO in the target used to form the intermediate layer is in a concentration of 0.0001%. In the table, "C" indicates 1.0 or more to less than 1.4; "B", 1.4 or more to less than 1.8; and "A", 1.8 or more.

As is seen from the results shown in Table E29, in the target used to form the intermediate layer at the time of the formation of the photovoltaic device base member, the concentration of the Fe contained in ZnO is preferably in the range of from 0.001% to 1% in view of the bending peel test (environmental resistance), the photoelectric conversion efficiency, the short-circuit current and the photo-deterioration characteristics.

TABLE E27

Photovoltaic device base member forming conditions
(Example E14; apparatus used: FIG. 8)

| | Intermediate layer: ZnO—Fe | Light-reflecting layer: Ag | Reflection enhancing layer: ZnO |
|---|---|---|---|
| Temp. rise rate: (°C./sec.) | 38 | 15 | 15 |
| Substrate temp.: (°C.) | 260 | 290 | 320 |
| Ar gas flow rate: (sccm) | 40 | 40 | 50 |
| Pressure: (mTorr) | 3 | 3 | 4 |
| Target species: (metal conc.: %) | ZnO—Fe (0.0001–10) | Ag | ZnO |
| Type of sputtering: | DC | DC | DC |
| Sputter voltage: (V) | 370 | 380 | 390 |
| Layer thickness: ($\mu$m) | 0.012 | 0.6 | 1.5 |
| Substrate cooling gas: | He | H$_2$ | He |
| Temp. drop rate: (°C./sec.) | 35 | 50 | 50 |

TABLE E28

| | SiH$_4$ Flow rate (sccm) | Si$_2$H$_6$ Flow rate (sccm) | CH$_4$ Flow rate (sccm) | GeH$_4$ Flow rate (sccm) | H$_2$ Flow rate (sccm) | PH$_3$/H$_2$ Flow rate (sccm) | B$_2$H$_6$/H$_2$ Flow rate (sccm) | SiH$_4$/H$_2$ Flow rate (sccm) | Pressure (Torr) | MW power (W/cm$^2$) | RF power (W/cm$^2$) | Base member temp. (°C.) | Layer thickness (nm) |
|---|---|---|---|---|---|---|---|---|---|---|---|---|---|
| RF n-type layer: (203) | 2.0 | — | — | — | 100 | 220 | — | — | 1.3 | — | 0.05 | 350 | 20 |
| RF i-type layer: (251) | — | 7.0 | — | — | 180 | — | — | — | 0.8 | — | 0.008 | 300 | 10 |
| MW i-type layer: (204) | 78 | — | — | 78 | 420 | — | — | — | 0.011 | 0.11 | 0.32 | 370 | 100 |
| RF i-type layer: (261) | — | 7.0 | — | — | 185 | — | — | — | 0.55 | — | 0.008 | 300 | 23 |
| RF p-type layer: (205) | — | — | 0.1 | — | 80 | — | 9 | 2 | 1.8 | — | 0.07 | 300 | 10 |
| RF n-type layer: (206) | 1.1 | — | — | — | 30 | 290 | — | — | 1.2 | — | 0.04 | 300 | 10 |
| RF i-type layer: (252) | — | 7.0 | — | — | 190 | — | — | — | 0.75 | — | 0.008 | 300 | 10 |
| MW i-type layer: (207) | 62 | — | — | 57 | 380 | — | — | — | 0.010 | 0.11 | 0.3 | 350 | 98 |
| RF i-type layer: (262) | — | 7.5 | — | — | 90 | — | — | — | 0.7 | — | 0.008 | 280 | 23 |
| RF p-type layer: (208) | — | — | 0.2 | — | 80 | — | 9 | 2 | 1.7 | — | 0.07 | 260 | 10 |
| RF n-type layer: (209) | 0.8 | — | — | — | 50 | 250 | — | — | 1.05 | — | 0.04 | 230 | 10 |
| RF i-type layer: (210) | — | 7.0 | — | — | 320 | — | — | — | 0.7 | — | 0.007 | 190 | 90 |
| RF p-type layer: (211) | — | — | 0.4 | — | 90 | — | 8 | 2 | 1.6 | — | 0.07 | 170 | 10 |

TABLE E29

| | Intermediate layer: ZnO—Fe (metal concentration: %) | | | | | | | |
|---|---|---|---|---|---|---|---|---|
| | 0.0001 | 0.0007 | 0.001 | 0.01 | 0.1 | 1 | 2 | 10 |
| Environmental resistance bending peel test: | A | A | A | A | A | A | A | B |
| Photoelectric conversion efficiency | A | A | A | A | A | A | A | C |
| Short-circuit current: | B | B | A | A | A | A | B | B |
| Photoelectric conversion efficiency after photo-deterioration: | A | A | A | A | A | A | A | B |

EXAMPLE E15

In the present Example, using ZnO—Ni as the target used to form the intermediate layer, the concentration of Ni was changed in the range of from 0.0001% to 10% to examine how it affects the initial photoelectric conversion characteristics and so forth in photovoltaic devices obtained.

In the present Example, triple type photovoltaic devices having the structure as shown in FIG. 4 were produced in the same manner as in Example E8 except that the photovoltaic device base member was formed under conditions shown in Table E30 and the semiconductor layers were formed under conditions shown in Table E31, using the apparatus for continuously forming the photovoltaic device base member as shown in FIG. 8 and the apparatus for continuously forming the photovoltaic device semiconductor layers as shown in FIG. 10. Stated specifically, eight samples having different Ni concentrations in the target used to form the intermediate layer were prepared.

In respect of the samples of the photovoltaic device thus obtained, environmental resistance, characteristics of initial photoelectric conversion efficiency and photo-deterioration characteristics were evaluated in the same manner as in Example E8 to obtain the results as shown in Table E32.

The results of evaluation on the bending peel test, photoelectric conversion efficiency, short-circuit current and photo-deterioration characteristics as shown in Table E32 are indicated by standardizing the results obtained for the photovoltaic device produced in this example, on the basis of the measurement results of the sample obtained when the Ni contained in ZnO in the target used to form the intermediate layer is in a concentration of 0.0001%. In the table, "C" indicates 1.0 or more to less than 1.4; "B", 1.4 or more to less than 1.8; and "A", 1.8 or more.

As is seen from the results shown in Table E32, in the target used to form the intermediate layer at the time of the formation of the photovoltaic device base member, the concentration of the Ni contained in ZnO is preferably in the range of from 0.001% to 1% in view of the bending peel test (environmental resistance), the photoelectric conversion efficiency, the short-circuit current and the photo-deterioration characteristics.

TABLE E30

Photovoltaic device base member forming conditions (Example E15; apparatus used: FIG. 8)

| | Intermediate layer: ZnO—Ni | Light-reflecting layer: Ag | Reflection enhancing layer: ZnO |
|---|---|---|---|
| Temp. rise rate: (°C./sec.) | 38 | 15 | 15 |
| Substrate temp.: (°C.) | 250 | 290 | 320 |
| Ar gas flow rate: (sccm) | 35 | 30 | 35 |
| Pressure: (mTorr) | 3 | 3 | 4 |
| Target species: | ZnO—Ni | Ag | ZnO |

TABLE E30-continued

Photovoltaic device base member forming conditions
(Example E15; apparatus used: FIG. 8)

|  | Intermediate layer: ZnO—Ni | Light-reflecting layer: Ag | Reflection enhancing layer: ZnO |
|---|---|---|---|
| (metal conc.: %) | (0.0001–10) | | |
| Type of sputtering: | DC | DC | DC |
| Sputter voltage: (V) | 375 | 380 | 390 |
| Layer thickness: ($\mu$m) | 0.011 | 0.7 | 1.2 |
| Substrate cooling gas: | He | $H_2$ | He |
| Temp. drop rate: (°C./sec.) | 35 | 50 | 50 | changed in the range of from 0.0001% to 10% to examine how it affects the initial photoelectric conversion characteristics and so forth in photovoltaic devices obtained.

In the present Example, triple type photovoltaic devices having the structure as shown in FIG. 4 were produced in the same manner as in Example E8 except that the photovoltaic device base member was formed under conditions shown in Table E33 and the semiconductor layers were formed under conditions shown in Table E34, using the apparatus for continuously forming the photovoltaic device base member as shown in FIG. 8 and the apparatus for continuously forming the photovoltaic device semiconductor layers as shown in FIG. 10. Stated specifically, eight samples having different Cr concentrations in the target used to form the intermediate layer were prepared.

TABLE E31

|  | $SiH_4$ Flow rate (sccm) | $Si_2H_6$ Flow rate (sccm) | $CH_4$ Flow rate (sccm) | $GeH_4$ Flow rate (sccm) | $H_2$ Flow rate (sccm) | $PH_3/H_2$ Flow rate (sccm) | $B_2H_6/H_2$ Flow rate (sccm) | $SiH_4/H_2$ Flow rate (sccm) | Pressure (Torr) | MW power (W/cm$^2$) | RF power (W/cm$^2$) | Base member temp. (°C.) | Layer thickness (nm) |
|---|---|---|---|---|---|---|---|---|---|---|---|---|---|
| RF n-type layer: (203) | 2.0 | — | — | — | 100 | 220 | — | — | 1.3 | — | 0.05 | 350 | 20 |
| RF i-type layer: (251) | — | 7.0 | — | — | 180 | — | — | — | 0.8 | — | 0.008 | 300 | 10 |
| MW i-type layer: (204) | 66 | — | — | 68 | 320 | — | — | — | 0.011 | 0.11 | 0.32 | 370 | 100 |
| RF i-type layer: (261) | — | 7.0 | — | — | 180 | — | — | — | 0.55 | — | 0.008 | 300 | 23 |
| RF p-type layer: (205) | — | — | 0.1 | — | 80 | — | 9 | 2 | 1.8 | — | 0.07 | 300 | 10 |
| RF n-type layer: (206) | 1.1 | — | — | — | 30 | 290 | — | — | 1.2 | — | 0.04 | 300 | 10 |
| RF i-type layer: (252) | — | 7.0 | — | — | 190 | — | — | — | 0.75 | — | 0.008 | 300 | 10 |
| MW i-type layer: (207) | 52 | — | — | 47 | 320 | — | — | — | 0.010 | 0.11 | 0.3 | 350 | 98 |
| RF i-type layer: (262) | — | 7.5 | — | — | 90 | — | — | — | 0.7 | — | 0.008 | 280 | 23 |
| RF p-type layer: (208) | — | — | 0.2 | — | 80 | — | 9 | 2 | 1.7 | — | 0.07 | 260 | 10 |
| RF n-type layer: (209) | 0.8 | — | — | — | 50 | 250 | — | — | 1.05 | — | 0.04 | 230 | 10 |
| RF i-type layer: (210) | — | 7.0 | — | — | 200 | — | — | — | 0.7 | — | 0.007 | 190 | 90 |
| RF p-type layer: (211) | — | — | 0.4 | — | 90 | — | 8 | 2 | 1.6 | — | 0.07 | 170 | 10 |

TABLE E32

Intermediate layer: ZnO—Fe
(metal concentration: %)

|  | 0.0001 | 0.0007 | 0.001 | 0.01 | 0.1 | 1 | 2 | 10 |
|---|---|---|---|---|---|---|---|---|
| Environmental resistance bending peel test: | A | A | A | A | A | A | B | B |
| Photoelectric conversion efficiency: | A | A | A | A | A | A | A | C |
| Short-circuit current: | B | B | A | A | A | A | B | B |
| Photoelectric conversion efficiency after photodeterioration: | A | A | A | A | A | A | A | B |

EXAMPLE E16

In the present Example, using ZnO—Cr as the target used to form the intermediate layer, the concentration of Cr was In respect of the samples of the photovoltaic device thus obtained, environmental resistance, characteristics of initial photoelectric conversion efficiency and photo-deterioration characteristics were evaluated in the same manner as in Example E8 to obtain the results as shown in Table E35.

The results of evaluation on the bending peel test, photoelectric conversion efficiency, short-circuit current and photo-deterioration characteristics as shown in Table E35 are indicated by standardizing the results obtained for the photovoltaic device produced in this example, on the basis of the measurement results of the sample obtained when the Cr contained in ZnO in the target used to form the intermediate layer is in a concentration of 0.0001%. In the table, "C" indicates 1.0 or more to less than 1.4; "B", 1.4 or more to less than 1.8; and "A", 1.8 or more.

As is seen from the results shown in Table E35, in the target used to form the intermediate layer at the time of the formation of the photovoltaic device base member, the concentration of the Cr contained in ZnO is preferably in the range of from 0.001% to 1% in view of the bending peel test (environmental resistance), the photoelectric conversion efficiency, the short-circuit current and the photo-deterioration characteristics.

TABLE E33

Photovoltaic device base member forming conditions
(Example E16; apparatus used: FIG. 8)

|  | Intermediate layer: ZnO—Cr | Light-reflecting layer: Ag | Reflection enhancing layer: ZnO |
|---|---|---|---|
| Temp. rise rate: (°C./sec.) | 40 | 15 | 15 |
| Substrate temp.: (°C.) | 230 | 290 | 320 |
| Ar gas flow rate: (sccm) | 35 | 35 | 50 |
| Pressure: (mTorr) | 3 | 3 | 4 |
| Target species: (metal conc.: %) | ZnO—Cr (0.0001–10) | Ag | ZnO |
| Type of sputtering: | DC | DC | DC |
| Sputter voltage: (V) | 370 | 380 | 390 |
| Layer thickness: ($\mu$m) | 0.010 | 0.7 | 1.1 |
| Substrate cooling gas: | He | $H_2$ | He |
| Temp. drop rate: (°C./sec.) | 40 | 50 | 40 |

TABLE E34

| | $SiH_4$ Flow rate (sccm) | $Si_2H_6$ Flow rate (sccm) | $CH_4$ Flow rate (sccm) | $GeH_4$ Flow rate (sccm) | $H_2$ Flow rate (sccm) | $PH_3/H_2$ Flow rate (sccm) | $B_2H_6/H_2$ Flow rate (sccm) | $SiH_4/H_2$ Flow rate (sccm) | Pressure (Torr) | MW power (W/cm$^2$) | RF power (W/cm$^2$) | Base member temp. (°C.) | Layer thickness (nm) |
|---|---|---|---|---|---|---|---|---|---|---|---|---|---|
| RF n-type layer: (203) | 2.0 | — | — | — | 100 | 220 | — | — | 1.3 | — | 0.05 | 350 | 20 |
| RF i-type layer: (251) | — | 7.0 | — | — | 180 | — | — | — | 0.8 | — | 0.008 | 300 | 10 |
| MW i-type layer: (204) | 65 | — | — | 68 | 330 | — | — | — | 0.010 | 0.11 | 0.32 | 370 | 100 |
| RF i-type layer: (261) | — | 7.0 | — | — | 180 | — | — | — | 0.55 | — | 0.008 | 300 | 23 |
| RF p-type layer: (205) | — | — | 0.1 | — | 80 | — | 9 | 2 | 1.8 | — | 0.07 | 300 | 10 |
| RF n-type layer: (206) | 1.1 | — | — | — | 30 | 290 | — | — | 1.2 | — | 0.04 | 300 | 10 |
| RF i-type layer: (252) | — | 7.0 | — | — | 190 | — | — | — | 0.75 | — | 0.008 | 300 | 10 |
| MW i-type layer: (207) | 52 | — | — | 45 | 350 | — | — | — | 0.010 | 0.11 | 0.3 | 350 | 98 |
| RF i-type layer: (262) | — | 7.5 | — | — | 90 | — | — | — | 0.7 | — | 0.008 | 280 | 23 |
| RF p-type layer: (208) | — | — | 0.2 | — | 80 | — | 9 | 2 | 1.7 | — | 0.07 | 260 | 10 |
| RF n-type layer: (209) | 0.8 | — | — | — | 50 | 250 | — | — | 1.05 | — | 0.04 | 230 | 10 |
| RF i-type layer: (210) | — | 7.0 | — | — | 200 | — | — | — | 0.7 | — | 0.007 | 190 | 90 |
| RF p-type layer: (211) | — | — | 0.4 | — | 90 | — | 8 | 2 | 1.6 | — | 0.07 | 170 | 10 |

TABLE E35

Intermediate layer: ZnO—Cr (metal concentration: %)

| | 0.0001 | 0.0007 | 0.001 | 0.01 | 0.1 | 1 | 2 | 10 |
|---|---|---|---|---|---|---|---|---|
| Environmental resistance bending peel test: | A | A | A | A | A | A | B | B |
| Photoelectric conversion efficiency: | A | A | A | A | A | A | A | C |
| Short-circuit current: | B | B | A | A | A | A | A | B |
| Photoelectric conversion efficiency after photodeterioration: | A | A | A | A | A | A | A | B |

EXAMPLE E17

In the present Example, using ZnO—Cu as the target used to form the intermediate layer, the concentration of Cu was changed in the range of from 0.0001% to 10% to examine how it affects the initial photoelectric conversion characteristics and so forth in photovoltaic devices obtained.

In the present Example, triple type photovoltaic devices having the structure as shown in FIG. 4 were produced in the same manner as in Example E8 except that the photovoltaic device base member was formed under conditions shown in Table E36 and the semiconductor layers were formed under conditions shown in Table E37, using the apparatus for continuously forming the photovoltaic device base member as shown in FIG. 8 and the apparatus for continuously forming the photovoltaic device semiconductor layers as shown in FIG. 10. Stated specifically, eight samples having different Cu concentrations in the target used to form the intermediate layer were prepared.

In respect of the samples of the photovoltaic device thus obtained, environmental resistance, characteristics of initial photoelectric conversion efficiency and photo-deterioration characteristics were evaluated in the same manner as in Example E8 to obtain the results as shown in Table E38.

The results of evaluation on the bending peel test, photoelectric conversion efficiency, short-circuit current and photo-deterioration characteristics as shown in Table E38 are indicated by standardizing the results obtained for the photovoltaic device produced in this example, on the basis of the measurement results of the sample obtained when the Cu contained in ZnO in the target used to form the intermediate layer is in a concentration of 0.0001%. In the table, "C" indicates 1.0 or more to less than 1.4; "B", 1.4 or more to less than 1.8; and "A", 1.8 or more.

As is seen from the results shown in Table E38, in the target used to form the intermediate layer at the time of the formation of the photovoltaic device base member, the concentration of the Cu contained in ZnO is preferably in the range of from 0.001% to 1% in view of the bending peel test (environmental resistance), the photoelectric conversion efficiency, the short-circuit current and the photo-deterioration characteristics.

TABLE E36

Photovoltaic device base member forming conditions
(Example E17; apparatus used: FIG. 8)

|  | Intermediate layer: ZnO—Cr | Light-reflecting layer: Ag | Reflection enhancing layer: ZnO |
|---|---|---|---|
| Temp. rise rate: (°C./sec.) | 35 | 15 | 15 |
| Substrate temp.: (°C.) | 260 | 290 | 320 |
| Ar gas flow rate: (sccm) | 40 | 35 | 50 |
| Pressure: (mTorr) | 4 | 3 | 4 |
| Target species: (metal conc.: %) | ZnO—Cu (0.0001–10) | Ag | ZnO |
| Type of sputtering: | DC | DC | DC |
| Sputter voltage: (V) | 375 | 380 | 390 |
| Layer thickness: (μm) | 0.010 | 0.7 | 1.1 |
| Substrate cooling gas: | He | $H_2$ | He |
| Temp. drop rate: (°C./sec.) | 40 | 50 | 40 |

TABLE E38

Intermediate layer: ZnO—Cu (metal concentration: %)

|  | 0.0001 | 0.0007 | 0.001 | 0.01 | 0.1 | 1 | 2 | 10 |
|---|---|---|---|---|---|---|---|---|
| Environmental resistance bending peel test: | A | A | A | A | A | A | B | B |
| Photoelectric conversion efficiency: | A | A | A | A | A | A | A | B |
| Short-circuit current: | B | B | A | A | A | A | B | C |
| Photoelectric conversion efficiency after photodeterioration: | A | A | A | A | A | A | A | B |

EXAMPLE E18

This example is different from Example E8 in that ZnO—Cu (99.6:0.4) was used as the target to form the reflection enhancing layer when the photovoltaic device base member was produced. ZnO—Ag—Fe—Ni (99.1:0.3:0.3:0.3) was used as the target to form the intermediate layer, and Ag was used as the target to form the light-reflecting layer. Except these points, the procedure of Example E8 was repeated using this photovoltaic device base member, to produce a photovoltaic device to examine its initial photoelectric conversion characteristics and so forth.

In the present Example, too, like Example E8, the triple type photovoltaic device as shown in FIG. 4 was produced using the apparatus employing a roll-to-roll system as shown in FIGS. 8 and 10.

TABLE E37

|  | $SiH_4$ Flow rate (sccm) | $Si_2H_6$ Flow rate (sccm) | $CH_4$ Flow rate (sccm) | $GeH_4$ Flow rate (sccm) | $H_2$ Flow rate (sccm) | $PH_3/H_2$ Flow rate (sccm) | $B_2H_6/H_2$ Flow rate (sccm) | $SiH_4/H_2$ Flow rate (sccm) | Pressure (Torr) | MW power (W/cm²) | RF power (W/cm²) | Base member temp. (°C.) | Layer thickness (nm) |
|---|---|---|---|---|---|---|---|---|---|---|---|---|---|
| RF n-type layer: (203) | 2.0 | — | — | — | 100 | 220 | — | — | 1.3 | — | 0.05 | 350 | 20 |
| RF i-type layer: (251) | — | 7.0 | — | — | 180 | — | — | — | 0.8 | — | 0.008 | 300 | 10 |
| MW i-type layer: (204) | 75 | — | — | 78 | 300 | — | — | — | 0.010 | 0.11 | 0.32 | 370 | 100 |
| RFi-type layer: (261) | — | 7.0 | — | — | 180 | — | — | — | 0.55 | — | 0.008 | 300 | 23 |
| RF p-type layer: (205) | — | — | 0.1 | — | 80 | — | 9 | 2 | 1.8 | — | 0.07 | 300 | 10 |
| RF n-type layer: (206) | 1.1 | — | — | — | 30 | 290 | — | — | 1.2 | — | 0.04 | 300 | 10 |
| RF i-type layer: (252) | — | 7.0 | — | — | 190 | — | — | — | 0.75 | — | 0.008 | 300 | 10 |
| MW i-type layer: (207) | 62 | — | — | 65 | 300 | — | — | — | 0.010 | 0.10 | 0.3 | 350 | 98 |
| RF i-type layer: (262) | — | 7.5 | — | — | 90 | — | — | — | 0.7 | — | 0.008 | 280 | 23 |
| RF p-type layer: (208) | — | — | 0.2 | — | 80 | — | 9 | 2 | 1.7 | — | 0.07 | 260 | 10 |
| RF n-type layer: (209) | 0.8 | — | — | — | 50 | 250 | — | — | 1.05 | — | 0.04 | 230 | 10 |
| RF i-type layer: (210) | — | 7.0 | — | — | 200 | — | — | — | 0.7 | — | 0.007 | 190 | 90 |
| RF p-type layer: (211) | — | — | 0.4 | — | 90 | — | 8 | 2 | 1.6 | — | 0.07 | 170 | 10 |

As the substrate, a belt-like stainless steel sheet of 300 m long, 30 cm wide and 0.2 mm thick was used.

The process of forming the photovoltaic device base member will be described below in detail with reference to FIG. 8.

The apparatus for continuously forming the photovoltaic device base member as shown in FIG. 8 is successively provided with the substrate feed-out chamber 3610, a plurality of deposition chambers 3611 to 3614 and the substrate wind-up chamber 3684, which are connected through separating paths 3615, 3616, 3617, 3618 and 3619 between them. Each deposition chamber has an exhaust vent, through which the inside thereof can be evacuated.

The belt-like substrate 3621 is passed through these deposition chambers and separating paths after it is sent out of the substrate feed-out chamber, and is wound up in the substrate wind-up chamber. At the same time, the apparatus is so designed that gases can be fed into the respective deposition chambers and separating paths through their gas inlets, gases can be drawn out through the respective exhaust vents and the respective layers can be formed.

The intermediate layer of ZnO—Ag—Fe—Ni (99.1:0.3:0.3:0.3) is formed in the deposition chamber 3612, the light-reflecting layer of Ag in the deposition chamber 3613, and the reflection enhancing layer of ZnO—Cu (99.6:0.4) in the deposition chamber 3614. The deposition chambers are respectively provided in their insides with the halogen lamp heaters 3640, 3641, 3642 and 3643 for heating the substrate on the back thereof, and the substrate is temperature-raised or heated to the stated temperature in each deposition chamber. The separating paths 3617, 3618 and 3619 have also the function to lower temperature as described in Example E8.

In the deposition chamber 3612, DC magnetron sputtering is carried out, in which Ar gas is fed into the chamber through the gas inlet 3632 and ZnO—Ag—Fe—Ni (99.1:0.3:0.3:0.3) is used as the target 3650.

In the deposition chamber 3613, DC magnetron sputtering is carried out, in which Ar gas is fed into the chamber through the gas inlet 3634 and Ag is used as the target 3660. In the deposition chamber 3614, DC magnetron sputtering or RF magnetron sputtering is carried out, in which Ar gas is fed into the chamber through the gas inlet 3636 and ZnO—Cu (99.6:0.4) is used as the target 3670.

After the photovoltaic device base member is formed on the belt substrate under conditions shown in Table E39, the substrate (formed into the base member) is wound up in the substrate wind-up chamber 3684.

The process of producing the photovoltaic device will be described below with reference to FIG. 10.

The triple type photovoltaic device having the layer configuration as shown in FIG. 4 was produced under conditions as shown in Table E40 below, using the apparatus employing a roll-to-roll system as shown in FIG. 10.

The belt base member comprising the photovoltaic device base member obtained in the manner as described above was set in the load chamber 5010 for introducing the belt base member. This belt base member was passed through all the deposition chambers and all the gas gates and connected to the belt base member wind-up jig in the unload chamber 5150. The respective deposition chambers were evacuated to $10^{-3}$ Torr or below by means of an exhaust system (not shown). The desired materials gases were fed into the respective deposition chambers from the deposited film forming mixing systems 5024, 5034, 5044, 5054, 5064, 5074, 5084, 5094, 5104, 5114, 5124, 5134 and 5144. To the gas gates 5201, 5202, 5203, 5204, 5205, 5206, 5207, 5208, 5209, 5210, 5211, 5212, 5213 and 5214, gas was fed from the respective gate gas feeding system. The base member was heated by means of the base member heater in each deposition system, and the degree of vacuum was controlled by adjusting the opening of the exhaust valve of each exhaust system. After the base member temperature and degree of vacuum became stable, the belt base member was begun to be transported, and RF power or MW (frequency: 2.45 GHz) power for generating plasma was supplied to each deposition chamber. In this way, the triple type photovoltaic device having three pin structures as shown in FIG. 4, which were superposingly formed on the belt base member 290 (corresponding to 5401 in FIG. 10, 3621 in FIG. 8), was formed.

Next, on the RF p-type layer 211, ITO was deposited by vacuum deposition in a layer thickness of 70 nm as the transparent conductive layer 212.

Next, on the transparent conductive layer 212, a mask with a comb-shaped opening was placed, and the comb-shaped collector electrode 213 with a flat structure, comprised of Cr(40 nm)/Ag(1,000 nm)/Cr(40 nm) was deposited by vacuum deposition.

Thus, the fabrication of the photovoltaic device of the present Example was completed. This photovoltaic device is herein called SCE18. Conditions for forming the photovoltaic device base member in the present Example are shown in Table E39. Conditions for forming the respective semiconductor layers RF n-type layers, RF i-type layers, MW i-type layers and RF p-type layers are shown in Table E40.

TABLE E39

Photovoltaic device base member forming conditions
(Example E18; apparatus used: FIG. 8)

|  | Intermediate layer: ZnO—Ag—Fe—Ni (99.1:0.3:0.3:0.3) | Light-reflecting layer: Ag | Reflection enhancing layer: ZnO—Cu* *(99.6:0.4) |
|---|---|---|---|
| Temp. rise rate: (°C./sec.) | 20 | 15 | 15 |
| Substrate temp.: (°C.) | 280 | 290 | 300 |
| Ar gas flow rate: (sccm) | 35 | 30 | 38 |
| Pressure: (mTorr) | 3 | 3 | 4 |
| Target species: | ZnO—Ag—Fe—Ni (99.1:0.3:0.3:0.3) | Ag | ZnO—Cu (99.6:0.4) |
| Type of sputtering: | DC | DC | DC |
| Sputter voltage: (V) | 370 | 380 | 385 |
| Layer thickness: (μm) | 0.01 | 0.62 | 1.2 |
| Substrate cooling gas: | He | $H_2$ | He |
| Temp. drop rate: (°C./sec.) | 10 | 10 | 15 |

TABLE E40

|  | SiH$_4$ Flow rate (sccm) | Si$_2$H$_6$ Flow rate (sccm) | CH$_4$ Flow rate (sccm) | GeH$_4$ Flow rate (sccm) | H$_2$ Flow rate (sccm) | PH$_3$/H$_2$ Flow rate (sccm) | B$_2$H$_6$/H$_2$ Flow rate (sccm) | SiH$_4$/H$_2$ Flow rate (sccm) | Pressure (Torr) | MW power (W/cm$^2$) | RF power (W/cm$^2$) | Base member temp. (°C.) | Layer thickness (nm) |
|---|---|---|---|---|---|---|---|---|---|---|---|---|---|
| RF n-type layer: (203) | 2.0 | — | — | — | 100 | 220 | — | — | 1.3 | — | 0.05 | 350 | 20 |
| RF i-type layer: (251) | — | 7.0 | — | — | 100 | — | — | — | 0.8 | — | 0.008 | 300 | 10 |
| MW i-type layer: (204) | 78 | — | — | 78 | 400 | — | — | — | 0.011 | 0.11 | 0.32 | 370 | 100 |
| RF i-type layer: (261) | — | 7.0 | — | — | 105 | — | — | — | 0.55 | — | 0.008 | 300 | 23 |
| RF p-type layer: (205) | — | — | 0.1 | — | 80 | — | 9 | 2 | 1.8 | — | 0.07 | 300 | 10 |
| RF n-type layer: (206) | 1.1 | — | — | — | 30 | 290 | — | — | 1.2 | — | 0.04 | 300 | 10 |
| RF i-type layer: (252) | — | 7.0 | — | — | 90 | — | — | — | 0.75 | — | 0.008 | 300 | 10 |
| MW i-type layer: (207) | 65 | — | — | 57 | 400 | — | — | — | 0.010 | 0.11 | 0.3 | 350 | 98 |
| RF i-type layer: (262) | — | 7.5 | — | — | 90 | — | — | — | 0.7 | — | 0.008 | 280 | 23 |
| RF p-type layer: (208) | — | — | 0.2 | — | 80 | — | 9 | 2 | 1.7 | — | 0.07 | 260 | 10 |
| RF n-type layer: (209) | 0.8 | — | — | — | 50 | 250 | — | — | 1.05 | — | 0.04 | 230 | 10 |
| RF i-type layer: (210) | — | 7.0 | — | — | 420 | — | — | — | 0.7 | — | 0.007 | 190 | 90 |
| RF p-type layer: (211) | — | — | 0.4 | — | 90 | — | 8 | 2 | 1.6 | — | 0.07 | 170 | 10 |

Reference Example E18-1

This example is different from Example E18 in that the intermediate layer 299 of ZnO—Ag—Fe—Ni (99.1:0.3:0.3:0.3) was not formed on the substrate and, after the light-reflecting layer 201 of Ag was formed, the reflection enhancing layer 202 of ZnO—Cu (99.6:0.4) was formed without the step of lowering the substrate temperature to 100° C. or below. Except for these points, the procedure of Example E18 was repeated to produce photovoltaic devices as shown in FIG. 4. Samples of the photovoltaic device of this example are called "SCE18-1".

For every two kinds of the samples of the photovoltaic device, i.e., SCE18 and SCE18-1, seven samples were prepared. In respect of these samples of the photovoltaic device, a bending peel test was carried out in the same manner as as described below, to examine their environmental resistance. Characteristics of initial photoelectric conversion efficiency (photoelectromotive force/incident light intensity) (in respect of photoelectric conversion efficiency and short-circuit current) were evaluated in the same manner as in Example A1. Photo-deterioration characteristics were also evaluated in the manner as described below. The results obtained are shown together in Table E41.

The bending peel test was carried out in the following way: The respective photovoltaic devices were left to stand for 310 hours in an environment of a high-temperature and high-humidity atmosphere (temperature: 85° C.; humidity: 85% RH), and thereafter put to a bending test repeated thirty times. In addition, to the part thus bended, a weight of 10 kg was dropped fourteen times at a height of 50 cm, and any peeling in the device was observed using a scanning electron microscope (SEM), manufactured by Hitachi Ltd. (model: S-4500; magnifications: 50,000×).

To examine the photo-deterioration characteristics, photoelectric conversion efficiency was evaluated after photovoltaic devices having a temperature of 54° C. was irradiated by light for 1,350 hours under 1 sun of 100 mW/cm$^2$.

In the results of the bending peel test, shown in Table E41, letter symbol "A" indicates an instance where no peeling occurs at all, and "C" an instance where peeling partly occurs. The results of evaluation on the characteristics of initial photoelectric conversion efficiency and photo-deterioration characteristics also shown in Table E41 are indicated by standardizing the results of the photovoltaic device SCE18-1 on the basis of the results of the photovoltaic device SCE18 which are regarded as 1.

TABLE E41

| Sample | Bending peel test | Total reflectance | Scattered reflectance | Photo-deterioration characteristics |
|---|---|---|---|---|
| SCE18 | A | 1.00 | 1.00 | 1.00 |
| SCE18-1 | C | 0.82 | 0.90 | 0.91 |

As is seen from the results shown in Table E41, the photovoltaic device SCE18 obtained in Example E18 by the process of the present invention is superior to the photovoltaic devices SCE18-1 of Reference Example E18-1 in all the environmental resistance, characteristics of initial photoelectric conversion efficiency and photo-deterioration characteristics at the same time.

EXAMPLE E19

This example is different from Example E8 in that ZnO—Cu—Fe—Cr (99.1:0.3:0.3:0.3) was used as the target to form the intermediate layer and ZnO—Fe—Ni (99.4:0.3:0.3) was used as the target to form the reflection enhancing layer when the photovoltaic device base member was produced. Ag was used as the target to form the light-reflecting layer. Except these points, the procedure of Example E8 was repeated using this photovoltaic device base member, to produce a photovoltaic device to examine its initial photoelectric conversion characteristics and so forth.

In the present Example, too, like Example E8, the triple type photovoltaic device as shown in FIG. 4 was produced using the apparatus employing a roll-to-roll system as shown in FIGS. 8 and 10.

As the substrate, a belt-like stainless steel sheet of 300 m long, 30 cm wide and 0.2 mm thick was used.

The process of forming the photovoltaic device base member will be described below in detail with reference to FIG. 8.

The apparatus for continuously forming the photovoltaic device base member as shown in FIG. 8 is successively provided with the substrate feed-out chamber 3610, a plurality of deposition chambers 3611 to 3614 and the substrate wind-up chamber 3684, which are connected through separating paths 3615, 3616, 3617, 3618 and 3619 between them. Each deposition chamber has an exhaust vent, through which the inside thereof can be evacuated.

The belt-like substrate 3621 is passed through these deposition chambers and separating paths after it is sent out of the substrate feed-out chamber, and is wound up in the substrate wind-up chamber. At the same time, the apparatus is so designed that gases can be fed into the respective deposition chambers and separating paths through their gas inlets, gases can be drawn out through the respective exhaust vents and the respective layers can be formed.

The intermediate layer of ZnO—Cu—Fe—Cr (99.1:0.3:0.3:0.3) is formed in the deposition chamber 3612, the light-reflecting layer of Ag in the deposition chamber 3613, and the reflection enhancing layer of ZnO—Fe—Ni (99.4:0.3:0.3) in the deposition chamber 3614. The deposition chambers are respectively provided in their insides with the halogen lamp heaters 3640, 3641, 3642 and 3643 for heating the substrate on the back thereof, and the substrate is temperature-raised or heated to the stated temperature in each deposition chamber. The separating paths 3617, 3618 and 3619 have also the function to lower temperature as described in Example E8.

In the deposition chamber 3612, DC magnetron sputtering is carried out, in which Ar gas is fed into the chamber through the gas inlet 3632 and ZnO—Cu—Fe—Cr (99.1:0.3:0.3:0.3) is used as the target 3650.

In the deposition chamber 3613, DC magnetron sputtering is carried out, in which Ar gas is fed into the chamber through the gas inlet 3634 and Ag is used as the target 3660. In the deposition chamber 3614, DC magnetron sputtering or RF magnetron sputtering is carried out, in which Ar gas is fed into the chamber through the gas inlet 3636 and ZnO—Fe—Ni (99.4:0.3:0.3) is used as the target 3670.

After the photovoltaic device base member is formed on the belt substrate under conditions shown in Table E42, the substrate (formed into the base member) is wound up in the substrate wind-up chamber 3684.

The process of producing the photovoltaic device will be described below with reference to FIG. 10.

The triple type photovoltaic device having the layer configuration as shown in FIG. 4 was produced under conditions as shown in Table E43 below, using the apparatus employing a roll-to-roll system as shown in FIG. 10.

The belt base member comprising the photovoltaic device base member obtained in the manner as described above was set in the load chamber 5010 for introducing the belt base member. This belt base member was passed through all the deposition chambers and all the gas gates and connected to the belt base member wind-up jig in the unload chamber 5150. The respective deposition chambers were evacuated to $10^{-3}$ Torr or below by means of an exhaust system (not shown). The desired materials gases were fed into the respective deposition chambers from the deposited film forming mixing systems 5024, 5034, 5044, 5054, 5064, 5074, 5084, 5094, 5104, 5114, 5124, 5134 and 5144. To the gas gates 5201, 5202, 5203, 5204, 5205, 5206, 5207, 5208, 5209, 5210, 5211, 5212, 5213 and 5214, gas was fed from the respective gate gas feeding system. The base member was heated by means of the base member heater in each deposition system, and the degree of vacuum was controlled by adjusting the opening of the exhaust valve of each exhaust system. After the base member temperature and degree of vacuum became stable, the belt base member was begun to be transported, and RF power or MW (frequency: 2.45 GHz) power for generating plasma was supplied to each deposition chamber. In this way, the triple type photovoltaic device having three pin structures as shown in FIG. 4, which were superposingly formed on the belt base member 290 (corresponding to 5401 in FIG. 10, 3621 in FIG. 8), was formed.

Next, on the RF p-type layer 211, ITO was deposited by vacuum deposition in a layer thickness of 70 nm as the transparent conductive layer 212.

Next, on the transparent conductive layer 212, a mask with a comb-shaped opening was placed, and the comb-shaped collector electrode 213 with a flat structure, comprised of Cr(40 nm)/Ag(1,000 nm)/Cr(40 nm) was deposited by vacuum deposition.

Thus, the fabrication of the photovoltaic device of the present Example was completed. This photovoltaic device is herein called SCE19. Conditions for forming the photovoltaic device base member in the present Example are shown in Table E42. Conditions for forming the respective semiconductor layers RF n-type layers, RF i-type layers, MW i-type layers and RF p-type layers are shown in Table E43.

TABLE E42

Photovoltaic device base member forming conditions (Example E18; apparatus used: FIG. 8)

| | Intermediate layer: ZnO—Ag—Fe—Cr (99.1:0.3:0.3:0.3) | Light-reflecting layer: Ag | Reflection enhancing layer: ZnO——Fe—Ni* *(99.4:0.3:0.3) |
|---|---|---|---|
| Temp. rise rate: (°C./sec.) | 20 | 15 | 13 |
| Substrate temp.: (°C.) | 280 | 280 | 310 |
| Ar gas flow rate: (sccm) | 35 | 30 | 45 |
| Pressure: (mTorr) | 3 | 3 | 4 |
| Target species: | ZnO—Cu—Fe—Cr (99.1:0.3:0.3:0.3) | Ag | ZnO—Fe—Ni (99.4:0.3:0.3) |
| Type of sputtering: | DC | DC | DC |
| Sputter voltage: (V) | 370 | 380 | 380 |
| Layer thickness: ($\mu$m) | 0.01 | 0.62 | 1.2 |
| Substrate cooling gas: | He | $H_2$ | He |
| Temp. drop rate: (°C./sec.) | 10 | 10 | 18 |

TABLE E43

| | SiH$_4$ Flow rate (sccm) | Si$_2$H$_6$ Flow rate (sccm) | CH$_4$ Flow rate (sccm) | GeH$_4$ Flow rate (sccm) | H$_2$ Flow rate (sccm) | PH$_3$/H$_2$ Flow rate (sccm) | B$_2$H$_6$/H$_2$ Flow rate (sccm) | SiH$_4$/H$_2$ Flow rate (sccm) | Pressure (Torr) | MW power (W/cm$^2$) | RF power (W/cm$^2$) | Base member temp. (°C.) | Layer thickness (nm) |
|---|---|---|---|---|---|---|---|---|---|---|---|---|---|
| RF n-type layer: (203) | 2.0 | — | — | — | 100 | 220 | — | — | 1.3 | — | 0.05 | 350 | 20 |
| RF i-type layer: (251) | — | 7.0 | — | — | 180 | — | — | — | 0.8 | — | 0.008 | 300 | 10 |
| MW i-type layer: (204) | 76 | — | — | 78 | 420 | — | — | — | 0.011 | 0.11 | 0.32 | 370 | 100 |
| RF i-type layer: (261) | — | 7.0 | — | — | 180 | — | — | — | 0.55 | — | 0.008 | 300 | 23 |
| RF p-type layer: (205) | — | — | 0.1 | — | 80 | — | 9 | 2 | 1.8 | — | 0.07 | 300 | 10 |
| RF n-type layer: (206) | 1.1 | — | — | — | 30 | 290 | — | — | 1.2 | — | 0.04 | 300 | 10 |
| RF i-type layer: (252) | — | 7.0 | — | — | 190 | — | — | — | 0.75 | — | 0.008 | 300 | 10 |
| MW i-type layer: (207) | 62 | — | — | 57 | 380 | — | — | — | 0.010 | 0.11 | 0.3 | 350 | 98 |
| RF i-type layer: (262) | — | 7.5 | — | — | 90 | — | — | — | 0.7 | — | 0.008 | 280 | 23 |
| RF p-type layer: (208) | — | — | 0.2 | — | 80 | — | 9 | 2 | 1.7 | — | 0.07 | 260 | 10 |
| RF n-type layer: (209) | 0.8 | — | — | — | 50 | 250 | — | — | 1.05 | — | 0.04 | 230 | 10 |
| RF i-type layer.: (210) | — | 7.0 | — | — | 320 | — | — | — | 0.7 | — | 0.007 | 190 | 90 |
| RF p-type layer: (211) | — | — | 0.4 | — | 90 | — | 8 | 2 | 1.6 | — | 0.07 | 170 | 10 |

Reference Example E19-1

This example is different from Example E19 in that the intermediate layer 299 of ZnO—Cu—Fe—Cr (99.1:0.3:0.3:0.3) was not formed on the substrate and, after the light-reflecting layer 201 of Ag was formed, the reflection enhancing layer 202 of ZnO—Fe—Ni (99.4:0.3:0.3) was formed without the step of lowering the substrate temperature to 100° C. or below. Except these points, the procedure of Example E19 was repeated to produce photovoltaic devices as shown in FIG. 4. Samples of the photovoltaic device of this example are called "SCE19-1".

For every two kinds of the samples of the photovoltaic device, i.e., SCE19 and SCE19-1, seven samples were prepared. In respect of these samples of the photovoltaic device, a bending peel test was carried out in the same manner as as described below, to examine their environmental resistance. Characteristics of initial photoelectric conversion efficiency (photoelectromotive force/incident light intensity) (in respect of photoelectric conversion efficiency and short-circuit current) were evaluated in the same manner as in Example A1. Photo-deterioration characteristics were also evaluated in the manner as described below. The results obtained are shown together in Table E44.

The bending peel test was carried out in the following way: The respective photovoltaic devices were left to stand for 285 hours in an environment of a high-temperature and high-humidity atmosphere (temperature: 84° C.; humidity: 86% RH), and thereafter put to a bending test repeated thirty times. In addition, to the part thus bended, a weight of 10 kg was dropped nineteen times at a height of 50 cm, and any peeling in the device was observed using a scanning electron microscope (SEM), manufactured by Hitachi Ltd. (model: S-4500; magnifications: 50,000×).

To examine the photo-deterioration characteristics, photoelectric conversion efficiency was evaluated after photovoltaic devices having a temperature of 52° C. were irradiated by light for 1,380 hours under 1 sun of 100 mW/cm$^2$.

In the results of the bending peel test, shown in Table E44, letter symbol "A" indicates an instance where no peeling occurs at all, and "C" an instance where peeling partly occurs. The results of evaluation on the characteristics of initial photoelectric conversion efficiency and photo-deterioration characteristics also shown in Table E44 are indicated by standardizing the results of the photovoltaic device SCE19-1 on the basis of the results of the photovoltaic device SCE19 which are regarded as 1.

TABLE E44

| Sample | Bending peel test | Total reflectance | Scattered reflectance | Photo-deterioration characteristics |
|---|---|---|---|---|
| SCE19 | A | 1.00 | 1.00 | 1.00 |
| SCE19-1 | C | 0.81 | 0.90 | 0.90 |

As is seen from the results shown in Table E44, the photovoltaic device SCE19 obtained in Example E19 by the process of the present invention is superior to the photovoltaic devices SCE19-1 of Reference Example E19-1 in all the environmental resistance, characteristics of initial photoelectric conversion efficiency and photo-deterioration characteristics at the same time.

What is claimed is:

1. A method for producing a photovoltaic device comprising a base member comprising a substrate and superposingly formed thereon a reflecting layer and a reflection enhancing layer, and a pin photo active layer structure formed of non-single crystal n-type, i-type and p-type semiconductor layers containing silicon atoms, the pin layer structure being repeated at least once on the base member, the method comprising the sequential steps of:

(a) depositing the reflecting layer at a substrate temperature of from 200° to 500° C.;

(b) lowering the substrate temperature to 100° C. or below after step (a); and (c) depositing the reflection enhancing layer on the reflecting layer at a substrate temperature of from 200° to 400° C.

2. The method for producing a photovoltaic device according to claim 1, wherein in step (b) the substrate temperature is lowered at a rate of from 1° C./second to 50° C./second.

3. The method for producing a photovoltaic device according to claim 1, wherein in step (c) the substrate temperature is raised at a rate of from 10° C./second to 100° C./second.

4. The method for producing a photovoltaic device according to claim 1, wherein in step (b) a gas is used to lower the substrate temperature; the gas being at least one selected from the group consisting of hydrogen, helium, and argon.

5. The method for producing a photovoltaic device according to claim 1, wherein the reflecting layer comprises silver.

6. The method for producing a photovoltaic device according to claim 1, wherein the reflection enhancing layer comprises an aluminum-silicon alloy.

7. The method for producing a photovoltaic device according to claim 1, wherein the reflection enhancing layer comprises zinc oxide.

8. The method for producing a photovoltaic device according to claim 7, wherein the ZnO reflection enhancing layer further contains at least one element selected from the group consisting of Ag, Ni, Fe, Cr, and Cu.

9. The method for producing a photovoltaic device according to claim 8, wherein the at least one element selected from the group consisting of Ag, Ni, Fe, Cr and Cu is contained in the ZnO in an amount of from 10 ppm to 10,000 ppm.

10. The method for producing a photovoltaic device according to claim 1, wherein an intermediate layer is formed on the substrate, prior to the reflecting layer being formed thereon in step (a).

11. The method for producing a photovoltaic device according to claim 10, wherein the intermediate layer comprises an aluminum-silicon alloy.

12. The method for producing a photovoltaic device according to claim 11, wherein the intermediate layer is deposited at a substrate temperature of from 30° to 500° C.

13. The method for producing a photovoltaic device according to claim 10, wherein the intermediate layer comprises zinc oxide.

14. The method for producing a photovoltaic device according to claim 13, wherein the intermediate layer is deposited at a substrate temperature of from 30° to 500° C.

15. The method for producing a photovoltaic device according to claim 13, wherein the ZnO intermediate layer contains at least one element selected from the group consisting of Ag, Ni, Fe, Cr, and Cu.

16. The method for producing a photovoltaic device according to claim 15, wherein the at least one element selected from the group consisting of Ag, Ni, Fe, Cr, and Cu is contained in an amount of from 10 ppm to 10,000 ppm.

17. The method for producing a photovoltaic device according to claim 10, wherein the substrate has a predetermined shape and is successively carried into a plurality of separate chambers, and the intermediate layer, the reflecting layer, and the reflection enhancing layer are formed in respective chambers separate from each other.

18. The method for producing a photovoltaic device according to claim 10, wherein the substrate is in the shape of an elongated belt and is successively carried into a plurality of chambers, and the intermediate layer, the reflecting layer, and the reflection enhancing layer are continuously formed on the substrate.

19. The method for producing a photovoltaic device according to claim 1, wherein the substrate has a predetermined shape and is successively carried into a plurality of separate chambers, and the reflecting layer and the reflection enhancing layer are formed in respective chambers separate from each other.

20. The method for producing a photovoltaic device according to claim 1, wherein the substrate is in the shape of an elongated belt and is successively carried into a plurality of chambers, and the reflecting layer and the reflection enhancing layer are continuously formed on the substrate.

21. The method for producing a photovoltaic device according to claim 1, wherein the reflecting layer comprises aluminum.

* * * * *

UNITED STATES PATENT AND TRADEMARK OFFICE
CERTIFICATE OF CORRECTION

PATENT NO. : 5,824,566

DATED : October 20, 1998

INVENTOR(S) : MASAFUMI SANO ET AL.

It is certified that error appears in the above-identified patent and that said Letters Patent is hereby corrected as shown below:

ON THE TITLE PAGE, [75]

Inventors, "Soraku-gun;" should read --Kyoto--; and "Nara," should read --Nara-shi--.

ON THE TITLE PAGE, [57] ABSTRACT

Line 1, "photo voltaic" should read --photovoltaic--.

COLUMN 1

Line 21, "For example" should read --For example,--;
Line 49, "based member" should read --base member--; and
Line 61, "400°C." should read --400°C.,--.

COLUMN 3

Line 23, "substrate" should read --substrate,--.

UNITED STATES PATENT AND TRADEMARK OFFICE
CERTIFICATE OF CORRECTION

PATENT NO. : 5,824,566

DATED : October 20, 1998

INVENTOR(S) : MASAFUMI SANO ET AL.

It is certified that error appears in the above-identified patent and that said Letters Patent is hereby corrected as shown below:

COLUMN 7

Line 31, "for example" should read --, for example--;
Line 33, "for example" should read --, for example--;
Line 36, "for example" should read --, for example--;
Line 38, "for example" should read --, for example--;
Line 39, "for example" should read --, for example--;
Line 47, "100 nmr" should read --100 nm--; and
Line 57, "pressure, of" should read --pressure of,--.

COLUMN 8

Line 22, "for example" should read --, for example,--; and
Line 29, "for example" should read --, for example,--.

COLUMN 10

Line 39, "example" should read --example,--.

COLUMN 12

Line 32, "preferable" should read --preferably--.

COLUMN 15

Line 24, "for example" should read --, for example,--.

UNITED STATES PATENT AND TRADEMARK OFFICE
CERTIFICATE OF CORRECTION

PATENT NO. : 5,824,566
DATED : October 20, 1998
INVENTOR(S) : MASAFUMI SANO ET AL.

It is certified that error appears in the above-identified patent and that said Letters Patent is hereby corrected as shown below:

COLUMN 17

Line 33, "mean" should read --means--.

COLUMN 19

Line 44, "(ad)" should read --($\sigma$d)--.

COLUMN 23

Line 16, "$B_4H_1$" should read --$B_4H_{10}$--.

COLUMN 26

Line 66, "$mM^2$" should read --$mm^2$--.

COLUMN 29

Line 49, "1 pm" should read --1 $\mu$m--.

COLUMN 33

Line 13, "pc-Si" should read --$\mu$c-Si--; and
Line 15, "pc-Si" should read --$\mu$c-Si--.

COLUMN 36

Line 36, "(photo electromotive" should read --(photoelectromotive--.

UNITED STATES PATENT AND TRADEMARK OFFICE
CERTIFICATE OF CORRECTION

PATENT NO. : 5,824,566

DATED : October 20, 1998

INVENTOR(S) : MASAFUMI SANO ET AL.

It is certified that error appears in the above-identified patent and that said Letters Patent is hereby corrected as shown below:

COLUMN 40

Line 1, "(photo electromotive" should read
--(photoelectromotive--.

COLUMN 42

Line 23, "pc-Si" should read --$\mu$c-Si--; and
Line 25, "pc-Si" should read --$\mu$c-Si--.

COLUMN 43

Table A7, "220" should read --200--; and
Line 57, "(photo electromotive" should read
--(photoelectromotive--.

COLUMN 44

Table A7, "0008" should read --0.008--.

COLUMN 47

Line 40, "(photo electromotive" should read
--(photoelectromotive--.

COLUMN 48

Line 57, "(photo electromotive" should read
--(photoelectromotive--.

UNITED STATES PATENT AND TRADEMARK OFFICE
CERTIFICATE OF CORRECTION

PATENT NO. : 5,824,566
DATED : October 20, 1998
INVENTOR(S) : MASAFUMI SANO ET AL.

It is certified that error appears in the above-identified patent and that said Letters Patent is hereby corrected as shown below:

COLUMN 50

Line 22, "(photo electromotive" should read --(photoelectromotive--.

COLUMN 51

Line 58, "2 8 10 40 70 100 120 150" should read --0.2 0.8 1 10 30 50 70 90--; and
Line 60, "B" (1st occurrence) should read --A--.

COLUMN 53

Line 6, "mtorr" should read --mTorr--.

COLUMN 60

Line 11, "Except" should read --Except for--.

COLUMN 61

Line 5, "1 x 10-$^5$ Torr." should read --1 x $10^{-5}$ Torr.--;
Line 14, "1 x 10-$^5$ Torr." should read --1 x $10^{-5}$ Torr.--;
Line 25, "pc-Si" should read --$\mu$c-Si--; and
Line 27, "pc-Si" should read --$\mu$c-Si--.

COLUMN 63

Line 20, "1 x 10-$^5$ Torr." should read --1 x $10^{-5}$ Torr.--.

UNITED STATES PATENT AND TRADEMARK OFFICE
CERTIFICATE OF CORRECTION

PATENT NO. : 5,824,566
DATED : October 20, 1998
INVENTOR(S) : MASAFUMI SANO ET AL.

It is certified that error appears in the above-identified patent and that said Letters Patent is hereby corrected as shown below:

COLUMN 64

Line 10, "(photo electromotive" should read --(photoelectromotive--.

COLUMN 68

Line 9, "(photo electromotive" should read --(photoelectromotive--.

COLUMN 70

Line 23, "pc-Si" should read --$\mu$c-Si--; and
Line 25, "pc-Si," should read --$\mu$c-Si,--.

COLUMN 71

Line 60, "(photo electromotive" should read --(photoelectromotive--.

COLUMN 75

Line 31, "(photo electromotive" should read --(photoelectromotive--; and
Line 37, "Table 11." should read --Table B11.--.

COLUMN 76

Line 37, "(photo electromotive" should read --(photoelectromotive--.

UNITED STATES PATENT AND TRADEMARK OFFICE
CERTIFICATE OF CORRECTION

PATENT NO. : 5,824,566

DATED : October 20, 1998

INVENTOR(S) : MASAFUMI SANO ET AL.

It is certified that error appears in the above-identified patent and that said Letters Patent is hereby corrected as shown below:

COLUMN 79

Table B17, "Temp. rise rate:" should read --Temp. drop rate:-- and "30   70" should read --30   50   70--;

```
        A  A            A  A  A
        A  A            A  A  A
        A  A            A  A  A
```

COLUMN 87

Line 62, "Except" should read --Except for--.

COLUMN 99

Line 25, "scam" should read --sccm--; and
Line 26, "scam" (both occurrences) should read --sccm--.

COLUMN 101

Table C6, "SCC561" should read --SCC6-1--; and
Line 47, "Reference Example" should read --Reference Example C6-1--.

COLUMN 108

Line 3, "materials" should read --material--.

UNITED STATES PATENT AND TRADEMARK OFFICE
CERTIFICATE OF CORRECTION

PATENT NO. : 5,824,566
DATED : October 20, 1998
INVENTOR(S) : MASAFUMI SANO ET AL.

It is certified that error appears in the above-identified patent and that said Letters Patent is hereby corrected as shown below:

COLUMN 109

Table C10, "RFn-type layer:" should read --RF n-type layer:--.

COLUMN 111

Table C13, "RF i-type Iayer:" should read --RF i-type layer:--.

COLUMN 112

Table C14, "Open-end voltage:" should read --Photoelectric conversion efficiency after photo-deterioration--.

COLUMN 114

Table C17, "photodeterioration" should read --photo-deterioration-- and
"90" should read --90--.

| | |
|---|---|
| B | B |
| C | C |
| C | C |
| C | B |

COLUMN 117

Table C20, "deterioration" should read --deterioration:--.

UNITED STATES PATENT AND TRADEMARK OFFICE
CERTIFICATE OF CORRECTION

PATENT NO. : 5,824,566
DATED : October 20, 1998
INVENTOR(S) : MASAFUMI SANO ET AL.

It is certified that error appears in the above-identified patent and that said Letters Patent is hereby corrected as shown below:

COLUMN 120

Line 64, "3 x $10^{-5}$ Torr." should read --3 x $10^{-6}$ Torr.--.

COLUMN 129

Line 23, "scam," should read --sccm--; and
Line 24, "scam," should read --sccm--.

COLUMN 131

Line 48, "EXAMPLE D5" should read --EXAMPLE D6--.

COLUMN 132

Line 37, "scam" should read --sccm--; and
Line 37, "scam" (both occurrences) should read --sccm--.

COLUMN 135

Line 54, "Table D5," should read --Table D6,--.

COLUMN 139

Table D7, "NW i-type layer:" should read --MW i-type layer:--.

UNITED STATES PATENT AND TRADEMARK OFFICE
CERTIFICATE OF CORRECTION

PATENT NO. : 5,824,566
DATED : October 20, 1998
INVENTOR(S) : MASAFUMI SANO ET AL.

It is certified that error appears in the above-identified patent and that said Letters Patent is hereby corrected as shown below:

COLUMN 140

Line 52, "Reference Example" should read --Reference Example D7-1--.

COLUMN 146

Table D14, "photodeterioration:" should read --photo-deterioration--.

COLUMN 147

Line 7, "used" (2nd occurrence) should be deleted.

COLUMN 148

Table D17, "Temp. rise rate:" should read --Temp. drop rate:--.

COLUMN 149

Table D17, "Temp. rise rate:" should read --Temp. drop rate:--.

COLUMN 154

Line 38, "Table E," should read --Table E1,--.

UNITED STATES PATENT AND TRADEMARK OFFICE
CERTIFICATE OF CORRECTION

PATENT NO. : 5,824,566
DATED : October 20, 1998
INVENTOR(S) : MASAFUMI SANO ET AL.

It is certified that error appears in the above-identified patent and that said Letters Patent is hereby corrected as shown below:

COLUMN 161

Line 18, "80°C./sec." should read --8°C./sec.--.

COLUMN 164

Line 16, "45 scam," should read --45 sccm,--.

COLUMN 165

Line 12, "$B_2H^6/H_2$ gas" should read --$B_2H_6/H_2$ gas--.

COLUMN 166

Table E5, "Open-and voltage" should read --Open-end voltage--.

COLUMN 176

Line 66, "materials" should read --material--.

COLUMN 179

Line 4, "as" (2nd occurrence) should read --is--.

COLUMN 181

Table E14, "photodeterioration:" should read --photo-deterioration:--

UNITED STATES PATENT AND TRADEMARK OFFICE
CERTIFICATE OF CORRECTION

PATENT NO. : 5,824,566
DATED : October 20, 1998
INVENTOR(S) : MASAFUMI SANO ET AL.

It is certified that error appears in the above-identified patent and that said Letters Patent is hereby corrected as shown below:

COLUMN 183

Table E17, "Temp. rise rate:" should read --Temp. drop rate:-- and "photodeterioration:" should read --photo-deterioration--.

COLUMN 186

Table E20, "efficiency" (1st occurrence) should read --efficiency:--.

COLUMN 188

Table E21, "38" (2nd occurrence) should read --39--; and
Table E23, "0.0007" should read --0.0007--.
      B         A
      A         A

COLUMN 191

Table E26, "0.0002 0.0007 0.001 0.01 0.07 0.1 0.15 0.2" should read --0.0001 0.0007 0.001 0.01 0.1 1 2 10-- and "efficiency" (1st occurrence) should read --efficiency:--.

COLUMN 193

Table E29, "efficiency" should read --efficiency:--.

UNITED STATES PATENT AND TRADEMARK OFFICE
CERTIFICATE OF CORRECTION

PATENT NO. : 5,824,566
DATED : October 20, 1998
INVENTOR(S) : MASAFUMI SANO ET AL.

It is certified that error appears in the above-identified patent and that said Letters Patent is hereby corrected as shown below:

COLUMN 195

Table E32, "photodeterioration:" should read
--photo-deterioration:--.

COLUMN 198

Table E35, "photodeterioration:" should read
--photo-deterioration:--.

COLUMN 199

Table E37, "RFi-type layer:" (2nd occurrence) should
read --RF i-type layer--.

COLUMN 200

Table E38, "photodeterioration:" should read
--photo-deterioration:--.

COLUMN 203

Line 66, "was" should read --were--.

COLUMN 204

Line 63, "these" should read --for these--.

UNITED STATES PATENT AND TRADEMARK OFFICE
CERTIFICATE OF CORRECTION

| | | |
|---|---|---|
| PATENT NO. | : | 5,824,566 |
| DATED | : | October 20, 1998 |
| INVENTOR(S) | : | MASAFUMI SANO ET AL. |

It is certified that error appears in the above-identified patent and that said Letters Patent is hereby corrected as shown below:

<u>COLUMN 206</u>

Table E42, "(Example E18;" should read --(Example E19;--.

<u>COLUMN 207</u>

Line 38, "these" should read --for these--; and
Line 46, "as as" should read --as is--.

<u>COLUMN 208</u>

Line 60, "photo active" should read --photoactive--.

Signed and Sealed this

Twelfth Day of December, 2000

*Attest:*

Q. TODD DICKINSON

*Attesting Officer*       *Director of Patents and Trademarks*